United States Patent [19]
Yih et al.

[11] Patent Number: 5,030,907
[45] Date of Patent: Jul. 9, 1991

[54] CAD DRIVEN MICROPROBE INTEGRATED CIRCUIT TESTER

[75] Inventors: Christopher Yih; Tsen-Shau Yang; Kuang-Hua Huang, all of Cupertino; Ger-Chih Chou, San Jose, all of Calif.

[73] Assignee: Knights Technology, Inc., Cupertino, Calif.

[21] Appl. No.: 354,268

[22] Filed: May 19, 1989

[51] Int. Cl.[5] ................................ G01R 1/04
[52] U.S. Cl. ................................ 324/158 F; 324/72.5; 324/158 P; 901/5; 364/474.37
[58] Field of Search ............... 324/158 P, 158 F, 72.5, 324/73 PC, 158 MG; 901/3-5; 364/474.37, 474.28

[56] References Cited

U.S. PATENT DOCUMENTS

| | | | |
|---|---|---|---|
| 3,727,119 | 4/1973 | Stanley et al. | 901/5 |
| 3,958,740 | 5/1976 | Dixon | 901/5 |
| 4,283,764 | 8/1981 | Crum | 901/4 |
| 4,321,517 | 3/1982 | Touchton et al. | 360/78.04 |
| 4,328,621 | 5/1982 | Benjamin | 901/3 |
| 4,389,669 | 6/1983 | Epstein et al. | 364/474.37 |
| 4,471,298 | 9/1984 | Frohlich | 324/73 PC |
| 4,544,889 | 10/1985 | Hendriks et al. | 356/375 |
| 4,565,966 | 1/1986 | Burr et al. | 324/73 PC |
| 4,638,232 | 1/1987 | Anderson et al. | 364/474.37 |
| 4,670,698 | 6/1987 | Fulton et al. | 324/158 MG |
| 4,706,019 | 11/1987 | Richardson . | |

FOREIGN PATENT DOCUMENTS

| | | | |
|---|---|---|---|
| 0107323 | 3/1984 | European Pat. Off. | 324/158 F |
| 0123509 | 6/1987 | Japan | 364/474.28 |

*Primary Examiner*—Kenneth Wieder
*Assistant Examiner*—William J. Burns
*Attorney, Agent, or Firm*—Townsend and Townsend

[57] ABSTRACT

A system for testing integrated circuits is disclosed which uses a mechanical microprobe and the integrated circuit's CAD database. The system is integrated with the CAD database in such a manner that after an initial alignment operation between the CAD database and the integrated circuit being tested, the microprobe can be moved automatically to any spot on the circuit by choosing a point in the CAD database and placing a cursor on that spot. The microprobe is then automatically moved to the point so indicated. A contact sensing circuit allows the probe to be driven into the actual circuit to take measurements or inject test signals without fear of damaging the integrated circuit. The system can operate in numerous modes, each of which provide a different way of visualizing the circuit being tested.

6 Claims, 9 Drawing Sheets

FIG._1.

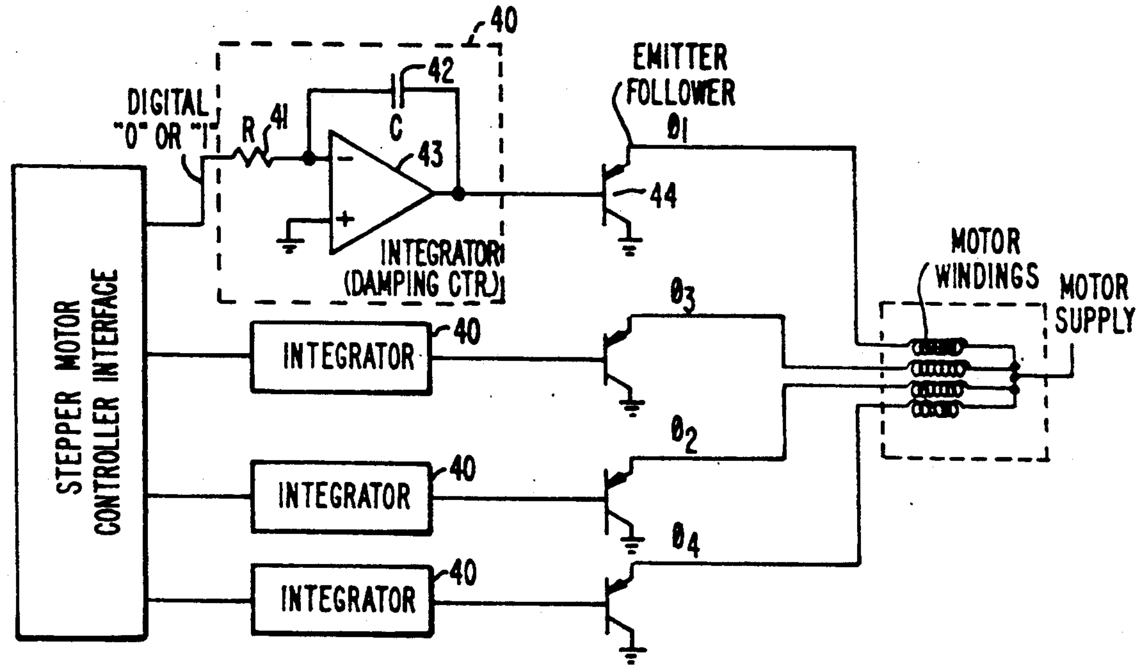
FIG._3A.
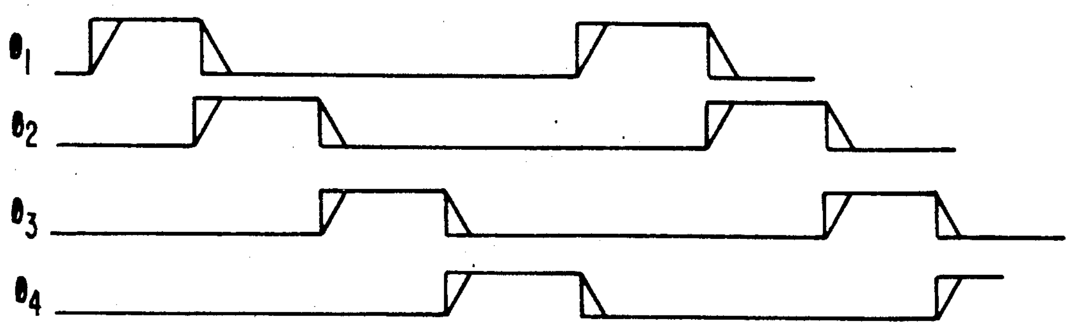
FIG._3B.

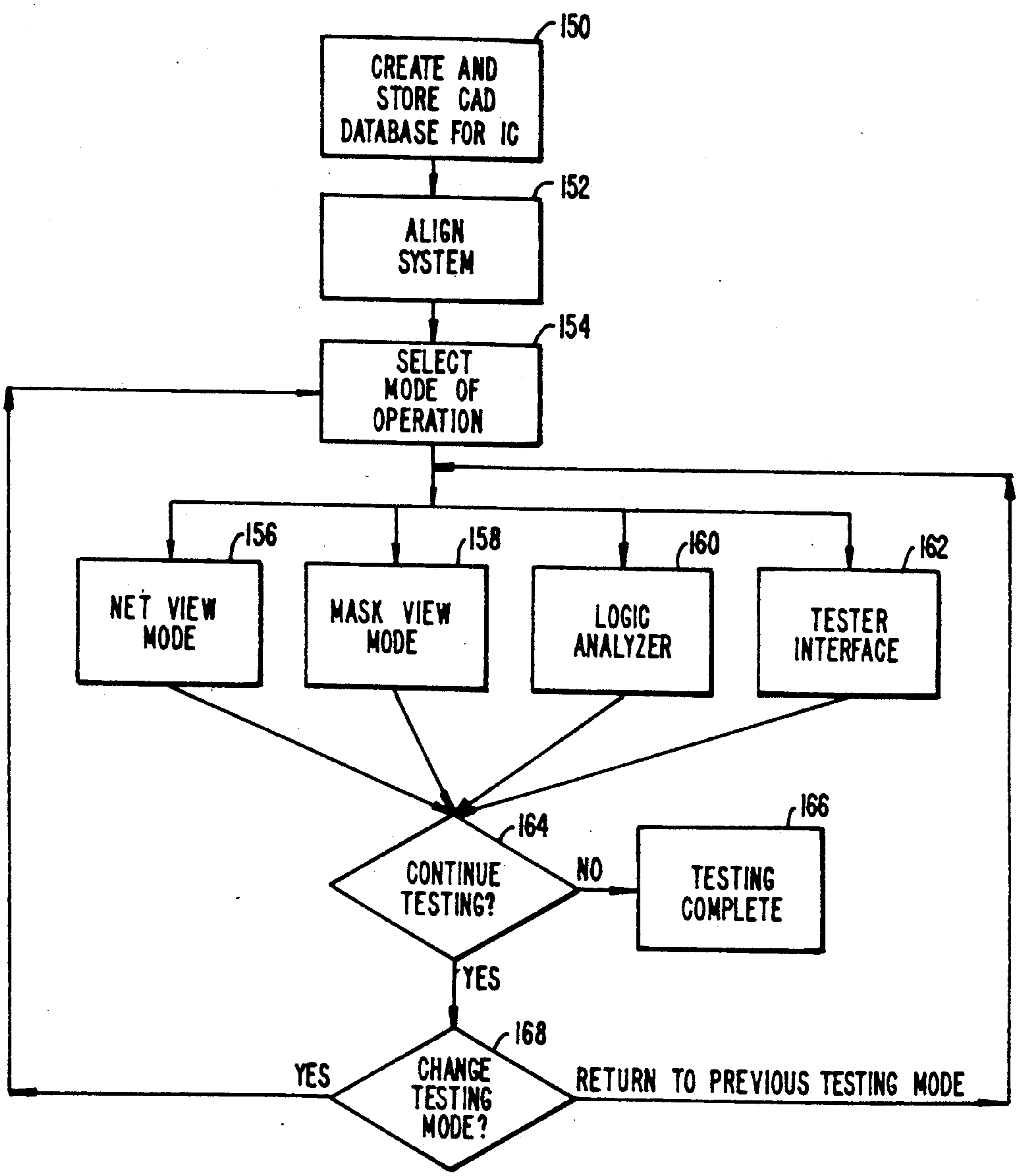
FIG._4.

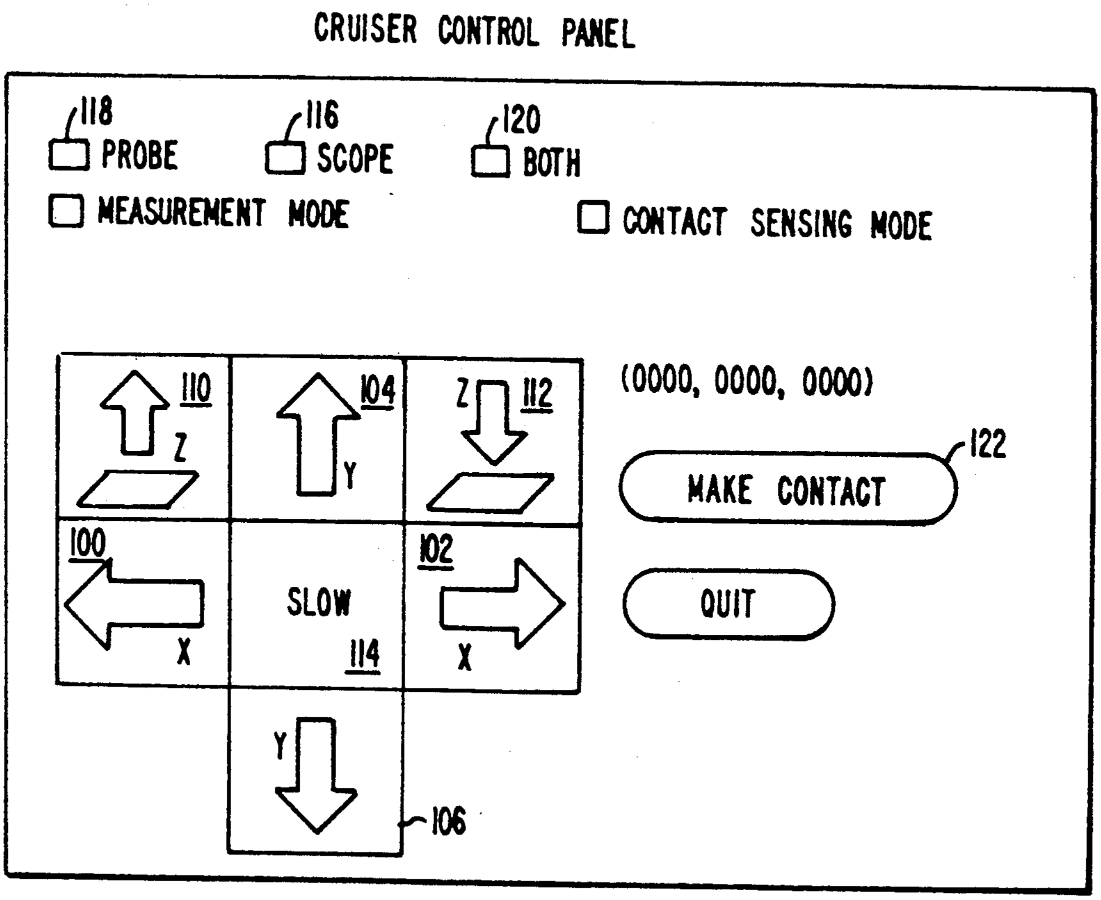
FIG._5.

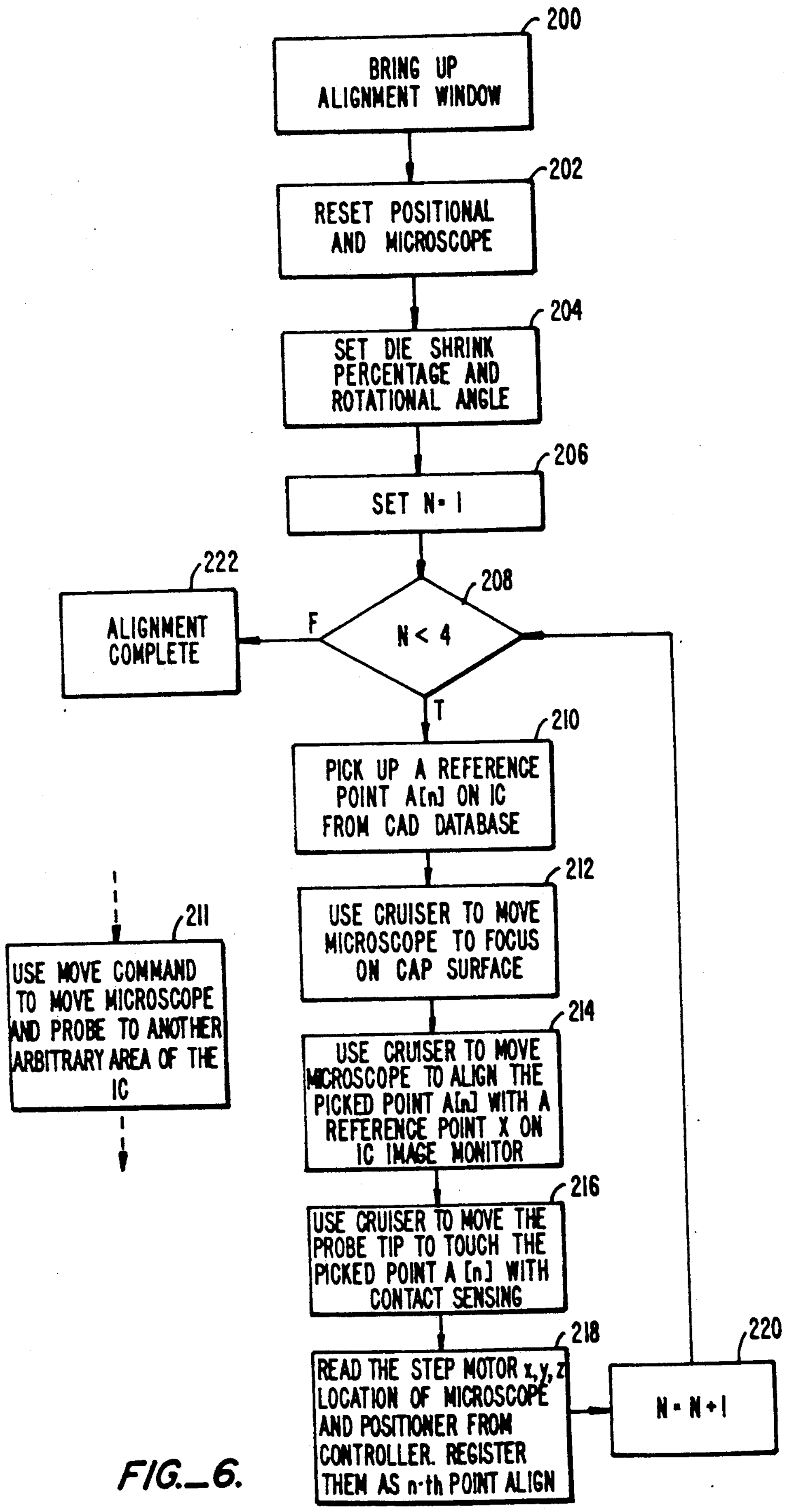
FIG._6.

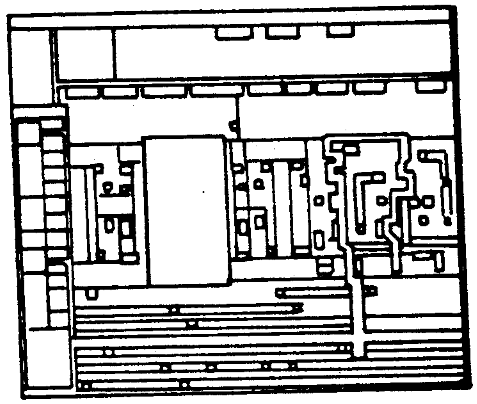
FIG._7.
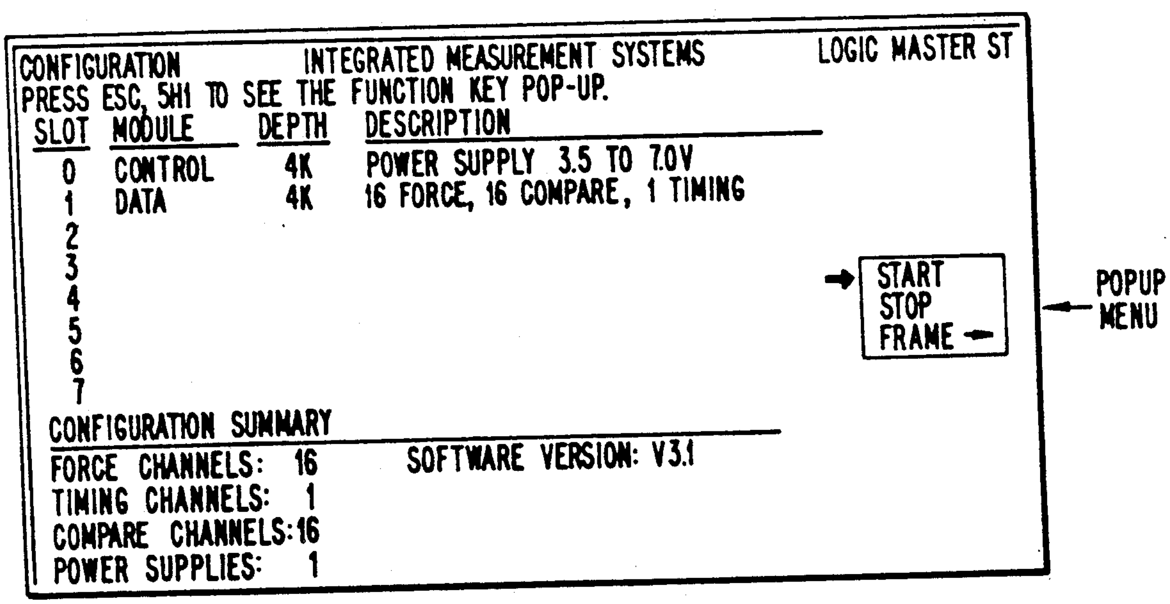
FIG._10.

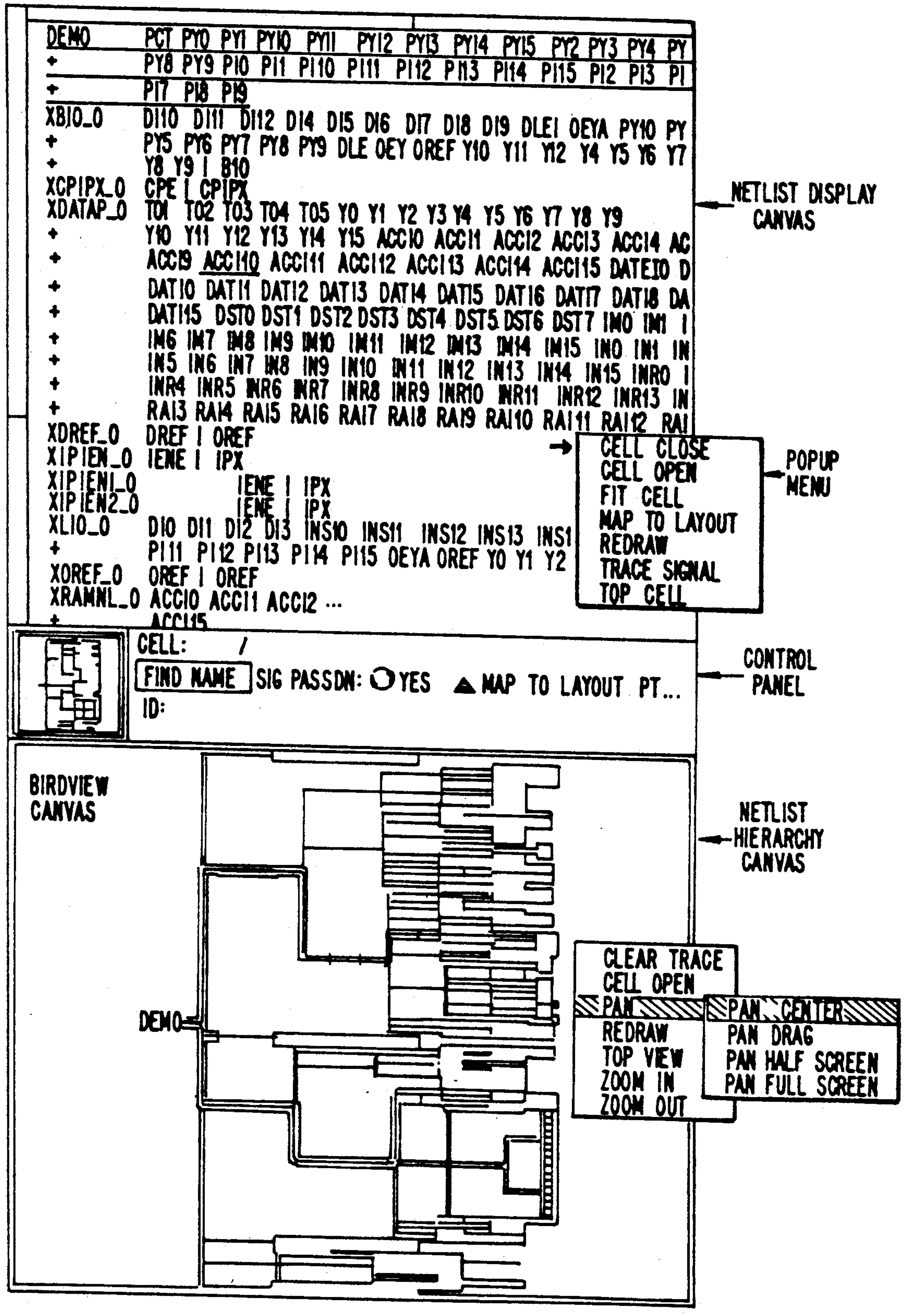
FIG._8.

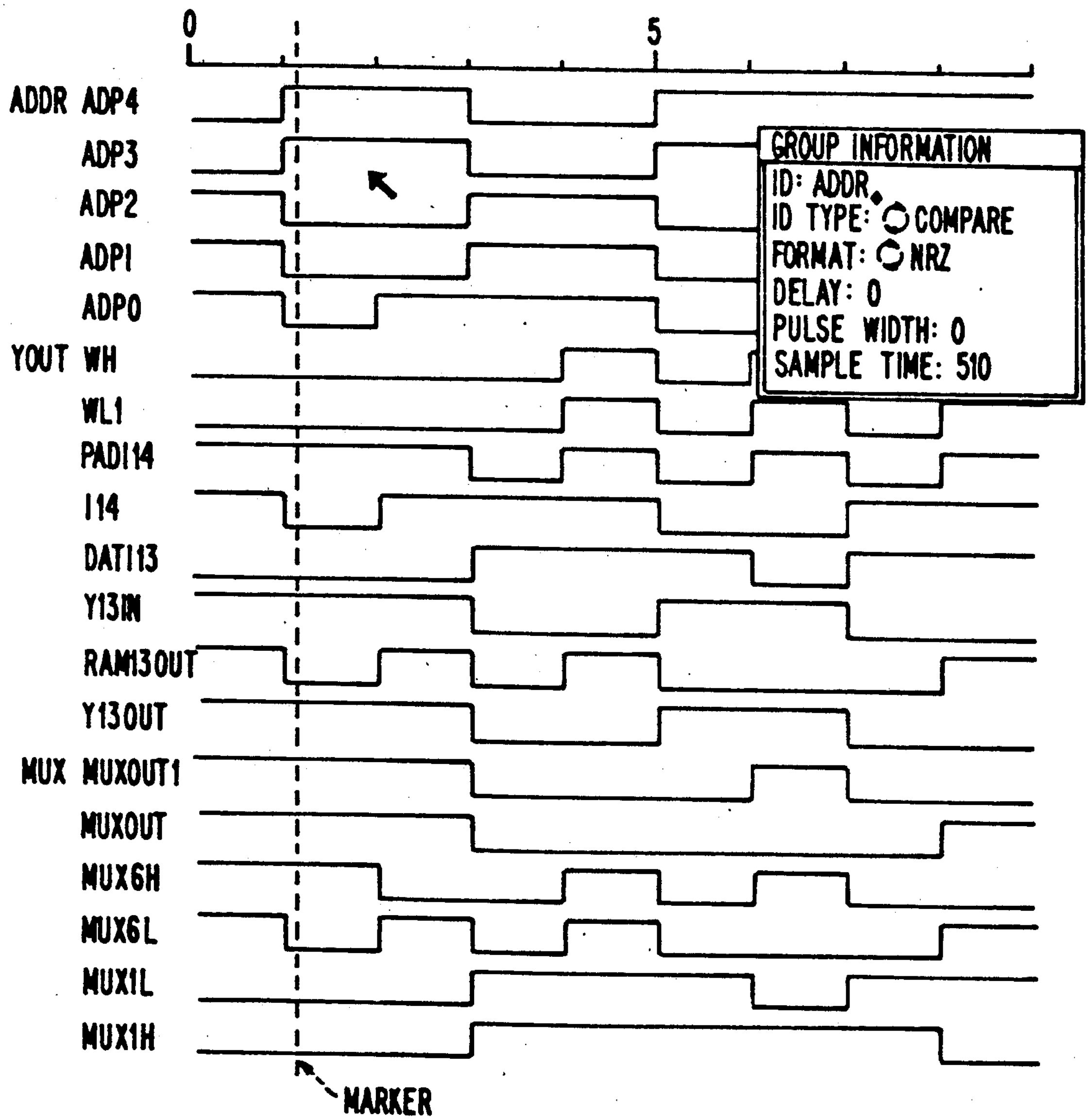
FIG._9.

CAD DRIVEN MICROPROBE INTEGRATED CIRCUIT TESTER

NOTICE REGARDING COPYRIGHTED MATERIAL

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD OF THE INVENTION

This invention relates to the field of integrated circuit testing systems. More particularly it relates to the field of integrated circuit testing systems which use a mechanical probe to test the circuit in conjunction with a CAD database which describes the circuit under test.

BACKGROUND OF THE INVENTION

Wave form measurement at internal nodes in integrated circuits is necessary both to verify the circuit's design and to analyze its failures. Numerous systems are known which perform such measurements, the most common systems using either electron probes or mechanical probes to access the internal nodes.

Prior art electron probes, most of which are essentially scanning electron microscopes, have several problems which limit their usefulness as debugging tools. First, the necessity of maintaining the integrated circuit being tested in a vacuum makes it difficult to access the internal nodes with a mechanical probe to inject test signals. Second, there is no simple way for the tester to locate the specific area on the integrated circuit where test signals must be injected or received. Locating a specific area on the integrated circuit requires extensive physical manipulation of the circuit or viewing apparatus until the area of the circuit being viewed on the apparatus corresponds to the area of the suspected malfunction as that area is drawn on the schematic diagram of the circuit being tested. This process can be very time consuming when a plurality of points must be tested. Although Richardson, U.S. Pat. 4,706,019, discloses an electgron beam test probe system wherein the electron probe is closely integrated with a schematic diagram of the integrated circuit, the Richardson System is quite complex. Last, an electron probe cannot inject test signals.

Known mechanical probe systems correct some of these problems but share some of the same problems and add new problems. Mechanical probes can make very accurate voltage measurements and have a frequency response comparable to that of an electron probe. However, as in current electron probe systems, it is difficult to locate the area or component to be tested as no simple correspondence between the schematic which describes the circuit and the area of the actual circuit being viewed exists. Probe systems can also damage the integrated circuit when they are applied to test areas if the probe is overdriven into the circuit. This problem necessitates extreme positioning accuracy for the probe, which greatly increases testing time.

Given the shortcomings of existing electron probes and mechanical microprobes, a need exists for an integrated circuit testing system which can provide rapid access to and testing of specific areas in an integrated circuit, which will be extremely accurate in its voltage measurements, which can inject test signals, but which will not damage the circuit being tested.

SUMMARY OF THE INVENTION

The present invention is an integrated circuit testing system which uses a mechanical microprobe and corrects the previously noted shortcomings of such mechanical systems to fulfill the stated need.

The system comprises a Computer Aided Design ('CAD') database which fully describes the circuit being tested. For purposes of this invention this CAD database is broadly defined to include maskworks necessary to fabricate the circuit, schematics of the circuit, the various waveforms expected from the output of each device in the circuit and other information used to design and construct the circuit. The CAD database is stored, accessed and displayed on a computer. A controller is coupled to both the computer and the microprobe. The controller is used to establish a common coordinate system between the integrated circuit under test and its CAD database. Once this common coordinate system is established, the probe can be navigated automatically to points on the actual integrated circuit which correspond to points selected from and indicated on the CAD database. This automatic probe navigation can be described as "Layout Driven", as the circuits' 'layout' drives the probe to various test points. For purposes of this application, the terms "CAD driven", "CAD database driven", and "Layout Driven" are all equivalent. It should be noted that any one of the different stored descriptions of the integrated circuit, such as the maskworks or the schematic, may be accessed on the computer and test points selected therefrom. Regardless of what form the circuit description takes, the system, once the common coordinates have been established, can drive the probe to the point on the actual integrated circuit which corresponds to the point selected from the CAD database.

The components of one embodiment of the present invention are a computer coupled to a mechanical microprobe movable in three axes and a microscope with a charge-coupled device ('CCD') camera and monitor located in close proximity to the microprobe. The integrated circuit being tested is placed beneath the microscope and its image is displayed on the monitor.

The computer contains the entire CAD database for the integrated circuit ('IC') being tested. After the completion of a brief alignment procedure, the region of the IC which is suspect is accessed from the database and displayed on the computer's cathode ray tube ('CRT'). The probe and microscope are then automatically moved until the area of the actual integrated circuit which correspond to the image displayed on the CRT is found. This image is then displayed on the monitor.

After correspondence is established between the proposed test site shown on the computer's CRT and the image of the IC being viewed, a cursor is placed on the CRT's image to mark the exact location to be tested or probed. The mechanical probe is then driven to the corresponding location on the IC.

Both the alignment procedure and the testing operation depend upon the system's ability to drive the microprobe into the IC sufficiently far to insure good electrical contact but not so far as to damage the IC. A special contact sensing circuit which informs the system of the exact moment of the probe's contact with the IC fulfills both requirements. This circuit is described in the commonly owned U.S. patent application 076/349,203 entitled "CONTACT SENSING FOR INTEGRATED CIRCUIT TESTING", filed on May 9, 1989, now abandoned; and U.S. patent application No. 07/527,661 filed 5/21/90.

Probe contact can be used either to inject test signals or to measure signals. Because of the special contact sensing circuit, repeated contacts of the same point on the IC can occur without causing chip damage.

The system just described is, in essence, driven by the CAD database. Numerous operational modes and methods of use are envisioned and will be described herein.

BRIEF DESCRIPTION OF THE DRAWINGS

FIG. 3A is a schematic of the integrator used on each winding of the step motors;

FIG. 3B is a graph of the wave form inputs and outputs to and from the circuit shown in FIG. 3A.;

FIG. 4 is a flow chart of the overall system operation;

FIG. 5 is a representation of the cruiser control panel;

FIG. 6 is a flow chart of the alignment process;

FIG. 7 is a typical display on the CRT when the system is operating in the Maskview mode;

FIG. 8 is a typical display on the CRT when the system is operating in the Netlist mode;

FIG. 9 is a typical display on the CRT when the system is operating in the Logic Analyzer mode; and FIG. 10 is a typical display on the CRT when the system is operating IMS interface mode.

DETAILED DESCRIPTION OF THE PREFERRED EMBODIMENT

I. Physical Configuration of the system

Figure 1:
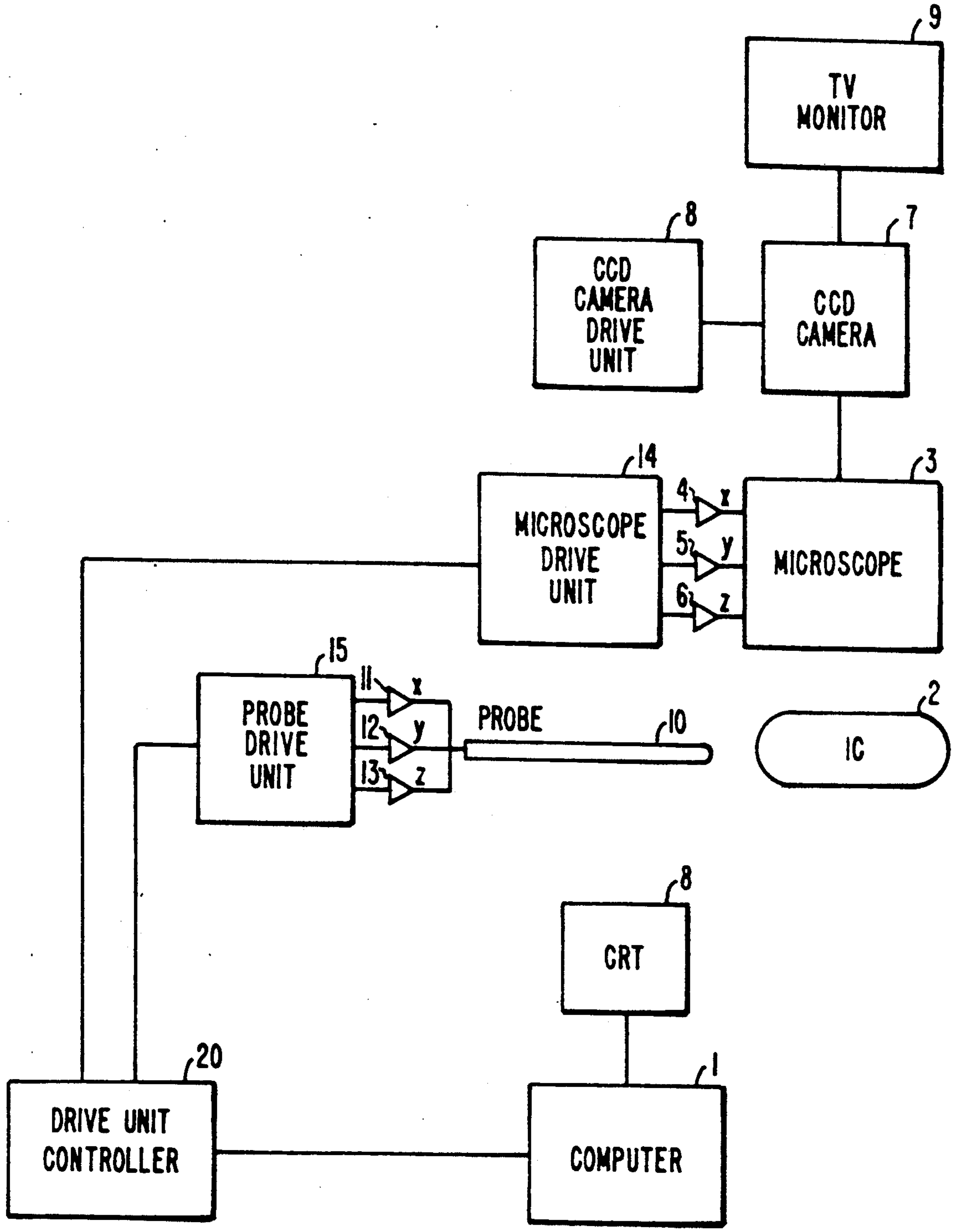
FIG. 1 is a block diagram of the physical components of the present invention.

As is shown in FIG. 1, the system comprises microscope 3 with camera 7, camera drive unit 8, and monitor 9, a three axis drive unit 14 for the microscope, microprobe 10 coupled to three axis drive unit 15, computer 1 coupled to CRT display 18, and Drive Unit Controller 20 coupled to probe drive unit 15, microscope drive unit 14 and computer 1.

In a preferred embodiment of the present invention, computer 1 is a SUN-3/60C workstation with 8 megabytes real memory, a 327 megabyte hard disk and an quarter inch tape drive with a 60 megabyte cartridge capacity. Computer 1 is coupled to cathode ray tube ('CRT') display 18, input keyboard (not shown), and input mouse (not shown). Computer 1 stores and displays the Computer Aided Design ('CAD') database of the integrated circuit ('IC') being tested. The interaction between computer 1, its CAD database, and the other system components is described subsequently.

IC 2 is placed at the focus of microscope 3. Microscope 3 is manufactured by Bausch & Lomb, has a magnification range from 22.5× to 3000× and a built-in 2× zoom. The microscope is supplied as part of an Alessi, Inc. Rel-4100A Failure Analysis Test Station. As part of the test station, microscope 3 is capable of three-axis motion using step motors 4, 5 and 6. These motors are capable of moving microscope 3 with great precision, a resolution of 1 microns being regularly achieved. A charge-coupled device ('CCD') TV camera 7 with camera drive unit 8 is coupled to the eyepiece of microscope 3 and the image obtained therefrom is shown on monitor 9. Both the camera and its drive unit are manufactured by Panasonic and the monitor is a Sony Trinitron. Components provided by other manufacturers could be substituted for these components, particularly the microscope, camera, camera drive, and monitor, as long as the minimum capabilities of the described components are met.

Adjacent to microscope 3 and IC 2 is a microprobe ('probe') 10 mounted on microprobe drive unit ('drive unit') 15 with associated step motor drives 11, 12 and 13. The drive unit is capable of three axis motion over a range of 0.5"×0.5"×0.16" with 0.5 micron resolution. Probe 10 has a tip diameter of 1 micron and a capacitance of 0.1 pico farad, with 0.02 pico farad probes being optional. In alternative embodiments, use of a plurality of such probes and drive units, along with their associated motors is envisioned.

Drive motors 4, 5, 6, 11, 12 and 13 are coupled to drive unit controller ('Controller') 20, which in turn is coupled to computer 1. Controller 20 controls the motion of both probe 10 and microscope 3 through the drive motors upon receiving commands from either computer 1 or a user of the system. Controller 20 also acts as the interface between the probe 10 and computer 1, relaying probe contact and test data from IC 2 to the computer. Controller 20 is also capable of generating a logic output and accepting input from either computer 1 or an external keyboard 17.

Figure 2:
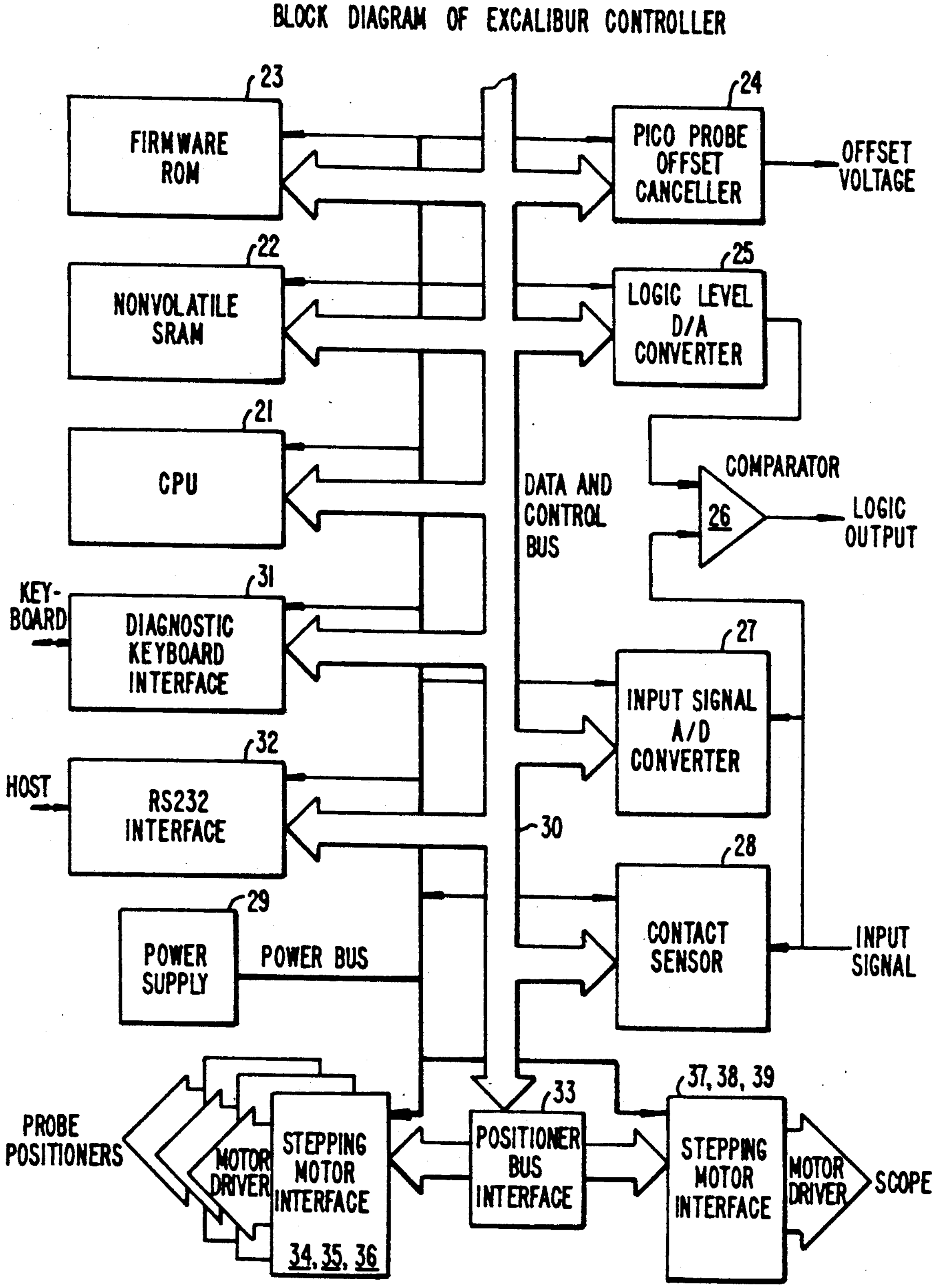
FIG. 2 is a block diagram of the drive motor controller unit.

The various components of controller 20 are shown in FIG. 2. Power supply 29 provides the proper voltage and current to the system controller in a known manner. Input signals from probe 10 are simultaneously applied to Input Signal A/D converter 27 which converts the analog voltage signal detected by probe 10 into a digital input signal and contact sensor 28. Contact sensor 28, which is fully described in the commonly owned patent application filed on May 9, 1989 and entitled "Contact Sensing for Integrated Circuit Testing", the specification of which is hereby fully incorporated herein, provides a signal which indicates when probe 10 has contacted IC 2. Both the digital test signals and the contact signal are placed on data and control bus ('BUS') 30. Pico Probe Offset Canceller 24 provides probe 10 with needed offset voltages to cancel the probe's bias voltage and its effect on the received test signals. In order to provide a logic signal output from the input signal, the input signal is also applied to one side of comparator 26. Whenever the input signal exceeds the threshold voltage established on comparator 26 by logic level D/A converter 25, a logic "high" output voltage is generated at comparator 26's output.

Command signals from computer 1 enter controller 20 over RS232 interface 32. Control signals may also be entered directly using a keyboard interface 31. These command signals are interpreted by CPU 21 using programs stored in ROM 23. The firmware used in conjunction with controller 20 which enables its operation is attached as Appendix C. This firmware is used on an Intel 8051 microprocessor and is written in an assembly language appropriate for use on the Intel microprocessor. Signals received from computer 1 or probe 10 may be temporarily stored in memory 22 which in this embodiment comprises a Static Random Access Memory ('SRAM'). When computer 1 commands movement in either microscope 3 or drive unit 15, these command movements are translated by CPU 21 and forwarded to the appropriate drive motors using Positioner Bus Interface 33, which helps CPU 21 detect the positions of the various step motors, and stepping motor interface 33.

Stepping motor interfaces 34, 35 and 36 have a special circuit for insuring vibration free motion of step motors 11, 12 and 13 which motors are coupled to drive unit 15. Vibration free motion of the probe is especially important when the probe is close to IC 2. Even with the very sensitive contact sensing circuit 28, if the probe is vibrating when it contacts IC 2, devices and interconnections on the IC may be destroyed. Consequently, as the probe nears IC 2 it must only operate in "slow" motion. Even with slow motion, the tip of the probe may begin to vibrate. As is known, stepping motors have a plurality of magnetic poles on their rotors and many individual stator windings. Windings are turned on and off individually, which in turn attracts or repels the various magnetic poles. Even at slow speed, these individual stepping pulses, especially if they are simple square wave voltage pulses, can cause the motor to resonate which in turn causes the probe to vibrate.

The special circuit which prevents this resonance and vibration problem is shown in FIG. 3A. The figure shows how each of stepping motor interfaces 34, 35 and 36 has a plurality of separate integrator damping circuits, each winding on the individual stepping motors requiring a separate integrator damping circuit coupled to the winding and the interface.

In FIG. 3A, integrator damping circuit 40 comprises RC network 41 and 42, operational amplifier 43 to which RC network 41/42 is coupled in an inverting configuration and emitter follower transistor 44, coupled to the output of operational amplifier 43, minimizes this resonance problem by slowing the rise and fall time of the voltage pulse which turn on the windings of the stepping motors. As shown in FIG. 3B, this lengthened rise and fall time results in a smoother application of power to the motor. This greatly reduces the resonance and consequent vibration caused by the abrupt on-off application of power square wave pulse trains. For purposes of this specification, the drive modes which uses the slow rising and falling power pulses just described during alignment and testing are called 'damped-stepping'.

II. System Operation

Overall system operation is outlined by the flow chart of FIG. 4. Initially a CAD database of the IC to be tested is created and stored in computer 1 (step 150). The CAD database as defined and used in this invention comprises at least the maskworks, schematic and net list of the integrated circuit being tested. Each of the different components of the CAD database are created and stored in a known manner. For example, the maskworks can be stored in the CIF or the Applicon 860 format.

After the CAD database is available on computer 1, the database and the image of the actual IC are aligned with one another so that upon the selection of a point in the database, the system can automatically move the probe and microscope to the area of the IC which corresponds to this selected point. This occurs at step 152.

After completion of the alignment process, the user selects, at step 154, which mode to use while testing the IC. In this embodiment, the modes available are Netview (step 156), Maskview (step 158), Logic Analyzer (step 160), and Tester Interface (step 162). Each of these modes implies a different way to view the IC being tested or a different way to display the test data.

After the initial series of tests has been performed in the selected mode, the user can choose to continue testing or not at step 164. If he chooses to continue, he or she can return to step 154 to change testing modes (step 168). If continued testing is desired without a change of testing modes, the system returns the user to the last mode in which the system was operating.

The details of these various operations, as well as the function of the different modes will now be described.

A. Alignment

The system described in this specification has many operational modes. Maskview, Netview, and Logic Analyzer are the names of some of these modes. As each mode relies upon the correlation of a selected point in the CAD database as shown on the CRT with the point being displayed on the monitor, the alignment process which allows this correlation to be made assumes great importance.

The alignment procedure takes place when the system is operating in the Maskview mode. In this mode, the physical hierarchy of the IC being tested is displayed on a cell-by-cell basis. Several common graphics data bases such as Calma's GDSII, CIF, and Applicon 860 can be used on computer 1 when it operates in this mode. Maskview operates in one of these submodes: Birdview Canvas, which displays the top view of the IC layout, Control Panel, which displays the current command and status of the command and warning messages, and Layout Canvas. As the Layout Canvas submode of the Maskview mode is used for the alignment process, the commands associated therewith are listed in Table 1 below. An explanation of the function of each of these commands is given in Appendix A.

TABLE 1

| |
|---|
| Cell Open/Close |
| Map to Netlist |
| Palette Tools |
| Pan |
| Probe commands |
| Previous View |
| Redraw |
| Top View |
| Trace Signal |
| Trace Removal |
| Zoom In |
| Zoom Out |
| Window Commands |

As the alignment procedure requires exceedingly accurate motion of probe 10, a special control panel (window) called the 'cruiser' is provided to control the motion of the probe and microscope during the alignment process. FIG. 5 shows how this panel appears on computer 1. The mouse coupled to computer 1 allows the user to select the desired command(s) and option(s) from the cruiser panel. As much of the following description involves three dimensional motion and observation, the commonly used X-Y-Z orthogonal planes are used to provide orientation for the description of such motion. To avoid all confusion, IC 2 is considered to be within the X-Y plane, with its surface perpendicular to the Z axis. Positive Z axis motion is up (away) from the IC's surface and negative Z motion is down through the IC.

As shown in FIG. 5, the cruiser panel enables the tester to move the probe in the ±X (100 and 102 respectively), ±Y (104 and 106 respectively) and ±Z (110 and 112 respectively) axes. The tester can also select from three speeds: slow (shown as 114), which moves the probe at 0.5 microns a step in each direction at a time, medium (not shown, but co-located with 114), which moves the probe at 4 microns a step, and fast (not shown, but also co-located with 114), which moves the probe at 128 microns a step. The cruiser panel allows the tester to move microscope 3, drive unit 15 or both using buttons 116, 118, and 120, respectively. When microscope motion is commanded, it moves at twice the speed of drive unit 15 at each speed level.

The "Make Contact" button 122 allows the user to perform test probes. Pressing this button results in the probe being lowered at the selected point. When the probe contacts the IC, the contact sensing circuit stops the motion. If overdriving the probe is desireable, further downward motion can be commanded by moving probe 10 along the −Z axis (pushing button 112). This may be necessary to obtain a reliable test signal.

As shown in FIG. 4 at step 150, the CAD database is created and stored on computer 1. Controller 20 is used to help perform the alignment procedure of step 152 which in turn enables the system to navigate probe 10 automatically.

Before the alignment process begins, the IC which will be tested is mounted in a holding stage beneath microscope 3. In the preferred embodiment, the IC remains stationary after being placed on the test stand. In a readily envisioned alternative embodiment, the IC will be moved and the microscope will remain stationary.

Ideally, if the IC was mounted perfectly flat relative to the Z plane and perfectly aligned within the X-Y planes, centering probe 10 over the IC and finding the center of the IC in the CAD database would be sufficient to align the system. Entry of an appropriate scaling factor, which would account for possible differences in scale between the CAD database and the IC as seen (imaged) in the microscope, would then enable automatic probe navigation. As the ideal situation never occurs, the following alignment process is needed.

FIG. 6 is a flow chart of the process used to align the system. As shown in FIG. 6, after the IC is mounted, the alignment window is called up on computer as step 200. At step 202, microscope 3 and drive unit 15 are placed in their respective centers of travel (at least in the X-Y ranges of motion) by commanding a reset. This center becomes the zero reference point for controller 20. Although this zero reference point does not correspond to the real zero points along each of the three axes of motion, it can be described by the formula $X'=Y'=Z'=0$. Next, at step 204, an appropriate scaling factor is entered so that the image of the CAD database displayed on computer 1's CRT is the same size as the image of the actual IC displayed on the monitor. This scaling factor is called the Die Shrink Percentage. Next, if the images displayed on the CRT and the monitor are not aligned in the X-Y plane, the computer can be instructed to shift the image in either the CRT or monitor to effect alignment between the images. This is movement of the rotation angle. As only visually obvious misalignment can be corrected here, the rotation correction is only accurate to within about 50–100 microns.

Although the scaling process and image alignment are part of the alignment process, they alone are not sufficient to enable automatic probe navigation. As the Z plane of the IC is undefined, automatic probe navigation is impossible, as skewing of the IC along the Z plane in an unknown way affects the actual position of IC's features in the X-Y planes. Additionally, some commands operate relative to the Z plane. As these points are needed to define a plane, a so-called "Three-Point Alignment" process is needed to define the IC's Z plane.

At step 206 a counter variable N is set to 1 and a loop condition check occurs at step 208. As the test of whether N is less than 4 is true at this time, step 210 is reached. Here, a first reference point A[n] is selected on the CRT display of the IC's CAD database. The previously described Layout Canvas sub-mode of the Mask-view Window mode is used during this process. The "Cell Open/Close" command (Appendix A) is used to open and view the highest or top level cell. Zoom In/-Zoom Out commands (Appendix A) are used to view the particular area where reference point A[n=1] is. Generally, for ease of operation, a very prominent IC feature is selected as the first point. The center of the IC is generally used as the N=1 point.

At step 212, microscope 3 is focused on the area of the IC corresponding to the A[n] point of the database by using the cruiser control panel.

A cursor is now placed upon the selected point in the IC's CAD database. This cursor appears on the CRT. As indicated by step 214, the cruiser is used to move the microscope and drive unit to the point on the actual IC which corresponds to the cursored point. A '+' symbol is used to pinpoint the corresponding point on the monitor. The '+' symbol also acts as the projected contact point for probe 10 on the actual IC. During this move, controller 20 keeps tract of and stores in SRAM 22 the X and Y distance travelled to reach this point.

After finding the desired point, the cruiser panel is used once again, this time to command probe 10 to contact the '+' point using contact sensor circuit 28. Now controller 20 keeps track of and stores the distance travelled in the −Z direction to reach this point. Upon contact, the −Z distance is recorded (step 216, FIG. 6).

At step 218, the distances travelled by the microscope and the probe are stored in controller SRAM 22. Thus, a single X—X', Y—Y', and Z—Z' correspondence is established between one point in the CAD database and one point on the IC. Although one point alignment is insufficient to define the Z plane of the IC fully, it is precise enough to allow some automatic motion in the X and Y axes. This allows use of the MOVE command for further movement of the probe and microscope, which is much faster than using the cruiser to order such motion. For reference purposes only, single point alignment allows X and Y motion to new points with an accuracy of roughly 50 microns.

Although the possibility of using the MOVE command is shown in FIG. 6 as step 211, which step can simply be substituted for step 212 after at least one point alignment, for purposes of clarity it will be assumed that subsequent alignment points are found using the cruiser. As is obvious by the title of the operation, "Three point Alignment", the process just described for a single point is repeated verbatim for two additional points. At step 220 the variable "n" is increased by one and the program returns to the loop control test of step 208. Until N is greater than 3, the loop defined by steps 210 through 220 is repeated.

A small variation can occur after performing the single point alignment just described. This variation is shown in FIG. 6 by step 211. After the completion of the first point's alignment (steps 10 through 220), the MOVE command described in Appendix A can be used instead of the cruiser to perform alignment with points $A_2$ and $A_3$. The primary difference between using the cruiser and the MOVE command is that the pulses used to activate the stepping motor with the cruiser (so-called 'damped-stepping') have a much shorter duty cycle than the pulses used to operate the motors when the MOVE command is used. As the MOVE command involves automatic navigation, the necessity for at least a rough alignment before using the command is obvious, as its use prior to such alignment would result in unintended probe contact with the IC. Even with a single point alignment, it is recommended that the probe tip be withdrawn a safe distance from the IC to prevent accidental contact due to unknown variations in the Z plane. It is envisioned hat all Z motion in close proximity to IC 2 will be done using the step motors in the 'damped-stepping' mode.

Although the foregoing description of the alignment procedure is sufficient to enable one of ordinary skill in this particular field to practice this invention, a copy of the portion of the source code programs used in this embodiment of the invention which performs the alignment process is included as Appendix B. The source code is written in the C programming language and is used on a Motorola 68020 microprocessor. The source code illustrates the alignment procedure of the present invention in greater detail.

At the completion of the alignment procedure, automatic navigation of the probe can be done with a placement accuracy of about one micron. It should be noted that as the system is used, drift will inevitably cause some decrease in positioning accuracy. Such drift is easily corrected by re-entering the alignment procedure, which can be done at any time, and using one or more new points to update the alignment.

B. IC Testing

After the alignment procedure is completed, the user now has the option of testing the system in one of the Net View, Mask View, Logic Analyzer, or Tester Interface modes. These various modes and submodes are described briefly below. They share the common feature that the probe can be automatically guided to any point chosen from the IC's CAD database. Thus, whether a mask of the IC is displayed, or whether a node in the IC is selected from a circuit net list of nodes, or whether some other mode is used, the probe can be automatically guided to the point on IC 2 which corresponds to the selected device, node, or area selected from the CAD database.

As will be understood by those with knowledge of integrated circuit testing, sometimes it is preferable to use the IC's mask as a guide for testing and debugging the IC, sometimes a list of its devices and nodes, and sometimes the signals appearing at a selected point or points. The present system can function in any of these ways and therefore provides unique flexibility to the user.

1. Mask View Mode

Although one of the sub-modes within this mode, Layout Canvas, has been discussed, this mode has two other sub-modes: Control Panel, which displays the current command, status of the command and relevant warning messages and Birdview Canvas, which displays the top view of the layout. A typical display on the CRT when the system is operating in the Mask View mode is shown in FIG. 7. This mode allows the user to test the IC while referencing the various masks used to fabricate the IC.

2. Net View Mode

The Net View mode makes signal names readily accessible to the user, eliminating the need to search paper schematics. It describes circuit connectivity and maintains logical cell hierarchy. Standard Net List formats such as SPICE, TEGAS, ILOGS, SILOS & LOGIS are available and used within this mode. This mode is particularly useful to testers who need to work from the IC's schematic while observing the actual IC.

Net View has four sub-modes: Birdview Canvas, which displays a top view of the Netlist Hierarchy, Netlist Display Canvas, which displays a netlist in SPICE format, Netlist Hierarchy Canvas, which displays the netlist cell hierarchy, and Control Panel, which shows current command, status of the command and warning messages and allows the user to type in the path name of a particular cell, internal signal or device to be viewed.

The Netlist Display Canvas mode operates with the commands listed below in Table 2. These are discussed in Appendix D. A typical CRT display when the system is operating in this sub-mode is shown in FIG. 8.

TABLE 2

Cell Close
Cell Open
Fit Cel
Map to Layout
Redraw
Trace Signal
Top Cell

The Netlist Hierarchy Canvas mode operates with the commands listed below in Table 3 and discussed in Appendix E.

TABLE 3

Clear Trace
Cell Open
Pan
Redraw
Top View
Zoom In
Zoom Out

3. Logic Analyzer Mode

This mode displays waveforms of acquired signals and has three subwindows: Control Panel, which shows the current command, command status and warning messages, and clock period; Group Name Window, which displays all the group names of signals available to the user, and Waveform Canvas, which shows the waveforms of all the signals under the groups selected for display.

The Group Name mode operates using two commands: Display Group and Redraw. The Waveform Canvas submode operates using the commands listed below in Table 4 and described in Appendix F, which also explains the Group Name mask commands. A typical display on the CRT when the system is operating in the Waveform Canvas submode is shown in FIG. 9.

TABLE 4

| |
|---|
| Create Marker |
| Delete Marker |
| Move Marker |
| Undisplay Group |
| Move Group |
| Zoom In |
| Zoom Out |
| Pan |
| Redraw |
| Create Group |
| Mod/Del Group |
| Modify Ckt Info |
| Sample 1 Signal |
| Save File |
| Restore File |

4. IMS Interface Mode

This mode provides a screen-link interface to the tester displays. The present embodiment can interface with IMS Logic Master. Other tester interfaces can be made available as required by system users. A typical tester interface display is shown in FIG. 10. This mode allows use of automatic testing devices.

III. Conclusion

The system described in the foregoing specification allows its user to test an IC in a new and uniquely efficient manner. By aligning the stored CAD database with the actual IC being tested, and storing the positioning data which allows this spatial coordination, the system allows its user to navigate the probe to any feature on the actual IC which can be selected from the CAD database. The various modes in which the system can operate allow the user to view the CAD database in any of several commonly used ways, thereby increasing operation flexibility.

In the foregoing specification, the invention has been described with reference to a specific exemplary embodiment thereof. It will, however, be evident that various modifications and changes may be made thereunto without departing from the broader spirit and scope of the invention as set forth in the appended claims. For example, a plurality of probes could be used simultaneously, the IC could be moved beneath the microscope in lieu of or in addition to the microscope, different viewing modes could be presented, and so forth. Many such changes or modifications are readily envisioned. The specification and drawings are, accordingly, to be regarded in an illustrative rather than in a restrictive sense.

APPENDIX A

Layout Canvas Commands and Description Thereof

*Cell Open/Close—Controls the opening and closing of cells in the layout hierarchy for display. It has the following 5 options in the submenu:

a) Open Cell—This opens one cell one level at a time at the cursor position where the user clicks the left mouse key. The extent of the cell being considered is outlined in the layout canvas as a visual aid.

b) Open Cell All—This opens the cell at the cursor position where the user clicks the left mouse key to the lowest level in the layout hierarchy.

c) Open Chip—This opens the whole chip from the top level cell to the lowest level cells.

d) Close Cell—This closes the cell by displaying only the cell boundary and nothing under this cell in the layout hierarchy.

e) Close Chip—This closes all the cells which are currently opened and displays only the top cell boundary box.

*Map to Netlist—This command allows cross-mapping from layout to netlist. This is done by choosing either a device or a signal in the layout. The device or signal will be highlighted in the layout and its counterpart will be highlighted in the Netview window. Two options are available in the submenu:

a) Map Net—The cross-mapping is for signals.

b) Map Device—The cross-mapping is for devices.

*Palette Tools—This command allows the user to create and change colors for layers. This also allows the changing of fill pattern and the visibility of layers in the layout display. Two options in the submenu are available:

a) Rainbow window—This window displays the pen colors or fill patterns. There are 4 slider items at the top for creating your own color.

b) Legend window—This brings up the layout display legend in the left side of the Layout canvas. Together with the Rainbow window the fill pattern, color and/or visibility of layers can be modified.

* Pan—This command allows the user to perform panning.

* Probe Commands—This command allows the user to choose from a set of commands related to probing. The commands available are the following:

a) Align—This button allows the user to do alignment between chip and layout. There is a pop-up menu available in the lower half of this window which has the following commands:

i) Trace Align Pts—This command traces the alignment points done so far in the Layout canvas for reference.

ii) Clear align—This command clears all the alignment points done so far.

iii) Lower Probe—During alignment this command can be used to lower the probe tip in focus.

iv) Reset—This is a software reset that automatically resets the scope and the probe to their respective center of travel range. This will maximize their travel range.

v) Alignment Info—This command saves alignment points done to a table for future sessions or restores a set of alignment points saved earlier. It has a submenu which has the following 2 options:

Save align info—Saves the alignment points done so far in an alignment table for future sessions.

Restore align info—Restores the alignment table previously.

vi) Done—Allows the user to exit from alignment window.

b) Adjust—During a session the alignment done earlier may be off a little due to small movement of the equipments. This button allows offsets to the probe tip for adjustment.

c) Contact—This button tries to establish contact at the current position by lowering the probe tip. This will be using the "Z" floor established by a three point alignment as the contact surface.

d) Uncontact—This button will uncontact the probe tip from the chip surface to the standby altitude after contact has been made.

e) Locate—This button displays a small square with a cross-hair showing the current position of the probe tip in the chip with respect to the layout.

f) Move—This button allows automated navigation across the chip surface. Alignment must be made before using the move command.

Notice the probe tip will be raised first and both the scope and probe will travel to the final destination. Finally the probe tip will be lowered to a standby altitude. While this command is being carried out, a small yellow stop sign will appear in the Layout canvas to indicate the move is till in effect.

g) Probe—This button is a macro command used together with the tester (e.g. IMS). It will try to make contact at the current position. If this is successful it will switch from "Contact sensing mode" to "Measurement mode" in the Cruiser control panel, and acquire the signal for the tester. At the completion of the testing program on the tester, the probe tip will be raised and switched back to "Contact sensing mode". Again this will be trying to make contact with the "Z" floor which depends on accurate alignment made to be successful.

h) Sample—This button is used in conjunction with the "Probe" button above. If the testing program on the tester is a looping program, this button can be used to break contact and switch from "Measurement mode" to "Contact sensing mode" in the Cruiser control panel.

i) Standby—This button brings the probe tip from whatever z location it is at to the standby altitude.

j) Quit—The probe command buttons will not be displayed anymore.

* Previous View—This command will display the last view of the Layout canvas before the current one.

Redraw—This command will redraw the current view.

* Top View—This command brings the layout display to top level cell.
* Trace Signal—This command traces any signal in the layout.
* Trace Removal—This command removes traces that are currently displayed in the Layout canvas.
* Zoom In—Zooms in a smaller area for display. It has a submenu with the following:

a) Box zoom in—The area to zoom in is defined by a box drawn in the Layout canvas. The area within the box will now be displayed to the full extent of the Layout canvas.

b) Zoom 2×—Zooms in at the center of the current view at 2 ×.

c) Zoom 4×—Zooms in at the center of the current view at 4×.

* Zoom Out—Zooms out to a larger area for display. It has a submenu with the following:

a) Box zoom out—The area to zoom out is defined by a box drawn in the layout canvas. The current view will be displayed in the box defined.

b) Zoom 2×—Zooms out at the center of the current view at 2×.

c) Zoom 4×—Zooms out at the center of the current view at 4×.

* Window Commands—This is just a replica of the Suntools window command to close, move, expose, hide, resize and quit the window.

APPENDIX B

Alignment Procedure Operating Software

```
        /* draw lines between accepted alignment points */
        for (i=0; i<ALIGN_PT_CNT; i++) {
                j = (i+1) % ALIGN_PT_CNT;
                if ((db_sts[i] == PT_ALIGNED) && (db_sts[j] == PT_ALIGNED)) {
                        if (to_which == TO_LAYOUT) {
                                make_a_line( pw, 2,
                                        CHIP_TO_CANVAS_X(screen_pt[i].x),
                                        CHIP_TO_CANVAS_Y(screen_pt[i].y),
                                        CHIP_TO_CANVAS_X(screen_pt[j].x),
                                        CHIP_TO_CANVAS_Y(screen_pt[j].y),
                                        PIX_SRC, color);
#if 0
                                /*****************************.*/ *************
                                 these are tried to see if the trace align at
                                 very high magnification will not have problems.
                                 The following floating macro conversion and the
                                 float function calls both produces same problem.
                                 It is determined that this is a SunView problem.
                                ************************************************/
                                make_a_line( pw, 2,
                                        (int)(chip_to_canvas_x(screen_pt[i].x)),
                                        (int)(chip_to_canvas_y(screen_pt[i].y)),
                                        (int)(chip_to_canvas_x(screen_pt[j].x)),
                                        (int)(chip_to_canvas_y(screen_pt[j].y)),
                                make_a_line( pw, 2,
                                        (int)(F_CHIP_TO_CANVAS_X(screen_pt[i].x))
                                        (int)(F_CHIP_TO_CANVAS_Y(screen_pt[i].y))
                                        (int)(F_CHIP_TO_CANVAS_X(screen_pt[j].x))
                                        (int)(F_CHIP_TO_CANVAS_Y(screen_pt[j].y))
                                        PIX_SRC, color);
#endif
                        } else {
                                make_a_line( pw, 1,
                                        CHIP_TO_MAP_X(screen_pt[i].x),
                                        CHIP_TO_MAP_Y(screen_pt[i].y),
                                        CHIP_TO_MAP_X(screen_pt[j].x),
                                        CHIP_TO_MAP_Y(screen_pt[j].y),
                                        PIX_SRC, color);
                        }
                }
        }

        /*  restore bitmap mask to fully writable  */
        planes = LAYOUT_CMS_SIZE-1;
        pw_putattributes( pw, &planes);
}

/*************************************************************
 This is the function that receives the middle mouse key entry
 from the layout canvas as database corresponding point for
 the alignment.
**************************************************************/
void
align_layout_input( canvas, event)
        Canvas  canvas;
        Event   *event;
{
        int             tmpx, tmpy;
        char    commstr[18];
        char    str[60];
        unsigned char sts;
        void    confirm_entry();

        if (wait_layout_input < 0) {
                echo_message( layout_prompt_msg, "Input not expected.", 1, NULL);
                echo_message( layout_echo_msg, "Make a successful 'Align' then e
                return;
        }
        make_a_cross( layout_pw, 1, 20, event_x(event), event_y(event), PIX_SRC,

        /*******   convert to database unit. *********************/
        db_x = CANVAS_TO_CHIP_X(event_x(event));
        db_y = CANVAS_TO_CHIP_Y(event_y(event));

        /* store old values in temp variables */
        tmpx = screen_pt[wait_layout_input].x;
        tmpy = screen_pt[wait_layout_input].y;
        sts  = db_sts[wait_layout_input];

        /* undraw the old alignment points */
        show_align_points(TO_LAYOUT, M_UNHIGHLIGHT);
        show_align_points(TO_MAP, M_UNHIGHLIGHT);

        /* this is just to make use of the show_align_points function */
        screen_pt[wait_layout_input].x = db_x;
        screen_pt[wait_layout_input].y = db_y;
        db_sts[wait_layout_input]      = PT_ALIGNED;

        /* draw new alignment points */
        show_align_points(TO_LAYOUT, M_HIGHLIGHT);
        show_align_points(TO_MAP, M_HIGHLIGHT);

        sprintf(str,"(%d, %d)",screen_pt[wait_layout_input].x,screen_pt[wait_layo
        panel_set( db_pitem[wait_layout_input], PANEL_LABEL_STRING, str, 0);

        screen_pt[wait_layout_input].x = tmpx;
        screen_pt[wait_layout_input].y = tmpy;
        db_sts[wait_layout_input]      = sts;

        /* after database point is acquired, set probe and scope coord into stru
        confirm_entry( SHOW);
}


int
check_point_ok( which, new_pt, idx)
        int     which, idx;
        COORD_STRUCT    new_pt;
{
        unsigned char   i;

        for (i=0; i<ALIGN_PT_CNT; i++) {
                /* check to ensure x and y are different, difference in z does n
                if ((aln[which].w_sts[i]==PT_ALIGNED) &&
                        (i!= idx) && (aln[which].wx[i] == new_pt.x) &&
                                (aln[which].wy[i] == new_pt.y) ) {
                        echo_message( align_msg, "Identical points not allowed.",
                                        "Rejected user align on two id
                        return( 0);
                }
        }
        return( 1);
}


void
update_align_coord()
{
```

```
/*    @(#)sv_align.c     3.20   4/4/89     */
/********************************************************************/
/* date    | name | modification log                                */
/*---------+------+-------------------------------------------------*/
/*         |      |                                                 */
/*---------+------+-------------------------------------------------*/
/*         |      |                                                 */
/*---------+------+-------------------------------------------------*/
/*         |      |                                                 */
/*---------+------+-------------------------------------------------*/
/*         |      |                                                 */
/*---------+------+-------------------------------------------------*/
/********************************************************************/
#include <stdio.h>
#include <math.h>
#include <pixrect/pixrect_hs.h>
#include <suntool/scrollbar.h>
#include "sv_def.h"
#include "sv_var_ext.h"
#include "sv_color_def.h"
#include "sv_color_ext.h"

#include "hw_rs232_def.h"
#include "hw_rs232_ext.h"
#include "vk_def.h"
#include "vk_ext.h"

#include "sv_probe_def.h"
#include "sv_probe_ext.h"

#define font_width(font)  font->pf_defaultsize.x
#define font_height(font) font->pf_defaultsize.y

#define ALIGN_TOOL_DOWN         201
#define ALIGN_RESTART           202
#define ALIGN_SOFT_RESET        203
#define ALIGN_SHOW_POINTS       204
#define ALIGN_PT_CONFIRM        205
#define ALIGN_LOWER_TIP         206
#define ALIGN_SAVE_ALIGN        207
#define ALIGN_RESTORE_ALIGN     208

Frame           align_frame;
Panel           align_panel;
Canvas          align_canvas;
Menu            align_menu;
Pixwin          *align_pw;
Panel_item      acquire_pitem[3], probe_pitem[3], scope_pitem[3], db_pitem[3], align_msg;
Panel_item      align_cancel_button, align_yes_button, align_in_focus;
Bool            align_is_up = FALSE;
short           wait_layout_input = -1;

static  int     wafer_z, tip_z;
static  int     align_curr_cmd = 0;
static  int     db_x=0, db_y=0;                 /* temporary storage for new database ali
static  COORD_STRUCT    npt[MAX_PROBES];/* temporary storage for new probe align points *

char    commstr[ 60];
char    ary[3][8] = {"Align 1", "Align 2", "Align 3"};

extern  Bool    reject_input;                   /* defined in sv_canvas.c */
extern  Bool    softhome_done;

void
init_align_frame()
{
        void    down_align_frame();

/*
        int     h = (int)window_get( layout_frame, WIN_HEIGHT);
*/
        int     h = 680;

        align_frame = window_create( layout_frame,      FRAME,
/*
                                FRAME_SHOW_LABEL,TRUE,
                                FRAME_LABEL,    " Alignment Window ",
*/
                                FRAME_DONE_PROC, down_align_frame,
                                FRAME_NO_CONFIRM, TRUE,
                                WIN_WIDTH,      (int)window_get( layout_frame,
                                WIN_HEIGHT,     900-h,
                                WIN_X,          0,
                                WIN_Y,          h,
                                WIN_SHOW,       FALSE,
                                0);
}

void
init_align_panel()
{
        unsigned char   i, row;
        char    xyz_str[50];
        void    acquire_probe_position();
        void    align_yes_dispatch();
        void    align_cancel_dispatch();
        void    align_focus_dispatch();

        align_panel = window_create( align_frame, PANEL,
                                WIN_PERCENT_HEIGHT,     100,
                                WIN_PERCENT_WIDTH,      100,
                                WIN_X,          0,
                                WIN_Y,          0,
                                WIN_FONT,       panel_font,
                                0);

        panel_create_item( align_panel, PANEL_MESSAGE,
                                PANEL_ITEM_X,   ATTR_COL(0),
                                PANEL_ITEM_Y,   ATTR_ROW(0),
                                PANEL_LABEL_STRING, "               SCOPE
                                0);

        for ( i=1; i<=3; i++) {
            sprintf( xyz_str, "Align %d", i);
            acquire_pitem[i-1] = panel_create_item( align_panel, PANEL_BUTTO
                                PANEL_LABEL_IMAGE, panel_button_
                                PANEL_ITEM_X,   ATTR_COL(1),
                                PANEL_ITEM_Y,   ATTR_ROW(i),
                                PANEL_NOTIFY_PROC, acquire_probe
                                0);

            scope_pitem[i-1]= panel_create_item( align_panel, PANEL_MESSAGE,
                                PANEL_ITEM_X,   ATTR_COL(12),
                                PANEL_ITEM_Y,   ATTR_ROW(i),
                                PANEL_LABEL_STRING, "(  ?,  ?,
                                0);
```

```
        probe_pitem[i-1]= panel_create_item( align_panel, PANEL_MESSAGE,
                                PANEL_ITEM_X,    ATTR_COL(33),
                                PANEL_ITEM_Y,    ATTR_ROW(1),
                                PANEL_LABEL_STRING, "(  ?,   ?,   ?)",
                                0);

        db_pitem[i-1] = panel_create_item( align_panel, PANEL_MESSAGE,
                                PANEL_ITEM_X,    ATTR_COL(54),
                                PANEL_ITEM_Y,    ATTR_ROW(1),
                                PANEL_LABEL_STRING, "(  ?,   ?)",
                                0);
    }

    align_cancel_button = panel_create_item( align_panel, PANEL_BUTTON,
                        PANEL_LABEL_IMAGE, panel_button_image(align_panel
                        PANEL_ITEM_X,    ATTR_COL(51),
                        PANEL_ITEM_Y,    ATTR_ROW(1),
                        PANEL_SHOW_ITEM, FALSE,
                        PANEL_NOTIFY_PROC, align_cancel_dispatch,
                        0);

    align_yes_button = panel_create_item( align_panel, PANEL_BUTTON,
                        PANEL_LABEL_IMAGE, panel_button_image(align_panel
                        PANEL_ITEM_X,    ATTR_COL(60),
                        PANEL_ITEM_Y,    ATTR_ROW(1),
                        PANEL_SHOW_ITEM, FALSE,
                        PANEL_NOTIFY_PROC, align_yes_dispatch,
                        0);

    align_in_focus = panel_create_item( align_panel, PANEL_BUTTON,
                        PANEL_LABEL_IMAGE, panel_button_image(align_panel
                        PANEL_ITEM_X,    ATTR_COL(60),
                        PANEL_ITEM_Y,    ATTR_ROW(1),
                        PANEL_SHOW_ITEM, FALSE,
                        PANEL_NOTIFY_PROC, align_focus_dispatch,
                        0);

    align_msg = panel_create_item( align_panel, PANEL_MESSAGE,
                        PANEL_ITEM_X,    ATTR_COL(1),
                        PANEL_ITEM_Y,    ATTR_ROW(1),
                        PANEL_LABEL_STRING,      "   ",
                        0);
    window_fit_height( align_panel);
}

void
init_align_canvas()
{
    void    align_canvas_proc();
    align_canvas= window_create( align_frame,      CANVAS,
                    WIN_BELOW,       align_panel,
                    WIN_HEIGHT,                         20*font_height( p
                    WIN_PERCENT_WIDTH,       100,
                    WIN_X,           0,
                    WIN_CONSUME_PICK_EVENTS,
                        WIN_MOUSE_BUTTONS,
                        0,
                    WIN_VERTICAL_SCROLLBAR, scrollbar_create(SCROLL_MARGIN, 1
                    WIN_EVENT_PROC,              align_canvas_proc,
                    CANVAS_RETAINED,             FALSE,
                    CANVAS_AUTO_SHRINK,          FALSE,
                    0);

        window_fit( align_frame);
*/
}

void
init_align_menu()
{
        align_menu = menu_create(
                    MENU_TITLE_ITEM,                "Commands:",
                    MENU_ITEM,
                        MENU_STRING,                "Trace Align Pts",
                        MENU_VALUE,                 ALIGN_SHOW_POINTS,
                        0,
                    MENU_ITEM,
                        MENU_STRING,                "Clear Align",
                        MENU_VALUE,                 ALIGN_RESTART,
                        0,
                    MENU_ITEM,
                        MENU_STRING,                "Lower Probe Tip",
                        MENU_VALUE,                 ALIGN_LOWER_TIP,
                        0,
                    MENU_ITEM,
                        MENU_STRING,                "Reset ",
                        MENU_VALUE,                 ALIGN_SOFT_RESET,
                        0,
                    MENU_ITEM,
                        MENU_STRING,                "Alignment Info ",
                        MENU_PULLRIGHT,
                        menu_create(
                            MENU_ITEM,
                                MENU_STRING,            "Save a]
                                MENU_VALUE,             ALIGN_S/
                                0,
                            MENU_ITEM,
                                MENU_STRING,            "Restor(
                                MENU_VALUE,             ALIGN_R{
                                0,
                            0),
                        0,
                    MENU_ITEM,
                        MENU_STRING,                "Done",
                        MENU_VALUE,                 ALIGN_TOOL_DOWN,
                        0,
                    0);
}

void
init_align_environ()
{
        unsigned char   i, j;

        align_sts = ALIGN_NOT_DONE;

        for (i=0; i < MAX_PROBES; i++)
            { for (j=0; j<ALIGN_PT_CNT; j++) {
                    aln[i].wx[j] = aln[i].wy[j] = aln[i].wz[j] = 0;
                    aln[i].w_sts[j] = PT_NOT_ALIGNED;
                    npt[i].x = npt[i].y = npt[i].z = 0;
            }
            aln[i].a = aln[i].b = aln[i].g = 0.0;
```

```
		aln[i].X1 = aln[i].Y1 = aln[i].Z1 = 0.0;
		aln[i].X2 = aln[i].Y2 = aln[i].Z2 = 0.0;
		aln[i].X3 = aln[i].Y3 = aln[i].Z3 = 0.0;
		aln[i].U1 = aln[i].V1 = 0.0;
		aln[i].U2 = aln[i].V2 = 0.0;
		aln[i].U3 = aln[i].V3 = 0.0;
		aln[i].SQD12 = aln[i].SQD32 = 0.0;
	}

	for (i=0; i<ALIGN_PT_CNT; i++) {
		screen_pt[i].x = screen_pt[i].y = 0;
		db_sts[i] = PT_NOT_ALIGNED;
	}
}

/**************************************************
 set the location of where the alignment window
 would appear.
**************************************************/
void
setup_align_location()
{
	Rect	*rect;
	int		i;
	char	xyz_str[50];
	void	update_align_coord();

	rect = (Rect *)window_get( layout_frame, WIN_RECT);
	i = rect->r_top + rect->r_height;
	if (i>680) i = 680;
	window_set( align_frame, WIN_X,  0,
				 WIN_Y,  i,
				 0);

	/* set WIN_HEIGHT destroies the pixwin record, it is necessary to
	   reget the pixwin value */
	align_pw = (Pixwin *)canvas_pixwin( align_canvas);

	pw_setcmsname( align_pw, "probe");
	pw_putcolormap(align_pw, 0, LAYOUT_CMS_SIZE, red, green, blue);
	window_set( align_canvas, CANVAS_RETAINED, TRUE, 0);

	update_align_coord();
/*
	this call will mess up the color map. You may even try to use it.
	pw_putcolormap( (Pixwin *)window_get( align_frame, WIN_PIXWIN),
			0, LAYOUT_CMS_SIZE, red, green, blue);
*/
}


void
init_align_window()
{
	/* NOTE : DO NOT CHANGE THE SEQUENCE OF THE FOLLOWING LINES */
	init_align_frame();
	init_align_panel();
	init_align_canvas();
	init_align_menu();
	setup_align_location();
}

/**************************************************
	THE FOLLOWING MACRO DEFINITIONS ARE COPIED FROM
	SV_DEF.H WITH MACRO NAME PREFIXED WITH F_ TO
	DIFFERENTIATE.
**************************************************/
#define F_CHIP_TO_CANVAS_X(x) \
		(((float)((x)-(llx(curr_view_area)))* \
		(canvas_x_range))/(area_x_range))

#define F_CHIP_TO_CANVAS_Y(y) \
		((canvas_height)-(((float)((y)-(lly(curr_view_area)))* \
		(canvas_y_range))/(area_y_range)))

#define F_CANVAS_TO_CHIP_X(x) \
		(llx(curr_view_area)+(((float)(x)* \
		(area_x_range))/(canvas_x_range)))

#define F_CANVAS_TO_CHIP_Y(y) \
		(lly(curr_view_area)-(((float)((y)-(canvas_height))* \
		(area_y_range))/(canvas_y_range)))

/*******************************************************
 this function trace out the accepted alignment points in
 either layout canvas or the map canvas.
*******************************************************/
void
show_align_points( to_which, color)
	unsigned char	to_which;
	int				color;
{
	unsigned char	i, j;
	char	str[5];
	int		x, y;
	Pixwin	*pw;
	int	planes;

	if (to_which == TO_LAYOUT)
		pw = (Pixwin *)canvas_pixwin( layout_canvas);
	else
		pw = (Pixwin *)canvas_pixwin( map_canvas);

	/* set mask to make only the highlight plane writable */
	planes = M_HIGHLIGHT;
	pw_putattributes( pw, &planes);

	for (i=0; (i<ALIGN_PT_CNT)&&(db_sts[i]==PT_ALIGNED); i++) {
		if (to_which == TO_LAYOUT) {
			x = CHIP_TO_CANVAS_X(screen_pt[i].x);
			y = CHIP_TO_CANVAS_Y(screen_pt[i].y);
			/* make_an_x( pw, thickness, size, x, y, mode, color) */
			make_an_x( pw, 2, 10, x, y, PIX_SRC, color);

			sprintf( str, "%d", i+1);
			pw_text( pw, x - font_width( panel_font), y - font_heig
				PIX_SRC|PIX_COLOR(color), panel_font, s
		} else {
			x = CHIP_TO_MAP_X(screen_pt[i].x);
			y = CHIP_TO_MAP_Y(screen_pt[i].y);

			sprintf( str, "%d", i+1);
			pw_text( pw, x, y,
				PIX_SRC|PIX_COLOR(color), panel_font, s
```

```
        unsigned char i;
        char    xyz_str[60];

        if (!align_is_up) return;

        for ( i=0; i<3; i++) {
                /* print scope coord. */
                if (aln[scope].w_sts[i] == PT_ALIGNED)
                        build_hex_str( xyz_str, aln[scope].wx[i], aln[scope].wy[i], aln[s
                else
                        sprintf( xyz_str, "(  ?,  ?,  ?)");
                panel_set( scope_pitem[i], PANEL_LABEL_STRING, xyz_str, 0);

                /* print probe tip coord. */
                if (aln[tip].w_sts[i] == PT_ALIGNED)
                        build_hex_str( xyz_str, (int)(aln[tip].wx[i]/setup.probes[tip].x_
                                (int)(aln[tip].wy[i]/setup.probes[tip].y_res+0x3800),
                                (int)(aln[tip].wz[i]/setup.probes[tip].z_res+0x1b20));
                else
                        sprintf( xyz_str, "(  ?,  ?,  ?)");
                panel_set( probe_pitem[i], PANEL_LABEL_STRING, xyz_str, 0);

                /* print database coord. */
                if ( db_sts[i] == PT_ALIGNED)
                        sprintf( xyz_str, "(%d, %d)", screen_pt[i].x, screen_pt[i].y);
                else
                        sprintf( xyz_str, "(  ?,  ?)");
                panel_set( db_pitem[i], PANEL_LABEL_STRING, xyz_str, 0);
        }
}

void
acquire_probe_position(item, value, event)
        Panel_item item;
        int value;
        Event *event;
{
        unsigned char   i;
        int             sts;
        char    xyz_str[60];

        if (reject_input) {
                echo_message( layout_prompt_msg, "Please respond to prompt in align windo
                                        1, "Align prompt not answered yet.\n");
                return;
        }

        update_align_coord();
        for (i=0; i<ALIGN_PT_CNT; i++) {
                if (item == acquire_pitem[i]) break;
        }
        wait_layout_input = i;

        if ( (align_sts == ALIGN_NOT_DONE) && (wait_layout_input != 0)) {
                        echo_message( align_msg, "Must start align from 'Align 1'.",
                                        1, NULL);
                        wait_layout_input = -1;
                        return;
        } else if (align_sts == ALIGN_1_PT) {
                if (wait_layout_input > 1) {
                        echo_message( align_msg, "Must do 'Align 2'.",
                                        1, NULL);
                        wait_layout_input = -1;
                        return;
                }
        }

        if( (dev = open_ttya()) < 0 ) {
                wait_layout_input = -1;
                echo_message( layout_echo_msg, "Can't communicate with probe contro
                                1, "Uncontact cmd open ttya failed.\n");
                update_env();
                refresh_vk_panel();
                return;
        }

        sts=parm_get_position(tip, &npt[tip].x, &npt[tip].y, &npt[tip].z);
        if (sts == PARM_TIMEOUT) {
                wait_layout_input = -1;
                echo_message( align_msg, "No response from probe controller. Check
                                        1, "parm_get_position time out.\n");
                close_tty( &dev);
                return;
        }
        if ( !check_point_ok( tip, npt[tip], wait_layout_input) ) {
                wait_layout_input = -1;
                close_tty( &dev);
                return;
        }

/******************  quick fix for firmware timing problem. **********/
        usleep( 500000);

        sts=parm_get_position(scope, &npt[scope].x, &npt[scope].y, &npt[scope].z);
        if (sts == PARM_TIMEOUT) {
                wait_layout_input = -1;
                echo_message( align_msg, "No response from probe controller. Check
                                        1, "parm_get_position time out.\n");
                close_tty( &dev);
                return;
        }
        if ( !check_point_ok( scope, npt[scope], wait_layout_input) ) {
                wait_layout_input = -1;
                close_tty( &dev);
                return;
        }

        build_hex_str( xyz_str, npt[scope].x, npt[scope].y, npt[scope].z);
        panel_set( scope_pitem[i], PANEL_LABEL_STRING, xyz_str, 0);
        build_hex_str( xyz_str, (int)(npt[tip].x/setup.probes[tip].x_res+0x3800),
                        (int)(npt[tip].y/setup.probes[tip].x_res+0x3800),
                        (int)(npt[tip].z/setup.probes[tip].x_res+0x1b20));
        panel_set( probe_pitem[i], PANEL_LABEL_STRING, xyz_str, 0);

        close_tty( &dev);
        update_env();
        refresh_vk_panel();
}


void
enter_new_pt()
{
        char    str[60];
        int             sts;
        int             delta;
        double  dx2, dy2, dx3, dy3;
        int             x2, y2, x3, y3;
```

```
                                        a_canvas,
                                        canvas_window_event( a_canvas, event),
                                        0);
switch( align_curr_cmd ) {
case ALIGN_RESTART:
        if ( wait_layout_input > -1 ) {
                wait_layout_input = -1;
                update_align_coord();
        }
        confirm_restart( SHOW);
        break;
case ALIGN_LOWER_TIP:
        sprintf( str, "Focus on SURFACE then click this button. ");
        len = strlen( str);
        echo_message( align_msg, str, 0, NULL);

        panel_set( align_in_focus,
                                PANEL_ITEM_X,   ATTR_COL(len+1),
                                PANEL_SHOW_ITEM, TRUE, 0);
        break;
case ALIGN_SOFT_RESET:
        if ( wait_layout_input > -1 ) {
                wait_layout_input = -1;
                update_align_coord();
        }
        confirm_soft_reset( SHOW);
        break;
case ALIGN_SHOW_POINTS:
        show_align_points(TO_LAYOUT, M_UNHIGHLIGHT);
        show_align_points(TO_LAYOUT, M_HIGHLIGHT);
        show_align_points(TO_MAP, M_UNHIGHLIGHT);
        show_align_points(TO_MAP, M_HIGHLIGHT);
        break;
case ALIGN_RESTORE_ALIGN:
        confirm_align_io( SHOW);
        break;
case ALIGN_SAVE_ALIGN:
        confirm_align_io( SHOW);
        break;
case ALIGN_TOOL_DOWN:
        wait_layout_input = -1;
        down_align_window();
        break;
}
break;





}
break;
```

```
        SYMBOLS
        ASCLIST   OFF
        LIST      ON
        PW        132
        PL        66
        TOP       0
        TITLE     'Knights Technology Inc. Positioner Controller'
        SUBTITLE  'Copyright 1989 Knights Tech. Inc. by Wang, Shinn-Hwa Jimmy'
;
;       KNIGHTS TECHNOLOGY INCORPORATED
;
;           COPYRIGHT  1987, 1988, 1989
;
;         BY SHINN-HWA JIMMY WANG
;
;      REVISION 2.42  FIRST IMPLEMENTED Jan. 19, 1989
;
```

```
        INCLUDE KTHEAD.A51
;
;1-LEVEL : NOT APPLICABLE  KTDATA.A51
;
;2-TYPE :  CONSTANTS DEFINE
;          DATA VARIABLES DEFINE
;          VECTOR TABLE
;
;3-FUNCTION : WORKING MODEL, FOR 1 uM W/END DET.
;
;4-CALLING PROGRAM : NONE
;
;5-ENTRY POINT: RESET, EXTI0, TIMER0,
;               EXTI1, TIMER1, SINT, TIMER2.
;
;6-SUBROUTINE USED: INIT,  REFRESH,  COMM.
;
;7-BUFFER, QUEUE, TABLE USED: NONE
;
;
;
;--------------------------------------------------
;
; PUBLIC AND EXTERNAL DECLARATIONS
;
          PUBLIC  CHARNO, TICK,   NCOL,   NROW
          PUBLIC  DEBNCE, LONGBP, SHRTBP, EXLNGBP
          PUBLIC  PWRSTB, RLYSTB, DFTCHO, DFTAXI
          PUBLIC  DFFSDL, DFMDTE, DFMDNS
          PUBLIC  ATMLNG, ATMMID, ATMSHT
          PUBLIC  SFTYRG, NGSFRG, ADCVPR, USDELY
          PUBLIC  ZSTPLM, USTPDL, DEADBN, MIDBEP
          PUBLIC  DISMSK, ENAMSK, FSTRVL, MDTRVL
          PUBLIC  MAXXRG, MAXYRG, MAXZRG
          PUBLIC  MINXRG, MINYRG, MINZRG
          PUBLIC  XCENTR, YCENTR, ZCENTR
          PUBLIC  MAXXLM, MAXYLM, MAXZLM
          PUBLIC  MINXLM, MINYLM, MINZLM
          PUBLIC  ENRSCH, DSRSCH, SMORNG
;
          PUBLIC  FGREG0, BEEPIN, TXDENA
          PUBLIC  DIRECT, XAXIS,  YAXIS,  ZAXIS
          PUBLIC  WRMSTRT,LZBLNK, SNSCLI, SCNTXD
          PUBLIC  FGREG1, PSEXST, RESPRQ, ODDSTP
          PUBLIC  TBEMPY, RBEMPY, TXIDLE, SILENT
          PUBLIC  GF0,    SGNFG0, SGNFG1
          PUBLIC  FGREG2, THRSGN, PASSTH, CTDSGN
          PUBLIC  WKASGN, TPRSGN, ADCSGN
          PUBLIC  SCHBMP, SCNKEY, UPDTCK, RQSBMP
          PUBLIC  SCHBMP0,SCHBMP1,SCHBMP2,SCHBMP3
          PUBLIC  SCHBMP4,SCHBMP5,SCHBMP6,SCHBMP7
          PUBLIC  RQSBMP0,RQSBMP1,RQSBMP2,RQSBMP3
          PUBLIC  RQSBMP4,RQSBMP5,RQSBMP6,RQSBMP7
          PUBLIC  MVSTG1, MVRTRV, MVZUPW, MVZDNW
          PUBLIC  MVAPPR, ZSMLRG, MVABRT
          PUBLIC  FGSTUS, PSSELT0,PSSELT1,PSSELT2
          PUBLIC  CONTACT,REMOTE, OVERRUN,SUCCES
;
          PUBLIC  CPSNUM, CADROF, FASTDL
          PUBLIC  NPSCTH, NPSCTL
          PUBLIC  NXTMPH, NXTMPL
          PUBLIC  NYTMPH, NYTMPL
          PUBLIC  NZTMPH, NZTMPL
          PUBLIC  CXLMNH, CXLMNL
          PUBLIC  CYLMNH, CYLMNL
          PUBLIC  CZLMNH, CZLMNL
          PUBLIC  CXLMXH, CXLMXL
          PUBLIC  CYLMXH, CYLMXL
          PUBLIC  CZLMXH, CZLMXL
          PUBLIC  CTD,    CTH,    CTL
          PUBLIC  VTHRH,  VTHRL
          PUBLIC  VOFSTD, VOFSTH, VOFSTL
          PUBLIC  VADCIH, VADCIL
          PUBLIC  AUTOTM, ATRPCT, NSTEPS
;
          PUBLIC  NREPTS, KEYLOC, KBDBUF
          PUBLIC  RDELAY, BEPDLY
          PUBLIC  CNVNUM, PB0TMP, PC0TMP
          PUBLIC  PA1TMP, PB1TMP, PC1TMP
;
          PUBLIC  INTFLG, IDLTMR, LONGTM, BSPGGT
          PUBLIC  STATUS, STTST0, STTST1, STTST2
          PUBLIC  T2MS,   T100MS, T1S,    T1M
          PUBLIC  T1H,    TAP,    TWD,    TDM
          PUBLIC  TMNTH,  TY
          PUBLIC  SINRDP, SINWRP, SOPRDP, SOPWRP
;
          PUBLIC  WKACCD, WKACCH, WKACCL
          PUBLIC  TPREGD, TPREGH, TPREGL
;
          PUBLIC  STACK
;
          PUBLIC  EXISPS
          PUBLIC  XT1S,   XT1M,   XT1H,   XTAP
          PUBLIC  XTWD,   XTDM,   XTMNTH, XTY
;
          PUBLIC  LENSTR, MDTBEN, MDSTNB
;
          PUBLIC  CXPSH0, CXPSL0
          PUBLIC  CYPSH0, CYPSL0
          PUBLIC  CZPSH0, CZPSL0
          PUBLIC  XMNPH0, XMNPL0
          PUBLIC  YMNPH0, YMNPL0
          PUBLIC  ZMNPH0, ZMNPL0
          PUBLIC  XMXPH0, XMXPL0
          PUBLIC  YMXPH0, YMXPL0
          PUBLIC  ZMXPH0, ZMXPL0
          PUBLIC  XFSDL0, YFSDL0
          PUBLIC  ZFSDL0
;
          PUBLIC  CXPSH1, CXPSL1
          PUBLIC  CYPSH1, CYPSL1
          PUBLIC  CZPSH1, CZPSL1
          PUBLIC  XMNPH1, XMNPL1
          PUBLIC  YMNPH1, YMNPL1
          PUBLIC  ZMNPH1, ZMNPL1
          PUBLIC  XMXPH1, XMXPL1
          PUBLIC  YMXPH1, YMXPL1
          PUBLIC  ZMXPH1, ZMXPL1
          PUBLIC  XFSDL1, YFSDL1
          PUBLIC  ZFSDL1
;
          PUBLIC  CXPSH2, CXPSL2
          PUBLIC  CYPSH2, CYPSL2
          PUBLIC  CZPSH2, CZPSL2
          PUBLIC  XMNPH2, XMNPL2
          PUBLIC  YMNPH2, YMNPL2
          PUBLIC  ZMNPH2, ZMNPL2
```

```
PUBLIC  XMXPH2, XMXPL2
PUBLIC  YMXPH2, YMXPL2
PUBLIC  ZMXPH2, ZMXPL2
PUBLIC  XFSDL2, YFSDL2
PUBLIC  ZFSDL2

PUBLIC  CXPSH3, CXPSL3
PUBLIC  CYPSH3, CYPSL3
PUBLIC  CZPSH3, CZPSL3
PUBLIC  XMNPH3, XMNPL3
PUBLIC  YMNPH3, YMNPL3
PUBLIC  ZMNPH3, ZMNPL3
PUBLIC  XMXPH3, XMXPL3
PUBLIC  YMXPH3, YMXPL3
PUBLIC  ZMXPH3, ZMXPL3
PUBLIC  XFSDL3, YFSDL3
PUBLIC  ZFSDL3

PUBLIC  CXPSH4, CXPSL4
PUBLIC  CYPSH4, CYPSL4
PUBLIC  CZPSH4, CZPSL4
PUBLIC  XMNPH4, XMNPL4
PUBLIC  YMNPH4, YMNPL4
PUBLIC  ZMNPH4, ZMNPL4
PUBLIC  XMXPH4, XMXPL4
PUBLIC  YMXPH4, YMXPL4
PUBLIC  ZMXPH4, ZMXPL4
PUBLIC  XFSDL4, YFSDL4
PUBLIC  ZFSDL4

PUBLIC  CXPSH5, CXPSL5
PUBLIC  CYPSH5, CYPSL5
PUBLIC  CZPSH5, CZPSL5
PUBLIC  XMNPH5, XMNPL5
PUBLIC  YMNPH5, YMNPL5
PUBLIC  ZMNPH5, ZMNPL5
PUBLIC  XMXPH5, XMXPL5
PUBLIC  YMXPH5, YMXPL5
PUBLIC  ZMXPH5, ZMXPL5
PUBLIC  XFSDL5, YFSDL5
PUBLIC  ZFSDL5

PUBLIC  CXPSH6, CXPSL6
PUBLIC  CYPSH6, CYPSL6
PUBLIC  CZPSH6, CZPSL6
PUBLIC  XMNPH6, XMNPL6
PUBLIC  YMNPH6, YMNPL6
PUBLIC  ZMNPH6, ZMNPL6
PUBLIC  XMXPH6, XMXPL6
PUBLIC  YMXPH6, YMXPL6
PUBLIC  ZMXPH6, ZMXPL6
PUBLIC  XFSDL6, YFSDL6
PUBLIC  ZFSDL6

PUBLIC  CXPSH7, CXPSL7
PUBLIC  CYPSH7, CYPSL7
PUBLIC  CZPSH7, CZPSL7
PUBLIC  XMNPH7, XMNPL7
PUBLIC  YMNPH7, YMNPL7
PUBLIC  ZMNPH7, ZMNPL7
PUBLIC  XMXPH7, XMXPL7
PUBLIC  YMXPH7, YMXPL7
PUBLIC  ZMXPH7, ZMXPL7
PUBLIC  XFSDL7, YFSDL7
```

```
          PUBLIC  ZFSDL7
;
          PUBLIC  SINBUF
          PUBLIC  SOTBUF
;
          PUBLIC  PPRSNT, PXM,     PYM,     PZM
          PUBLIC  PSENSE, PADCMP, PDIAG,   PSTART
          PUBLIC  PCNTCT, PFAST,   PNC,     PMTRPD
          PUBLIC  PXCCW,  PXCW,    PYCCW,   PYCW
          PUBLIC  PZCCW,  PZCW,    PUSTEP, PPEN0
          PUBLIC  PPEN1,  PPEN2,   PPEN3,   PPEN4
          PUBLIC  PAUDIO
;
          PUBLIC  STADR0
          PUBLIC  GDATA0
          PUBLIC  STADR1
          PUBLIC  GDATA1
;
          PUBLIC  PORTA0
          PUBLIC  PORTB0
          PUBLIC  PORTC0
          PUBLIC  CSREG0
          PUBLIC  PORTA1
          PUBLIC  PORTB1
          PUBLIC  PORTC1
          PUBLIC  CSREG1
          PUBLIC  PORTA2
          PUBLIC  PORTB2
          PUBLIC  PORTC2
          PUBLIC  CSREG2
;
;------------------------------------------------
;
;  EXTERNAL DECLARE
;
          EXTERNAL INIT
          EXTERNAL REFRESH
          EXTERNAL COMM
          EXTERNAL MTRCNT
;
;------------------------------------------------
;
IS_MELLIS: ASK     ASSEMBLE FOR MELLIS(-1) OR ALESSI & NIGHTS(-0) POSITIONER
;
;------------------------------------------------
;
IS_ALESSI: ASK     ASSEMBLE FOR ALESSI(-1) OR KNIGHTS(-0) POSITIONER
;
;------------------------------------------------
;
; ASSEMBLE TIME USED CONSTANTS
;
CHARNO:    EQU     8              ; DISPLAY LED CHARACTER NO.
TICK:      EQU     -733H          ; 16 BIT, 11MHz, 1843D
                                  ; OS TIME INTERRUPT INTERVAL
NCOL:      EQU     4              ; NUMBER OF COLUMNS
NROW:      EQU     8              ; NUMBER OF ROWS
DEBNCE:    EQU     3              ; DEBOUNCE, FAST REACTION
;
LONGBP:    EQU     100
MIDBEP:    EQU     70
SHRTBP:    EQU     20
EXLNGBP:   EQU     200
;
```

```
ATMLNG:    EQU     64              ; LONG AUTO REPEAT TIME DELAY
ATMMID:    EQU     16              ; MID DELAY
ATMSHT:    EQU     4               ; SHORT DELAY
;
PWRSTB:    EQU     10
RLYSTB:    EQU     63
SFTYRG:    EQU     80
NGSFRG:    EQU     -SFTYRG
ADCVPR:    EQU      20
;
ZSTPLM:    EQU     20
USTPDL:    EQU     4               ; USTPDL affect the abs & rel slow move
                                   ; uSTEP DELAY FOR 15.4 PPS
USDELY:    EQU     10H             ; FAKE FASTDL
DEADBN:    EQU     3
;
DFFSDL:    EQU     30H             ; DEFAULT FAST DELAY
                                   ; = 144 NOP DELAY
DFMDTE:    EQU     04H             ; DEFAULT MEDIUM TAB ENTRY
DFMDNS:    EQU     08H             ; DEFAULT MEDIUM STEPS
;
DFTCHO:    EQU     1               ; DEFAULT SETUP CHOICE ITEM
DFTAXI:    EQU     1               ; DEFAULT TO X AXIS
;
           IF      IS_MELLIS       ; IS_MELLIS
FSTRVL:    EQU     100H
           ELSE                    ; IS_ALESSI OR IS_KNIGHTS
           IF      IS_ALESSI       ; IS_ALESSI
FSTRVL:    EQU     100H
           ELSE                    ; IS_KNIGHTS
FSTRVL:    EQU     100H
           ENDIF                   ; END OF IS_ALESSI OR IS_KNIGHTS
           ENDIF                   ; END OF IS_MELLIS
MDTRVL     EQU     8H
;
SMORNG:    EQU     8
;
DISMSK:    EQU     10010000B       ; STILL TAKE ABORT FROM RS232
ENAMSK:    EQU     10010010B       ; SI + TIMO
;
ENRSCH:    EQU     7FH
DSRSCH:    EQU     80H
;
           IF      IS_MELLIS       ; IS_MELLIS IS TRUE
;
MAXXRG:    EQU     A440H           ; MAXIMUM X TRAVEL W/O END DET.
MAXYRG:    EQU     A440H           ; MAXIMUM Y TRAVEL W/O END DET.
MAXZRG:    EQU     3640H           ; MAXIMUM Z TRAVEL W/O END DET.
ENDRNG     EQU      400H           ; END ZONE CLEARANCE
;
           ELSE                    ; IS USING ALESSI OR KNIGHTS PST.
           IF      IS_ALESSI       ; IS_ALESSI IS TRUE
;
MAXXRG:    EQU     3620H           ; MAXIMUM X TRAVEL W/ END DET.
MAXYRG:    EQU     3620H           ; MAXIMUM Y TRAVEL W/ END DET.
MAXZRG:    EQU     1820H           ; MAXIMUM Z TRAVEL W/ END DET.
ENDRNG     EQU      400H           ; END ZONE CLEARANCE
;
           ELSE                    ; IS USING 1/2 uM KNIGHTS PST.
;
MAXXRG:    EQU     7000H           ; MAXIMUM X TRAVEL W/O END DET.
MAXYRG:    EQU     7000H           ; MAXIMUM Y TRAVEL W/O END DET.
MAXZRG:    EQU     3640H           ; MAXIMUM Z TRAVEL W/O END DET.
ENDRNG     EQU      400H           ; END ZONE CLEARANCE
;
           ENDIF
           ENDIF
;
MINXRG:    EQU     0H              ; MINIMUM X TRAVEL W/O END DET.
MINYRG:    EQU     0H              ; MINIMUM Y TRAVEL W/O END DET.
MINZRG:    EQU     0H              ; MINIMUM Z TRAVEL W/O END DET.
;
XCENTR:    EQU     (MAXXRG/2)      ; X CENTER POSITION
YCENTR:    EQU     (MAXYRG/2)      ; Y CENTER POSITION
ZCENTR:    EQU     (MAXZRG/2)      ; Z CENTER POSITION
;
MAXXLM:    EQU     MAXXRG-ENDRNG   ; MAXIMUM X TRAVEL W/O END DET.
MAXYLM:    EQU     MAXYRG-ENDRNG   ; MAXIMUM Y TRAVEL W/O END DET.
MAXZLM:    EQU     MAXZRG-ENDRNG   ; MAXIMUM Z TRAVEL W/O END DET.
;
MINXLM:    EQU     ENDRNG          ; MINIMUM X TRAVEL W/O END DET.
MINYLM:    EQU     ENDRNG          ; MINIMUM Y TRAVEL W/O END DET.
MINZLM:    EQU     ENDRNG          ; MINIMUM Z TRAVEL W/O END DET.
;
;--------------------------------------------------
;
;    INTEL PREDEFINE INTERNAL RAM SPACE
;
;    16 byte of bit addressable space  32-47
;
;BSEG:     ORG     20H
                                   ; BIT 7 6 5 4 3 2 1 0
FGREG0:    EQU     32              ;     X X X X X X X X
BEEPIN:    REG     FGREG0.0        ; BIT 0 AS F1, BEEP PIN
TXDENA:    REG     FGREG0.1        ; BIT 1 AS TXD ENA
DIRECT:    REG     FGREG0.2        ; BIT 2 AS CW/ -CCW
XAXIS:     REG     FGREG0.3        ; BIT 3 AS X AXIS
YAXIS:     REG     FGREG0.4        ; BIT 4 AS Y AXIS
ZAXIS:     REG     FGREG0.5        ; BIT 5 AS Z AXIS
WRMSTRT:   REG     FGREG0.6        ; BIT 6 AS -COLD/WARM START
LZBLNK:    REG     FGREG0.7        ; BIT 7 AS LEADING ZERO BLANK
;
                                   ; BIT 7 6 5 4 3 2 1 0
FGREG1:    EQU     FGREG0+1        ;     X X X X X X X X
PSEXST:    REG     FGREG1.0        ; BIT 0 AS POS EXISTING
RESPRQ:    REG     FGREG1.1        ; BIT 1 AS RS232C RESPONSE
                                   ;          REQUIRED
ODDSTP:    REG     FGREG1.2        ; BIT 2 AS ODD STEPS TRUE
TBEMPY:    REG     FGREG1.3        ; BIT 3 AS TX BUF EMPTY
RBEMPY:    REG     FGREG1.4        ; BIT 4 AS RX BUF EMPTY
TXIDLE:    REG     FGREG1.5        ; BIT 5 AS TXD IDLE
SILENT:    REG     FGREG1.6        ; BIT 6 AS SOUND ON/OFF
GF0:       REG     FGREG1.7        ; BIT 7 AS KEY PRESSED FLAG
;
                                   ; BIT 7 6 5 4 3 2 1 0
FGREG2:    EQU     FGREG1+1        ;     X X X X X X X X
THRSGN:    REG     FGREG2.0    ; BIT 0 AS THRESHOLD'S SIGN
PASSTH:    REG     FGREG2.1    ; BIT 1 AS RS232 PASS THRU
CTDSGN:    REG     FGREG2.2        ; BIT 2 AS CT'S SIGN
WKASGN:    REG     FGREG2.3        ; BIT 3 AS WKACC'S SIGN
TPRSGN:    REG     FGREG2.4        ; BIT 4 AS TPREG'S SIGN
ADCSGN:    REG     FGREG2.5    ; BIT 5 AS ADC I/P'S SIGN
SGNFG0:    REG     FGREG2.6    ; BIT 6 AS ADD/SUB-END SIGN
SGNFG1:    REG     FGREG2.7    ; BIT 7 AS ADD/SUB-OR SIGN
;
                                   ; BIT 7 6 5 4 3 2 1 0
SCHBMP:    EQU     FGREG2+1        ; ON SCHDULE SERVICE BITMAP
SCHBMP0:   REG     SCHBMP.0        ; BIT 0 AS SCAN KEY IN
```

```
SCHBMP1:   REG   SCHBMP.1        ; BIT 1 AS UPDATE CLOCK
SCHBMP2:   REG   SCHBMP.2        ; BIT 2 AS SERIAL CLI
SCHBMP3:   REG   SCHBMP.3        ; BIT 3 AS SCAN TXD IDLE
SCHBMP4:   REG   SCHBMP.4        ; BIT 4 AS
SCHBMP5:   REG   SCHBMP.5        ; BIT 5 AS
SCHBMP6:   REG   SCHBMP.6        ; BIT 6 AS
SCHBMP7:   REG   SCHBMP.7        ; BIT 7 AS
;
SCNKEY:    REG   SCHBMP0         ; BIT 0 AS SCAN KEY IN
UPDTCK:    REG   SCHBMP1         ; BIT 1 AS UPDATE CLOCK
SNSCLI:    REG   SCHBMP2         ; BIT 2 AS SERIAL CLI
SCNTXD:    REG   SCHBMP3         ; BIT 3 AS SCAN TXD IDLE
;
                                 ; BIT 7 6 5 4 3 2 1 0
RQSBMP:    EQU   SCHBMP+1        ; ON REQUIST SERVICE BITMAP
RQSBMP0:   REG   RQSBMP.0        ; BIT 0 AS
RQSBMP1:   REG   RQSBMP.1        ; BIT 1 AS
RQSBMP2:   REG   RQSBMP.2        ; BIT 2 AS
RQSBMP3:   REG   RQSBMP.3        ; BIT 3 AS
RQSBMP4:   REG   RQSBMP.4        ; BIT 4 AS
RQSBMP5:   REG   RQSBMP.5        ; BIT 5 AS
RQSBMP6:   REG   RQSBMP.6        ; BIT 6 AS
RQSBMP7:   REG   RQSBMP.7        ; BIT 7 AS
;
                                 ; BIT 7 6 5 4 3 2 1 0
MVSTG1:    EQU   RQSBMP+1        ;     - - - - X X X X
MVRTRV:    REG   MVSTG1.0        ; BIT 0 AS RETRIEVE 20 uSTEPS
MVZUPW:    REG   MVSTG1.1        ; BIT 1 AS Z UPWARD FAST
MVZDNW:    REG   MVSTG1.2        ; BIT 2 AS Z DOWNWARD FAST
MVAPPR:    REG   MVSTG1.3        ; BIT 3 AS APPROACH
ZSMLRG:    REG   MVSTG1.4        ; BIT 4 AS Z < 20 STEPS
MVABRT:    REG   MVSTG1.5        ; BIT 5 AS
;          REG   MVSTG1.6        ; BIT 6 AS
;          REG   MVSTG1.7        ; BIT 7 AS
;
                                 ; BIT 7 6 5 4 3 2 1 0
FGSTUS:    EQU   MVSTG1+1        ;     X X X X X X X X
PSSELT0:   REG   FGSTUS.0        ; BIT 0 AS PS SELECT BIT0
PSSELT1:   REG   FGSTUS.1        ; BIT 1 AS PS SELECT BIT1
PSSELT2:   REG   FGSTUS.2        ; BIT 2 AS PS SELECT BIT2
CONTACT:   REG   FGSTUS.3        ; BIT 3 AS CONTACT BAR
REMOTE:    REG   FGSTUS.4        ; BIT 4 AS REMOTE ENABLE
                                 ;          LOCAL LOCKOUT
OVERRUN:   REG   FGSTUS.5        ; BIT 5 AS COMMAND OVERRUN
SUCCES:    REG   FGSTUS.6        ; BIT 6 AS SERIAL COMMAND DONE
;          REG   FGSTUS.7        ; BIT 7 AS
;
;--------------------------------------------------
;
;     80 byte of scrach pad   48-127
;
;DSEG      ORG   30H
;
CPSNUM:    EQU   48              ; CURRENT POSITIONER #
CADROF:    EQU   CPSNUM+1        ; ADDRESS OFFSET
FASTDL:    EQU   CADROF+1        ; FAST DELAY FOR MOTOR CNTL
NPSCTH:    EQU   FASTDL+1        ; NO.STEPS TO MOVE HIGH BYTE
NPSCTL:    EQU   NPSCTH+1        ; NO.STEPS TO MOVE LOW BYTE
NXTMPH:    EQU   NPSCTL+1        ; TEMP X POSITION HIGH BYTE
NXTMPL:    EQU   NXTMPH+1        ; TEMP X POSITION LOW BYTE
NYTMPH:    EQU   NXTMPL+1        ; TEMP Y POSITION HIGH BYTE
NYTMPL:    EQU   NYTMPH+1        ; TEMP Y POSITION LOW BYTE
NZTMPH:    EQU   NYTMPL+1        ; TEMP Z POSITION HIGH BYTE
NZTMPL:    EQU   NZTMPH+1        ; TEMP Z POSITION LOW BYTE
```

```
CXLMNH:    EQU   NZTMPL+1        ; CURRENT X LIMIT HIGH BYTE
CXLMNL:    EQU   CXLMNH+1        ; CURRENT X LIMIT LOW BYTE
CYLMNH:    EQU   CXLMNL+1        ; CURRENT Y LIMIT HIGH BYTE
CYLMNL:    EQU   CYLMNH+1        ; CURRENT Y LIMIT LOW BYTE
CZLMNH:    EQU   CYLMNL+1        ; CURRENT Z LIMIT HIGH BYTE
CZLMNL:    EQU   CZLMNH+1        ; CURRENT Z LIMIT LOW BYTE
CXLMXH:    EQU   CZLMNL+1        ; CURRENT X LIMIT HIGH BYTE
CXLMXL:    EQU   CXLMXH+1        ; CURRENT X LIMIT LOW BYTE
CYLMXH:    EQU   CXLMXL+1        ; CURRENT Y LIMIT HIGH BYTE
CYLMXL:    EQU   CYLMXH+1        ; CURRENT Y LIMIT LOW BYTE
CZLMXH:    EQU   CYLMXL+1        ; CURRENT Z LIMIT HIGH BYTE
CZLMXL:    EQU   CZLMXH+1        ; CURRENT Z LIMIT LOW BYTE
CTD:       EQU   CZLMXL+1        ; INPUT ADDRESS HIGH DIGIT
CTH:       EQU   CTD+1           ; INPUT ADDRESS HIGH BYTE
CTL:       EQU   CTH+1           ; INPUT ADDRESS LOW BYTE
NSTEPS:    EQU   CTL+1           ; NO. OF STEPS IN ACC./DEACC.
VTHRH:     EQU   NSTEPS+1        ; THRESHOLD VOLTAGE HIGH
VTHRL:     EQU   VTHRH+1         ; THRESHOLD VOLTAGE LOW
VOFSTD:    EQU   VTHRL+1         ; POWER SUPPLY HIGH DIGIT
VOFSTH:    EQU   VOFSTD+1        ; POWER SUPPLY HIGH BYTE
VOFSTL:    EQU   VOFSTH+1        ; POWER SUPPLY LOW BYTE
VADCIH:    EQU   VOFSTL+1        ; ADC I/P VLOT HIGH BYTE
VADCIL:    EQU   VADCIH+1        ; ADC I/P VOLT LOW BYTE
;
AUTOTM:    EQU   VADCIL+1        ; AUTO REPEAT TIMER
ATRPCT:    EQU   AUTOTM+1        ; FIRAT THREE AUTO REPEAT CT
NREPTS:    EQU   ATRPCT+1        ; NO. OF REPEAT
KEYLOC:    EQU   NREPTS+1        ; KEY LOCATION CODE HOLD
KBDBUF:    EQU   KEYLOC+1        ; KEY BOARD BUFFER
RDELAY:    EQU   KBDBUF+1        ; DELAY (16mS)
BEPDLY:    EQU   RDELAY+1        ; DELAY (2mS) ALSO SOUND BEEP
;
PBOTMP:    EQU   BEPDLY+1        ; 1st 8255 PORT B MAP
PCOTMP:    EQU   PBOTMP+1        ; 1st 8255 PORT C MAP
PA1TMP:    EQU   PCOTMP+1        ; 2nd 8255 PORT A MAP
PB1TMP:    EQU   PA1TMP+1        ; 2nd 8255 PORT B MAP
PC1TMP:    EQU   PB1TMP+1        ; 2nd 8255 PORT C MAP
CNVNUM:    EQU   PC1TMP+1        ; XMIT PTR
;
INTFLG:    EQU   CNVNUM+1        ; INTERRUPT HAPPEN FLAG
IDLTMR:    EQU   INTFLG+1        ; IDLE TIMER
LONGTM:    EQU   IDLTMR+1        ; LONG TIMER
BSPGCT:    EQU   LONGTM+1        ; BASE LEVEL SERVICE COUNTER
;
STATUS:    EQU   BSPGCT+1        ; TASK STATUS BITMAP
STTST0:    EQU   STATUS+1        ; LEVEL 0 STATUS MAP
STTST1:    EQU   STTST0+1        ; LEVEL 1 STATUS MAP
STTST2:    EQU   STTST1+1        ; LEVEL 2 STATUS MAP
;
T2MS:      EQU   TTST2+1         ; 2MS TIMER
T100MS:    EQU   T2MS+1          ; 100MS TIMER
T1S:       EQU   T100MS+1        ; 1 SEC TIMER
T1M:       EQU   T1S+1           ; 1 MIN TIMER
T1H:       EQU   T1M+1           ; 1 HOUR TIMER
TAP:       EQU   T1H+1           ; AM/PM
TWD:       EQU   TAP+1           ; DAY OF THE WEEK
TDM:       EQU   TWD+1           ; DAY OF THE MONTH
TMNTH:     EQU   TDM+1           ; MONTH
TY:        EQU   TMNTH+1         ; YEAR
;
SINRDP:    EQU   TY+1            ; SERIAL INPUT READ PTR
SINWRP:    EQU   SINRDP+1        ; SERIAL INPUT WRITE PTR
SOPRDP:    EQU   SINWRP+1        ; SERIAL OUTPUT READ PTR
SOPWRP:    EQU   SOPRDP+1        ; SERIAL OUTPUT WRITE PTR
```

```
;
WKACCD:     EQU     SOPWRP+1        ; WORKING ACC HIGH DIGIT
WKACCH:     EQU     WKACCD+1        ; WORKING ACC HIGH BYTE
WKACCL:     EQU     WKACCH+1        ; WORKING ACC LOW BYTE
;
TPREGD:     EQU     WKACCL+1        ; TEMP REGISTER HIGH DIGIT
TPREGH:     EQU     TPREGD+1        ; TEMP REGISTER HIGH BYTE
TPREGL:     EQU     TPREGH+1        ; TEMP REGISTER LOW BYTE
;
;-------------------------------------------------
;
;    INTEL PREDEFINE INTERNAL RAM SPACE
;
;    8 X 8 bytes entries on stack
;SSEG:      ORG     80H
;
STACK:      EQU     80H             ; 128D FOR 8032
;
;-------------------------------------------------
;
;    PREDEFINE EXTERNAL RAM SPACE
;
;XSEG       ORG     00H
;
EXISPS:     EQU     0               ; POSITIONER EXISTING BITMAP
;
XT1S:       EQU     EXISPS+1        ; 1 SEC TIMER
XT1M:       EQU     XT1S+1          ; 1 MIN TIMER
XT1H:       EQU     XT1M+1          ; 1 HOUR TIMER
XTAP:       EQU     XT1H+1          ; AM/PM
XTWD:       EQU     XTAP+1          ; DAY OF THE WEEK
XTDM:       EQU     XTWD+1          ; DAY OF THE MONTH
XTMNTH:     EQU     XTDM+1          ; MONTH
XTY:        EQU     XTMNTH+1        ; YEAR
;
MDTBEN:     EQU     XTY+1           ; MEDIUM TABLE ENTRY
MDSTNB:     EQU     MDTBEN+1        ; MEDIUM HOP DIST.
;
; --------------------------------------------------------
;
;  STATIC DATA STRUCTURE FOR POSITIONER
;
; --------------------------------------------------------
;
;  POSITIONER #0 POSITION INFORMATIONS
;
CXPSH0:     EQU     32              ; CURRENT X POS. HIGH BYTE
CXPSL0:     EQU     CXPSH0+1        ; CURRENT X POS. LOW BYTE
CYPSH0:     EQU     CXPSL0+1        ; CURRENT Y POS. HIGH BYTE
CYPSL0:     EQU     CYPSH0+1        ; CURRENT Y POS. LOW BYTE
CZPSH0:     EQU     CYPSL0+1        ; CURRENT Z POS. HIGH BYTE
CZPSL0:     EQU     CZPSH0+1        ; CURRENT Z POS. LOW BYTE
;
XMNPH0:     EQU     CZPSL0+1        ; MINIMUM X POS. HIGH BYTE
XMNPL0:     EQU     XMNPH0+1        ; MINIMUM X POS. LOW BYTE
YMNPH0:     EQU     XMNPL0+1        ; MINIMUM Y POS. HIGH BYTE
YMNPL0:     EQU     YMNPH0+1        ; MINIMUM Y POS. LOW BYTE
ZMNPH0:     EQU     YMNPL0+1        ; MINIMUM Z POS. HIGH BYTE
ZMNPL0:     EQU     ZMNPH0+1        ; MINIMUM Z POS. LOW BYTE
;
XMXPH0:     EQU     ZMNPL0+1        ; MAXIMUM X POS. HIGH BYTE
XMXPL0:     EQU     XMXPH0+1        ; MAXIMUM X POS. LOW BYTE
YMXPH0:     EQU     XMXPL0+1        ; MAXIMUM Y POS. HIGH BYTE
YMXPL0:     EQU     YMXPH0+1        ; MAXIMUM Y POS. LOW BYTE
ZMXPH0:     EQU     YMXPL0+1        ; MAXIMUM Z POS. HIGH BYTE
ZMXPL0:     EQU     ZMXPH0+1        ; MAXIMUM Z POS. LOW BYTE
;
XFSDL0:     EQU     ZMXPL0+1        ; X AXIS FAST DELAY
YFSDL0:     EQU     XFSDL0+1        ; Y AXIS FAST DELAY
ZFSDL0:     EQU     YFSDL0+1        ; Z AXIS FAST DELAY
;
; --------------------------------------------------------
;
;  POSITIONER #1 POSITION INFORMATIONS
;
CXPSH1:     EQU     ZFSDL0+1        ; CURRENT X POS. HIGH BYTE
CXPSL1:     EQU     CXPSH1+1        ; CURRENT X POS. LOW BYTE
CYPSH1:     EQU     CXPSL1+1        ; CURRENT Y POS. HIGH BYTE
CYPSL1:     EQU     CYPSH1+1        ; CURRENT Y POS. LOW BYTE
CZPSH1:     EQU     CYPSL1+1        ; CURRENT Z POS. HIGH BYTE
CZPSL1:     EQU     CZPSH1+1        ; CURRENT Z POS. LOW BYTE
;
XMNPH1:     EQU     CZPSL1+1        ; MINIMUM X POS. HIGH BYTE
XMNPL1:     EQU     XMNPH1+1        ; MINIMUM X POS. LOW BYTE
YMNPH1:     EQU     XMNPL1+1        ; MINIMUM Y POS. HIGH BYTE
YMNPL1:     EQU     YMNPH1+1        ; MINIMUM Y POS. LOW BYTE
ZMNPH1:     EQU     YMNPL1+1        ; MINIMUM Z POS. HIGH BYTE
ZMNPL1:     EQU     ZMNPH1+1        ; MINIMUM Z POS. LOW BYTE
;
XMXPH1:     EQU     ZMNPL1+1        ; MAXIMUM X POS. HIGH BYTE
XMXPL1:     EQU     XMXPH1+1        ; MAXIMUM X POS. LOW BYTE
YMXPH1:     EQU     XMXPL1+1        ; MAXIMUM Y POS. HIGH BYTE
YMXPL1:     EQU     YMXPH1+1        ; MAXIMUM Y POS. LOW BYTE
ZMXPH1:     EQU     YMXPL1+1        ; MAXIMUM Z POS. HIGH BYTE
ZMXPL1:     EQU     ZMXPH1+1        ; MAXIMUM Z POS. LOW BYTE
;
XFSDL1:     EQU     ZMXPL1+1        ; X AXIS FAST DELAY
YFSDL1:     EQU     XFSDL1+1        ; Y AXIS FAST DELAY
ZFSDL1:     EQU     YFSDL1+1        ; Z AXIS FAST DELAY
;
; --------------------------------------------------------
;
;  POSITIONER #2 POSITION INFORMATIONS
;
CXPSH2:     EQU     ZFSDL1+1        ; CURRENT X POS. HIGH BYTE
CXPSL2:     EQU     CXPSH2+1        ; CURRENT X POS. LOW BYTE
CYPSH2:     EQU     CXPSL2+1        ; CURRENT Y POS. HIGH BYTE
CYPSL2:     EQU     CYPSH2+1        ; CURRENT Y POS. LOW BYTE
CZPSH2:     EQU     CYPSL2+1        ; CURRENT Z POS. HIGH BYTE
CZPSL2:     EQU     CZPSH2+1        ; CURRENT Z POS. LOW BYTE
;
XMNPH2:     EQU     CZPSL2+1        ; MINIMUM X POS. HIGH BYTE
XMNPL2:     EQU     XMNPH2+1        ; MINIMUM X POS. LOW BYTE
YMNPH2:     EQU     XMNPL2+1        ; MINIMUM Y POS. HIGH BYTE
YMNPL2:     EQU     YMNPH2+1        ; MINIMUM Y POS. LOW BYTE
ZMNPH2:     EQU     YMNPL2+1        ; MINIMUM Z POS. HIGH BYTE
ZMNPL2:     EQU     ZMNPH2+1        ; MINIMUM Z POS. LOW BYTE
;
XMXPH2:     EQU     ZMNPL2+1        ; MAXIMUM X POS. HIGH BYTE
XMXPL2:     EQU     XMXPH2+1        ; MAXIMUM X POS. LOW BYTE
YMXPH2:     EQU     XMXPL2+1        ; MAXIMUM Y POS. HIGH BYTE
YMXPL2:     EQU     YMXPH2+1        ; MAXIMUM Y POS. LOW BYTE
ZMXPH2:     EQU     YMXPL2+1        ; MAXIMUM Z POS. HIGH BYTE
ZMXPL2:     EQU     ZMXPH2+1        ; MAXIMUM Z POS. LOW BYTE
;
XFSDL2:     EQU     ZMXPL2+1        ; X AXIS FAST DELAY
YFSDL2:     EQU     XFSDL2+1        ; Y AXIS FAST DELAY
ZFSDL2:     EQU     YFSDL2+1        ; Z AXIS FAST DELAY
```

```
;
; ------------------------------------------------------------
;
; POSITIONER #3 POSITION INFORMATIONS
;
CXPSH3:   EQU   ZFSDL2+1      ; CURRENT X POS. HIGH BYTE
CXPSL3:   EQU   CXPSH3+1      ; CURRENT X POS. LOW BYTE
CYPSH3:   EQU   CXPSL3+1      ; CURRENT Y POS. HIGH BYTE
CYPSL3:   EQU   CYPSH3+1      ; CURRENT Y POS. LOW BYTE
CZPSH3:   EQU   CYPSL3+1      ; CURRENT Z POS. HIGH BYTE
CZPSL3:   EQU   CZPSH3+1      ; CURRENT Z POS. LOW BYTE
;
XMNPH3:   EQU   CZPSL3+1      ; MINIMUM X POS. HIGH BYTE
XMNPL3:   EQU   XMNPH3+1      ; MINIMUM X POS. LOW BYTE
YMNPH3:   EQU   XMNPL3+1      ; MINIMUM Y POS. HIGH BYTE
YMNPL3:   EQU   YMNPH3+1      ; MINIMUM Y POS. LOW BYTE
ZMNPH3:   EQU   YMNPL3+1      ; MINIMUM Z POS. HIGH BYTE
ZMNPL3:   EQU   ZMNPH3+1      ; MINIMUM Z POS. LOW BYTE
;
XMXPH3:   EQU   ZMNPL3+1      ; MAXIMUM X POS. HIGH BYTE
XMXPL3:   EQU   XMXPH3+1      ; MAXIMUM X POS. LOW BYTE
YMXPH3:   EQU   XMXPL3+1      ; MAXIMUM Y POS. HIGH BYTE
YMXPL3:   EQU   YMXPH3+1      ; MAXIMUM Y POS. LOW BYTE
ZMXPH3:   EQU   YMXPL3+1      ; MAXIMUM Z POS. HIGH BYTE
ZMXPL3:   EQU   ZMXPH3+1      ; MAXIMUM Z POS. LOW BYTE
;
XFSDL3:   EQU   ZMXPL3+1      ; X AXIS FAST DELAY
YFSDL3:   EQU   XFSDL3+1      ; Y AXIS FAST DELAY
ZFSDL3:   EQU   YFSDL3+1      ; Z AXIS FAST DELAY
;
; ------------------------------------------------------------
;
; POSITIONER #4 POSITION INFORMATIONS
;
CXPSH4:   EQU   ZFSDL3+1      ; CURRENT X POS. HIGH BYTE
CXPSL4:   EQU   CXPSH4+1      ; CURRENT X POS. LOW BYTE
CYPSH4:   EQU   CXPSL4+1      ; CURRENT Y POS. HIGH BYTE
CYPSL4:   EQU   CYPSH4+1      ; CURRENT Y POS. LOW BYTE
CZPSH4:   EQU   CYPSL4+1      ; CURRENT Z POS. HIGH BYTE
CZPSL4:   EQU   CZPSH4+1      ; CURRENT Z POS. LOW BYTE
;
XMNPH4:   EQU   CZPSL4+1      ; MINIMUM X POS. HIGH BYTE
XMNPL4:   EQU   XMNPH4+1      ; MINIMUM X POS. LOW BYTE
YMNPH4:   EQU   XMNPL4+1      ; MINIMUM Y POS. HIGH BYTE
YMNPL4:   EQU   YMNPH4+1      ; MINIMUM Y POS. LOW BYTE
ZMNPH4:   EQU   YMNPL4+1      ; MINIMUM Z POS. HIGH BYTE
ZMNPL4:   EQU   ZMNPH4+1      ; MINIMUM Z POS. LOW BYTE
;
XMXPH4:   EQU   ZMNPL4+1      ; MAXIMUM X POS. HIGH BYTE
XMXPL4:   EQU   XMXPH4+1      ; MAXIMUM X POS. LOW BYTE
YMXPH4:   EQU   XMXPL4+1      ; MAXIMUM Y POS. HIGH BYTE
YMXPL4:   EQU   YMXPH4+1      ; MAXIMUM Y POS. LOW BYTE
ZMXPH4:   EQU   YMXPL4+1      ; MAXIMUM Z POS. HIGH BYTE
ZMXPL4:   EQU   ZMXPH4+1      ; MAXIMUM Z POS. LOW BYTE
;
XFSDL4:   EQU   ZMXPL4+1      ; X AXIS FAST DELAY
YFSDL4:   EQU   XFSDL4+1      ; Y AXIS FAST DELAY
ZFSDL4:   EQU   YFSDL4+1      ; Z AXIS FAST DELAY
;
; ------------------------------------------------------------
;
; POSITIONER #5 POSITION INFORMATIONS
;
CXPSH5:   EQU   ZFSDL4+1      ; CURRENT X POS. HIGH BYTE
CXPSL5:   EQU   CXPSH5+1      ; CURRENT X POS. LOW BYTE
CYPSH5:   EQU   CXPSL5+1      ; CURRENT Y POS. HIGH BYTE
CYPSL5:   EQU   CYPSH5+1      ; CURRENT Y POS. LOW BYTE
CZPSH5:   EQU   CYPSL5+1      ; CURRENT Z POS. HIGH BYTE
CZPSL5:   EQU   CZPSH5+1      ; CURRENT Z POS. LOW BYTE
;
XMNPH5:   EQU   CZPSL5+1      ; MINIMUM X POS. HIGH BYTE
XMNPL5:   EQU   XMNPH5+1      ; MINIMUM X POS. LOW BYTE
YMNPH5:   EQU   XMNPL5+1      ; MINIMUM Y POS. HIGH BYTE
YMNPL5:   EQU   YMNPH5+1      ; MINIMUM Y POS. LOW BYTE
ZMNPH5:   EQU   YMNPL5+1      ; MINIMUM Z POS. HIGH BYTE
ZMNPL5:   EQU   ZMNPH5+1      ; MINIMUM Z POS. LOW BYTE
;
XMXPH5:   EQU   ZMNPL5+1      ; MAXIMUM X POS. HIGH BYTE
XMXPL5:   EQU   XMXPH5+1      ; MAXIMUM X POS. LOW BYTE
YMXPH5:   EQU   XMXPL5+1      ; MAXIMUM Y POS. HIGH BYTE
YMXPL5:   EQU   YMXPH5+1      ; MAXIMUM Y POS. LOW BYTE
ZMXPH5:   EQU   YMXPL5+1      ; MAXIMUM Z POS. HIGH BYTE
ZMXPL5:   EQU   ZMXPH5+1      ; MAXIMUM Z POS. LOW BYTE
;
XFSDL5:   EQU   ZMXPL5+1      ; X AXIS FAST DELAY
YFSDL5:   EQU   XFSDL5+1      ; Y AXIS FAST DELAY
ZFSDL5:   EQU   YFSDL5+1      ; Z AXIS FAST DELAY
;
; ------------------------------------------------------------
;
; POSITIONER #6 POSITION INFORMATIONS
;
CXPSH6:   EQU   ZFSDL5+1      ; CURRENT X POS. HIGH BYTE
CXPSL6:   EQU   CXPSH6+1      ; CURRENT X POS. LOW BYTE
CYPSH6:   EQU   CXPSL6+1      ; CURRENT Y POS. HIGH BYTE
CYPSL6:   EQU   CYPSH6+1      ; CURRENT Y POS. LOW BYTE
CZPSH6:   EQU   CYPSL6+1      ; CURRENT Z POS. HIGH BYTE
CZPSL6:   EQU   CZPSH6+1      ; CURRENT Z POS. LOW BYTE
;
XMNPH6:   EQU   CZPSL6+1      ; MINIMUM X POS. HIGH BYTE
XMNPL6:   EQU   XMNPH6+1      ; MINIMUM X POS. LOW BYTE
YMNPH6:   EQU   XMNPL6+1      ; MINIMUM Y POS. HIGH BYTE
YMNPL6:   EQU   YMNPH6+1      ; MINIMUM Y POS. LOW BYTE
ZMNPH6:   EQU   YMNPL6+1      ; MINIMUM Z POS. HIGH BYTE
ZMNPL6:   EQU   ZMNPH6+1      ; MINIMUM Z POS. LOW BYTE
;
XMXPH6:   EQU   ZMNPL6+1      ; MAXIMUM X POS. HIGH BYTE
XMXPL6:   EQU   XMXPH6+1      ; MAXIMUM X POS. LOW BYTE
YMXPH6:   EQU   XMXPL6+1      ; MAXIMUM Y POS. HIGH BYTE
YMXPL6:   EQU   YMXPH6+1      ; MAXIMUM Y POS. LOW BYTE
ZMXPH6:   EQU   YMXPL6+1      ; MAXIMUM Z POS. HIGH BYTE
ZMXPL6:   EQU   ZMXPH6+1      ; MAXIMUM Z POS. LOW BYTE
;
XFSDL6:   EQU   ZMXPL6+1      ; X AXIS FAST DELAY
YFSDL6:   EQU   XFSDL6+1      ; Y AXIS FAST DELAY
ZFSDL6:   EQU   YFSDL6+1      ; Z AXIS FAST DELAY
;
; ------------------------------------------------------------
;
; POSITIONER #7 POSITION INFORMATIONS
;
CXPSH7:   EQU   ZFSDL6+1      ; CURRENT X POS. HIGH BYTE
CXPSL7:   EQU   CXPSH7+1      ; CURRENT X POS. LOW BYTE
CYPSH7:   EQU   CXPSL7+1      ; CURRENT Y POS. HIGH BYTE
CYPSL7:   EQU   CYPSH7+1      ; CURRENT Y POS. LOW BYTE
CZPSH7:   EQU   CYPSL7+1      ; CURRENT Z POS. HIGH BYTE
CZPSL7:   EQU   CZPSH7+1      ; CURRENT Z POS. LOW BYTE
;
```

```
XMNPH7:     EQU     CZPSL7+1        ; MINIMUM X POS. HIGH BYTE
XMNPL7:     EQU     XMNPH7+1        ; MINIMUM X POS. LOW BYTE
YMNPH7:     EQU     XMNPL7+1        ; MINIMUM Y POS. HIGH BYTE
YMNPL7:     EQU     YMNPH7+1        ; MINIMUM Y POS. LOW BYTE
ZMNPH7:     EQU     YMNPL7+1        ; MINIMUM Z POS. HIGH BYTE
ZMNPL7:     EQU     ZMNPH7+1        ; MINIMUM Z POS. LOW BYTE
;
XMXPH7:     EQU     ZMNPL7+1        ; MAXIMUM X POS. HIGH BYTE
XMXPL7:     EQU     XMXPH7+1        ; MAXIMUM X POS. LOW BYTE
YMXPH7:     EQU     XMXPL7+1        ; MAXIMUM Y POS. HIGH BYTE
YMXPL7:     EQU     YMXPH7+1        ; MAXIMUM Y POS. LOW BYTE
ZMXPH7:     EQU     YMXPL7+1        ; MAXIMUM Z POS. HIGH BYTE
ZMXPL7:     EQU     ZMXPH7+1        ; MAXIMUM Z POS. LOW BYTE
;
XFSDL7:     EQU     ZMXPL7+1        ; X AXIS FAST DELAY
YFSDL7:     EQU     XFSDL7+1        ; Y AXIS FAST DELAY
ZFSDL7:     EQU     YFSDL7+1        ; Z AXIS FAST DELAY
;
LENSTR:     EQU     CXPSH1-CXPSH0   ; LENGTH OF STRUCTURE
;
;------------------------------------------------
;
;   KNIGHTS RS322C BUFFER INPUT/OUTPUT SAPCE
;
;           FOR COMM TXM AND RCV
;
SINBUF:     EQU     256             ; SERIAL INPUT BUFFER
;
SOTBUF:     EQU     384             ; SERIAL OUTPUT BUFFER
;
;------------------------------------------------
;
;   KNIGHTS HARDWARE EXTERNAL INPUT/OUTPUT SAPCE
;
;           FOR 8032 P1 & P3
;
PPRSNT:     REG     P1.0            ; PS PRESENT
PXM:        REG     P1.1            ; X \MO
PYM:        REG     P1.2            ; Y \MO
PZM:        REG     P1.3            ; Z \MO
PSENSE:     REG     P1.4        ; LOW ACTIVE CONTACT SENSING
PADCMP:     REG     P1.5        ; ADC CONVERTION COMPLETE
PDIAG:      REG     P1.6            ; DIAG SWITCH STRIP INPUT
PSTART:     REG     P1.7            ; START ADC CONVERTION
;
PCNTCT:     REG     P3.2            ; LOW FOR CONTACT
PFAST:      REG     P3.3            ; FAST KEY INPUT
PNC:        REG     P3.4            ; N.C.
PMTRPD:     REG     P3.5; MOTOR POWER DOWN WATCHDOG TIMER TRIG
;
;           FOR 8255 0 & 1 & 2
;
;           ORG     06800H
PORTA0:     EQU     06800H          ; PA0-PA7 MSByte OF ADC
                                    ;
PORTB0:     EQU     06801H
PXCCW:      REG     A.0             ; PB0-PB1, X CONTROL
PXCW:       REG     A.1
PYCCW:      REG     A.2             ; PB2-PB3, Y CONTROL
PYCW:       REG     A.3
PZCCW:      REG     A.4             ; PB4-PB5, Z CONTROL
PZCW:       REG     A.5
PUSTEP:     REG     A.6             ; PB6   uSTEP CONTROL
PPEN0:      REG     A.7             ; PB7    PEN0 CONTROL
```

```
                                    ;
PORTC0:     EQU     06802H          ; PC0-PC3 LSNibble OF ADC
                                    ;
PPEN1:      REG     A.4             ; PC4, PEN1 CONTROL
PPEN2:      REG     A.5             ; PC5, PEN2 CONTROL
PPEN3:      REG     A.6             ; PC6, PEN3 CONTROL
PPEN4:      REG     A.7             ; PC7, PEN4 CONTROL
                                    ;
CSREG0:     EQU     06803H          ; 8255 COMMAND STATUS REG
;
;           ORG     08800H          ; 08800H FOR NOW
PORTA1:     EQU     08800H          ; PORT B1 + PORT C1L AS
                                    ; PICO POWER CNTL
                        ; BIT 11 10 9 8 7 6 5 4    3 2 1 0
                        ;    PB 7   6 5 4 3 2 1 0 PC 3 2 1 0
PORTB1:     EQU     08801H          ; PORT A1 + PORT C1H AS
PORTC1:     EQU     08802H          ; COMPARATOR REF THR CNTL
                        ; BIT 11 10 9 8     7 6 5 4 3 2 1 0
                        ;    PC 7   6 5 4 PA 3 2 1 0 7 6 5 4
CSREG1:     EQU     08803H          ; 8255 COMMAND STATUS REG
;
;           ORG     0A800H          ; 0A800H FOR NOW
PORTA2:     EQU     0A800H          ; SPARE OUTPUT
PORTB2:     EQU     0A801H          ; KBD SCAN LINES O/P
PORTC2:     EQU     0A802H          ; PC3-PC1, SPARE O/P
PAUDIO:     REG     A.0             ; PC0, AUDIO
                                    ; PC7-PC4, KBD RTN LINES 3-0
CSREG2:     EQU     0A803H          ; 8255 COMMAND STATUS REG
;
;------------------------------------------------
;
;           FOR LCD 0 & 1
;
;IOSEG:     ORG     0C800H          ; 0C800H FOR NOW
STADR0:     EQU     0C800H          ; STATUS AND ADDRESS
GDATA0:     EQU     0C801H          ; BIDIRECTION DATA LINES
;
;           ORG     0E800H          ; 0E800H FOR NOW
STADR1:     EQU     0E800H          ; STATUS AND ADDRESS
GDATA1:     EQU     0E801H          ; BIDIRECTION DATA LINES
;
;------------------------------------------------
;           MAIN PROGRAM
;------------------------------------------------
;
;   INTEL PREDEFINE INTERNAL ROM SPACE
;
;   These are fixed locations that must be left
;   in this way. All are not callable. Please
;   don't jump into these vector table because
;   the stack will be upset if you do so.
;
;
;           VECTOR TABLE  :         ; DEFAULT CSEG
;
            CODE
            ORG     0H              ; RESET COLD START
RESET:      AJMP    INIT
            BYTE    0FFH
;
;------------------------------------------------
;
;           ORG     3H
EXTI0:      JNB     P3.2,$          ; single step
```

\032

```
        JB      P3.2,$
        RETI
        BYTE    0FFH
;
;--------------------------------------------------
;
;       ORG     0BH
TIMER0: AJMP    REFRESH         ; O.S. JOB SCHEDULER
        BYTE    0FFH
        BYTE    0FFH
        BYTE    0FFH
        BYTE    0FFH
        BYTE    0FFH
        BYTE    0FFH
;
;--------------------------------------------------
;
;       ORG     13H
EXTI1:  DW      0               ; NOT APPLICABLE/ SPARE
        RETI
        BYTE    0FFH
        BYTE    0FFH
        BYTE    0FFH
        BYTE    0FFH
        BYTE    0FFH
;
;--------------------------------------------------
;
;       ORG     1BH
TIMER1: DW      0               ; RS232 BAUD RATE GENERATOR
TCI1RET: RETI                   ; DUMMY OP
        BYTE    0FFH
        BYTE    0FFH
        BYTE    0FFH
        BYTE    0FFH
        BYTE    0FFH
;
;--------------------------------------------------
;
;       ORG     23H
SINT:   AJMP    COMM            ; SERIAL COMMUNICATION HANDLE
        BYTE    0FFH
        BYTE    0FFH
        BYTE    0FFH
        BYTE    0FFH
        BYTE    0FFH
        BYTE    0FFH
;
;--------------------------------------------------
;
;       ORG     2BH
TIMER2: DW      0               ; WILL BE STEP TIME CONTROL
        RETI                    ; HAVE TO USE SERIAL CONTROL
;
; TO BUY MYSELF A LITTLE MORE TIME
;
;TIMER2: LJMP   MTRCNT          ; STEP TIMING CONTROL
;       BYTE    0FFH
        BYTE    0FFH
        BYTE    0FFH
;
;--------------------------------------------------
;
        END
```

```
;
;       KNIGHTS TECHNOLOGY INCORPORATED
;
;             COPYRIGHT  1987
;
;          BY SHINN-HWA JIMMY WANG
;
;1-LEVEL : NOT APPLICABLE
;
;2-TYPE : INCLUDE EXTERNAL VARIABLES   KTINCL.A51
;
;3-FUNCTION : WORKING MODEL, CONDITIONAL ASSEMBLY INCLUDE
;             FOR BOTH 1/2 uM  W/O END,DET. AND 1 uM W/ END DET.
;             Oct. 31, 1988 Adding MELLIS PST SUPPORT.
;
;4-CALLING PROGRAM :
;
;             NOT APPLICABLE.
;
;5-ENTRY POINT:    N/A
;
;6-SUBROUTINE USED    N/A
;
;7-BUFFER, QUEUE, TABLE USED:
;
;                     N/A
;
;
;--------------------------------------------------
;
;          EXTERNAL DECLARATIONS
;
           EXTERNAL  CHARNO, TICK,   NCOL,   NROW
           EXTERNAL  DEBNCE, LONGBP, SHRTBP, EXLNGBP
           EXTERNAL  PWRSTB, RLYSTB, DFTCHO, DFTAXI
           EXTERNAL  DFFSDL, DFMDTE, DFMDNS
           EXTERNAL  ATMLNG, ATMMID, ATMSHT
           EXTERNAL  SFTYRG, NGSFRG, ADCVPR, USDELY
           EXTERNAL  ZSTPLM, USTPDL, DEADBN, MIDBEP
           EXTERNAL  DISMSK, ENAMSK, FSTRVL, MDTRVL
           EXTERNAL  MAXXRG, MAXYRG, MAXZRG
           EXTERNAL  MINXRG, MINYRG, MINZRG
           EXTERNAL  XCENTR, YCENTR, ZCENTR
           EXTERNAL  MAXXLM, MAXYLM, MAXZLM
           EXTERNAL  MINXLM, MINYLM, MINZLM
           EXTERNAL  ENRSCH, DSRSCH, SMORNG
;
           EXTERNAL  FGREGO, BEEPIN, TXDENA
           EXTERNAL  DIRECT, XAXIS,  YAXIS,  ZAXIS
           EXTERNAL  WRMSTRT,LZBLNK, SNSCLI, SCNTXD
           EXTERNAL  FGREG1, PSEXST, RESPRQ, ODDSTP
           EXTERNAL  TBEMPY, RBEMPY, TXIDLE, SILENT
           EXTERNAL  GFO,    SGNFGO, SGNFG1
           EXTERNAL  FGREG2, THRSGN, PASSTH, CTDSGN
           EXTERNAL  WKASGN, TPRSGN, ADCSGN
           EXTERNAL  SCHBMP, SCNKEY, UPDTCK, RQSBMP
           EXTERNAL  SCHBMP0,SCHBMP1,SCHBMP2,SCHBMP3
           EXTERNAL  SCHBMP4,SCHBMP5,SCHBMP6,SCHBMP7
           EXTERNAL  RQSBMP0,RQSBMP1,RQSBMP2,RQSBMP3
           EXTERNAL  RQSBMP4,RQSBMP5,RQSBMP6,RQSBMP7
           EXTERNAL  MVSTG1, MVRTRV, MVZUPW, MVZDNW
           EXTERNAL  MVAPPR, ZSMLRG, MVABRT
           EXTERNAL  FGSTUS, PSSELTO,PSSELT1,PSSELT2
           EXTERNAL  CONTACT,REMOTE, OVERRUN,SUCCES

           EXTERNAL  CPSNUM, CADROF, FASTDL
           EXTERNAL  NPSCTH, NPSCTL
           EXTERNAL  NXTMPH, NXTMPL
           EXTERNAL  NYTMPH, NYTMPL
           EXTERNAL  NZTMPH, NZTMPL
           EXTERNAL  CXLMNH, CXLMNL
           EXTERNAL  CYLMNH, CYLMNL
           EXTERNAL  CZLMNH, CZLMNL
           EXTERNAL  CXLMXH, CXLMXL
           EXTERNAL  CYLMXH, CYLMXL
           EXTERNAL  CZLMXH, CZLMXL
           EXTERNAL  CTD,    CTH,    CTL
           EXTERNAL  VTHRH,  VTHRL
           EXTERNAL  VOFSTD, VOFSTH, VOFSTL
           EXTERNAL  VADCIH, VADCIL
           EXTERNAL  AUTOTM, ATRPCT, NSTEPS
;
           EXTERNAL  NREPTS, KEYLOC, KBDBUF
           EXTERNAL  RDELAY, BEPDLY
           EXTERNAL  CNVNUM, PBOTMP, PCOTMP
           EXTERNAL  PA1TMP, PB1TMP, PC1TMP
;
           EXTERNAL  INTFLG, IDLTMR, LONGTM, BSPGCT
           EXTERNAL  STATUS, STTSTO, STTST1, STTST2
           EXTERNAL  T2MS,   T100MS, T1S,    T1M
           EXTERNAL  T1H,    TAP,    TWD,    TDM
           EXTERNAL  TMNTH,  TY
           EXTERNAL  SINRDP, SINWRP, SOPRDP, SOPWRP
;
           EXTERNAL  WKACCD, WKACCH, WKACCL
           EXTERNAL  TPREGD, TPREGH, TPREGL
;
           EXTERNAL  STACK
;
           EXTERNAL  EXISPS
           EXTERNAL  XT1S,   XT1M,   XT1H,   XTAP
           EXTERNAL  XTWD,   XTDM,   XTMNTH, XTY
;
           EXTERNAL  LENSTR, MDTBEN, MDSTNB
;
           EXTERNAL  CXPSH0, CXPSL0
           EXTERNAL  CYPSH0, CYPSL0
           EXTERNAL  CZPSH0, CZPSL0
           EXTERNAL  XMNPH0, XMNPL0
           EXTERNAL  YMNPH0, YMNPL0
           EXTERNAL  ZMNPH0, ZMNPL0
           EXTERNAL  XMXPH0, XMXPL0
           EXTERNAL  YMXPH0, YMXPL0
           EXTERNAL  ZMXPH0, ZMXPL0
           EXTERNAL  XFSDL0, YFSDL0
           EXTERNAL  ZFSDL0
;
           EXTERNAL  CXPSH1, CXPSL1
           EXTERNAL  CYPSH1, CYPSL1
           EXTERNAL  CZPSH1, CZPSL1
           EXTERNAL  XMNPH1, XMNPL1
           EXTERNAL  YMNPH1, YMNPL1
           EXTERNAL  ZMNPH1, ZMNPL1
           EXTERNAL  XMXPH1, XMXPL1
           EXTERNAL  YMXPH1, YMXPL1
           EXTERNAL  ZMXPH1, ZMXPL1
           EXTERNAL  XFSDL1, YFSDL1
           EXTERNAL  ZFSDL1
```

```
EXTERNAL  CXPSH2, CXPSL2
EXTERNAL  CYPSH2, CYPSL2
EXTERNAL  CZPSH2, CZPSL2
EXTERNAL  XMNPH2, XMNPL2
EXTERNAL  YMNPH2, YMNPL2
EXTERNAL  ZMNPH2, ZMNPL2
EXTERNAL  XMXPH2, XMXPL2
EXTERNAL  YMXPH2, YMXPL2
EXTERNAL  ZMXPH2, ZMXPL2
EXTERNAL  XFSDL2, YFSDL2
EXTERNAL  ZFSDL2

EXTERNAL  CXPSH3, CXPSL3
EXTERNAL  CYPSH3, CYPSL3
EXTERNAL  CZPSH3, CZPSL3
EXTERNAL  XMNPH3, XMNPL3
EXTERNAL  YMNPH3, YMNPL3
EXTERNAL  ZMNPH3, ZMNPL3
EXTERNAL  XMXPH3, XMXPL3
EXTERNAL  YMXPH3, YMXPL3
EXTERNAL  ZMXPH3, ZMXPL3
EXTERNAL  XFSDL3, YFSDL3
EXTERNAL  ZFSDL3

EXTERNAL  CXPSH4, CXPSL4
EXTERNAL  CYPSH4, CYPSL4
EXTERNAL  CZPSH4, CZPSL4
EXTERNAL  XMNPH4, XMNPL4
EXTERNAL  YMNPH4, YMNPL4
EXTERNAL  ZMNPH4, ZMNPL4
EXTERNAL  XMXPH4, XMXPL4
EXTERNAL  YMXPH4, YMXPL4
EXTERNAL  ZMXPH4, ZMXPL4
EXTERNAL  XFSDL4, YFSDL4
EXTERNAL  ZFSDL4

EXTERNAL  CXPSH5, CXPSL5
EXTERNAL  CYPSH5, CYPSL5
EXTERNAL  CZPSH5, CZPSL5
EXTERNAL  XMNPH5, XMNPL5
EXTERNAL  YMNPH5, YMNPL5
EXTERNAL  ZMNPH5, ZMNPL5
EXTERNAL  XMXPH5, XMXPL5
EXTERNAL  YMXPH5, YMXPL5
EXTERNAL  ZMXPH5, ZMXPL5
EXTERNAL  XFSDL5, YFSDL5
EXTERNAL  ZFSDL5

EXTERNAL  CXPSH6, CXPSL6
EXTERNAL  CYPSH6, CYPSL6
EXTERNAL  CZPSH6, CZPSL6
EXTERNAL  XMNPH6, XMNPL6
EXTERNAL  YMNPH6, YMNPL6
EXTERNAL  ZMNPH6, ZMNPL6
EXTERNAL  XMXPH6, XMXPL6
EXTERNAL  YMXPH6, YMXPL6
EXTERNAL  ZMXPH6, ZMXPL6
EXTERNAL  XFSDL6, YFSDL6
EXTERNAL  ZFSDL6

EXTERNAL  CXPSH7, CXPSL7
EXTERNAL  CYPSH7, CYPSL7
EXTERNAL  CZPSH7, CZPSL7
EXTERNAL  XMNPH7, XMNPL7
EXTERNAL  YMNPH7, YMNPL7
EXTERNAL  ZMNPH7, ZMNPL7
EXTERNAL  XMXPH7, XMXPL7
EXTERNAL  YMXPH7, YMXPL7
EXTERNAL  ZMXPH7, ZMXPL7
EXTERNAL  XFSDL7, YFSDL7
EXTERNAL  ZFSDL7

EXTERNAL  SINBUF
EXTERNAL  SOTBUF

EXTERNAL  PPRSNT, PXM,    PYM,    PZM
EXTERNAL  PSENSE, PADCMP, PDIAG,  PSTART
EXTERNAL  PCNTCT, PFAST,  PNC,    PMTRPD
EXTERNAL  PXCCW,  PXCW,   PYCCW,  PYCW
EXTERNAL  PZCCW,  PZCW,   PUSTEP, PPEN0
EXTERNAL  PPEN1,  PPEN2,  PPEN3,  PPEN4
EXTERNAL  PAUDIO

EXTERNAL  STADR0
EXTERNAL  GDATA0
EXTERNAL  STADR1
EXTERNAL  GDATA1

EXTERNAL  PORTA2
EXTERNAL  PORTB2
EXTERNAL  PORTC2
EXTERNAL  CSREG2
EXTERNAL  PORTA0
EXTERNAL  PORTB0
EXTERNAL  PORTC0
EXTERNAL  CSREG0
EXTERNAL  PORTA1
EXTERNAL  PORTB1
EXTERNAL  PORTC1
EXTERNAL  CSREG1
```

```
        INCLUDE KTHEAD.A51
;
;1-LEVEL : 0,  TOP MOST
;
;2-TYPE : INITIALIZE PROGRAM
;
;3-FUNCTION : TESTING THE MOTORIZED POSITIONER.
;
;4-CALLING PROGRAM : NONE
;
;5-ENTRY POINT: INIT, ECHO
;
;6-SUBROUTINE USED:
;
;         CLRLCD0, RSTLCD0, WCMLCD0, WDTLCD0, HMCLCD0,
;         CLRLCD1, RSTLCD1, WCMLCD1, WDTLCD1, HMCLCD1,
;         KBDIN,   ENACC,   FUNCTN,  PCHOME.
;
;
;
;7-BUFFER, QUEUE, TABLE USED:
;
;         INITAB  SIZE 88  SIGN-ON MESSAGE.
;
;
;------------------------------------------------
;
;  This is the cold start routine, It assume nothing
;  is correct, as the controller has just being power
;  up. It uses all: Acc, R0-R7, and DPTR. It clear
;  internal RAM and test the size of external RAM.
;  It is not callable. It is ok to jump to here, but
;  you will loss everything. Initializations are done
;  in sequence: from INIT 0.0- INIT 0.7.
;
;------------------------------------------------
;
        INCLUDE KTINCL.A51
;
;------------------------------------------------
;
;  PUBLIC DECLARE
;
        PUBLIC  INIT,   IDLE
;
;------------------------------------------------
;
;  EXTERNAL DECLARE
;
        EXTERNAL CLRLCD0,CLRLCD1,RSTLCD0
        EXTERNAL RSTLCD1,WCMLCD0,WCMLCD1
        EXTERNAL SELPST, SENSPS, MARKPS
        EXTERNAL PCHOME, DISSIG, DISOFT
        EXTERNAL SADLCD1,DISHEX1,KTDPCH
        EXTERNAL SNDLOG, OPOFST, PCOFST
        EXTERNAL OPTTHR, STDLMT
;
;------------------------------------------------
;
IS_MELLIS: ASK    ASSEMBLE FOR MELLIS(-1) OR ALESSI & NIGHTS(-0) POSITIONER
;
;------------------------------------------------
;
IS_ALESSI: ASK    ASSEMBLE FOR ALESSI(-1) OR KNIGHTS(-0) POSITIONER

;
;------------------------------------------------
;
;         ORG     30H
;
;INIT 0.0 ---------------------------------------
;
INIT:     MOV     SP,#STACK-1       ; INIT STACK POINTER
          ORL     PSW,#00011000B    ; SELECT RB3(1)
          MOV     R7,#CHARNO        ; INIT KEY ROW COUNTER
          ANL     PSW,#11100111B    ; SELECT RB0
;
;INIT 0.1 ---------------------------------------
;
          MOV     PCON,#00000000B ; SMOD-PCON.7-0
                                  ; UNDER 9600 BAUD
          MOV     SCON,#01010000B ; INIT SERIAL PORT
                                  ; 8-BIT UART
;
          MOV     TCON,#00000000B ; TR0,TR1 - 0  STOP TCNT
                                  ; IT0,IT1 - 0  LEVEL TRIG
          MOV     TMOD,#00100001B ; GATE -0, C/T-0
                                  ; MODE 2, TIMER 1
                                  ; MODE 1, TIMER 0
          MOV     TH1,#0FDH       ; SET 0FDH FOR 9600 BAUD
          MOV     TL1,#0FDH       ; SET 0F4H FOR 2400 BAUD
                                  ; TIMER INTR INTERVAL
          MOV     TH0,#>TICK      ; 2 mS
          MOV     TL0,#<TICK      ; SET OS JOB SCHEDULER
                                  ; TIMER INTERRUPT INTERVAL
          SETB    TR0             ; STRT T0
          SETB    TR1             ; STRT T1
;
          MOV     IPC,#00000000B  ; SET TIMER HIGH PRIORITY
          MOV     IEC,#ENAMSK     ; EN I, DIS EX0 EX1 TCNTI1
                                  ; EN TCNTI0 & TI+RI
          MOV     P2,#0           ; ACCESS SRAM ZERO PAGE
;
;INIT 0.2 ---------------------------------------
;
          CLR     GF0             ; CLEAR KEY PRESSED FLAG
;
          MOV     R0,#20H         ; CLEAR RAM
          MOV     R1,#(FFH-20H+1)
INIT1:    MOV     @R0,#0
          INC     R0
          DJNZ    R1,INIT1
;
          MOV     KBDBUF,#0FFH    ; BLOCK POWER UP NOISE
;         MOV     KEYLOC,#0       ; INIT CODE CNT
          MOV     BEPDLY,#SHRTBP  ; POWER UP BEEP
          SETB    TXIDLE          ; TO TRIG TXD
          MOV     VTHRH,#20H      ; +2.000 VOLT
;         MOV     VTHRL,#00H
          SETB    THRSGN
          MOV     VOFSTD,#02H     ; +020.000 VOLT
;         MOV     VOFSTH,#00H
;         MOV     VOFSTL,#00H
;
;INIT 0.3 ---------------------------------------
;
;
SCNRAM:   CLR     WRMSTRT         ; COLD START
          MOV     DPTR,#1FFEH     ; RAM SIZE 0000-1FFF
```

```
            MOVX    A,@DPTR
            CJNE    A,#5AH,SCNRAM1   ; TST PATTERN
            INC     DPTR
            MOVX    A,@DPTR
            CJNE    A,#A5H,SCNRAM1   ; TST PATTERN
            SETB    WRMSTRT          ; WARM START
SCNRAM1:    JB      WRMSTRT,INIT2    ; IS WARM START
            MOV     T1H,#12H         ; COLD HARD TIME
            MOV     TAP,#1
            MOV     TWD,#3           ; 1987 7 1 Wed.
            MOV     TDM,#1           ; 12:00:00.00 AM
            MOV     TMNTH,#7
            MOV     TY,#87H
            MOV     R0,#MDTBEN       ; DEFAULT MD TAB ENTRY
            MOV     A,#DFMDTE
            MOVX    @R0,A
            INC     R0               ; DEFAULT MD HOP DIST.
            MOV     A,#DFMDNS
            MOVX    @R0,A            ; TO MDSTNB
            MOV     CPSNUM,#4        ; SET TO DEFAULT LIMIT
            LCALL   SELPST           ; AND FAST SPEED
            LCALL   STDLMT
            MOV     CPSNUM,#3        ; SET TO DEFAULT LIMIT
            LCALL   SELPST           ; AND FAST SPEED
            LCALL   STDLMT
            MOV     CPSNUM,#2        ; SET TO DEFAULT LIMIT
            LCALL   SELPST           ; AND FAST SPEED
            LCALL   STDLMT
            MOV     CPSNUM,#1        ; SET TO DEFAULT LIMIT
            LCALL   SELPST           ; AND FAST SPEED
            LCALL   STDLMT
            MOV     CPSNUM,#0        ; SET TO DEFAULT LIMIT
            LCALL   SELPST           ; AND FAST SPEED
            LCALL   STDLMT
            SJMP    INIT4            ; CONTINUE START PROC
;
INIT2:      MOV     R0,#XT1S         ; WARM WRONG TIME
            MOV     R1,#T1S          ; USER ADJUST
            MOV     R2,#8            ; OR USE CLOCK CHIP
INIT3:      MOVX    A,@R0
            MOV     @R1,A
            INC     R0
            INC     R1
            DJNZ    R2,INIT3
INIT4:
;
;INIT 0.4 -----------------------------------------
;
            ; ACTIVATE CONTACT SENSING
;
            MOV     DPTR,#CSREG0     ; CONTROL PORT 8255
            MOV     A,#91H           ; MODE 0 I/P PA & O/P PCH
            MOVX    @DPTR,A          ; MODE 0 O/P PB & I/P PCL
;
            MOV     DPTR,#PORTB0
            MOV     A,#40H           ; ALL CW CCW LOW, USTEP HIGH
            MOVX    @DPTR,A          ; CLEAR PORT B
            MOV     PB0TMP,A
            INC     DPTR
            MOV     A,#0FH           ; INIT O/P PORT
            MOVX    @DPTR,A          ; CLEAR PORT C 3-0
            MOV     PC0TMP,A
;
            MOV     DPTR,#CSREG1     ; CONTROL PORT 8255
            MOV     A,#80H           ; MODE 0 O/P PA & PB & PC
            MOVX    @DPTR,A
;
;           MOV     DPTR,#PORTA1
;           CLR     A                ; INIT OUTPUT PORT
;           MOVX    @DPTR,A          ; CLEAR PORT A
;           MOV     PA1TMP,A
;           INC     DPTR
;
            MOV     DPTR,#PORTB1
            MOV     A,#80H           ; INIT O/P PORT
            MOVX    @DPTR,A          ; CLEAR PORT B
            MOV     PB1TMP,A
            INC     DPTR
            MOVX    @DPTR,A          ; CLEAR PORT C
            MOV     PC1TMP,A
;
            MOV     DPTR,#CSREG2     ; KEYBOARD 8255
            MOV     A,#88H           ; MODE 0 O/P PA & PB
            MOVX    @DPTR,A          ;  & PCL ; I/P PCH
;
            MOV     DPTR,#PORTA2
            MOV     A,#0FFH          ; INIT O/P PORT
            MOVX    @DPTR,A          ; CLEAR PORT A
            INC     DPTR
            MOVX    @DPTR,A          ; CLEAR PORT B
            INC     DPTR
            MOVX    @DPTR,A          ; CLEAR PORT C
;
;INIT 0.5 -----------------------------------------
;
            LCALL   CLRLCD0          ; WIPE OUT DISPLAY
            LCALL   CLRLCD1          ; WIPE OUT DISPLAY
            MOV     R2,#0FH          ; DISPLAY ON, CURSOR ON
            LCALL   WCMLCD0          ; BLINKING ON
            MOV     R2,#0CH          ; DISPLAY ON, CURSOR OFF
            LCALL   WCMLCD1          ; BLINKING OFF
            MOV     R2,#3FH          ; 8-BIT INTERFACE
            LCALL   WCMLCD0          ; 1 LINE, 5X7 DOTS
            LCALL   WCMLCD1          ; 1 LINE, 5X7 DOTS
;
;INIT 0.6 -----------------------------------------
;
PSHOME:     JNB     WRMSTRT,COLDHM
            AJMP    PSHM04           ; IS WARM START
;
COLDHM:
            MOV     RDELAY,#RLYSTB   ; WAIT FOR POWER UP
$1:         MOV     A,RDELAY
            JNZ     $1
;
            MOV     CPSNUM,#0        ; POSITIONER #0 PRESENTS
            LCALL   SELPST           ; SELECT POSITONER #0
            LCALL   SENSPS           ; DETECT PRESENCE BY END
            JB      PSEXST,PSHM00    ; NOT PRESENT
            LCALL   MARKPS           ; SET BITMAP
            LCALL   PCHOME           ; INIT POSITIONERS
;
PSHM00:     MOV     CPSNUM,#1        ; POSITIONER #1 PRESENTS
            LCALL   SELPST           ; SELECT POSITONER #1
            LCALL   SENSPS           ; DETECT PRESENCE BY END
            JB      PSEXST,PSHM01    ; NOT PRESENT
            LCALL   MARKPS           ; SET BITMAP
            LCALL   PCHOME           ; INIT POSITIONERS
```

```
PSHM01:   MOV     CPSNUM,#2         ; POSITIONER #2 PRESENTS
          LCALL   SELPST            ; SELECT POSITONER #2
          LCALL   SENSPS            ; DETECT PRESENCE BY END
          JB      PSEXST,PSHM02     ; NOT PRESENT
          LCALL   MARKPS            ; SET BITMAP
          LCALL   PCHOME            ; INIT POSITIONERS
;
PSHM02:   MOV     CPSNUM,#3         ; POSITIONER #3 PRESENTS
          LCALL   SELPST            ; SELECT POSITONER #3
          LCALL   SENSPS            ; DETECT PRESENCE BY END
          JB      PSEXST,PSHM03     ; NOT PRESENT
          LCALL   MARKPS            ; SET BITMAP
          LCALL   PCHOME            ; INIT POSITIONERS
;
PSHM03:   MOV     CPSNUM,#4         ; POSITIONER #4 PRESENTS
          LCALL   SELPST            ; SELECT POSITONER #4
          LCALL   SENSPS            ; DETECT PRESENCE BY END
          JB      PSEXST,PSHM04     ; NOT PRESENT
          LCALL   MARKPS            ; SET BITMAP
          LCALL   PCHOME            ; INIT POSITIONERS
;
PSHM04:
SCNRAM2:  MOV     DPTR,#1FFEH       ; RAM SIZE 0000-1FFF
          MOV     A,#5AH            ; TST PATTERN
          MOVX    @DPTR,A
          INC     DPTR
          MOV     A,#A5H            ; TST PATTERN
          MOVX    @DPTR,A
          SETB    WRMSTRT           ; FINISHING COLD START
;
PSHM08:   MOV     CPSNUM,#0         ; WARM START ENTRY
          LCALL   SELPST
;
;INIT 0.7 -----------------------------------------
;
SIGNON:   LCALL   DISSIG
;
          CLR     PFAST             ; TRIG FAST MODE
          SETB    RESPRQ
          LCALL   PCOFST            ; AUTO
          SETB    PFAST
;
          MOV     C,THRSGN          ; POSITIVE
          MOV     WKASGN,C
          CLR     WKACCD
          MOV     WKACCH,VTHRH      ; 2.000 VOLT THR
          MOV     WKACCL,VTHRL
          LCALL   OPTTHR
;
;INIT 0.8 -----------------------------------------
;
          MOV     STATUS,#0         ; WARM/COLD -- INIT STATE
          LCALL   DISOFT            ; SHOW SOFT KEY MESSAGES
;
;INIT 0.9 -----------------------------------------
;
;    Main loop is here. not callable, must jump or
;    return to here according to how you leave this
;    loop. If it is a call, use return. If it is a
;    jump then use jump.
;
IDLE:     ANL     BSPGCT,#7FH       ; SET TASK SWITCHABLE
          CLR     A                 ; CLEAR THE TESTING
          MOV     R4,A              ; DISPLAY
          MOV     R5,A
;
IDLE00:   MOV     R0,#IDLTMR
          INC     @R0
          CLR     PSW.6             ; CLEAR AC
          MOV     A,R5              ; WILL REMOVE
          ADD     A,#1
          DA      A
          MOV     R5,A
          MOV     A,R4
          ADDC    A,#0
          DA      A
          MOV     R4,A
;
          MOV     R0,#INTFLG        ; IF INTERRUPT HAPPEND
          CJNE    @R0,#0,IDLE01
          SJMP    IDLE00
IDLE01:   MOV     R2,#36            ; SHOW IDLE TIME
          LCALL   SADLCD1           ; FOR TESTING PURPOSE
          LCALL   DISHEX1
          LCALL   KTDPCH            ; GO TO JOB DISPATCH
          SJMP    IDLE
;
;--------------------------------------------------
;
          END
```

```
       INCLUDE  .HEAD.A51
;
;1-LEVEL : NOT APPLICABLE
;
;2-TYPE : MAIN PROGRAM  KTIPCD.A51
;
;3-FUNCTION : WORKING MODEL, CONDITIONAL ASSEMBLY INCLUDE
;             FOR BOTH 1/2 uM  W/O END DET. AND 1 uM W/ END DET.
;             Oct. 31, 1988 Adding MELLIS PST SUPPORT.
;
;4-CALLING PROGRAM :
;
;             NOT APPLICABLE.
;
;5-ENTRY POINT:   N/A
;
;6-SUBROUTINE USED    N/A
;
;7-BUFFER, QUEUE, TABLE USED:
;
;                     N/A
;
;          INCLUDE KTINCL.A51
;          INCLUDE KTDATA.A51
;          INCLUDE KTINIT.A51
;          INCLUDE KTDPCH.A51
;          INCLUDE KTISSR.A51
;          INCLUDE KTSKEY.A51
;          INCLUDE KTFUNC.A51
;          INCLUDE KTPRFU.A51
;          INCLUDE KTPRFN.A51
;          INCLUDE KTPRFC.A51
;          INCLUDE KTNUTL.A51
;          INCLUDE KTUTL1.A51
;          INCLUDE KTUTL2.A51
;          INCLUDE KTLABL.A51
;
;---------------------------------------------------
;
IS_MELLIS: ASK     ASSEMBLE FOR MELLIS(-1) OR ALESSI & NIGHTS(-0) POSITIONER
;
;---------------------------------------------------
;
IS_ALESSI: ASK     ASSEMBLE FOR ALEESI(-1) OR KNIGHTS(-0) POSITIONER
           END
```

```
        INCLUDE KTHEAD.A51
;
;1-LEVEL : 0,  TOP
;
;2-TYPE :  INTERRUPT SERVICE PROGRAM
;          SERIAL COMMUNICATION,  O.S. TIMER.
;
;3-FUNCTION : TESTING THE MOTORIZED POSITIONER.
;
;4-CALLING PROGRAM :
;
;          VETCOR TABLE.
;
;
;5-ENTRY POINT:   COMM,    REFRESH.
;
;6-SUBROUTINE USED: TXMISR,  RCVISR.
;
;7-BUFFER, QUEUE, TABLE USED: CHRSTB.
;
;
;
;
;-------------------------------------------------
;
IS_MELLIS: ASK     ASSEMBLE FOR MELLIS(-1) OR ALESSI & NIGHTS(-0) POSITIONER
;
;-------------------------------------------------
;
IS_ALESSI: ASK     ASSEMBLE FOR ALESSI(-1) OR KNIGHTS(-0) POSITIONER
;
;-------------------------------------------------
;
          INCLUDE KTINCL.A51
;
;-------------------------------------------------
;
;  PUBLIC DECLARE
;
          PUBLIC  COMM,    TXMISR,RCVISR
          PUBLIC  REFRESH,CHRSTB
;
;-------------------------------------------------
;
;  EXTERNAL DECLARE
;
          EXTERNAL TXOBRD, RXIBWR, SNDSTS
          EXTERNAL SNDLOG, WDTLCD1,CLRLCD1
;
;-------------------------------------------------
;         INTERRUPT SERVICE ROUTINE
;-------------------------------------------------
;
;Serial communication handle routine. not callable,
;   Don't jump here. Running in background. Only
;   access will be through SBUF or SINQUE/SOGQUE.
;   Strickly no call or jump.
;
;-------------------------------------------------
;
COMM:     PUSH    PSW
          ORL     PSW,#00011000B  ; SEL RB3 (1)
          PUSH    A
          PUSH    DPL
          PUSH    DPH
;
          JBC     TI,TXMISR
          JBC     RI,RCVISR
SINTRET:
          POP     DPH
          POP     DPL
          POP     A
          POP     PSW
          RETI
;
;-------------------------------------------------
;
TXMISR:   JB      TXDENA,$3         ; TXD INHIBIT
          LCALL   TXOBRD            ; GET NEXT BYTE IN BUF
          JB      TBEMPY,$3         ; IF EMPTY
          MOV     SBUF,A
          CLR     TXIDLE            ; INDICATE TXD NOT IDLE
          SJMP    $2
$3:       SETB    TXIDLE            ; TXIDLE WILL TRIG O.S.
$2:       AJMP    SINTRET
;
;-------------------------------------------------
;
;RCVISR:  MOV     A,SBUF            ; RECEIVE DATA
;         ANL     A,#7FH            ; MASK ANY PARITY
;         LCALL   RXIBWR            ; PUT INTO SERIAL BUF
;         JNB     OVERRUN,$1        ; NOT OVERRUN
;         LCALL   SNDSTS            ; SHOW WARNING TO HOST
;$1:      SJMP    SINTRET
;
;-------------------------------------------------
;
;         JNB     PASSTH,SCLI0      ; NOT IN PASS MODE
;         CJNE    A,#0DH,SCLI7      ; IS TERM PASS THRU
;         CLR     PASSTH            ; TERM PASS THRU
;         LCALL   SNDSTS
;         SJMP    SCLI08
;SCLI7:   MOV     R2,A              ; IN PASS THRU
;         LCALL   WDTLCD1           ; SHOW ON LCD1
;         SJMP    SCLI08
;SCLI0:
;
;-------------------------------------------------
;
RCVISR:   MOV     A,SBUF            ; RECEIVE DATA
          ANL     A,#7FH            ; MASK ANY PARITY
          CJNE    A,#36H,SCLI6 ; FASTEST RESPONCE REQUIRED
          SETB    MVABRT            ; 6 RECEIVED
          SJMP    SINTRET           ; ABORT MOTION
SCLI6:    CJNE    A,#31H,SCLI1
          SETB    TXDENA            ; 1 RECEIVED
          SJMP    SCLI08            ; STOP TXD
SCLI1:    CJNE    A,#32H,SCLI2
          CLR     TXDENA            ; 2 RECEIVED
          SJMP    SCLI08            ; CONTINUE TXD
SCLI2:    CJNE    A,#33H,SCLI3
          CLR     TXDENA            ; 3 RECEIVED
          LCALL   SNDLOG            ; INIT TXD
          SJMP    SCLI08            ; CONTINUE TXD
SCLI3:    CJNE    A,#34H,SCLI4
          CLR     PFAST             ; 4 RECEIVED
                                    ; ACTIVE FAST MODE
          SJMP    SCLI08            ; CONTINUE TXD
```

```
SCLI4:    CJNE   A,#35H,SCLI5
          SETB   PFAST              ; 5 RECEIVED
                                    ; DISABLE FAST MODE
          SJMP   SCLI08             ; CONTINUE TXD
SCLI5:    CLR    C
          SUBB   A,#40H
          ANL    A,#1FH
          MOV    KBDBUF,A           ; OTHER KEY
          SETB   RESPRQ             ; RESPONSE REQUIRED
          CLR    SUCCES             ; SUPPOSE FAIL
          CLR    MVABRT             ; NOT ABORT
SCLI08:   SJMP   SINTRET
;
;--------------------------------------------------
;
;    O.S. Timer Interrupt handler. Job Scheduled here.
;    2mS o.s. Running in background. Strickly no call
;    or jump to here. Output through request bit-map
;    and KBDBUF. Handle beep and delay too.
;
;
;--------------------------------------------------
;
REFRESH:  PUSH   PSW
          ORL    PSW,#00011000B   ; SELECT RB3(1)
          PUSH   A
          PUSH   DPL
          PUSH   DPH
          MOV    TH0,#>TICK         ; RELOAD TIMER
          MOV    TL0,#<TICK
;
                                    ; UPDATE CONTACT FLAG
          JNB    PSENSE,REF0        ; IS MEASURE MODE
          MOV    C,PCNTCT           ; GET CONTACT
          MOV    CONTACT,C          ; STORE IN FGSTUS
;
REF0:     MOV    A,#CHRSTB
          ADD    A,R7
          MOVC   A,@A+PC            ; TABLE TRANSLATE
REF1:     MOV    DPTR,#PORTB2       ; PORT B.
          MOVX   @DPTR,A            ; CHANGE SCAN LINE
;
SCHEDL:   MOV    R0,#SCHBMP         ; MARK ON SCHEDULE JOB
          MOV    A,@R0
          ORL    A,#00001011B
          MOV    @R0,A
          INC    INTFLG             ; SET INTERRUPT HAPPEND
;
SCAN:     INC    DPTR               ; PORT C
          MOVX   A,@DPTR
          ANL    A,#0F0H            ; HIGH NIBBLE
SCAN2:    MOV    R5,#4              ; LOOP 4 TIMES
NXTLOC:   RLC    A                  ; CHECK BIT CLEAR
          MOV    R4,A               ; FOR A KEY PRESSED
          JC     SCAN5              ; THIS COLUMN NO
          SETB   GF0                ; A KEY PRESSED
          MOV    A,KEYLOC           ; GET (@KEYLOC)
          XCH    A,R6               ; TEST FOR SAME KEY
          XRL    A,R6
          MOV    R0,#NREPTS
          JZ     SCAN3              ; SAME KEY
          MOV    @R0,#DEBNCE        ; NEW KEY DEBOUNCE IT
          SJMP   SCAN5              ; SKIP FOR NEW KEY
;
SCAN3:    MOV    A,@R0              ; READ DEBOUNCE COUNT
          JZ     SCAN4              ; ALREADY DEBOUNCED
          DEC    A                  ; DEC BOUNCE COUNT
          MOV    @R0,A
          JNZ    SCAN5              ; WAIT NEXT TIME
          JB     REMOTE,SCAN5       ; REMOTE ENABLE/LOCAL
                                    ; LOCKOUT
          MOV    KBDBUF,R6          ; KEY RECONGNIZED
          MOV    AUTOTM,#ATMLNG     ; STORE A VALID KEY
          MOV    ATRPCT,#3          ; 3 TIMES SLOW
          SJMP   SCAN5              ; STROKE, ONLY HERE
;
SCAN4:    JB     REMOTE,SCAN5       ; REMOTE ENABLE/LOCAL
                                    ; LOCKOUT
          DJNZ   AUTOTM,SCAN5       ; AUTO REPEAT NOT TIME
                                    ; OUT YET
          MOV    KBDBUF,R6          ; DO AUTO REPEAT ONCE
          MOV    A,ATRPCT           ; CHECK IF FIRST THREE
          JZ     SCAN41             ; TIMES AUTO REPEAT
          DEC    A
          MOV    ATRPCT,A           ; SAVE COUNT
          MOV    AUTOTM,#ATMMID
          SJMP   SCAN5              ; DO A SLOW AUTO REPEAT
SCAN41:   MOV    AUTOTM,#ATMSHT     ; RELOAD AUTO TIMER
;
SCAN5:    INC    KEYLOC             ; TO NEXT KEY CODE
          MOV    A,R4               ; FOR NEXT COL! I/P
          DJNZ   R5,NXTLOC          ; CHECK NEXT COL.
;
SCAN6:    DJNZ   R7,SCAN9           ; DEC ROW COUNTER
;
          MOV    R7,#CHARNO         ; INIT ROW COUNTER

          MOV    KEYLOC,#0          ; INIT KEY CODE COUNTER
          JB     GF0,SCAN8          ; KEY PRESSED?
          MOV    R6,#0FFH           ; INIT LAST KEY HOLDER
SCAN8:    CLR    GF0                ; CLEAR KEY PRESSED FLAG
;
          MOV    A,RDELAY           ; 16 mS DEC ONCE
          JZ     SCAN9
          DEC    A
          MOV    RDELAY,A           ; DEC DELAY COUNTER
;
SCAN9:    MOV    DPTR,#CSREG2
          MOV    A,BEPDLY           ; 2 mS DEC ONCE
          JZ     SCAN10
          DEC    A
          MOV    BEPDLY,A
          CPL    BEEPIN             ; FGREG1.0
          JB     SILENT,SCAN10
          JNB    BEEPIN,SCAN10
          MOV    A,#00000001B       ; SET AUDIO
          AJMP   SCAN11
SCAN10:   MOV    A,#00000000B       ; CLR AUDIO
SCAN11:   MOVX   @DPTR,A            ; OUT PORT C0
;
SCAN12:   POP    DPH
          POP    DPL
          POP    A
          POP    PSW
          RETI
;
CHRSTB:   EQU    $-REF1-1
```

```
        DB      0FEH            ; 1 OF 8 DECODER
        DB      0FDH
        DB      0FBH
        DB      0F7H
        DB      0EFH
        DB      0DFH
        DB      0BFH
        DB      07FH
;
;--------------------------------------------------
;
        END
```

```
        INCLUDE KTHEAD.A51
;
;1-LEVEL : NOT APPLICABLE
;
;2-TYPE : LABEL PROGRAM  KTLABL.A51
;
;3-FUNCTION : WORKING MODEL, CONDITIONAL ASSEMBLY INCLUDE
;             FOR BOTH 1/2 uM  W/O END DET. AND 1 uM W/ END DET.
;             Oct. 31, 1988 Adding MELLIS PST SUPPORT.
;             Jan. 19, 1989 bug fixing and medium feature enhance
;
;4-CALLING PROGRAM :
;
;             NOT APPLICABLE.
;
;5-ENTRY POINT:   N/A
;
;6-SUBROUTINE USED    N/A
;
;7-BUFFER, QUEUE, TABLE USED:
;
;                   N/A
;
;
;--------------------------------------------
;
        PUBLIC  LOGO
;
;--------------------------------------------
;
IS_ALESSI: ASK      ASSEMBLE FOR ALEESI(-1) OR KNIGHTS(-0) POSITIONER
;
;--------------------------------------------
;
LOGO:   ASCII   Knights Technology Inc. Positioner Controller |
        ASCII   Copyright 1987,1988,1989  by Wang, Shinn-Hwa Jimmy |
        ASCII   for KNIGHTS 0.625 uM NEW positioner, with 120 NC  speed |
        ASCII   REVISION  2.42  IMPLEMENTED Jan. 19, 1989|
        DB      00H
;
;--------------------------------------------
;
        END
```

```
        INCLUDE KTHEAD.A51
;
;1-LEVEL : TOP LEVEL 0
;
;2-TYPE : DISPATCH PGM.  KTDPCH.A51
;
;3-FUNCTION : WORKING MODEL, FOR 1 uM W/END DET.
;
;4-CALLING PROGRAM :
;
;            EITHER JMP FROM IDLE LOOP AFTER INTERRUPT
;            HAPPEND OR RESCHEDULE BY REFRESH (TIME
;            INTERRUPT ROUTINE) IF LONG TIMER EXPIRED.
;
;5-ENTRY POINT:   KTDPCH
;
;6-SUBROUTINE USED:
;
;            1). ON SCHEDULE JOB:  KTKYIN, KTCLCK.
;
;            2). ON REQUEST JOB:   KTSKEY.
;
;            3). BASE LEVEL JOB:
;
;7-BUFFER, QUEUE, TABLE USED:
;
;
;
;
;--------------------------------------------------
;
IS_MELLIS: ASK     ASSEMBLE FOR MELLIS(=1) OR ALESSI & NIGHTS(=0) POSITIONER
;
;--------------------------------------------------
;
IS_ALESSI:ASK      ASSEMBLE FOR ALESSI(=1) OR KNIGHTS(=0) POSITIONER
;
;--------------------------------------------------
;
           INCLUDE KTINCL.A51
;
;--------------------------------------------------
;
;   PUBLIC DECLARE
;
           PUBLIC  KTDPCH
;
;--------------------------------------------------
;
;   EXTERNAL DECLARE
;
           EXTERNAL KTKYIN, KTCLCK, KTSCLI
           EXTERNAL KTSKEY, DISTIM0,MVXTME
           EXTERNAL IDLE,   KTSNTX, REPCNT
;
;--------------------------------------------------
;
KTDPCH:    ANL     BSPGCT,#ENRSCH  ; NON CRITICAL REGION
           MOV     INTFLG,#0       ; CLEAR INTERRUPT HAPPEND
           MOV     IDLTMR,#0       ; CLEAR IDLE TIMER
KTDPC1:    MOV     LONGTM,#0       ; CLEAR LONG TIMER
           ANL     BSPGCT,#ENRSCH  ; NON CRITICAL REGION
           JB      SCHBMP0,KTDPC2  ; 1ST ON SCHDULE JOB
           JB      SCHBMP1,KTDPC3  ; 2ND
           JB      SCHBMP2,KTDPC4  ; 3RD
           JB      SCHBMP3,KTDPC5  ; 4TH
           JB      SCHBMP4,KTDPC6  ; 5TH
           JB      SCHBMP5,KTDPC7  ; 6TH
           JB      SCHBMP6,KTDPC8  ; 7TH
           JB      SCHBMP7,KTDPC9  ; 8TH
           MOV     INTFLG,#0       ; NO MORE ON SCHDULE JOB
           AJMP    KTDPR1          ; GO DO ON REQUEST JOB
;
KTDPC2:    CLR     SCHBMP0         ; RESET KEYIN
           ORL     BSPGCT,#DSRSCH
           LCALL   KTKYIN          ; GO TO SCAN KEY
           AJMP    KTDPC1
KTDPC3:    CLR     SCHBMP1         ; RESET CLOCK
           ORL     BSPGCT,#DSRSCH
           LCALL   KTCLCK          ; GO TO UPDATE CLOCK
           AJMP    KTDPC1
KTDPC4:    CLR     SCHBMP2         ; RESET RS-232C CLI
           ORL     BSPGCT,#DSRSCH
           LCALL   KTSCLI          ; GO TO CHECK INBUF
           AJMP    KTDPC1
KTDPC5:    CLR     SCHBMP3         ; RESET
           ORL     BSPGCT,#DSRSCH
           LCALL   KTSNTX          ; SCAN TXD IDLE OR NOT
           AJMP    KTDPC1
KTDPC6:    CLR     SCHBMP4         ; RESET
           ORL     BSPGCT,#DSRSCH
           LCALL   PROCDM
           AJMP    KTDPC1
KTDPC7:    CLR     SCHBMP5         ; RESET
           ORL     BSPGCT,#DSRSCH
           LCALL   PROCDM
           AJMP    KTDPC1
KTDPC8:    CLR     SCHBMP6         ; RESET
           ORL     BSPGCT,#DSRSCH
           LCALL   PROCDM
           AJMP    KTDPC1
KTDPC9:    CLR     SCHBMP7         ; RESET
           ORL     BSPGCT,#DSRSCH
           LCALL   PROCDM
           AJMP    KTDPC1
;
;--------------------------------------------------
;
KTDPR1:    ANL     BSPGCT,#ENRSCH  ; NON CRITICAL REGION
           CLR     A
           CJNE    A,INTFLG,KTDPRA ; INTERRUPT HAPPEND ?
           SJMP    KTDPRB
KTDPRA:    AJMP    KTDPC1
KTDPRB:    MOV     LONGTM,#0
           JB      RQSBMP0,KTDPR2  ; 1ST ON REQUEST JOB
           JB      RQSBMP1,KTDPR3  ; 2ND
           JB      RQSBMP2,KTDPR4  ; 3RD
           JB      RQSBMP3,KTDPR5  ; 4TH
           JB      RQSBMP4,KTDPR6  ; 5TH
           JB      RQSBMP5,KTDPR7  ; 6TH
           JB      RQSBMP6,KTDPR8  ; 7TH
           JB      RQSBMP7,KTDPR9  ; 8TH
           AJMP    KTDPB1          ; GO DO BASE LEVEL JOB
;
KTDPR2:    CLR     RQSBMP0         ; RESET SKEY
           ORL     BSPGCT,#DSRSCH
           LCALL   KTSKEY          ; GO TO PARSE KEY
           AJMP    KTDPR1
```

```
KTDPR3:   CLR     RQSBMP1           ; RESET
          ORL     BSPGCT,#DSRSCH
          LCALL   DISTIM0           ; UPDATE CLOCK
          AJMP    KTDPR1
KTDPR4:   CLR     RQSBMP2           ; RESET
          ORL     BSPGCT,#DSRSCH
          LCALL   MVXTME            ; PUT TIME INTO SRAM
          AJMP    KTDPR1
KTDPR5:   CLR     RQSBMP3           ; RESET
          ORL     BSPGCT,#DSRSCH
          LCALL   PROCDM
          AJMP    KTDPR1
KTDPR6:   CLR     RQSBMP4           ; RESET
          ORL     BSPGCT,#DSRSCH
          LCALL   PROCDM
          AJMP    KTDPR1
KTDPR7:   CLR     RQSBMP5           ; RESET
          ORL     BSPGCT,#DSRSCH
          LCALL   PROCDM
          AJMP    KTDPR1
KTDPR8:   CLR     RQSBMP6           ; RESET
          ORL     BSPGCT,#DSRSCH
          LCALL   PROCDM
          AJMP    KTDPR1
KTDPR9:   CLR     RQSBMP7           ; RESET
          ORL     BSPGCT,#DSRSCH
          LCALL   PROCDM
          AJMP    KTDPR1
;
;--------------------------------------------------
;
KTDPB1:   CLR     A
          CJNE    A,INTFLG,KTDPCT ; HAVE ON SCHEDULE JOB
          SJMP    KTDPBT
KTDPCT:   AJMP    KTDPC1
KTDPBT:   MOV     LONGTM,#0
          INC     BSPGCT            ; TO NEXT BASE LEVEL JOB
          MOV     A,BSPGCT
          ANL     A,#ENRSCH
;
          CJNE    A,#1,KTDPB2       ; 1ST BASE LEVEL JOB
          LCALL   REPCNT            ; UPDATE CONTACT DISPLAY
          AJMP    KTDPB1
KTDPB2:   CJNE    A,#2,KTDPB3       ; 2ND BASE LEVEL JOB
          LCALL   PROCDM
;
;--------------------------------------------------
;
KTDPB3:   MOV     BSPGCT,#0         ; TO 1ST BASE LEVEL JOB
          MOV     LONGTM,#0
          RET                       ; TO IDLE / KBDIN
;         AJMP    IDLE              ; TO IDLE LOOP
;
;--------------------------------------------------
;
PROCDM:   RET           ; RESERVE FOR UNIMPLEMENTED JOB
;
;--------------------------------------------------
;
          END
\032
```

```
        INCLUDE KTHEAD.A51
;
;1-LEVEL : 1, CLI
;
;2-TYPE : COMMAND LINE INTERPRETER PROGRAM
;
;3-FUNCTION : TESTING THE MOTORIZED POSITIONER.
;
;4-CALLING PROGRAM : ECHO.
;
;5-ENTRY POINT:  FUNCTN.
;
;               PROC00,PROC01,PROC02,PROC03,
;               PROC04,PROC05,PROC06,PROC07,
;               PROC08,PROC09,PROC0A,PROC0B,
;               PROC0C,PROC0D,PROC0E,PROC0F.
;               PCHOME,PROCUP,PROCDN,PROCLF,
;               PROCRT,PROCX, PROCY, PROCZ,
;               PROCMZ,PROCPZ,PROCNX,PROCST,
;               PROCDL,PROCTL,PROCBS,PROCFC.
;
;   NOT IMPLEMENT:PROC00,PROC01,PROC02,PROC03,
;
;   LISTED HERE:  FUNCTN, PCHOME, PROCST
;                 STUSTB, PROCFC, PROC0A are list here.
;
;6-SUBROUTINE USED:
;
;       CALL ALL UTILITY ROUTINES.
;
;7-BUFFER, QUEUE, TABLE USED:
;
;       FUNCTB SIZE 22 FUNC KEY PROCESSING.
;
;
;------------------------------------------------
;
IS_MELLIS: ASK     ASSEMBLE FOR MELLIS(-1) OR ALESSI & NIGHTS(-0) POSITIONER
;
;------------------------------------------------
;
IS_ALESSI: ASK     ASSEMBLE FOR ALESSI(-1) OR KNIGHTS(-0) POSITIONER
;
;------------------------------------------------
;
        INCLUDE KTINCL.A51
;
;------------------------------------------------
;
; PUBLIC DECLARATION
;
        PUBLIC FUNCTN, PCHOME, PROCST
        PUBLIC STUSTB, PROCFC, PROC0A
        PUBLIC PCMOVE, PRMV08, MVMSG2
        PUBLIC PRMVRET
;
;------------------------------------------------
;
; EXTERNAL DECLARATION
;
        EXTERNAL PROC00, PROC01, PROC02, PROC03
        EXTERNAL PROC04, PROC05, PROC06, PROC07
        EXTERNAL PROC08, PROC09, PROC0B, PROC0C
        EXTERNAL PROC0D, PROC0E, PROC0F, PROCUP
        EXTERNAL PROCDN, PROCLF, PROCRT, PROCX
        EXTERNAL PROCY,  PROCZ,  PROCMZ, PROCPZ
        EXTERNAL PROCNX, PROCDL, PROCTL, PROCBS
;
        EXTERNAL ACTUSTP,MODLMH, HMTCNT, MTRCNT
        EXTERNAL STDLMT, SNDSTS, REPTST, HMCLCD0
        EXTERNAL DISSIG ,DISOFT, WCMLCD0
        EXTERNAL CLRLCD1,WCMLCD1,SADLCD1
        EXTERNAL DISIGN1,DISHEX1,KBDIN,  INPADR
        EXTERNAL TGPBIT, PCMDAB
;
;------------------------------------------------
;       FUNCTION KEY OPERATION
;------------------------------------------------
;
FUNCTN:                                 ; N-WAY BRANCH
        ANL     A,#1FH
        MOV     R2,A
        RL      A
        ADD     A,R2
        MOV     DPTR,#FUNCTB
        JMP     @A+DPTR
;
FUNCTB: EQU     $                       ; KEY
        LJMP    PROC00                  ;     0
        LJMP    PROC01                  ;     1
        LJMP    PROC02                  ;     2
        LJMP    PROC03                  ;     3
        LJMP    PROC04                  ;     4
        LJMP    PROC05                  ;     5
        LJMP    PROC06                  ;     6
        LJMP    PROC07                  ;     7
        LJMP    PROC08                  ;     8
        LJMP    PROC09                  ;     9
        LJMP    PROC0A                  ;     A
        LJMP    PROC0B                  ;     B
        LJMP    PROC0C                  ;     C
        LJMP    PROC0D                  ;     D
        LJMP    PROC0E                  ;     E
        LJMP    PROC0F                  ;     F
;
        LJMP    PCHOME                  ; KEY HOME
        LJMP    PROCUP                  ;     UP
        LJMP    PROCDN                  ;     DOWN
        LJMP    PROCLF                  ;     LEFT
        LJMP    PROCRT                  ;     RIGHT
        LJMP    PROCX                   ;     X
        LJMP    PROCY                   ;     Y
        LJMP    PROCZ                   ;     Z
        LJMP    PROCMZ                  ;     -
        LJMP    PROCPZ                  ;     + / -
        LJMP    PROCNX                  ;     , NEXT
        LJMP    PROCST                  ;     . STOP
        LJMP    PROCDL                  ;     DELETE
        LJMP    PROCTL                  ;     CNTL
        LJMP    PROCBS                  ;     BACK SPACE
        LJMP    PROCFC                  ;     FUNC
;
;------------------------------------------------
;
;   CALL THIS ROUTINE TO HOME THE POSITIONER.
;   USE ALL, DESTORY ALL. CALLING ROUTINE HAS
;   TO KEEP WHAT HE WANTS IN RAM LOCATIONS
;   OTHER THAN C_POS_, AND NPSCT_.
```

```
;
;   HARD CONTROLL, USE BITS BY ITS NATIVE MODE.
;
PCHOME:                             ; KEY HOME
;
;  PROMPT FOR REMOVING TIPS BEFORE HARD HOME
;
            MOV     R2,#0CH         ; SHUT CURSOR OF LCD 0
            LCALL   WCMLCD0
            LCALL   CLRLCD1
            MOV     R2,#0FH         ; SHOW CURSOR OF LCD 1
            LCALL   WCMLCD1
            MOV     DPTR,#HMMSG     ; SHOW PRECAUTION MSG
            MOV     R3,#80
            LCALL   DISIGN1
;
PCHM04:     LCALL   KBDIN
            CJNE    A,#9FH,PCHM05   ; IS FUNC KEY
            LJMP    PCHMRET         ; ABORT
PCHM05:     CJNE    A,#9AH,PCHM04   ; IS NEXT KEY
;
;  PUSH TO THE LIMIT
;
            MOV     R2,#0CH         ; SHUT CURSOR OF LCD 1
            LCALL   WCMLCD1
            MOV     A,PBOTMP
            JB      PUSTEP,PCHM00   ; IS USTEP ACTIVATED
            LCALL   ACTUSTP         ; OFF USTEP
PCHM00:     LCALL   MODLMH          ; MODIFY LIMIT TO HOME
            SETB    DIRECT          ; CCW UP/RIGHT/BACK/-
;
            SETB    XAXIS           ; X AXIS
            MOV     A,#CXPSHO       ; BASE
            ADD     A,CADROF        ; ADD OFFSET
            MOV     RO,A            ; POINT TO #N ADDRESS
            MOV     A,#>MAXXRG      ; CHANGE POS CNT
            MOVX    @RO,A
            INC     RO              ; CXPSLO + OFFSET
            MOV     A,#<MAXXRG      ; SO IT CAN GO
            MOVX    @RO,A
            MOV     A,#XFSDLO       ; BASE
            ADD     A,CADROF        ; ADD OFFSET
            MOV     RO,A            ; POINT X FAST DELAY
            MOVX    A,@RO           ; GET FAST DELAY
            MOV     FASTDL,A        ; PUT TO WORK
            MOV     NPSCTH,#>MAXXRG ; 11,808 PULSES
            MOV     NPSCTL,#<MAXXRG
            LCALL   HMTCNT          ; MOTOR ACC/DEACC
            CLR     XAXIS           ; WITHOUT END DETECT
            JNB     MVABRT,PCHM02   ; NOT ABORT BY RS232
            LJMP    PCHMRET
;
PCHM02:     MOV     A,#CXPSHO       ; BASE
            ADD     A,CADROF        ; ADD OFFSET
            MOV     RO,A            ; POINT TO #N ADDRESS
            MOV     A,#>MINXRG      ; CHANGE POS CNT
            MOVX    @RO,A
            INC     RO              ; CXPSLO + OFFSET
            MOV     A,#<MINXRG      ; SO IT CAN GO
            MOVX    @RO,A
;
            SETB    YAXIS           ; Y AXIS
            MOV     A,#CYPSHO       ; BASE
            ADD     A,CADROF        ; ADD OFFSET
            MOV     RO,A            ; POINT TO #N ADDRESS
            MOV     A,#>MAXYRG      ; CHANGE POS CNT
            MOVX    @RO,A
            INC     RO              ; CYPSLO + OFFSET
            MOV     A,#<MAXYRG      ; SO IT CAN GO
            MOVX    @RO,A
            MOV     A,#YFSDLO       ; BASE
            ADD     A,CADROF        ; ADD OFFSET
            MOV     RO,A            ; POINT Y FAST DELAY
            MOVX    A,@RO           ; GET FAST DELAY
            MOV     FASTDL,A        ; PUT TO WORK
            MOV     NPSCTH,#>MAXYRG ; 11,808 PULSES
            MOV     NPSCTL,#<MAXYRG
            LCALL   HMTCNT          ; MOTOR ACC/DEACC
            CLR     YAXIS           ; WITHOUT END DETECT
            JNB     MVABRT,PCHM03   ; NOT ABORT BY RS232
            LJMP    PCHMRET
;
PCHM03:     MOV     A,#CYPSHO       ; BASE
            ADD     A,CADROF        ; ADD OFFSET
            MOV     RO,A            ; POINT TO #N ADDRESS
            MOV     A,#>MINYRG      ; CHANGE POS CNT
            MOVX    @RO,A
            INC     RO              ; CYPSLO + OFFSET
            MOV     A,#<MINYRG      ; SO IT CAN GO
            MOVX    @RO,A
;
            CLR     DIRECT          ; CCW DN/LEFT/FRONT/+
;
            SETB    ZAXIS           ; Z AXIS
            MOV     A,#CZPSHO       ; BASE
            ADD     A,CADROF        ; ADD OFFSET
            MOV     RO,A            ; POINT TO #N ADDRESS
            MOV     A,#>MINZRG      ; CHANGE POS CNT
            MOVX    @RO,A
            INC     RO              ; CZPSLO + OFFSET
            MOV     A,#<MINZRG      ; SO IT CAN GO
            MOVX    @RO,A
            MOV     A,#ZFSDLO       ; BASE
            ADD     A,CADROF        ; ADD OFFSET
            MOV     RO,A            ; POINT Z FAST DELAY
            MOVX    A,@RO           ; GET FAST DELAY
            MOV     FASTDL,A        ; PUT TO WORK
            MOV     NPSCTH,#>MAXZRG ; 8,208 PULSES
            MOV     NPSCTL,#<MAXZRG
            LCALL   HMTCNT          ; MOTOR ACC/DEACC
            CLR     ZAXIS           ; WITHOUT END DETECT
            JNB     MVABRT,PCHM01   ; NOT ABORT BY RS232
            LJMP    PCHMRET
;
PCHM01:     MOV     A,#CZPSHO       ; BASE
            ADD     A,CADROF        ; ADD OFFSET
            MOV     RO,A            ; POINT TO #N ADDRESS
            MOV     A,#>MAXZRG      ; CHANGE POS CNT
            MOVX    @RO,A
            INC     RO              ; CZPSLO + OFFSET
            MOV     A,#<MAXZRG      ; SO IT CAN GO
            MOVX    @RO,A
;
;  RETURN TO SOFT HOME POSITION
;
            LCALL   PROCOE          ; SOFT HOME
;
;  CLEAN UP
```

```
;
PCHMRET:  LCALL   STDLMT          ; RESTORE STANDSRD LIMIT
          LCALL   DISOFT
          MOV     R2,#0CH         ; SHUT CURSOR OF LCD 1
          LCALL   WCMLCD1
          MOV     R2,#0FH         ; SHOW CURSOR OF LCD 0
          LCALL   WCMLCD0
          MOV     BEPDLY,#SHRTBP
          JNB     RESPRQ,$1       ; RESPONSE NOT REQUIRED
          SETB    SUCCES          ; SERIAL COMMAND DONE
          LCALL   SNDSTS
          CLR     RESPRQ
$1:       RET
;
HMMSG:    ASCII   Please lift the probe arm FAR away      |
          ASCII   from the IC surface! Press , to begin ! |
;
;------------------------------------------------
;
;   CALL THIS ROUTINE TO SHOW THE CURRENT POSITIONS
;   AND CONTACT OR NOT. USE ALL, DESTORY ALL.
;
PROCST:   LCALL   REPTST          ;     . STOP
          JNB     RESPRQ,$1       ; RESPONSE NOT REQUIRED
          SETB    SUCCES          ; SERIAL COMMAND DONE
          LCALL   SNDSTS
          CLR     RESPRQ
$1:       RET
;
;------------------------------------------------
;
STUSTB:   EQU     $
          DB      20H,20H
          ASCII   Positioner  |
          DB      23H,20H,20H,20H,20H,20H
          ASCII   X:        Y:        |
          DB      20H,20H
          ASCII   Current Position  |
          ASCII   Z:        Contact   |
;
;------------------------------------------------
;
;   CALL THIS ROUTINE TO SHOW SIGN ON MESSAGE.
;   USE ALL, DESTROY ALL.
;
PROCFC:   LCALL   HMCLCD0         ;     FUNC
          LCALL   DISSIG          ; DISPLAY SIGN-ON MSG
          LCALL   DISOFT          ; SHOW STMSG?
          JNB     RESPRQ,$1       ; RESPONSE NOT REQUIRED
          SETB    SUCCES          ; SERIAL COMMAND DONE
          LCALL   SNDSTS
          CLR     RESPRQ
$1:       RET
;
;------------------------------------------------
;
;   CALL THIS TO MOVE POSITIONER TO AN ABSOLUTE
;     COORDINATE.    THE NUMBER OF THREE
;     COORDINATES ARE ENTERED IN HEXDECIMAL
;     FORM. IT CAN BE ELABERATE LATER.
;   AFTER THE NUMBER ARE IN THE TMP, FALL THRU TO
;     PRMV08, SO THAT BOTH ABS AND REL MOV SHARE
;     THE NEXT HALF OF THE PROGRAM.
;   THIS IS POSSIBLE BECAUSE MY PROGRAM ARE ACTUALLY
;       INPLEMENTED IN RELATIVE MOVE, INSTEAD OF
;       ABSOLUTE MOVE.
;
PROCOA:                                   ;    MOVE TO X,Y,Z
PCMOVE:
;
;    PROC MOVE 0.0    ----    INIT PREPARATIONS
;
          JB      PFAST,PRMV1E    ; FAST OR MEDIUM
          LJMP    PCMDAB          ; MEDIUM
PRMV1E:   MOV     R2,#0CH         ; SHUT CURSOR OF LCD 0
          LCALL   WCMLCD0
          LCALL   CLRLCD1
          MOV     R2,#0FH         ; SHOW CURSOR OF LCD 1
          LCALL   WCMLCD1
          MOV     R2,#64          ; SHOW MOVE TO MSG
          LCALL   SADLCD1
          MOV     DPTR,#MVMSG1
          MOV     R3,#40
          LCALL   DISIGN1
          MOV     R2,#79
          LCALL   SADLCD1
          MOV     A,#CXPSH0       ; BASE
          ADD     A,CADROF        ; ADD OFFSET
          MOV     R0,A            ; POINT TO #N ADDRESS
          MOVX    A,@R0
          MOV     R4,A
          INC     R0              ; CXPSLO + OFFSET
          MOVX    A,@R0
          MOV     R5,A
          LCALL   DISHEX1
          MOV     R2,#88
          LCALL   SADLCD1
          MOV     A,#CYPSH0       ; BASE
          ADD     A,CADROF        ; ADD OFFSET
          MOV     R0,A            ; POINT TO #N ADDRESS
          MOVX    A,@R0
          MOV     R4,A
          INC     R0              ; CYPSLO + OFFSET
          MOVX    A,@R0
          MOV     R5,A
          LCALL   DISHEX1
          MOV     R2,#97
          LCALL   SADLCD1
          MOV     A,#CZPSH0       ; BASE
          ADD     A,CADROF        ; ADD OFFSET
          MOV     R0,A            ; POINT TO #N ADDRESS
          MOVX    A,@R0
          MOV     R4,A
          INC     R0              ; CZPSLO + OFFSET
          MOVX    A,@R0
          MOV     R5,A
          LCALL   DISHEX1
;
;    PROC MOVE 0.1    ----    COLLECT X PARAMETERS
;
PRMV2F:   MOV     A,#CXPSH0       ; BASE
          ADD     A,CADROF        ; ADD OFFSET
          MOV     R0,A
          MOVX    A,@R0
          MOV     NPSCTH,A        ; TEMP STORE
          MOV     CTH,A
          INC     R0              ; CXPSLO + OFFSET
          MOVX    A,@R0
```

```
         MOV     NPSCTL,A           ; TEMP STORE
         MOV     CTL,A              ; INIT POS CNT
         MOV     R2,#79             ; SHOW NUMBER ON LCD 1
         LCALL   SADLCD1
         MOV     R4,CTH
         MOV     R5,CTL
         LCALL   DISHEX1
PRMV00:  LCALL   KBDIN
         CJNE    A,#9EH,PRMV20      ; BACK SPACE EDITING
         SJMP    PRMV2F
PRMV20:  CJNE    A,#9FH,PRMV21      ; ABORT
         LJMP    PRMVRET
PRMV21:  CJNE    A,#9AH,PRMV01      ; IS NEXT
         CLR     C                  ; CALCULATE DIFFERENCE
         MOV     A,CTL
         SUBB    A,NPSCTL
         MOV     NXTMPL,A
         MOV     A,CTH
         SUBB    A,NPSCTH
         MOV     NXTMPH,A
         SJMP    PRMV02
PRMV01:  ANL     A,#0FH             ; GET NUM KEY
         MOV     R4,A               ; TMP IN BUF
         LCALL   INPADR             ; RIGHT ENTRY 2 BYTES
         MOV     R2,#79             ; SHOW NUMBER ON LCD 1
         LCALL   SADLCD1
         MOV     R4,CTH
         MOV     R5,CTL
         LCALL   DISHEX1
         SJMP    PRMV00
;
;    PROC MOVE 0.2    ----    COLLECT Y PARAMETERS
;
PRMV02:  MOV     A,#CYPSHO          ; BASE
         ADD     A,CADROF           ; ADD OFFSET
         MOV     R0,A
         MOVX    A,@R0
         MOV     NPSCTH,A           ; TEMP STORE
         MOV     CTH,A
         INC     R0                 ; CYPSLO + OFFSET
         MOVX    A,@R0
         MOV     NPSCTL,A           ; TEMP STORE
         MOV     CTL,A              ; INIT POS CNT
         MOV     R2,#88             ; SHOW NUMBER ON LCD 1
         LCALL   SADLCD1
         MOV     R4,CTH
         MOV     R5,CTL
         LCALL   DISHEX1
PRMV03:  LCALL   KBDIN
         CJNE    A,#9EH,PRMV22      ; BACK SPACE EDITING
         SJMP    PRMV2F
PRMV22:  CJNE    A,#9FH,PRMV23      ; ABORT
         LJMP    PRMVRET
PRMV23:  CJNE    A,#9AH,PRMV04      ; IS NEXT
         CLR     C                  ; CALCULATE DIFFERENCE
         MOV     A,CTL
         SUBB    A,NPSCTL
         MOV     NYTMPL,A
         MOV     A,CTH
         SUBB    A,NPSCTH
         MOV     NYTMPH,A
         SJMP    PRMV05
PRMV04:  ANL     A,#0FH             ; GET NUM KEY
         MOV     R4,A               ; TMP IN BUF
         LCALL   INPADR             ; RIGHT ENTRY 2 BYTES
         MOV     R2,#88             ; SHOW NUMBER ON LCD 1
         LCALL   SADLCD1
         MOV     R4,CTH
         MOV     R5,CTL
         LCALL   DISHEX1
         SJMP    PRMV03
;
;    PROC MOVE 0.3    ----    COLLECT Z PARAMETERS
;
PRMV05:  MOV     A,#CZPSHO          ; BASE
         ADD     A,CADROF           ; ADD OFFSET
         MOV     R0,A
         MOVX    A,@R0
         MOV     NPSCTH,A           ; TEMP STORE
         MOV     CTH,A
         INC     R0                 ; CZPSLO + OFFSET
         MOVX    A,@R0
         MOV     NPSCTL,A           ; TEMP STORE
         MOV     CTL,A              ; INIT POS CNT
         MOV     R2,#97             ; SHOW NUMBER ON LCD 1
         LCALL   SADLCD1
         MOV     R4,CTH
         MOV     R5,CTL
         LCALL   DISHEX1
PRMV06:  LCALL   KBDIN
         CJNE    A,#9EH,PRMV24      ; BACK SPACE EDITING
         SJMP    PRMV02
PRMV24:  CJNE    A,#9FH,PRMV25      ; ABORT
         LJMP    PRMVRET
PRMV25:  CJNE    A,#9AH,PRMV07      ; IS NEXT
         CLR     C                  ; CALCULATE DIFFERENCE
         MOV     A,CTL
         SUBB    A,NPSCTL
         MOV     NZTMPL,A
         MOV     A,CTH
         SUBB    A,NPSCTH
         MOV     NZTMPH,A
         SJMP    PRMV08
PRMV07:  ANL     A,#0FH             ; GET NUM KEY
         MOV     R4,A               ; TMP IN BUF
         LCALL   INPADR             ; RIGHT ENTRY 2 BYTES
         MOV     R2,#97             ; SHOW NUMBER ON LCD 1
         LCALL   SADLCD1
         MOV     R4,CTH
         MOV     R5,CTL
         LCALL   DISHEX1
         SJMP    PRMV06
;
;    PROC MOVE 0.4    ----    DESIGN MOVEMENT STRATAGY
;
PRMV08:  JB      PNC,PRMV1A         ; IS POWER UP ALREADY
         MOV     RDELAY,#PWRSTB     ; WAIT FOR POWER
         CLR     PMTRPD             ; TRIG WATCHDOG TIMER
         SETB    PMTRPD
PRMV1B:  MOV     A,RDELAY           ; SUPPLY STABLE
         JNZ     PRMV1B
PRMV1A:  CLR     PMTRPD             ; TRIG WATCHDOG TIMER
         SETB    PMTRPD
         MOV     R2,#0CH            ; SHUT CURSOR OF LCD 1
         LCALL   WCMLCD1
;
         CLR     A
         MOV     MVSTG1,A           ; CLEAR MOVE STRATAGY BIT MAP
```

```
                                ; MVRTRV, MVZUPW, MVZDNW,
                                ; MVAPPR, ZSMLRG.
          CJNE    A,NZTMPH,PRMV0A
          CJNE    A,NZTMPL,PRMV0B
                                ; CASE 1: NO Z MOVEMENT
          JNB     PCNTCT,PRMV09 ; IS CONTACT
          LJMP    PRMV11        ; M SEQUENCE ONLY
PRMV09:   SETB    MVRTRV        ; R-M-A SEQUENCE
          SETB    MVAPPR
          SJMP    PRMV0D
;
PRMV0A:   MOV     A,NZTMPH
          JNB     A.7,PRMV0B    ; CASE 2: NEGATIVE/UP
          SETB    MVRTRV        ; R-Z-M SEQUENCE
          SETB    MVZUPW
          SJMP    PRMV0D
;
PRMV0B:                         ; CASE 3: POSITIVE/DOWN
          JB      CONTACT,PRMV0C ; NOT CONTACT
          MOV     BEPDLY,#EXLNGBP ; SOUND ALARM
          LCALL   CLRLCD1
          MOV     DPTR,#MVMSG2  ; SHOW CAN'T INC Z MSG
          MOV     R3,#40
          LCALL   DISIGN1
PRMV26:   MOV     A,BEPDLY      ; WAIT A WHILE
          JNZ     PRMV26        ; LET USER SEE THE MSG
          LJMP    PRMVRET
PRMV0C:   SETB    MVZDNW        ; M-Z'-A SEQUENCE
          SETB    MVAPPR
;
;    PROC MOVE 0.5    ----    RETRIEVE 80 uSTEPS
;
PRMV0D:   JNB     MVRTRV,PRMV10 ; NO -R- REQUIRED
RETRIEVE: MOV     A,PBOTMP
          JNB     PUSTEP,PCMV27 ; IS USTEP ACTIVATED
          LCALL   ACTUSTP       ; ON USTEP
PCMV27:   SETB    DIRECT        ; CW UP/-
          SETB    ZAXIS
          JNB     MVZUPW,$1     ; R-M-A SEQ, NOT R-Z-M
          MOV     A,#>NGSFRG
          CJNE    A,NZTMPH,$1   ; > 256 STEPS
          MOV     A,#<NGSFRG
          CJNE    A,NZTMPL,$2   ; COMP >= 81 STEPS
$2:       JNC     $1
          MOV     A,NZTMPL
          CPL     A
          INC     A             ; 2'S COMPLEMENT
          MOV     R6,A
          SETB    ZSMLRG
          SJMP    PRMV0E     ; RETRACK ONLY < 80 STEP
$1:       MOV     R6,#<(SFTYRG) ; RETRACK 80 USTEPS
PRMV0E:   MOV     A,#1
          LCALL   TGPBIT
          LCALL   REPTST
          JNB     MVABRT,PRMV2D ; NOT ABORT BY RS232
          LJMP    PRMVRET
PRMV2D:   MOV     RDELAY,#USTPDL ; 256mS DELAY
PRMV0F:   MOV     A,RDELAY
          JNZ     PRMV0F
          DJNZ    R6,PRMV0E
          CLR     ZAXIS
;
;    PROC MOVE 0.6    ----    MOVE TO Z NEGATIVE LOCATIONS
;                             -/UP
;
PRMV10:   JNB     MVZUPW,PRMV11 ; NO -Z- REQUIRED
          JBC     ZSMLRG,PRMV11 ; ALREADY DONE
          MOV     A,PBOTMP
          JB      PUSTEP,PCMV28 ; IS USTEP ACTIVATED
          LCALL   ACTUSTP       ; OFF USTEP
PCMV28:   MOV     A,NZTMPH
          CPL     A             ; NEGATIVE STEPS
          MOV     NPSCTH,A      ; COMPLEMENT IT
          MOV     A,NZTMPL
          CPL     A
          MOV     NPSCTL,A
          CLR     C             ; R-Z-M ALWAYS TOGETHER
          MOV     A,NPSCTL      ; BUT R-M-A HAS NO Z MOVEMENT
          SUBB    A,#<SFTYRG
          MOV     NPSCTL,A      ; REMOVE THOSE uSTEPS
          MOV     A,NPSCTH
          SUBB    A,#0
          MOV     NPSCTH,A
          MOV     A,NPSCTL      ; INC 2'S COMPL
          ADD     A,#1
          MOV     NPSCTL,A
          MOV     A,NPSCTH
          ADDC    A,#0
          MOV     NPSCTH,A
          SETB    DIRECT        ; SET DIRECTION FOR CW UP/-
          SETB    ZAXIS         ; Z AXIS
          MOV     A,#ZFSDLO     ; BASE
          ADD     A,CADROF      ; ADD OFFSET
          MOV     R0,A          ; POINT Z FAST DELAY
          MOVX    A,@R0         ; GET FAST DELAY
          MOV     FASTDL,A      ; PUT TO WORK
          LCALL   MTRCNT
          CLR     ZAXIS
          JNB     MVABRT,PRMV11 ; NOT ABORT BY RS232
          LJMP    PRMVRET
;
;    PROC MOVE 0.7    ----    MOVE TO X LOCATIONS
;
PRMV11:                         ; -M- REQUIRED, ENEN 0 STEP
          MOV     A,PBOTMP
          JB      PUSTEP,PCMV29 ; IS USTEP ACTIVATED
          LCALL   ACTUSTP       ; OFF USTEP
PCMV29:   MOV     A,NXTMPH      ; IN X,Y DIR, MTRCNT DET.
          JNB     A.7,PRMV12    ; IS POSITIVE
          CPL     A             ; NEGATIVE STEPS
          MOV     NPSCTH,A      ; COMPLEMENT IT
          MOV     A,NXTMPL
          CPL     A
          MOV     NPSCTL,A
          MOV     A,NPSCTL      ; INC 2'S COMPL
          ADD     A,#1
          MOV     NPSCTL,A
          MOV     A,NPSCTH
          ADDC    A,#0
          MOV     NPSCTH,A
          SETB    DIRECT        ; SET DIR FOR CW RIGHT/-
          SJMP    PRMV13
PRMV12:   MOV     A,NXTMPH
          MOV     NPSCTH,A
          MOV     A,NXTMPL
          MOV     NPSCTL,A
          CLR     DIRECT        ; SET DIR FOR CCW LEFT/+
PRMV13:   SETB    XAXIS         ; X AXIS
```

```
        MOV     A,#XFSDLO       ; BASE
        ADD     A,CADROF        ; ADD OFFSET
        MOV     R0,A            ; POINT X FAST DELAY
        MOVX    A,@R0           ; GET FAST DELAY
        MOV     FASTDL,A        ; PUT TO WORK
        LCALL   MTRCNT
        CLR     XAXIS
        JNB     MVABRT,PRMV14   ; NOT ABORT BY RS232
        LJMP    PRMVRET
;
;   PROC MOVE 0.8   ----    MOVE TO Y LOCATIONS
;
PRMV14:                         ; -M- REQUIRED
        MOV     A,PBOTMP
        JB      PUSTEP,PCMV2A   ; IS USTEP ACTIVATED
        LCALL   ACTUSTP         ; OFF USTEP
PCMV2A: MOV     A,NYTMPH
        JNB     A.7,PRMV15      ; IS POSITIVE
        CPL     A               ; NEGATIVE STEPS
        MOV     NPSCTH,A        ; COMPLEMENT IT
        MOV     A,NYTMPL
        CPL     A
        MOV     NPSCTL,A
        MOV     A,NPSCTL        ; INC 2'S COMPL
        ADD     A,#1
        MOV     NPSCTL,A
        MOV     A,NPSCTH
        ADDC    A,#0
        MOV     NPSCTH,A
        SETB    DIRECT          ; SET DIR FOR CW BACK/-
        SJMP    PRMV16
PRMV15: MOV     A,NYTMPH
        MOV     NPSCTH,A
        MOV     A,NYTMPL
        MOV     NPSCTL,A
        CLR     DIRECT          ; SET DIR FOR CCW FRONT/+
PRMV16: SETB    YAXIS           ; Y AXIS
        MOV     A,#YFSDLO       ; BASE
        ADD     A,CADROF        ; ADD OFFSET
        MOV     R0,A            ; POINT Y FAST DELAY
        MOVX    A,@R0           ; GET FAST DELAY
        MOV     FASTDL,A        ; PUT TO WORK
        LCALL   MTRCNT
        CLR     YAXIS
        JNB     MVABRT,PRMV17   ; NOT ABORT BY RS232
        LJMP    PRMVRET
;
;   PROC MOVE 0.9   ----    MOVE TO Z POSITIVE LOCATIONS
;                           +/DOWN
;
PRMV17: JNB     MVZDNW,PRMV18   ; NO -Z'- REQUIRED
        CLR     A
        CJNE    A,NZTMPH,$1     ; > 256 STEPS
        MOV     A,#((<SFTYRG)+1)
        CJNE    A,NZTMPL,$2     ; >=81 STEPS
$2:     JC      $1
        SETB    ZSMLRG          ; < 80 STEPS
        SJMP    APPROACH
$1:     MOV     A,PBOTMP
        JB      PUSTEP,PCMV2B   ; IS USTEP ACTIVATED
        LCALL   ACTUSTP         ; OFF USTEP
PCMV2B: MOV     A,NZTMPH
        MOV     NPSCTH,A
        MOV     A,NZTMPL
        MOV     NPSCTL,A
        CLR     C               ; M-Z'-A, LAST 80 STEPS WILL
        MOV     A,NPSCTL        ; ALWAYS BE uSTEPed
        SUBB    A,#<SFTYRG
        MOV     NPSCTL,A
        MOV     A,NPSCTH
        SUBB    A,#0
        MOV     NPSCTH,A
        CLR     DIRECT          ; SET DIR FOR CCW DN/+
        SETB    ZAXIS           ; Z AXIS
        MOV     A,#ZFSDLO       ; BASE
        ADD     A,CADROF        ; ADD OFFSET
        MOV     R0,A            ; POINT Z FAST DELAY
        MOVX    A,@R0           ; GET FAST DELAY
        MOV     FASTDL,A        ; PUT TO WORK
        LCALL   MTRCNT
        CLR     ZAXIS
        JNB     MVABRT,PRMV18   ; NOT ABORT BY RS232
        LJMP    PRMVRET
;
;   PROC MOVE 0.A   ----    APPROACHING
;                           Z MOTOR MOVE DOWNWARD 80 uSTEPS
;                           WITH CONTACT SENSING ALL THE WAY.
;
PRMV18: JNB     MVAPPR,PRMVRET  ; NO -A- REQUIRED
APPROACH: MOV   A,PBOTMP
        JNB     PUSTEP,PRMV19   ; IS USTEP ACTIVATED
        LCALL   ACTUSTP         ; ON USTEP
PRMV19: JNB     ZSMLRG,$1
        MOV     R6,NZTMPL       ; MOVE ONLY < 80 STEPS
        SJMP    $2
$1:     MOV     R6,#<SFTYRG     ; MAKE CONTACT W/LIMIT
$2:     CLR     DIRECT          ; CCW DN/+
        SETB    ZAXIS           ; Z AXIS
;
PRMV1C: JNB     PCNTCT,PRMVRET  ; CONTACT
        MOV     A,#1
        LCALL   TGPBIT          ; SINGLE STEP
        LCALL   REPTST
        JNB     MVABRT,PRMV2E   ; NOT ABORT BY RS232
        LJMP    PRMVRET
PRMV2E: MOV     RDELAY,#USTPDL  ; 256mS DELAY
PRMV1D: JNB     PCNTCT,PRMVRET  ; CONTACT
        MOV     A,RDELAY
        JNZ     PRMV1D
        DJNZ    R6,PRMV1C       ; SEE IF CONTACT, AGAIN
        LCALL   REPTST
;
;   PROC MOVE 0.B   ----    CLEAN UP
;
PRMVRET: CLR    ZAXIS           ; Z AXIS
        SETB    DIRECT          ; UPWARD JUST IN CASE.
        MOV     A,PBOTMP
        JB      PUSTEP,PRMV2C   ; IS USTEP ACTIVATED
        LCALL   ACTUSTP         ; OFF USTEP
PRMV2C: LCALL   DISOFT
        MOV     R2,#0CH         ; SHUT CURSOR OF LCD 1
        LCALL   WCMLCD1
        MOV     R2,#0FH         ; SHOW CURSOR OF LCD 0
        LCALL   WCMLCD0
        MOV     BEPDLY,#SHRTBP
        JNB     RESPRQ,$1       ; RESPONSE NOT REQUIRED
        SETB    SUCCES          ; SERIAL COMMAND DONE
        LCALL   SNDSTS
```

```
        CLR     RESPRQ
$1:     RET
;
MVMSG1: ASCII   Move to --  X:      . Y:      . Z:      . |
MVMSG2: ASCII   CAN'T INC. Z ANY MORE, ALREADY CONTACT. |
;
;------------------------------------------------
;
        END
      INCLUDE KTHEAD.A51
;
;1-LEVEL : 2, CLI EXCUTIONER
;
;2-TYPE : COMMAND LINE OPERATION PROGRAMS
;
;3-FUNCTION : TESTING THE MOTORIZED POSITIONER.
;
;4-CALLING PROGRAM : FUNCTN.
;
;5-ENTRY POINT:     PROC00,PROC01,PROC02,PROC03,
;                   PROC04,PROC05,PROC06,PROC07,
;                   PROC08,PROC09,PROC0A,PROC0B,
;                   PROC0C,PROC0D,PROC0E,PROC0F.
;                   PCHOME,PROCUP,PROCDN,PROCLF,
;                   PROCRT,PROCX, PROCY, PROCZ,
;                   PROCMZ,PROCPZ,PROCNX,PROCST,
;                   PROCDL,PROCTL,PROCBS,PROCFC.
;
;    NOT IMPLEMENT:PROC00,PROC01,PROC02,PROC03,
;
;    LISTED HERE:   PROC00,PROC01,PROC02,PROC03,
;                   PROC04,PROC05,PROC06,PROC07,
;                   PROC0B,
;                   PROC0C,PROC0D,PROC0E,PROC0F.
;
;                        are list here.
;6-SUBROUTINE USED:
;
;          CALL ALL UTILITY ROUTINES.
;
;7-BUFFER, QUEUE, TABLE USED:
;
;------------------------------------------------
;
IS_MELLIS: ASK     ASSEMBLE FOR MELLIS(-1) OR ALESSI & NIGHTS(-0) POSITIONER
;
;------------------------------------------------
;
IS_ALESSI: ASK     ASSEMBLE FOR ALESSI(-1) OR KNIGHTS(-0) POSITIONER
;
;------------------------------------------------
;
          INCLUDE KTINCL.A51
;
;------------------------------------------------
;
; PUBLIC DECLARATION
;
          PUBLIC    PROC00,PROC01,PROC02,PROC03
          PUBLIC    PROC04,PROC05,PROC06,PROC07
          PUBLIC    PROC0B,PCOF20,PCOFST,PROCTH
          PUBLIC    PCTH10,PCOFST
          PUBLIC    PROC0C,PROC0D,PROC0E,PROC0F
;
;------------------------------------------------
;
; EXTERNAL DECLARATION
;
          EXTERNAL SNDSTS, HMCLCD0,OUTDIG1
          EXTERNAL SELPST, REPTST, XFRIMT
          EXTERNAL DISSIG ,DISOFT, WCMLCD0
          EXTERNAL CLRLCD1,WCMLCD1,SADLCD1
          EXTERNAL DISIGN1,DISHEX1,KBDIN
          EXTERNAL INPADR, DISTDG1,PCMDRL
          EXTERNAL PRMV08, PRMVRET,STDLMT
          EXTERNAL SHWTHR1,OPTTHR, SHWOFS1
          EXTERNAL INPVLT, BCDSUB, OPOFST
          EXTERNAL BCDADD, INPADC, SHWADC1
          EXTERNAL HEXBCD, PSPWDN, INPUT0
          EXTERNAL LEGNDS, BCDAD3, BCDSB3
          EXTERNAL ACTCTSN,DISBYT1,INPUT1
;
;------------------------------------------------
;      FUNCTION  KEY  OPERATION  ROUTINES
;------------------------------------------------
;
PROC00:                               ;     0
PROCPD:                               ; PROCEDURE POWER DOWN
          JNB     PFAST,PCPD10        ; IS FAST MODE
;
PCPD00:   SETB    SILENT              ; DISABLE SOUND
          MOV     CPSNUM,#4
          LCALL   SELPST
          JB      PPRSNT,PCPD01
          LCALL   REPTST
          LCALL   PSPWDN              ; SMALL RANGE MO-0
PCPD01:   MOV     CPSNUM,#3
          LCALL   SELPST
          JB      PPRSNT,PCPD02
          LCALL   REPTST
          LCALL   PSPWDN              ; SMALL RANGE MO-0
PCPD02:   MOV     CPSNUM,#2
          LCALL   SELPST
          JB      PPRSNT,PCPD03
          LCALL   REPTST
          LCALL   PSPWDN              ; SMALL RANGE MO-0
PCPD03:   MOV     CPSNUM,#1
          LCALL   SELPST
          JB      PPRSNT,PCPD04
          LCALL   REPTST
          LCALL   PSPWDN              ; SMALL RANGE MO-0
PCPD04:   MOV     CPSNUM,#0
          LCALL   SELPST
          JB      PPRSNT,PCPD05
          LCALL   REPTST
          LCALL   PSPWDN              ; SMALL RANGE MO-0
PCPD05:   CLR     SILENT              ; ENABLE SOUND
;
PCPDRET:  JNB     RESPRQ,$1           ; RESPONSE NOT REQUIRED
          SETB    SUCCES              ; SERIAL COMMAND DONE
          LCALL   SNDSTS
          CLR     RESPRQ
$1:       RET
;
PCPD10:   MOV     CPSNUM,#4
          LCALL   SELPST
          JB      PPRSNT,PCPD11
          LCALL   PROC0E              ; SOFTHOME GUARRENTY MO-0
          LCALL   PSPWDN              ; SMALL RANGE MO-0
          LCALL   PROC0F              ; SET ORIGIN
PCPD11:   MOV     CPSNUM,#3
          LCALL   SELPST
          JB      PPRSNT,PCPD12
          LCALL   PROC0E              ; SOFTHOME GUARRENTY MO-0
          LCALL   PSPWDN              ; SMALL RANGE MO-0
```

```
         LCALL   PROCOF              ; SET ORIGIN
PCPD12:  MOV     CPSNUM,#2
         LCALL   SELPST
         JB      PPRSNT,PCPD13
         LCALL   PROCOE              ; SOFTHOME GUARRENTY MO=0
         LCALL   PSPWDN              ; SMALL RANGE MO=0
         LCALL   PROCOF              ; SET ORIGIN
PCPD13:  MOV     CPSNUM,#1
         LCALL   SELPST
         JB      PPRSNT,PCPD14
         LCALL   PROCOE              ; SOFTHOME GUARRENTY MO=0
         LCALL   PSPWDN              ; SMALL RANGE MO=0
         LCALL   PROCOF              ; SET ORIGIN
PCPD14:  MOV     CPSNUM,#0
         LCALL   SELPST
         JB      PPRSNT,PCPD15
         LCALL   PROCOE              ; SOFTHOME GUARRENTY MO=0
         LCALL   PSPWDN              ; SMALL RANGE MO=0
         LCALL   PROCOF              ; SET ORIGIN
PCPD15:  SJMP    PCPDRET
;
;--------------------------------------------------
;
;  CALL THIS TO ADJUST THE PICO PROBE POWER
;    SUPPLY, SO AS TO GET ZERO OFFSET IN OUTPUT.
;    USER CAN INPUT A VALUE OR USING ZUP/ZDOWN.
;
;  IN FAST MODE, IT WILL AUTOMATICALLY ADJUST
;    THE POWER SUPPLY WITHOUT HUMAN INTERVENTION.
;    THE ALGORITHM USED IS SUCCESSIVE APROXIMATION.
;
;  NOTE HOWEVER THAT OUTPUT IS MODULATED ON TOP OF
;    20.000 VOLT TO GET 17.452 TO 22.048 VOLTS
;    ADJUSTABLE OUTPUT.
;
PROCO1:                              ;     1
PCOFST:
;
;    INIT PREPARATIONS AND SHOW MESSAGE
;
         MOV     C,PFAST
         MOV     F0,C
         MOV     R2,#0CH             ; SHUT CURSOR OF LCD 0
         LCALL   WCMLCD0
         LCALL   CLRLCD1
         MOV     R2,#0FH             ; SHOW CURSOR OF LCD 1
         LCALL   WCMLCD1
         MOV     R2,#0               ; SHOW OFFSET VOLTAGE MSG
         LCALL   SADLCD1
         MOV     DPTR,#OFMSG1
         MOV     R3,#80
         LCALL   DISIGN1
         JNB     PSENSE,$1           ; CONTACT SENSING OFF
         LCALL   ACTCTSN             ; TURN OFF
         MOV     RDELAY,#RLYSTB
$2:      MOV     A,RDELAY            ; WAIT FOR RELAY TO
         JNZ     $2                  ; STABLE
$1:      JB      F0,PCOF00           ; MANUAL MODE
         LJMP    PCOF20              ; FAST AUTO MODE
;
; MANUAL MODE : INIT PREPARATION AND SHOW MESSAGE
;
PCOF00:  SETB    WKASGN
         MOV     WKACCD,VOFSTD
         MOV     WKACCH,VOFSTH
         MOV     WKACCL,VOFSTL
;
PCOF0A:  MOV     R2,#72              ; SHOW NUMBER ON LCD 1
         LCALL   SADLCD1             ; WKACCD,WKACCH,WKACCL
         LCALL   SHWOFS1             ; SPECIAL ROUTINE FOR VOFST
         LCALL   OPOFST
         MOV     RDELAY,#PWRSTB
PCOF0D:  MOV     A,RDELAY
         JNZ     PCOF0D
PCOF0C:  MOV     R2,#94
         LCALL   SADLCD1
         LCALL   INPADC              ; READING
         LCALL   SHWADC1             ; SHOW IT
;
PCOF01:  MOV     R1,#KBDBUF
         MOV     A,#80H
         XCH     A,@R1
         JNB     A.7,PCOF0E          ; HANDLE ADC I/P
         MOV     RDELAY,#ADCVPR
         SJMP    PCOF0D
PCOF0E:  MOV     BEPDLY,#SHRTBP
         ANL     A,#1FH
         MOV     DPTR,#LEGNDS
         MOVC    A,@A+DPTR
;
         CJNE    A,#9EH,PCOF02       ; BACK SPACE EDITING
         SJMP    PCOF00
PCOF02:  CJNE    A,#9FH,PCOF03       ; ABORT
         MOV     WKACCD,VOFSTD
         MOV     WKACCH,VOFSTH
         MOV     WKACCL,VOFSTL
         LJMP    PCOF11
PCOF03:  CJNE    A,#9BH,PCOF04       ; IS DECIMAL POINT
         SJMP    PCOF01
PCOF04:  CJNE    A,#9AH,PCOF05       ; IS FINISH
         LJMP    PCOF10
PCOF05:  CJNE    A,#91H,PCOF06       ; IS  UP
         SJMP    PCOF07
PCOF06:  CJNE    A,#92H,PCOF08       ; IS DOWN
         SJMP    PCOF09
PCOF08:  ANL     A,#0FH              ; GET NUM KEY
         CJNE    A,#0AH,$1
$1:      JNC     PCOF01              ; NOT DECIMAL
         MOV     R4,A
         MOV     R1,#WKACCL
         LCALL   INPVLT
         LJMP    PCOF0A
;
PCOF07:  SETB    TPRSGN                ; +
         MOV     TPREGD,#00H
         JNB     PFAST,PCOF15          ; FAST MODE
         MOV     TPREGH,#00H
         MOV     TPREGL,#01H
         SJMP    PCOF16
PCOF15:  MOV     TPREGH,#01H
         MOV     TPREGL,#00H
PCOF16:  MOV     R0,#WKACCL
         MOV     R1,#TPREGL
         MOV     C,WKASGN
         MOV     SGNFG0,C
         MOV     C,TPRSGN
         MOV     SGNFG1,C
         LCALL   BCDAD3    ; INC 0.001 TO WKACCD, H, L
```

```
         SETB    WKASGN
         LJMP    PCOF0A
;
PCOF09:  CLR     TPRSGN            ; -
         MOV     TPREGD,#00H
         JNB     PFAST,PCOF17      ; FAST MODE
         MOV     TPREGH,#00H
         MOV     TPREGL,#01H
         SJMP    PCOF18
PCOF17:  MOV     TPREGH,#01H
         MOV     TPREGL,#00H
PCOF18:  MOV     R0,#WKACCL
         MOV     R1,#TPREGL
         MOV     C,WKASGN
         MOV     SGNFG0,C
         MOV     C,TPRSGN
         MOV     SGNFG1,C
         LCALL   BCDAD3    ; DEC 0.001 TO WKACCD, H, L
         SETB    WKASGN
         LJMP    PCOF0A
;
;   CALCULATE AND OUTPUT TO PORT 8800H
;    VALUE STORE IN VOFSTD,VOFSTH,VOFSTL
;    IN DECIMAL FORMAT.
;
PCOF10:  MOV     A,WKACCD
         ANL     A,#0FH
         MOV     TPREGD,A
         MOV     A,WKACCH
         ANL     A,#0F0H
         ORL     A,TPREGD
         SWAP    A
         CJNE    A,#20H,$1         ; WK >= 20.000 VOLT ?
$1:      JNC     PCOF19
;
         MOV     A,#79H            ; WK > 17.951 VOLT ?
         CJNE    A,WKACCH,$2
         SJMP    $4                ; WK = 17.9
$2:      JC      PCOF1C            ; WK > 17.9
         SJMP    PCOF1A            ; WK < 17.9
$4:      MOV     A,#51H
         CJNE    A,WKACCL,$3       ; WK >= 17.952
$3:      JC      PCOF1C
PCOF1A:  MOV     WKACCD,#01H       ; WK < ; ERROR PROCESS
         MOV     WKACCH,#79H
         MOV     WKACCL,#52H
         SJMP    PCOF1C
;
PCOF19:  MOV     A,#20H            ; WK > 22.047 VOLT ?
         CJNE    A,WKACCH,$2
         SJMP    $4                ; WK = 22.0
$2:      JNC     PCOF1C            ; WK < 22.0
         SJMP    PCOF1B            ; WK > 22.0
$4:      MOV     A,#48H
         CJNE    A,WKACCL,$3       ; WK < 22.048
$3:      JNC     PCOF1C
PCOF1B:  MOV     WKACCD,#02H       ; WK > ; ERROR PROCESS
         MOV     WKACCH,#20H
         MOV     WKACCL,#47H
;
PCOF1C:  MOV     VOFSTD,WKACCD
         MOV     VOFSTH,WKACCH
         MOV     VOFSTL,WKACCL
PCOF11:  MOV     R2,#72            ; SHOW NUMBER ON LCD 1
         LCALL   SADLCD1
         LCALL   SHWOFS1
         LCALL   OPOFST
         JB      RESPRQ,PCOFRET    ; REMOTE; NO USER
         MOV     R2,#0             ; RESPONCE NEEDED
         LCALL   SADLCD1
         MOV     DPTR,#OFMSG2      ; SHOW CHOICES
         MOV     R3,#40
         LCALL   DISIGN1
         MOV     RDELAY,#PWRSTB
         SJMP    PCOF1D
;
PCOF12:  MOV     RDELAY,#ADCVPR
PCOF1D:  MOV     A,RDELAY
         JNZ     PCOF1D
         MOV     R2,#94
         LCALL   SADLCD1
         LCALL   INPADC            ; READING
         LCALL   SHWADC1           ; SHOW IT
;
PCOF14:  MOV     R1,#KBDBUF
         MOV     A,#80H
         XCH     A,@R1
         JB      A.7,PCOF12
         MOV     BEPDLY,#SHRTBP
         ANL     A,#1FH
         MOV     DPTR,#LEGNDS
         MOVC    A,@A+DPTR
         CJNE    A,#9FH,PCOF13     ; FUNC KEY
         SJMP    PCOFRET
PCOF13:  CJNE    A,#9EH,PCOF12     ; BACK SPACE
         LJMP    PCOFST
;
;    CLEAN UP
;
PCOFRET: LCALL   DISOFT
         MOV     R2,#0CH           ; SHUT CURSOR OF LCD 1
         LCALL   WCMLCD1
         MOV     R2,#0FH           ; SHOW CURSOR OF LCD 0
         LCALL   WCMLCD0
         JB      PSENSE,$3         ; CONTACT SENSING ON
         LCALL   ACTCTSN           ; TURN ON
         MOV     RDELAY,#RLYSTB
$2:      MOV     A,RDELAY          ; WAIT FOR RELAY TO
         JNZ     $2                ; STABLE
$3:      JNB     RESPRQ,$1         ; RESPONSE NOT REQUIRED
         SETB    SUCCES            ; SERIAL COMMAND DONE
         LCALL   SNDSTS
         CLR     RESPRQ
$1:      RET
;
PCOF20:                            ; AUTO ZEROING OFFSET
PCATOF:  MOV     WKACCD,VOFSTD     ; INIT
         MOV     WKACCH,VOFSTH
         MOV     WKACCL,VOFSTL
;
; TEST IF AUTO PROCESSING NEEDED
;
         LCALL   INPADC            ; READ ADC IN
         MOV     A,VADCTH
         JB      A.3,PCOF28        ; POSITIVE ADC
         CPL     A                 ; NEGATIVE ADC
         MOV     VADCIH,A
         MOV     A,VADCIL
```

```
         CPL     A
         MOV     VADCIL,A
PCOF28:  MOV     A,VADCIH
         ANL     A,#07H
         CJNE    A,#0,PCOF21      ; ADC != 0
         MOV     A,#01H
         CJNE    A,VADCIL,$3
$3:      JC      PCOF21           ; ADC > 1
         LJMP    PCOF11           ; ADC < 1 --> EXIT
;
; START AUTO PROCESSING
;
PCOF21:  MOV     VOFSTD,#02H      ; INIT
         MOV     VOFSTH,#00H
         MOV     VOFSTL,#00H
         MOV     CNVNUM,#12
;
;  TEST LOOP CONDITION
;
PCOF22:  SETB    WKASGN           ; PWR ALWAYS POSITIVE
         MOV     WKACCD,VOFSTD
         MOV     WKACCH,VOFSTH
         MOV     WKACCL,VOFSTL
         DJNZ    CNVNUM,PCOF23    ; SUCCESSIVE APROXIMATION
         LJMP    PCOF11           ; END --> EXIT
;
; SUCCESIVE APPROXIMATION
;
PCOF23:  LCALL   OPOFST           ; LOOP AGAIN
         MOV     R2,#72           ; SHOW NUMBER ON LCD 1
         LCALL   SADLCD1          ; WKACCD,WKACCH,WKACCL
         LCALL   SHWOFS1          ; SPECIAL ROUTINE FOR VOFST
         MOV     RDELAY,#ADCVPR
$1:      MOV     A,RDELAY
         JNZ     $1
         MOV     R2,#94
         LCALL   SADLCD1
         LCALL   INPADC           ; READ ADC IN
         LCALL   SHWADC1          ; SHOW IT
         MOV     RDELAY,#ADCVPR
$2:      MOV     A,RDELAY
         JNZ     $2
         MOV     A,VADCIH
         MOV     CTD,A            ; SAVE FOR TEST SIGN
         JB      A.3,PCOF29       ; POSITIVE ADC
         CPL     A                ; NEGATIVE ADC
         MOV     VADCIH,A
         MOV     A,VADCIL
         CPL     A
         MOV     VADCIL,A
PCOF29:  MOV     A,VADCIH
         ANL     A,#07H
         CJNE    A,#0,PCOF24      ; ADC != 0
         MOV     A,#01H
         CJNE    A,VADCIL,$3
$3:      JC      PCOF24           ; ADC > 1
         LJMP    PCOF11           ; ADC < 1 --> EXIT
;
PCOF24:  MOV     R2,CNVNUM        ; ROTATE TO PRODUCE
         SETB    C                ; BIT PATTERN
         CLR     A                ; TO BE ADD OR SUBTRACT
         MOV     WKACCD,A         ; FROM VOFST...
         MOV     WKACCH,A
         MOV     WKACCL,A
PCOF25:  MOV     A,WKACCL         ; ROTATE
         RLC     A
         MOV     WKACCL,A
         MOV     A,WKACCH
         RLC     A
         MOV     WKACCH,A
         DJNZ    R2,PCOF25
         LCALL   HEXBCD           ; CONVERT BIT PATTERN
;
PCOF26:  MOV     R0,#VOFSTL       ; TO HALF STEP VOLTAGE
         MOV     R1,#WKACCL
         MOV     A,CTD            ; ADC > 0
         JB      A.3,PCOF27       ; YES
         SETB    WKASGN           ; ADC < 0
         SJMP    PCOF2A
PCOF27:  CLR     WKASGN
PCOF2A:  SETB    SGNFG0
         MOV     C,WKASGN
         MOV     SGNFG1,C
         LCALL   BCDAD3
         LJMP    PCOF22           ; TEST LOOP COND.
;
OFMSG1:  ASCII   Pico Power Supply: 17.952 to 22.048 VOLT|
         ASCII   Set to:        V. ADC Reading:        V.|
OFMSG2:  ASCII   Viewing ADC,Press BS Reedit,or FUNC Stop|
;
;-------------------------------------------------
;
PROC02:                           ;     2
         MOV     C,PFAST          ; SAVE FAST MODE
         MOV     F0,C
         MOV     R2,#0CH          ; SHUT CURSOR OF LCD 0
         LCALL   WCMLCD0
         LCALL   CLRLCD1
         MOV     R2,#0FH          ; SHOW CURSOR OF LCD 1
         LCALL   WCMLCD1
         MOV     R2,#64           ; SHOW OFFSET VOLTAGE MSG
         LCALL   SADLCD1
         MOV     DPTR,#ADMSG1
         MOV     R3,#40
         LCALL   DISIGN1
         JNB     PSENSE,PCAD03    ; CONTACT SENSING OFF
         LCALL   ACTCTSN          ; TURN OFF
         MOV     RDELAY,#RLYSTB
$2:      MOV     A,RDELAY         ; WAIT FOR RELAY TO
         JNZ     $2               ; STABLE
         JNB     F0,PCAD10        ; TO FAST MODE
         SJMP    PCAD03   ; SKIP DELAY FOR THE FIRST TIME
;
PCAD00:  MOV     RDELAY,#ADCVPR
$1:      MOV     A,RDELAY
         JNZ     $1
PCAD03:  MOV     R2,#77
         LCALL   SADLCD1
         LCALL   INPADC           ; READING
         LCALL   SHWADC1          ; SHOW IT
         JNB     RESPRQ,PCAD01    ; LOCAL HANDLE DIFFERENT
         LCALL   SNDSTS           ; DISPLAY ON REMOTE
         SETB    TI
         JNB     MVABRT,PCAD00
         SJMP    PCADRET          ; ABORT BY RS232
;
PCAD01:  MOV     R1,#KBDBUF
         MOV     A,#80H
```

```
        XCH     A,@R1
        JB      A.7,PCAD00
        MOV     BEPDLY,#SHRTBP
        ANL     A,#1FH
        MOV     DPTR,#LEGNDS
        MOVC    A,@A+DPTR
        CJNE    A,#9FH,PCAD00   ; FUNC KEY
;
;   CLEAN UP
;
PCADRET: LCALL  DISOFT
        MOV     R2,#0CH         ; SHUT CURSOR OF LCD 1
        LCALL   WCMLCD1
        MOV     R2,#0FH         ; SHOW CURSOR OF LCD 0
        LCALL   WCMLCD0
        JB      PSENSE,$3       ; CONTACT SENSING ON
        LCALL   ACTCTSN         ; TURN ON
        MOV     RDELAY,#RLYSTB
$2:     MOV     A,RDELAY        ; WAIT FOR RELAY TO
        JNZ     $2              ; STABLE
$3:     JNB     RESPRQ,$1       ; RESPONSE NOT REQUIRED
        SETB    SUCCES          ; SERIAL COMMAND DONE
        LCALL   SNDSTS
        CLR     RESPRQ
$1:     RET
;
;    FAST HANDLING
;
PCAD10: MOV     R2,#77
        LCALL   SADLCD1
        LCALL   INPADC          ; GET DVM VALUE
        LCALL   SHWADC1
        JB      RESPRQ,PCADRET  ; NO LOCAL ACK NEEDED
;
PCAD11: LCALL   KBDIN
        CJNE    A,#9FH,PCAD11   ; FUNC KEY
        SJMP    PCADRET
;
ADMSG1: ASCII   ADC Reading :        Volts.
;
;-------------------------------------------------
;
PROC03:                         ;     3
        JNB     PFAST,PCSN00    ; FAST MODE
;
        CLR     SILENT          ; ENABLE SOUND
PCSN02: JNB     RESPRQ,PCSN01   ; RESPONSE NOT REQUIRED
        SETB    SUCCES          ; SERIAL COMMAND DONE
        LCALL   SNDSTS
        CLR     RESPRQ
PCSN01: RET
;
PCSN00: SETB    SILENT          ; DISABLE SOUND
        SJMP    PCSN02
;
;-------------------------------------------------
;
;   CALL THIS TO SETUP PARAMETERS FOR OPERATION
;
;   CURRENT SUPPORT :
;      FAST DELAY :             '4'+'1,'+'axis,'+'dd'+','
;      MEDIUM TABLE ENTRY :       '4'+'2,'+'dd'+','
;      MEDIUM ONE HOUP STEP # :   '4'+'3,'+'dd'+','
;
;   ANYTHING ELSE WILL BE IGNORED, THIS WILL CAUSE
;      TROUBLE. THIS WILL BE FIXED IF I WOULD BE
;      ALLOWED TO DO ENHANCEMENTS.
;
PROC04:                         ;     4
PROCSU:
;
;   INIT PREPARATIONS AND SHOW MESSAGE
;
        MOV     R2,#0CH         ; SHUT OFF CURSOR LCD 0
        LCALL   WCMLCD0
        LCALL   CLRLCD1
        MOV     R2,#0FH         ; SHOW CURSOR OF LCD 1
        LCALL   WCMLCD1
        MOV     R2,#0           ; SHOW SETUP MSG
        LCALL   SADLCD1
        MOV     DPTR,#SUMSG1
        MOV     R3,#80
        LCALL   DISIGN1
;
;    COLLECT ITEM NUMBER PARAMETER
;
PCSU00: MOV     R2,#99          ; SHOW DEFAULT CHOICE
        LCALL   SADLCD1
        MOV     A,#DFTCHO
        MOV     CTD,A
        MOV     R4,A
        LCALL   DISBYT1
;
PCSU01: LCALL   KBDIN           ; GET CHOICE
        CJNE    A,#9EH,PCSU02   ; BACK SPACE EDITING
        SJMP    PCSU00
PCSU02: CJNE    A,#9FH,PCSU03   ; FUNCTION ABORT
        LJMP    PCSURET
PCSU03: CJNE    A,#9AH,PCSU04   ; NEXT TERMINATOR
        SJMP    PCSU10
PCSU04: CJNE    A,#9BH,PCSU05   ; '.' TERMINATOR
        SJMP    PCSU10
PCSU05: ANL     A,#3H           ; INPUT 1 TO 3
        MOV     CTH,A           ; SAVE
        JZ      PCSU01          ; ZERO NOT ALLOWED
        MOV     R2,#99          ; SHOW CURRENT CHOICE
        LCALL   SADLCD1
        MOV     A,CTH           ; RESTORE
        MOV     CTD,A
        MOV     R4,A            ; SHOW ON LCD 1
        LCALL   DISBYT1
        SJMP    PCSU01
;
;   FIRST LEVEL SOFT MENU EXPANSION
;
PCSU10: MOV     A,CTD           ; GET CHOICE
        CJNE    A,#2,PCSU11
        LJMP    PCSU30          ; PROCESS MEDIUM SPEED
PCSU11: CJNE    A,#3,PCSU12
        LJMP    PCSU40          ; PROCESS MEDIUM DIST.
;
; ---------------------------------------------------
;
; PROCESSING OF FIRST CHOICE : FAST DELAY
;
PCSU12: MOV     R2,#0           ; PROCESS FAST DELAY
        LCALL   SADLCD1
        MOV     DPTR,#SUMSG2    ; SHOW CURRENT AXIS
```

```
         MOV      R3,#80
         LCALL    DISIGN1
;
;   HANDLE FAST DELAY AXIS PARAMETER COLLECTION
;
PCSU13:  MOV      R2,#99           ; SHOW DEFAULT AXIS
         LCALL    SADLCD1
         MOV      A,#DFTAXI
         MOV      CTD,A
         MOV      R4,A
         LCALL    DISBYT1
;
PCSU14:  LCALL    KBDIN            ; GET CHOICE
         CJNE     A,#9EH,PCSU15    ; BACK SPACE EDITING
         SJMP     PCSU13
PCSU15:  CJNE     A,#9FH,PCSU16    ; FUNCTION ABORT
         LJMP     PCSURET
PCSU16:  CJNE     A,#9AH,PCSU17    ; NEXT TERMINATOR
         SJMP     PCSU1A
PCSU17:  CJNE     A,#9BH,PCSU18    ; '.' TERMINATOR
         SJMP     PCSU1A
PCSU18:  ANL      A,#3H            ; INPUT 1 TO 3
         JZ       PCSU14           ; ZERO NOT ALLOWED
         MOV      CTH,A            ; SAVE
         MOV      R2,#99           ; SHOW CURRENT CHOICE
         LCALL    SADLCD1
         MOV      A,CTH            ; RESTORE
         MOV      CTD,A
         MOV      R4,A             ; SHOW ON LCD 1
         LCALL    DISBYT1
         SJMP     PCSU14
;
;   PREPARE DELAY ADDRESS
;
PCSU1A:  MOV      R2,#0
         LCALL    SADLCD1
         MOV      DPTR,#SUMSG3     ; SHOW CURRENT DELAY
         MOV      R3,#80
         LCALL    DISIGN1
;
         MOV      A,#XFSDLO        ; BASE
         ADD      A,CADROF         ; OFFSET
         ADD      A,CTD            ; GET CHOICE
         DEC      A
         MOV      R1,A             ; POINT TO RIGHT LOC
         MOV      CTH,A            ; SAVE ADDR PTR
;
;   HANDLE FAST DELAY DELAY PARAMETER COLLECTION
;
PCSU1E:  MOV      R2,#99           ; SHOW DEFAULT AXIS
         LCALL    SADLCD1
         MOV      R1,CTH           ; GET ADDR PTR
         MOVX     A,@R1            ; SHOW CURRENT DELAY
         MOV      CTD,A
         MOV      R4,A
         LCALL    DISBYT1
         CLR      F0               ; NO NUMBER IN
;
PCSU1F:  LCALL    KBDIN            ; GET DELAY INPUT
         CJNE     A,#9EH,PCSU20    ; BACK SPACE EDITING
         SJMP     PCSU1E
PCSU20:  CJNE     A,#9FH,PCSU21    ; FUNCTION ABORT
         LJMP     PCSURET
PCSU21:  CJNE     A,#9AH,PCSU22    ; NEXT TERMINATOR
         SJMP     PCSU25
PCSU22:  CJNE     A,#9BH,PCSU23    ; '.' TERMINATOR
         SJMP     PCSU25
PCSU23:  JB       F0,PCSU24        ; IS FIRST DIGIT
         MOV      CTL,A            ; SAVE IT
         CLR      A                ; WHIP DISPLAY
         MOV      R1,#CTD          ; PUT INTO TMP BUF
         MOV      R2,#1
         MOV      R4,A
         LCALL    INPUT1           ; DO IT
         SETB     F0               ; SET NUMBER IN
         MOV      A,CTL            ; RETRIEVE
PCSU24:  ANL      A,#0FH           ; GET DIGIT
         MOV      R4,A             ; TMP IN BUF
         MOV      R1,#CTD          ; PUT INTO TMP BUF
         MOV      R2,#1
         LCALL    INPUT1           ; DO IT
         MOV      R2,#99           ; SHOW CURRENT CHOICE
         LCALL    SADLCD1
         MOV      A,CTD            ; INPUT 01 TO FF
         MOV      R4,A             ; SHOW ON LCD 1
         LCALL    DISBYT1
         SJMP     PCSU1F
;
;   PUT DELAY INTO DATA STRUCTURE
;
PCSU25:  MOV      R1,CTH           ; GET PTR
         MOV      A,CTD            ; GET NEW VALUE
         JNZ      PCSU26           ; ZERO INPUT NOT ALLOWED
         MOV      A,#DFFSDL
PCSU26:  MOVX     @R1,A            ; UPDATE TO FINAL
         LJMP     PCSURET          ; DONE
;
; ----------------------------------------------------------
;
;  PROCESSING OF SECOND CHOICE : MEDIUM TABLE ENTRY
;
PCSU30:  MOV      R2,#0            ; PROCESS MD TB ENTRY
         LCALL    SADLCD1
         MOV      DPTR,#SUMSG4     ; SHOW MSG
         MOV      R3,#80
         LCALL    DISIGN1
;
;   PREPARE MEDIUM TABLE ENTRY ADDRESS
;
         MOV      R1,#MDTBEN       ; POINT TO RIGHT LOC
         MOV      CTH,R1           ; SAVE ADDR PTR
;
;   HANDLE MEDIUM TABLE ENTRY PARAMETER COLLECTION
;
PCSU31:  MOV      R2,#99           ; SHOW DEFAULT ENTRY
         LCALL    SADLCD1
         MOV      R1,CTH           ; GET ADDR PTR
         MOVX     A,@R1            ; SHOW CURRENT #
         MOV      CTD,A
         MOV      R4,A
         LCALL    DISBYT1
         CLR      F0               ; NO NUMBER IN
;
PCSU32:  LCALL    KBDIN            ; GET ENTRY INPUT
         CJNE     A,#9EH,PCSU33    ; BACK SPACE EDITING
         SJMP     PCSU31
PCSU33:  CJNE     A,#9FH,PCSU34    ; FUNCTION ABORT
         LJMP     PCSURET
```

```
PCSU34:   CJNE    A,#9AH,PCSU35    ; NEXT TERMINATOR
          SJMP    PCSU38
PCSU35:   CJNE    A,#9BH,PCSU36    ; '.' TERMINATOR
          SJMP    PCSU38
PCSU36:   JB      F0,PCSU37        ; IS FIRST DIGIT
          MOV     CTL,A            ; SAVE IT
          CLR     A                ; WHIP DISPLAY
          MOV     R1,#CTD          ; PUT INTO TMP BUF
          MOV     R2,#1
          MOV     R4,A
          LCALL   INPUT1           ; DO IT
          SETB    F0               ; SET NUMBER IN
          MOV     A,CTL            ; RETRIEVE
PCSU37:   ANL     A,#0FH           ; GET DIGIT
          MOV     R4,A             ; TMP IN BUF
          MOV     R1,#CTD          ; PUT INTO TMP BUF
          MOV     R2,#1
          LCALL   INPUT1           ; DO IT
          MOV     R2,#99           ; SHOW CURRENT CHOICE
          LCALL   SADLCD1
          MOV     A,CTD            ; INPUT 01 TO FF
          MOV     R4,A             ; SHOW ON LCD 1
          LCALL   DISBYT1
          SJMP    PCSU32
;
;    PUT TABLE ENTRY INTO DATA STRUCTURE
;
PCSU38:   MOV     R1,CTH           ; GET PTR
          MOV     A,CTD            ; GET NEW VALUE
          JNZ     PCSU39           ; ZERO INPUT NOT ALLOWED
          MOV     A,#DFMDTE
PCSU39:   MOVX    @R1,A            ; UPDATE TO FINAL
          LJMP    PCSURET          ; DONE
;
;
; ------------------------------------------------------
;
;  PROCESSING OF THIRD CHOICE : MEDIUM HOP DISTANCE
;
PCSU40:   MOV     R2,#0            ; PROCESS MD STEP#
          LCALL   SADLCD1
          MOV     DPTR,#SUMSG5     ; SHOW MSG
          MOV     R3,#80
          LCALL   DISIGN1
;
;    PREPARE MEDIUM HOP STEP NUMBER ADDRESS
;
          MOV     R1,#MDSTNB       ; POINT TO RIGHT LOC
          MOV     CTH,R1           ; SAVE ADDR PTR
;
;    HANDLE MEDIUM HOP DISTANCE PARAMETER COLLECTION
;
PCSU41:   MOV     R2,#99           ; SHOW DEFAULT STEP#
          LCALL   SADLCD1
          MOV     R1,CTH           ; GET ADDR PTR
          MOVX    A,@R1            ; SHOW CURRENT #
          MOV     CTD,A
          MOV     R4,A
          LCALL   DISBYT1
          CLR     F0               ; NO NUMBER IN
;
PCSU42:   LCALL   KBDIN            ; GET STEP# INPUT
          CJNE    A,#9EH,PCSU43    ; BACK SPACE EDITING
          SJMP    PCSU41
```

```
PCSU43:   CJNE    A,#9FH,PCSU44    ; FUNCTION ABORT
          LJMP    PCSURET
PCSU44:   CJNE    A,#9AH,PCSU45    ; NEXT TERMINATOR
          SJMP    PCSU48
PCSU45:   CJNE    A,#9BH,PCSU46    ; '.' TERMINATOR
          SJMP    PCSU48
PCSU46:   JB      F0,PCSU47        ; IS FIRST DIGIT
          MOV     CTL,A            ; SAVE IT
          CLR     A                ; WHIP DISPLAY
          MOV     R1,#CTD          ; PUT INTO TMP BUF
          MOV     R2,#1
          MOV     R4,A
          LCALL   INPUT1           ; DO IT
          SETB    F0               ; SET NUMBER IN
          MOV     A,CTL            ; RETRIEVE
PCSU47:   ANL     A,#0FH           ; GET DIGIT
          MOV     R4,A             ; TMP IN BUF
          MOV     R1,#CTD          ; PUT INTO TMP BUF
          MOV     R2,#1
          LCALL   INPUT1           ; DO IT
          MOV     R2,#99           ; SHOW CURRENT CHOICE
          LCALL   SADLCD1
          MOV     A,CTD            ; INPUT 01 TO FF
          MOV     R4,A             ; SHOW ON LCD 1
          LCALL   DISBYT1
          SJMP    PCSU42
;
;    PUT STEP# INTO DATA STRUCTURE
;
PCSU48:   MOV     R1,CTH           ; GET PTR
          MOV     A,CTD            ; GET NEW VALUE
          JNZ     PCSU49           ; ZERO INPUT NOT ALLOWED
          MOV     A,#DFMDNS
PCSU49:   MOVX    @R1,A            ; UPDATE TO FINAL
          LJMP    PCSURET          ; DONE
;
; ------------------------------------------------------
;
;    CLEAN UP
;
PCSURET:  LCALL   DISOFT
          MOV     R2,#0CH          ; SHUT CURSOR OF LCD 1
          LCALL   WCMLCD1
          MOV     R2,#0FH          ; SHOW CURSOR OF LCD 0
          LCALL   WCMLCD0
          JNB     RESPRQ,$1        ; RESPONSE NOT REQUIRED
          SETB    SUCCES           ; SERIAL COMMAND DONE
          LCALL   SNDSTS
          CLR     RESPRQ
$1:       RET
;
SUMSG1:   ASCII   Enter '1' for FAST speed, '2' for medium|
          ASCII   speed, '3' for houp dist.   Choice:     |
SUMSG2:   ASCII   Enter '1' for X axis, '2' for Y axis,   |
          ASCII   '3' for Z axis.            Choice:      |
SUMSG3:   ASCII   Enter '01' to 'FF' for FAST speed delay,|
          ASCII   '30' equals 144 NOP delay.  Choice:     |
SUMSG4:   ASCII   Enter '01' to 'FF' for MEDIUM top speed,|
          ASCII   'FF' equals FAST top speed. Choice:     |
SUMSG5:   ASCII   Enter '01' to 'FF' for MEDIUM houp dist.|
          ASCII   'FF' equals FAST houp dist. Choice:     |
;
;------------------------------------------------
;
```

```
;     CALL THIS TO TOGGLE REMOTE BIT
;
;     FIRST CONCRN IS ONCE LOCK OUT, YOU CAN NOT
;       UNLOCK IT FROM KEYBOARD.
;
;     FIRST CONCRN IS WHEN POWER UP IT WILL BE ZEROD,
;       SO IT HAS TO BE HIGH ACTIVE, YOU WILL NOT BE
;       LOCK OUT FROM INIT.
;
;     THERE IS A CONCERN HOWEVER THAT A SEPERATE
;       CONTROL FOR ON/OFF WILL BE MORE DESIRABLE
;       BECAUSE THEN YOU WON'T NEED TO LOOK AT
;       THE STATUS TO DETERMINE WHICH STATE YOU ARE.
;
PROC05:                                ;     5
          JNB      PFAST,PCRM01        ; FAST MODE
;
          CLR      REMOTE              ; LOCAL ENABLE
PCRM00:   JNB      RESPRQ,$1           ; RESPONSE NOT REQUIRED
          SETB     SUCCES              ; SERIAL COMMAND DONE
          LCALL    SNDSTS
          CLR      RESPRQ
$1:       RET
;
PCRM01:   SETB     REMOTE              ; REMOTE ENABLE/LOCAL
          SJMP     PCRM00              ; LOCKOUT
;
;-------------------------------------------------
;
;     CALL THIS TO SET UP THE THRESHOLD VOLTAGE.
;
PROC06:                                ;     6
PROCTH:
;
;     INIT PREPARATIONS AND SHOW MESSAGE
;
          MOV      R2,#0CH             ; SHUT CURSOR OF LCD 0
          LCALL    WCMLCD0
          LCALL    CLRLCD1
          MOV      R2,#0FH             ; SHOW CURSOR OF LCD 1
          LCALL    WCMLCD1
          MOV      R2,#0               ; SHOW THRESHOLD VOLTAGE
          LCALL    SADLCD1             ; MSG
          MOV      DPTR,#THMSG1
          MOV      R3,#80
          LCALL    DISIGN1
;
;     COLLECT INTEGER VLOTAGE PARAMETERS
;
PCTH00:   MOV      C,THRSGN
          MOV      WKASGN,C
          MOV      WKACCH,VTHRH
          MOV      WKACCL,VTHRL
          MOV      R2,#92              ; SHOW NUMBER ON LCD 1
          LCALL    SADLCD1             ; WKASGN,WKACCH,WKACCL
          LCALL    SHWTHR1             ; SPECIAL ROUTINE FOR VTHR
          LCALL    OPTTHR
PCTH01:   LCALL    KBDIN
          CJNE     A,#9EH,PCTH02       ; BACK SPACE EDITING
          SJMP     PCTH00
PCTH02:   CJNE     A,#9FH,PCTH03       ; ABORT
          MOV      C,THRSGN
          MOV      WKASGN,C
          MOV      WKACCH,VTHRH
          MOV      WKACCL,VTHRL
          LJMP     PCTH11              ; RESTORE
PCTH03:   CJNE     A,#9BH,PCTH04       ; IS DECIMAL POINT
          SJMP     PCTH01
PCTH04:   CJNE     A,#9AH,PCTH05       ; IS FINISH
          LJMP     PCTH10
PCTH05:   CJNE     A,#98H,PCTH06       ; IS -
          SJMP     PCTH07
PCTH06:   CJNE     A,#99H,PCTH08       ; IS +
          SJMP     PCTH0E
PCTH08:   CJNE     A,#91H,PCTH0A       ; IS  UP
          SJMP     PCTH0B
PCTH0A:   CJNE     A,#92H,PCTH0C       ; IS DOWN
          SJMP     PCTH0D
PCTH0C:   ANL      A,#0FH              ; GET NUM KEY
          CJNE     A,#0AH,$1
$1:       JNC      PCTH01              ; NOT DECIMAL
          MOV      R4,A
          MOV      R1,#WKACCL          ; PUT DIGIT INTO
          LCALL    INPUT0              ; RIGHT ENTRY BUFFER
PCTH09:   MOV      R2,#92              ; SHOW NUMBER ON LCD 1
          LCALL    SADLCD1
          LCALL    SHWTHR1
          LCALL    OPTTHR
          SJMP     PCTH01
;
PCTH07:   CLR      WKASGN
          SJMP     PCTH09
;
PCTH0E:   SETB     WKASGN
          SJMP     PCTH09
;
PCTH0B:   SETB     TPRSGN              ; +
          JNB      PFAST,PCTH15        ; FAST MODE
          MOV      TPREGH,#00H
          MOV      TPREGL,#10H
          SJMP     PCTH16
PCTH15:   MOV      TPREGH,#05H
          MOV      TPREGL,#00H
PCTH16:   MOV      R0,#WKACCL
          MOV      R1,#TPREGL
          MOV      C,WKASGN
          MOV      SGNFG0,C
          MOV      C,TPRSGN
          MOV      SGNFG1,C
          LCALL    BCDADD      ; INC 0.010 TO WKACCH, L
          MOV      C,SGNFG0
          MOV      WKASGN,C
          SJMP     PCTH09
;
PCTH0D:   CLR      TPRSGN              ; -
          JNB      PFAST,PCTH17        ; FAST MODE
          MOV      TPREGH,#00H
          MOV      TPREGL,#10H
          SJMP     PCTH18
PCTH17:   MOV      TPREGH,#05H
          MOV      TPREGL,#00H
PCTH18:   MOV      R0,#WKACCL
          MOV      R1,#TPREGL
          MOV      C,WKASGN
          MOV      SGNFG0,C
          MOV      C,TPRSGN
          MOV      SGNFG1,C
          LCALL    BCDADD      ; DEC 0.010 TO WKACCH, L
```

```
        MOV     C,SGNFG0
        MOV     WKASGN,C
        SJMP    PCTH09
;
;   CALCULATE AND OUTPUT TO PORT 8800H
;    VALUE STORE IN THRSGN,VTHRH,VTHRL
;    IN DECIMAL FORMAT.
;
PCTH10: MOV     C,WKASGN
        MOV     THRSGN,C
        MOV     VTHRH,WKACCH
        MOV     VTHRL,WKACCL
PCTH11: LCALL   OPTTHR          ;,CALCULATE AND OUTPUT
;
;   CLEAN UP
;
PCTHRET: LCALL  DISOFT
        MOV     R2,#0CH         ; SHUT CURSOR OF LCD 1
        LCALL   WCMLCD1
        MOV     R2,#0FH         ; SHOW CURSOR OF LCD 0
        LCALL   WCMLCD0
        JNB     RESPRQ,$1       ; RESPONSE NOT REQUIRED
        SETB    SUCCES          ; SERIAL COMMAND DONE
        LCALL   SNDSTS
        CLR     RESPRQ
$1:     RET
;
THMSG1: ASCII   Input Range :     +9.999 to -9.999 VOLT |
        ASCII   Set Threshold Voltage to :         VOLT |
;
;--------------------------------------------------
;
;   CALL THIS TO SET UP THE Z FLOOR LIMIT FOR
;    ALL PS #.
;
PROC07:                         ;     7
;
;   INIT PREPARATIONS AND SHOW MESSAGE
;
        MOV     R2,#0CH         ; SHUT CURSOR OF LCD 0
        LCALL   WCMLCD0
        LCALL   CLRLCD1
        MOV     R2,#0FH         ; SHOW CURSOR OF LCD 1
        LCALL   WCMLCD1
        MOV     R2,#64          ; SHOW MOVE TO MSG
        LCALL   SADLCD1
        MOV     DPTR,#ZFMSG1
        MOV     R3,#40
        LCALL   DISIGN1
PCZF03: MOV     R2,#81
        LCALL   SADLCD1
        MOV     A,#ZMXPH0       ; BASE
        ADD     A,CADROF        ; ADD OFFSET
        MOV     R0,A            ; POINT TO #N ADDRESS
        MOVX    A,@R0
        MOV     CTH,A
        MOV     R4,A
        INC     R0              ; ZMXPL0 + OFFSET
        MOVX    A,@R0
        MOV     CTL,A
        MOV     R5,A
        LCALL   DISHEX1
;
;   COLLECT Z FLOOR LIMIT PARAMETERS
;
PCZF00: LCALL   KBDIN
        CJNE    A,#9EH,PCZF20   ; BACK SPACE EDITING
        SJMP    PCZF03
PCZF20: CJNE    A,#9FH,PCZF21   ; ABORT
        LJMP    PCZFRET
PCZF21: CJNE    A,#9AH,PCZF01   ; IS NEXT
        SJMP    PCZF02
PCZF01: ANL     A,#0FH          ; GET NUM KEY
        MOV     R4,A            ; TMP IN BUF
        LCALL   INPADR          ; RIGHT ENTRY 2 BYTES
        MOV     R2,#81          ; SHOW NUMBER ON LCD 1
        LCALL   SADLCD1
        MOV     R4,CTH
        MOV     R5,CTL
        LCALL   DISHEX1
        SJMP    PCZF00
;
;   CHECK AGAINST MAXIMUM BOUNDARY
;
PCZF02: MOV     A,CTH
        CJNE    A,#>MAXZLM,PCZF05
        SJMP    PCZF08
PCZF05: JC      PCZF06          ; (A)-(CTH) < MAXZLM OK!
        SJMP    PCZF09          ; (CTH) > MAXZLM
PCZF08: MOV     A,CTL           ; (CTH) = MAXZLM
        CJNE    A,#<MAXZLM,PCZF07
        SJMP    PCZF06          ; (A)-(CTL) = MAXZLM
PCZF07: JC      PCZF06          ; (CTH,CTL) < MAXZLM OK!
PCZF09: MOV     CTH,#>MAXZLM
        MOV     CTL,#<MAXZLM
;
;   SET LIMIT TO EACH LOCATION
;
PCZF06: MOV     R1,#ZMXPH0
        MOV     R2,#5
PCZF04: MOV     A,CTH
        MOVX    @R1,A           ; ZMXPH0 + OFFSET
        INC     R1
        MOV     A,CTL
        MOVX    @R1,A           ; ZMXPL0 + OFFSET
        MOV     A,R1
        ADD     A,#LENSTR       ; NEXT PS #
        MOV     R1,A
        DJNZ    R2,PCZF04
;
        LCALL   XFRLMT          ; TRANSFER NEW LIMIT
                                ; INTO 12-BYTE INT RAM
;
;   CLEAN UP
;
PCZFRET: LCALL  DISOFT
        MOV     R2,#0CH         ; SHUT CURSOR OF LCD 1
        LCALL   WCMLCD1
        MOV     R2,#0FH         ; SHOW CURSOR OF LCD 0
        LCALL   WCMLCD0
        JNB     RESPRQ,$1       ; RESPONSE NOT REQUIRED
        SETB    SUCCES          ; SERIAL COMMAND DONE
        LCALL   SNDSTS
        CLR     RESPRQ
$1:     RET
;
ZFMSG1: ASCII   Z FLOOR LIMIT :
;
```

```
;-------------------------------------------------
;
;    CALL THIS TO MOVE POSITIONER A NUMBER OF
;      RELATIVE STEPS. THE NUMBER OF THREE
;      COORDINATES ARE ENTERED IN 2'S COMPLEMENT
;      FORM. IT CAN BE ELABERATE LATER.
;   AFTER THE NUMBER ARE IN THE TMP, LONG JMP TO
;      PRMV08, SO THAT BOTH SHARE THE NEXT HALF
;      OF THE PROGRAM.
;   THIS IS POSSIBLE BECAUSE MY PROGRAM ARE ACTUALLY
;      INPLEMENTED IN RELATIVE MOVE, INSTEAD OF
;       ABSOLUTE MOVE.
;
PROCOB:                               ;    B
PCMRLT:
;
;    PROC MOVE RELATIVE 0.0   ----   INIT PREPARATIONS
;
            JB      PFAST,PCMR1E     ; FAST OR MEDIUM
            LJMP    PCMDRL
PCMR1E:     MOV     R2,#0CH          ; SHUT CURSOR OF LCD 0
            LCALL   WCMLCD0
            LCALL   CLRLCD1
            MOV     R2,#0FH          ; SHOW CURSOR OF LCD 1
            LCALL   WCMLCD1
            MOV     R2,#64           ; SHOW MOVE RELATIVE
            LCALL   SADLCD1          ; TO MSG
            MOV     DPTR,#MRMSG1
            MOV     R3,#40
            LCALL   DISIGN1
;
;    PROC MOVE RELATIVE 0.1   ----   COLLECT X PARAMETERS
;
PCMR2F:     CLR     A
            MOV     CTH,A
            MOV     CTL,A            ; INIT POS CNT
            MOV     R2,#81           ; SHOW NUMBER ON LCD 1
            LCALL   SADLCD1
            MOV     R4,CTH
            MOV     R5,CTL
            LCALL   DISHEX1
PCMR00:     LCALL   KBDIN
            CJNE    A,#9EH,PCMR20    ; BACK SPACE EDITING
            SJMP    PCMR2F
PCMR20:     CJNE    A,#9FH,PCMR21    ; ABORT
            LJMP    PRMVRET
PCMR21:     CJNE    A,#9AH,PCMR01    ; IS NEXT
            MOV     A,CTL
            MOV     NXTMPL,A
            MOV     A,CTH
            MOV     NXTMPH,A
            SJMP    PCMR02
PCMR01:     ANL     A,#0FH           ; GET NUM KEY
            MOV     R4,A             ; TMP IN BUF
            LCALL   INPADR           ; RIGHT ENTRY 2 BYTES
            MOV     R2,#81           ; SHOW NUMBER ON LCD 1
            LCALL   SADLCD1
            MOV     R4,CTH
            MOV     R5,CTL
            LCALL   DISHEX1
            SJMP    PCMR00
;
;    PROC MOVE RELATIVE 0.2   ----   COLLECT Y PARAMETERS
;
PCMR02:     CLR     A
            MOV     CTH,A
            MOV     CTL,A            ; INIT POS CNT
            MOV     R2,#90           ; SHOW NUMBER ON LCD 1
            LCALL   SADLCD1
            MOV     R4,CTH
            MOV     R5,CTL
            LCALL   DISHEX1
PCMR03:     LCALL   KBDIN
            CJNE    A,#9EH,PCMR22    ; BACK SPACE EDITING
            SJMP    PCMR2F
PCMR22:     CJNE    A,#9FH,PCMR23    ; ABORT
            LJMP    PRMVRET
PCMR23:     CJNE    A,#9AH,PCMR04    ; IS NEXT
            MOV     A,CTL
            MOV     NYTMPL,A
            MOV     A,CTH
            MOV     NYTMPH,A
            SJMP    PCMR05
PCMR04:     ANL     A,#0FH           ; GET NUM KEY
            MOV     R4,A             ; TMP IN BUF
            LCALL   INPADR           ; RIGHT ENTRY 2 BYTES
            MOV     R2,#90           ; SHOW NUMBER ON LCD 1
            LCALL   SADLCD1
            MOV     R4,CTH
            MOV     R5,CTL
            LCALL   DISHEX1
            SJMP    PCMR03
;
;    PROC MOVE RELATIVE 0.3   ----   COLLECT Z PARAMETERS
;
PCMR05:     CLR     A
            MOV     CTH,A
            MOV     CTL,A            ; INIT POS CNT
            MOV     R2,#99           ; SHOW NUMBER ON LCD 1
            LCALL   SADLCD1
            MOV     R4,CTH
            MOV     R5,CTL
            LCALL   DISHEX1
PCMR06:     LCALL   KBDIN
            CJNE    A,#9EH,PCMR24    ; BACK SPACE EDITING
            SJMP    PCMR02
PCMR24:     CJNE    A,#9FH,PCMR25    ; ABORT
            LJMP    PRMVRET
PCMR25:     CJNE    A,#9AH,PCMR07    ; IS NEXT
            MOV     A,CTL
            MOV     NZTMPL,A
            MOV     A,CTH
            MOV     NZTMPH,A
            SJMP    PCMR08
PCMR07:     ANL     A,#0FH           ; GET NUM KEY
            MOV     R4,A             ; TMP IN BUF
            LCALL   INPADR           ; RIGHT ENTRY 2 BYTES
            MOV     R2,#99           ; SHOW NUMBER ON LCD 1
            LCALL   SADLCD1
            MOV     R4,CTH
            MOV     R5,CTL
            LCALL   DISHEX1
            SJMP    PCMR06
;
PCMR08:     LJMP    PRMV08           ; SHARED WITH PCMOVE
;
MRMSG1:     ASCII   Move Relative X:    0. Y:    0. Z:    0.|
;
```

```
;-------------------------------------------------
;
;    CALL THIS TO SELECT THE NEXT POSITIONER
;      WHICH IS TO BE ACTIVATED.
;
;    INPUT 'C'+',' OR 'C'+'#'+ ','
;
PROCOC:                              ;     C
;
;    INIT PREPARATIONS AND SHOW MESSAGE
;
          MOV     R2,#0CH            ; SHUT CURSOR OF LCD 0
          LCALL   WCMLCD0
          LCALL   CLRLCD1
          MOV     R2,#0FH            ; SHOW CURSOR OF LCD 1
          LCALL   WCMLCD1
          MOV     R2,#64             ; SHOW SELECT CURRENT
          LCALL   SADLCD1            ; POSITIONER MSG
          MOV     DPTR,#SLMSG1
          MOV     R3,#40
          LCALL   DISIGN1
;
;    COLLECT INTEGER POSITIONER NUMBER PARAMETERS
;
PCTL00:   MOV     R2,#87             ; SHOW CURRENT POS.
          LCALL   SADLCD1
          MOV     A,CPSNUM           ; GET IT
          CLR     F0                 ; SET NO NUMBER FLAG
          MOV     CTD,A              ; INIT SCRATCH PAD
          INC     A                  ; HUMAN INTERFACE
          MOV     R4,A               ; SHOW ON LCD 1
          LCALL   DISBYT1
;
PCTL01:   LCALL   KBDIN              ; GET PARAMETER
          CJNE    A,#9EH,PCTL02      ; BACK SPACE EDITING
          SJMP    PCTL00
PCTL02:   CJNE    A,#9FH,PCTL03      ; ABORT
          LJMP    PCTLRET
PCTL03:   CJNE    A,#9AH,PCTL04      ; IF NOT NEXT
          SJMP    PCTL10             ; FINISH INPUT, PROCESS IT
PCTL04:   SETB    F0                 ; NUMBER INPUTTED
          DEC     A                  ; INPUT 1-5
          ANL     A,#7H              ; ONLY 5 POSITIONERS
          MOV     CTH,A              ; SAVE TC
          CJNE    A,#5,$1            ; INPUT EXCEED 5 ?
$1:       JNC     PCTL01             ; YES, IGNORE INPUT
          MOV     R2,#87             ; SHOW CURRENT POS.
          LCALL   SADLCD1
          MOV     A,CTH              ; GET BACK
          MOV     CTD,A
          INC     A                  ; HUMAN INTERFACE
          MOV     R4,A               ; SHOW ON LCD 1
          LCALL   DISBYT1
          SJMP    PCTL01             ; UPDATE LCD
;
;
PCTL10:   JB      F0,PCTL11          ; HAS NUMBER INPUTTED ?
          INC     CPSNUM             ; NO NUMBER INPUTTED
          MOV     A,#5               ; CHECK FOR OVERFLOW
          CJNE    A,CPSNUM,PCTL12
          MOV     CPSNUM,#0          ; WRAP
          SJMP    PCTL12
PCTL11:   MOV     A,CTD              ; GET WHAT'S IN BUFFER
          MOV     CPSNUM,A           ; TAKE IT AS NEW P.N.
PCTL12:   LCALL   SELPST
;
;    CLEAN UP
;
PCTLRET:  LCALL   REPTST             ; UPDATE LCD 0
          LCALL   DISOFT             ; UPDATE LCD 1
          MOV     R2,#0CH            ; SHUT OFF CURSOR OF LCD 1
          LCALL   WCMLCD1
          MOV     R2,#0FH            ; TURN ON CURSOR OF LCD 0
          LCALL   WCMLCD0
          JNB     RESPRQ,$1          ; RESPONSE NOT REQUIRED
          SETB    SUCCES             ; SERIAL COMMAND DONE
          LCALL   SNDSTS
          CLR     RESPRQ
$1:       RET
;
SLMSG1:   ASCII   Current Positioner  :
;
;-------------------------------------------------
;
;    CALL THIS TO ERASE THE MARKS, SOLOLY FOR
;      DEBUG PUPOSE, CAN BE DONE WITH ICE.
;
PROCOD:                              ;     D
;
;      WHIPE RAM, TO TRIGGER COLD START
;
          JNB     PFAST,PCDL00       ; IS FAST/SHIFT KEY
          LCALL   STDLMT             ; RECOVER TRAVEL RANGE
          SJMP    $1
;
PCDL00:   MOV     DPTR,#1F00H        ; RAM SIZE 0000-1FFF
          MOV     A,#0FFH            ; TST PATTERN
PCDL01:   MOVX    @DPTR,A
          DJNZ    DPL,PCDL01
          DJNZ    DPH,PCDL01
$1:       RET
;
;-------------------------------------------------
;
;    CALL THIS TO MOVE THE CURRENT POSITIONER
;      TO THE CENTER OF ALL ITS THREE AXIS TRAVEL.
;
;    SOFTHOME ROUTINE:
;
PROCOE:                              ;     E
          MOV     R2,#0CH            ; SHUT CURSOR OF LCD 0
          LCALL   WCMLCD0
;
;    PREPARE X PARAMETERS
;
          MOV     A,#CXPSH0          ; BASE
          ADD     A,CADROF           ; ADD OFFSET
          MOV     R0,A
          MOVX    A,@R0
          MOV     NPSCTH,A           ; TEMP STORE
          INC     R0                 ; CXPSL0 + OFFSET
          MOVX    A,@R0
          MOV     NPSCTL,A           ; TEMP STORE
          CLR     C                  ; CALCULATE DIFFERENCE
          MOV     A,#<XCENTR
          SUBB    A,NPSCTL
          MOV     NXTMPL,A
          MOV     A,#>XCENTR
```

```
         SUBB    A,NPSCTH
         MOV     NXTMPH,A
;
;   PREPARE Y PARAMETERS
;
         MOV     A,#CYPSHO          ; BASE
         ADD     A,CADROF           ; ADD OFFSET
         MOV     R0,A
         MOVX    A,@R0
         MOV     NPSCTH,A           ; TEMP STORE
         INC     R0                 ; CYPSLO + OFFSET
         MOVX    A,@R0
         MOV     NPSCTL,A           ; TEMP STORE
         CLR     C                  ; CALCULATE DIFFERENCE
         MOV     A,#<YCENTR
         SUBB    A,NPSCTL
         MOV     NYTMPL,A
         MOV     A,#>YCENTR
         SUBB    A,NPSCTH
         MOV     NYTMPH,A
;
;   PREPARE Z PARAMETERS
;
         MOV     A,#CZPSHO          ; BASE
         ADD     A,CADROF           ; ADD OFFSET
         MOV     R0,A
         MOVX    A,@R0
         MOV     NPSCTH,A           ; TEMP STORE
         INC     R0                 ; CZPSLO + OFFSET
         MOVX    A,@R0
         MOV     NPSCTL,A           ; TEMP STORE
         CLR     C                  ; CALCULATE DIFFERENCE
         MOV     A,#<ZCENTR
         SUBB    A,NPSCTL
         MOV     NZTMPL,A
         MOV     A,#>ZCENTR
         SUBB    A,NPSCTH
         MOV     NZTMPH,A
;
PROEO8:  LJMP    PRMV08             ; SHARE NEXT HALF
;
;------------------------------------------------
;
;   CALL THIS TO SET ORIGIN.
;
PROCOF:                             ;     F
         MOV     A,#CXPSHO
         ADD     A,CADROF
         MOV     R1,A
         MOV     A,#>XCENTR         ; CXPSHO + OFFSET
         MOVX    @R1,A
         INC     R1
         MOV     A,#<XCENTR         ; CXPSLO + OFFSET
         MOVX    @R1,A
         INC     R1
         MOV     A,#>YCENTR         ; CYPSHO + OFFSET
         MOVX    @R1,A
         INC     R1
         MOV     A,#<YCENTR         ; CYPSLO + OFFSET
         MOVX    @R1,A
         INC     R1
         MOV     A,#>ZCENTR         ; CZPSHO + OFFSET
         MOVX    @R1,A
         INC     R1
         MOV     A,#<ZCENTR         ; CZPSLO + OFFSET
         MOVX    @R1,A
         LCALL   REPTST
         JNB     RESPRQ,$1          ; RESPONSE NOT REQUIRED
         SETB    SUCCES             ; SERIAL COMMAND DONE
         LCALL   SNDSTS
         CLR     RESPRQ
$1:      RET
;
;------------------------------------------------
;
         END
```

```
        INCLUDE KTHEAD.A51
;
;1-LEVEL : 2, CLI EXCUTIONER
;
;2-TYPE : COMMAND LINE OPERATION PROGRAMS
;
;3-FUNCTION : TESTING THE MOTORIZED POSITIONER.
;
;4-CALLING PROGRAM : FUNCTN.
;
;5-ENTRY POINT:     PROC00,PROC01,PROC02,PROC03,
;                   PROC04,PROC05,PROC06,PROC07,
;                   PROC08,PROC09,PROC0A,PROC0B,
;                   PROC0C,PROC0D,PROC0E,PROC0F.
;                   PCHOME,PROCUP,PROCDN,PROCLF,
;                   PROCRT,PROCX, PROCY, PROCZ,
;                   PROCMZ,PROCPZ,PROCNX,PROCST,
;                   PROCDL,PROCTL,PROCBS,PROCFC.
;
;    NOT IMPLEMENT:PROC00,PROC01,PROC02,PROC03,
;
;    LISTED HERE:  PROC08,(PCUSTP),PROC09,(PRUSTP)
;
;6-SUBROUTINE USED:  PROCTL, TGPBIT, PROCST,
;
;7-BUFFER, QUEUE, TABLE USED:
;
;
;--------------------------------------------------
;
IS_MELLIS: ASK     ASSEMBLE FOR MELLIS(-1) OR ALESSI & NIGHTS(-0) POSITIONER
;
;--------------------------------------------------
;
IS_ALESSI: ASK     ASSEMBLE FOR ALESSI(-1) OR KNIGHTS(-0) POSITIONER
;
;--------------------------------------------------
;
          INCLUDE KTINCL.A51
;
;--------------------------------------------------
;
; PUBLIC DECLARATION
          PUBLIC PROC08, PCUSTP, PROC09, PRUSTP
          PUBLIC PCMDRL, PCMDAB
;
;--------------------------------------------------
;
; EXTERNAL DECLARATION
;
          EXTERNAL ACTUSTP,MODLMH, TGPBIT, USMCNT
          EXTERNAL STDLMT, SNDSTS, REPTST, HMCLCD0
          EXTERNAL DISSIG ,DISOFT, WCMLCD0,MTRCNT
          EXTERNAL MDMCNT,CLRLCD1,WCMLCD1,SADLCD1
          EXTERNAL DISIGN1,DISHEX1,KBDIN,  INPADR
          EXTERNAL MVMSG2
;
;--------------------------------------------------
;      FUNCTION  KEY  OPERATION  ROUTINES
;--------------------------------------------------
;
PROC08:                              ;     8
PCUSTP:
;
;    PROC uSTEP MOVE 0.0    ----    INIT PREPARATIONS
;
          MOV     R2,#0CH           ; SHUT CURSOR OF LCD 0
          LCALL   WCMLCD0
          LCALL   CLRLCD1
          MOV     R2,#0FH           ; SHOW CURSOR OF LCD 1
          LCALL   WCMLCD1
          MOV     R2,#64            ; SHOW uSTEP MOVE TO MSG
          LCALL   SADLCD1
          MOV     DPTR,#USMSG1
          MOV     R3,#40
          LCALL   DISIGN1
          MOV     R2,#81
          LCALL   SADLCD1
          MOV     A,#CXPSHO         ; BASE
          ADD     A,CADROF          ; ADD OFFSET
          MOV     R0,A              ; POINT TO #N ADDRESS
          MOVX    A,@R0
          MOV     R4,A
          INC     R0                ; CXPSLO + OFFSET
          MOVX    A,@R0
          MOV     R5,A
          LCALL   DISHEX1
          MOV     R2,#90
          LCALL   SADLCD1
          MOV     A,#CYPSHO         ; BASE
          ADD     A,CADROF          ; ADD OFFSET
          MOV     R0,A              ; POINT TO #N ADDRESS
          MOVX    A,@R0
          MOV     R4,A
          INC     R0                ; CYPSLO + OFFSET
          MOVX    A,@R0
          MOV     R5,A
          LCALL   DISHEX1
          MOV     R2,#99
          LCALL   SADLCD1
          MOV     A,#CZPSHO         ; BASE
          ADD     A,CADROF          ; ADD OFFSET
          MOV     R0,A              ; POINT TO #N ADDRESS
          MOVX    A,@R0
          MOV     R4,A
          INC     R0                ; CZPSLO + OFFSET
          MOVX    A,@R0
          MOV     R5,A
          LCALL   DISHEX1
;
;    PROC uSTEP MOVE 0.1    ----    COLLECT X PARAMETERS
;
PCUS2F:   MOV     A,#CXPSHO         ; BASE
          ADD     A,CADROF          ; ADD OFFSET
          MOV     R0,A
          MOVX    A,@R0
          MOV     NPSCTH,A          ; TEMP STORE
          MOV     CTH,A
          INC     R0                ; CXPSLO + OFFSET
          MOVX    A,@R0
          MOV     NPSCTL,A          ; TEMP STORE
          MOV     CTL,A             ; INIT POS CNT
          MOV     R2,#81            ; SHOW NUMBER ON LCD 1
          LCALL   SADLCD1
          MOV     R4,CTH
          MOV     R5,CTL
          LCALL   DISHEX1
PCUS00:   LCALL   KBDIN
```

```
        CJNE    A,#9EH,PCUS20      ; BACK SPACE EDITING
        SJMP    PCUS2F
PCUS20: CJNE    A,#9FH,PCUS21      ; ABORT
        LJMP    PCUSRET
PCUS21: CJNE    A,#9AH,PCUS01      ; IS NEXT
        CLR     C                  ; CALCULATE DIFFERENCE
        MOV     A,CTL
        SUBB    A,NPSCTL
        MOV     NXTMPL,A
        MOV     A,CTH
        SUBB    A,NPSCTH
        MOV     NXTMPH,A
        SJMP    PCUS02
PCUS01: ANL     A,#0FH             ; GET NUM KEY
        MOV     R4,A               ; TMP IN BUF
        LCALL   INPADR             ; RIGHT ENTRY 2 BYTES
        MOV     R2,#81             ; SHOW NUMBER ON LCD 1
        LCALL   SADLCD1
        MOV     R4,CTH
        MOV     R5,CTL
        LCALL   DISHEX1
        SJMP    PCUS00
;
;    PROC uSTEP MOVE 0.2   ----    COLLECT Y PARAMETERS
;
PCUS02: MOV     A,#CYPSHO          ; BASE
        ADD     A,CADROF           ; ADD OFFSET
        MOV     R0,A
        MOVX    A,@R0
        MOV     NPSCTH,A           ; TEMP STORE
        MOV     CTH,A
        INC     R0                 ; CYPSLO + OFFSET
        MOVX    A,@R0
        MOV     NPSCTL,A           ; TEMP STORE
        MOV     CTL,A              ; INIT POS CNT
        MOV     R2,#90             ; SHOW NUMBER ON LCD 1
        LCALL   SADLCD1
        MOV     R4,CTH
        MOV     R5,CTL
        LCALL   DISHEX1
PCUS03: LCALL   KBDIN
        CJNE    A,#9EH,PCUS22      ; BACK SPACE EDITING
        SJMP    PCUS2F
PCUS22: CJNE    A,#9FH,PCUS23      ; ABORT
        LJMP    PCUSRET
PCUS23: CJNE    A,#9AH,PCUS04      ; IS NEXT
        CLR     C                  ; CALCULATE DIFFERENCE
        MOV     A,CTL
        SUBB    A,NPSCTL
        MOV     NYTMPL,A
        MOV     A,CTH
        SUBB    A,NPSCTH
        MOV     NYTMPH,A
        SJMP    PCUS05
PCUS04: ANL     A,#0FH             ; GET NUM KEY
        MOV     R4,A               ; TMP IN BUF
        LCALL   INPADR             ; RIGHT ENTRY 2 BYTES
        MOV     R2,#90             ; SHOW NUMBER ON LCD 1
        LCALL   SADLCD1
        MOV     R4,CTH
        MOV     R5,CTL
        LCALL   DISHEX1
        SJMP    PCUS03
;    PROC uSTEP MOVE 0.3   ----    COLLECT Z PARAMETERS
;
PCUS05: MOV     A,#CZPSHO          ; BASE
        ADD     A,CADROF           ; ADD OFFSET
        MOV     R0,A
        MOVX    A,@R0
        MOV     NPSCTH,A           ; TEMP STORE
        MOV     CTH,A
        INC     R0                 ; CZPSLO + OFFSET
        MOVX    A,@R0
        MOV     NPSCTL,A           ; TEMP STORE
        MOV     CTL,A              ; INIT POS CNT
        MOV     R2,#99             ; SHOW NUMBER ON LCD 1
        LCALL   SADLCD1
        MOV     R4,CTH
        MOV     R5,CTL
        LCALL   DISHEX1
PCUS06: LCALL   KBDIN
        CJNE    A,#9EH,PCUS24      ; BACK SPACE EDITING
        SJMP    PCUS02
PCUS24: CJNE    A,#9FH,PCUS25      ; ABORT
        LJMP    PCUSRET
PCUS25: CJNE    A,#9AH,PCUS07      ; IS NEXT
        CLR     C                  ; CALCULATE DIFFERENCE
        MOV     A,CTL
        SUBB    A,NPSCTL
        MOV     NZTMPL,A
        MOV     A,CTH
        SUBB    A,NPSCTH
        MOV     NZTMPH,A
        SJMP    PCUS08
PCUS07: ANL     A,#0FH             ; GET NUM KEY
        MOV     R4,A               ; TMP IN BUF
        LCALL   INPADR             ; RIGHT ENTRY 2 BYTES
        MOV     R2,#99             ; SHOW NUMBER ON LCD 1
        LCALL   SADLCD1
        MOV     R4,CTH
        MOV     R5,CTL
        LCALL   DISHEX1
        SJMP    PCUS06
;
;PROC uSTEP MOVE 0.4   DESIGN uSTEP MOVEMENT STRATAGY
;
PCUS08: JB      PNC,PCUS1A         ; IS POWER UP ALREADY
        MOV     RDELAY,#PWRSTB     ; WAIT FOR POWER
        CLR     PMTRPD             ; TRIG WATCHDOG TIMER
        SETB    PMTRPD
PCUS1B: MOV     A,RDELAY           ; SUPPLY STABLE
        JNZ     PCUS1B
PCUS1A: CLR     PMTRPD             ; TRIG WATCHDOG TIMER
        SETB    PMTRPD
        MOV     R2,#0CH            ; SHUT CURSOR OF LCD 1
        LCALL   WCMLCD1
;
        CLR     A
        MOV     MVSTG1,A           ; CLEAR uSTEP MOVE
        CJNE    A,NZTMPH,PCUS0A    ; STRATAGY BIT MAP
        CJNE    A,NZTMPL,PCUS0B
;                       CASE 1:    NO Z uSTEP MOVEMENT
        JNB     PCNTCT,PCUS09      ; IS CONTACT
        LJMP    PCUS11             ; M SEQUENCE ONLY
PCUS09: SETB    MVRTRV             ; R-M-A SEQUENCE
        SETB    MVAPPR
        SJMP    PCUS0D
```

```
;
PCUS0A:    MOV    A,NZTMPH
           JNB    A.7,PCUS0B        ; CASE 2: NEGATIVE/UP
           SETB   MVZUPW            ; Z-M SEQUENCE
           SJMP   PCUS10
;
PCUS0B:    JB     PCNTCT,PCUS0C     ; NOT CONTACT
           MOV    BEPDLY,#EXLNGBP   ; SOUND ALARM
           LCALL  CLRLCD1
           MOV    DPTR,#MVMSG2      ; SHOW CAN'T INC Z MSG
           MOV    R3,#40
           LCALL  DISIGN1
PCUS26:    MOV    A,BEPDLY          ; WAIT A WHILE
           JNZ    PCUS26            ; LET USER SEE THE MSG
           AJMP   PCUSRET
PCUS0C:    SETB   MVZDNW            ; M-Z' SEQUENCE
           LJMP   PCUS11
;
;    PROC uSTEP MOVE 0.5    ----    RETRIEVE 80 uSTEPS
;
PCUS0D:    JNB    MVRTRV,PCUS10     ; NO -R- REQUIRED
           MOV    A,PBOTMP
           JNB    PUSTEP,PCUS27     ; IS USTEP ACTIVATED
           LCALL  ACTUSTP           ; ON USTEP
PCUS27:    SETB   DIRECT            ; CW UP/-
           SETB   ZAXIS
           MOV    R6,#<SFTYRG       ; RETRACK 80 USTEPS
PCUS0E:    MOV    A,#1
           LCALL  TGPBIT
           LCALL  REPTST
           JNB    MVABRT,PCUS2D     ; NOT ABORT BY RS232
           LJMP   PCUSRET
PCUS2D:    MOV    RDELAY,#USTPDL    ; 256mS DELAY
PCUS0F:    MOV    A,RDELAY
           JNZ    PCUS0F
           DJNZ   R6,PCUS0E
           CLR    ZAXIS
;
; PROC uSTEP MOVE 0.6   uSTEP MOVE TO Z NEGATIVE LOCATIONS
;                                 -/UP
;
PCUS10:    JNB    MVZUPW,PCUS11     ; NO -Z- REQUIRED
           MOV    A,PBOTMP
           JNB    PUSTEP,PCUS28     ; IS USTEP ACTIVATED
           LCALL  ACTUSTP           ; ON USTEP
PCUS28:    MOV    A,NZTMPH
           CPL    A                 ; NEGATIVE STEPS
           MOV    NPSCTH,A          ; COMPLEMENT IT
           MOV    A,NZTMPL
           CPL    A
           ADD    A,#1
           MOV    NPSCTL,A
           MOV    A,NPSCTH
           ADDC   A,#0
           MOV    NPSCTH,A
           SETB   DIRECT            ; SET DIRECTION FOR CW UP/-
           SETB   ZAXIS             ; Z AXIS
           MOV    FASTDL,#USDELY    ; FAKE FAST DELAY
           LCALL  USMCNT
           CLR    ZAXIS
           JNB    MVABRT,PCUS11     ; NOT ABORT BY RS232
           LJMP   PCUSRET
;
;    PROC uSTEP MOVE 0.7    ----    uSTEP MOVE TO X LOCATIONS
```

```
;
PCUS11:                             ; -M- REQUIRED, ENEN 0 STEP
           MOV    A,PBOTMP
           JNB    PUSTEP,PCUS29     ; IS USTEP ACTIVATED
           LCALL  ACTUSTP           ; ON USTEP
PCUS29:    MOV    A,NXTMPH          ; IN X,Y DIR, USMCNT DET.
           JNB    A.7,PCUS12        ; IS POSITIVE
           CPL    A                 ; NEGATIVE STEPS
           MOV    NPSCTH,A          ; COMPLEMENT IT
           MOV    A,NXTMPL
           CPL    A
           MOV    NPSCTL,A
           MOV    A,NPSCTL          ; INC 2'S COMPL
           ADD    A,#1
           MOV    NPSCTL,A
           MOV    A,NPSCTH
           ADDC   A,#0
           MOV    NPSCTH,A
           SETB   DIRECT            ; SET DIR FOR CW RIGHT/-
           SJMP   PCUS13
PCUS12:    MOV    A,NXTMPH
           MOV    NPSCTH,A
           MOV    A,NXTMPL
           MOV    NPSCTL,A
           CLR    DIRECT            ; SET DIR FOR CCW LEFT/+
PCUS13:    SETB   XAXIS             ; X AXIS
           MOV    FASTDL,#USDELY    ; FAKE FAST DELAY
           LCALL  USMCNT
           CLR    XAXIS
           JNB    MVABRT,PCUS14     ; NOT ABORT BY RS232
           LJMP   PCUSRET
;
;    PROC uSTEP MOVE 0.8    ----    uSTEP MOVE TO Y LOCATIONS
;
PCUS14:                             ; -M- REQUIRED
           MOV    A,PBOTMP
           JNB    PUSTEP,PCUS2A     ; IS USTEP ACTIVATED
           LCALL  ACTUSTP           ; ON USTEP
PCUS2A:    MOV    A,NYTMPH
           JNB    A.7,PCUS15        ; IS POSITIVE
           CPL    A                 ; NEGATIVE STEPS
           MOV    NPSCTH,A          ; COMPLEMENT IT
           MOV    A,NYTMPL
           CPL    A
           MOV    NPSCTL,A
           MOV    A,NPSCTL          ; INC 2'S COMPL
           ADD    A,#1
           MOV    NPSCTL,A
           MOV    A,NPSCTH
           ADDC   A,#0
           MOV    NPSCTH,A
           SETB   DIRECT            ; SET DIR FOR CW BACK/-
           SJMP   PCUS16
PCUS15:    MOV    A,NYTMPH
           MOV    NPSCTH,A
           MOV    A,NYTMPL
           MOV    NPSCTL,A
           CLR    DIRECT            ; SET DIR FOR CCW FRONT/+
PCUS16:    SETB   YAXIS             ; Y AXIS
           MOV    FASTDL,#USDELY    ; FAKE FAST DELAY
           LCALL  USMCNT
           CLR    YAXIS
           JNB    MVABRT,PCUS17     ; NOT ABORT BY RS232
           LJMP   PCUSRET
```

```
;
;    PROC uSTEP MOVE 0.9    ----    uSTEP MOVE TO Z POSITIVE LOCATIONS
;                                   +/DOWN
;
PCUS17:     JNB     MVZDNW,PCUS18   ; NO -Z'- REQUIRED
            MOV     A,PBOTMP
            JNB     PUSTEP,PCUS2B   ; IS USTEP ACTIVATED
            LCALL   ACTUSTP         ; ON USTEP
PCUS2B:     MOV     A,NZTMPH
            MOV     NPSCTH,A
            MOV     A,NZTMPL
            MOV     NPSCTL,A
            CLR     DIRECT          ; SET DIR FOR CCW DN/+
            SETB    ZAXIS           ; Z AXIS
            MOV     FASTDL,#USDELY  ; FAKE FAST DELAY
            LCALL   USMCNT
            CLR     ZAXIS
            JNB     MVABRT,PCUS18   ; NOT ABORT BY RS232
            LJMP    PCUSRET
;
;    PROC uSTEP MOVE 0.A    ----    APPROACHING
;                               Z MOTOR uSTEP MOVE DOWNWARD 80 uSTEPS
;                               WITH CONTACT SENSING ALL THE WAY.
;
PCUS18:     JNB     MVAPPR,PCUSRET  ; NO -A- REQUIRED
            MOV     A,PBOTMP
            JNB     PUSTEP,PCUS19   ; IS USTEP ACTIVATED
            LCALL   ACTUSTP         ; ON USTEP
PCUS19:     MOV     R6,#<SFTYRG     ; MAKE CONTACT W/LIMIT
            CLR     DIRECT          ; CCW DN/+
            SETB    ZAXIS           ; Z AXIS
;
PCUS1C:     JNB     PCNTCT,PCUSRET  ; CONTACT
            MOV     A,#1
            LCALL   TGPBIT          ; SINGLE STEP
            LCALL   REPTST
            JNB     MVABRT,PCUS2E   ; NOT ABORT BY RS232
            LJMP    PCUSRET
PCUS2E:     MOV     RDELAY,#USTPDL  ; 256mS DELAY
PCUS1D:     JNB     PCNTCT,PCUSRET  ; CONTACT
            MOV     A,RDELAY
            JNZ     PCUS1D
            DJNZ    R6,PCUS1C       ; SEE IF CONTACT, AGAIN
            LCALL   REPTST
;
;    PROC uSTEP MOVE 0.B    ----    CLEAN UP
;
PCUSRET:    CLR     ZAXIS           ; Z AXIS
            SETB    DIRECT          ; UPWARD JUST IN CASE.
            MOV     A,PBOTMP
            JB      PUSTEP,PCUS2C   ; IS USTEP ACTIVATED
            LCALL   ACTUSTP         ; OFF USTEP
PCUS2C:     LCALL   DISOFT
            MOV     R2,#0CH         ; SHUT CURSOR OF LCD 1
            LCALL   WCMLCD1
            MOV     R2,#0FH         ; SHOW CURSOR OF LCD 0
            LCALL   WCMLCD0
            JNB     RESPRQ,$1       ; RESPONSE NOT REQUIRED
            SETB    SUCCES          ; SERIAL COMMAND DONE
            LCALL   SNDSTS
            CLR     RESPRQ
$1:         RET
.
USMSG1:     ASCII   uSTEP to ---  X:      . Y:      . Z:      .|
```

```
;
;------------------------------------------------
;
;    CALL THIS TO MOVE USTEP RELATIVELY.
;
;    SHARE WITH PROC08: MOVE USTEP TO.
;
PROC09:                              ;     9
PRUSTP:
;
;    PROC MOVE RELATIVE 0.0    ----    INIT PREPARATIONS
;
            MOV     R2,#0CH          ; SHUT CURSOR OF LCD 0
            LCALL   WCMLCD0
            LCALL   CLRLCD1
            MOV     R2,#0FH          ; SHOW CURSOR OF LCD 1
            LCALL   WCMLCD1
            MOV     R2,#64           ; SHOW MOVE RELATIVE
            LCALL   SADLCD1          ; TO MSG
            MOV     DPTR,#URMSG1
            MOV     R3,#40
            LCALL   DISIGN1
;
;    PROC MOVE RELATIVE 0.1    ----    COLLECT X PARAMETERS
;
PRUS2F:     CLR     A
            MOV     CTH,A
            MOV     CTL,A            ; INIT POS CNT
            MOV     R2,#81           ; SHOW NUMBER ON LCD 1
            LCALL   SADLCD1
            MOV     R4,CTH
            MOV     R5,CTL
            LCALL   DISHEX1
PRUS00:     LCALL   KBDIN
            CJNE    A,#9EH,PRUS20    ; BACK SPACE EDITING
            SJMP    PRUS2F
PRUS20:     CJNE    A,#9FH,PRUS21    ; ABORT
            LJMP    PCUSRET
PRUS21:     CJNE    A,#9AH,PRUS01    ; IS NEXT
            MOV     A,CTL
            MOV     NXTMPL,A
            MOV     A,CTH
            MOV     NXTMPH,A
            SJMP    PRUS02
PRUS01:     ANL     A,#0FH           ; GET NUM KEY
            MOV     R4,A             ; TMP IN BUF
            LCALL   INPADR           ; RIGHT ENTRY 2 BYTES
            MOV     R2,#81           ; SHOW NUMBER ON LCD 1
            LCALL   SADLCD1
            MOV     R4,CTH
            MOV     R5,CTL
            LCALL   DISHEX1
            SJMP    PRUS00
;
;    PROC MOVE RELATIVE 0.2    ----    COLLECT Y PARAMETERS
;
PRUS02:     CLR     A
            MOV     CTH,A
            MOV     CTL,A            ; INIT POS CNT
            MOV     R2,#90           ; SHOW NUMBER ON LCD 1
            LCALL   SADLCD1
            MOV     R4,CTH
            MOV     R5,CTL
            LCALL   DISHEX1
```

```
PRUS03:   LCALL   KBDIN
          CJNE    A,#9EH,PRUS22      ; BACK SPACE EDITING
          SJMP    PRUS2F
PRUS22:   CJNE    A,#9FH,PRUS23      ; ABORT
          LJMP    PCUSRET
PRUS23:   CJNE    A,#9AH,PRUS04      ; IS NEXT
          MOV     A,CTL
          MOV     NYTMPL,A
          MOV     A,CTH
          MOV     NYTMPH,A
          SJMP    PRUS05
PRUS04:   ANL     A,#0FH             ; GET NUM KEY
          MOV     R4,A               ; TMP IN BUF
          LCALL   INPADR             ; RIGHT ENTRY 2 BYTES
          MOV     R2,#90             ; SHOW NUMBER ON LCD 1
          LCALL   SADLCD1
          MOV     R4,CTH
          MOV     R5,CTL
          LCALL   DISHEX1
          SJMP    PRUS03
;
;    PROC MOVE RELATIVE 0.3   ----   COLLECT Z PARAMETERS
;
PRUS05:   CLR     A
          MOV     CTH,A
          MOV     CTL,A              ; INIT POS CNT
          MOV     R2,#99             ; SHOW NUMBER ON LCD 1
          LCALL   SADLCD1
          MOV     R4,CTH
          MOV     R5,CTL
          LCALL   DISHEX1
PRUS06:   LCALL   KBDIN
          CJNE    A,#9EH,PRUS24      ; BACK SPACE EDITING
          SJMP    PRUS02
PRUS24:   CJNE    A,#9FH,PRUS25      ; ABORT
          LJMP    PCUSRET
PRUS25:   CJNE    A,#9AH,PRUS07      ; IS NEXT
          MOV     A,CTL
          MOV     NZTMPL,A
          MOV     A,CTH
          MOV     NZTMPH,A
          SJMP    PRUS08
PRUS07:   ANL     A,#0FH             ; GET NUM KEY
          MOV     R4,A               ; TMP IN BUF
          LCALL   INPADR             ; RIGHT ENTRY 2 BYTES
          MOV     R2,#99             ; SHOW NUMBER ON LCD 1
          LCALL   SADLCD1
          MOV     R4,CTH
          MOV     R5,CTL
          LCALL   DISHEX1
          SJMP    PRUS06
;
PRUS08:   LJMP    PCUS08             ; SHARED WITH PCMOVE
;
URMSG1:   ASCII   uSTEP MoveRel X:     0. Y:     0. Z:     0.|
;
;------------------------------------------------
;
;    MEDIUM SPEED MOVE :
;
;    CALL THIS TO MOVE POSITIONER A NUMBER OF
;      RELATIVE STEPS. THE NUMBER OF THREE
;      COORDINATES ARE ENTERED IN 2'S COMPLEMENT
;      FORM. IT CAN BE ELABERATE LATER.
```

```
;   AFTER THE NUMBER ARE IN THE TMP, LONG JMP TO
;      PRMV08, SO THAT BOTH SHARE THE NEXT HALF
;      OF THE PROGRAM.
;   THIS IS POSSIBLE BECAUSE MY PROGRAM ARE ACTUALLY
;      INPLEMENTED IN RELATIVE MOVE, INSTEAD OF
;       ABSOLUTE MOVE.
;
PCMDRL:                                 ; BRANCH FROM 'B'
;
;    PROC MEDIUM MOVE RELATIVE 0.0   ----   INIT PREPARATIONS
;
          MOV     R2,#0CH               ; SHUT CURSOR OF LCD 0
          LCALL   WCMLCD0
          LCALL   CLRLCD1
          MOV     R2,#0FH               ; SHOW CURSOR OF LCD 1
          LCALL   WCMLCD1
          MOV     R2,#64                ; SHOW MOVE RELATIVE
          LCALL   SADLCD1               ; TO MSG
          MOV     DPTR,#MDMSG1
          MOV     R3,#40
          LCALL   DISIGN1
;
;    PROC MEDIUM MOVE RELATIVE 0.1   ----   COLLECT X PARAMETERS
;
PCMD2F:   CLR     A
          MOV     CTH,A
          MOV     CTL,A                 ; INIT POS CNT
          MOV     R2,#81                ; SHOW NUMBER ON LCD 1
          LCALL   SADLCD1
          MOV     R4,CTH
          MOV     R5,CTL
          LCALL   DISHEX1
PCMD00:   LCALL   KBDIN
          CJNE    A,#9EH,PCMD20         ; BACK SPACE EDITING
          SJMP    PCMD2F
PCMD20:   CJNE    A,#9FH,PCMD21         ; ABORT
          LJMP    PRMARET
PCMD21:   CJNE    A,#9AH,PCMD01         ; IS NEXT
          MOV     A,CTL
          MOV     NXTMPL,A
          MOV     A,CTH
          MOV     NXTMPH,A
          SJMP    PCMD02
;
PCMD01:   ANL     A,#0FH                ; GET NUM KEY
          MOV     R4,A                  ; TMP IN BUF
          LCALL   INPADR                ; RIGHT ENTRY 2 BYTES
          MOV     R2,#81                ; SHOW NUMBER ON LCD 1
          LCALL   SADLCD1
          MOV     R4,CTH
          MOV     R5,CTL
          LCALL   DISHEX1
          SJMP    PCMD00
;
;    PROC MEDIUM MOVE RELATIVE 0.2   ----   COLLECT Y PARAMETERS
;
PCMD02:   CLR     A
          MOV     CTH,A
          MOV     CTL,A                 ; INIT POS CNT
          MOV     R2,#90                ; SHOW NUMBER ON LCD 1
          LCALL   SADLCD1
          MOV     R4,CTH
          MOV     R5,CTL
          LCALL   DISHEX1
```

```
PCMD03:   LCALL   KBDIN
          CJNE    A,#9EH,PCMD22     ; BACK SPACE EDITING
          SJMP    PCMD2F
PCMD22:   CJNE    A,#9FH,PCMD23     ; ABORT
          LJMP    PRMARET
PCMD23:   CJNE    A,#9AH,PCMD04     ; IS NEXT
          MOV     A,CTL
          MOV     NYTMPL,A
          MOV     A,CTH
          MOV     NYTMPH,A
          SJMP    PCMD05
;
PCMD04:   ANL     A,#0FH            ;'GET NUM KEY
          MOV     R4,A              ; TMP IN BUF
          LCALL   INPADR            ; RIGHT ENTRY 2 BYTES
          MOV     R2,#90            ; SHOW NUMBER ON LCD 1
          LCALL   SADLCD1
          MOV     R4,CTH
          MOV     R5,CTL
          LCALL   DISHEX1
          SJMP    PCMD03
;
;    PROC MEDIUM MOVE RELATIVE 0.3   ----   COLLECT Z PARAMETERS
;
PCMD05:   CLR     A
          MOV     CTH,A
          MOV     CTL,A             ; INIT POS CNT
          MOV     R2,#99            ; SHOW NUMBER ON LCD 1
          LCALL   SADLCD1
          MOV     R4,CTH
          MOV     R5,CTL
          LCALL   DISHEX1
PCMD06:   LCALL   KBDIN
          CJNE    A,#9EH,PCMD24     ; BACK SPACE EDITING
          SJMP    PCMD02
PCMD24:   CJNE    A,#9FH,PCMD25     ; ABORT
          LJMP    PRMARET
PCMD25:   CJNE    A,#9AH,PCMD26     ; IS NEXT
          SJMP    PCMD27
PCMD26:   CJNE    A,#9BH,PCMD07     ; IS TERM
PCMD27:   MOV     A,CTL
          MOV     NZTMPL,A
          MOV     A,CTH
          MOV     NZTMPH,A
          SJMP    PCMD08
;
PCMD07:   ANL     A,#0FH            ; GET NUM KEY
          MOV     R4,A              ; TMP IN BUF
          LCALL   INPADR            ; RIGHT ENTRY 2 BYTES
          MOV     R2,#99            ; SHOW NUMBER ON LCD 1
          LCALL   SADLCD1
          MOV     R4,CTH
          MOV     R5,CTL
          LCALL   DISHEX1
          SJMP    PCMD06
;
PCMD08:   LJMP    PRMA08            ; SHARED WITH PCMDAB
;
MDMSG1:   ASCII   Move Med Rel  X:    0. Y:    0. Z:    0.|
;
;-------------------------------------------------
;
;    MEDIUM SPEED MOVE :
;
;    CALL THIS TO MOVE POSITIONER TO AN ABSOLUTE
;      COORDINATE.    THE NUMBER OF THREE
;      COORDINATES ARE ENTERED IN HEXDECIMAL
;      FORM. IT CAN BE ELABERATE LATER.
;   AFTER THE NUMBER ARE IN THE TMP, FALL THRU TO
;      PRMV08, SO THAT BOTH ABS AND REL MOV SHARE
;      THE NEXT HALF OF THE PROGRAM.
;   THIS IS POSSIBLE BECAUSE MY PROGRAM ARE ACTUALLY
;      INPLEMENTED IN RELATIVE MOVE, INSTEAD OF
;       ABSOLUTE MOVE.
;
PCMDAB:                             ; ABS MED MOVE TO X,Y,Z.
;
;    PROC MEDIUM MOVE 0.0   ----   INIT PREPARATIONS
;
          MOV     R2,#0CH           ; SHUT CURSOR OF LCD 0
          LCALL   WCMLCD0
          LCALL   CLRLCD1
          MOV     R2,#0FH           ; SHOW CURSOR OF LCD 1
          LCALL   WCMLCD1
          MOV     R2,#64            ; SHOW MOVE TO MSG
          LCALL   SADLCD1
          MOV     DPTR,#MAMSG1
          MOV     R3,#40
          LCALL   DISIGN1
          MOV     R2,#79
          LCALL   SADLCD1
          MOV     A,#CXPSH0         ; BASE
          ADD     A,CADROF          ; ADD OFFSET
          MOV     R0,A              ; POINT TO #N ADDRESS
          MOVX    A,@R0
          MOV     R4,A
          INC     R0                ; CXPSL0 + OFFSET
          MOVX    A,@R0
          MOV     R5,A
          LCALL   DISHEX1
          MOV     R2,#88
          LCALL   SADLCD1
          MOV     A,#CYPSH0         ; BASE
          ADD     A,CADROF          ; ADD OFFSET
          MOV     R0,A              ; POINT TO #N ADDRESS
          MOVX    A,@R0
          MOV     R4,A
          INC     R0                ; CYPSL0 + OFFSET
          MOVX    A,@R0
          MOV     R5,A
          LCALL   DISHEX1
          MOV     R2,#97
          LCALL   SADLCD1
          MOV     A,#CZPSH0         ; BASE
          ADD     A,CADROF          ; ADD OFFSET
          MOV     R0,A              ; POINT TO #N ADDRESS
          MOVX    A,@R0
          MOV     R4,A
          INC     R0                ; CZPSL0 + OFFSET
          MOVX    A,@R0
          MOV     R5,A
          LCALL   DISHEX1
;
;    PROC MEDIUM MOVE 0.1   ----   COLLECT X PARAMETERS
;
PRMA2F:   MOV     A,#CXPSH0         ; BASE
          ADD     A,CADROF          ; ADD OFFSET
          MOV     R0,A
```

```
        MOVX    A,@R0
        MOV     NPSCTH,A        ; TEMP STORE
        MOV     CTH,A
        INC     R0              ; CXPSLO + OFFSET
        MOVX    A,@R0
        MOV     NPSCTL,A        ; TEMP STORE
        MOV     CTL,A           ; INIT POS CNT
        MOV     R2,#79          ; SHOW NUMBER ON LCD 1
        LCALL   SADLCD1
        MOV     R4,CTH
        MOV     R5,CTL
        LCALL   DISHEX1
PRMA00: LCALL   KBDIN
        CJNE    A,#9EH,PRMA20   ; BACK SPACE EDITING
        SJMP    PRMA2F
PRMA20: CJNE    A,#9FH,PRMA21   ; ABORT
        LJMP    PRMARET
PRMA21: CJNE    A,#9AH,PRMA01   ; IS NEXT
        CLR     C               ; CALCULATE DIFFERENCE
        MOV     A,CTL
        SUBB    A,NPSCTL
        MOV     NXTMPL,A
        MOV     A,CTH
        SUBB    A,NPSCTH
        MOV     NXTMPH,A
        SJMP    PRMA02
PRMA01: ANL     A,#0FH          ; GET NUM KEY
        MOV     R4,A            ; TMP IN BUF
        LCALL   INPADR          ; RIGHT ENTRY 2 BYTES
        MOV     R2,#79          ; SHOW NUMBER ON LCD 1
        LCALL   SADLCD1
        MOV     R4,CTH
        MOV     R5,CTL
        LCALL   DISHEX1
        SJMP    PRMA00
;
;   PROC MEDIUM MOVE 0.2   ----   COLLECT Y PARAMETERS
;
PRMA02: MOV     A,#CYPSHO       ; BASE
        ADD     A,CADROF        ; ADD OFFSET
        MOV     R0,A
        MOVX    A,@R0
        MOV     NPSCTH,A        ; TEMP STORE
        MOV     CTH,A
        INC     R0              ; CYPSLO + OFFSET
        MOVX    A,@R0
        MOV     NPSCTL,A        ; TEMP STORE
        MOV     CTL,A           ; INIT POS CNT
        MOV     R2,#88          ; SHOW NUMBER ON LCD 1
        LCALL   SADLCD1
        MOV     R4,CTH
        MOV     R5,CTL
        LCALL   DISHEX1
PRMA03: LCALL   KBDIN
        CJNE    A,#9EH,PRMA22   ; BACK SPACE EDITING
        SJMP    PRMA2F
PRMA22: CJNE    A,#9FH,PRMA23   ; ABORT
        LJMP    PRMARET
PRMA23: CJNE    A,#9AH,PRMA04   ; IS NEXT
        CLR     C               ; CALCULATE DIFFERENCE
        MOV     A,CTL
        SUBB    A,NPSCTL
        MOV     NYTMPL,A
        MOV     A,CTH
        SUBB    A,NPSCTH
        MOV     NYTMPH,A
        SJMP    PRMA05
PRMA04: ANL     A,#0FH          ; GET NUM KEY
        MOV     R4,A            ; TMP IN BUF
        LCALL   INPADR          ; RIGHT ENTRY 2 BYTES
        MOV     R2,#88          ; SHOW NUMBER ON LCD 1
        LCALL   SADLCD1
        MOV     R4,CTH
        MOV     R5,CTL
        LCALL   DISHEX1
        SJMP    PRMA03
;
;   PROC MEDIUM MOVE 0.3   ----   COLLECT Z PARAMETERS
;
PRMA05: MOV     A,#CZPSHO       ; BASE
        ADD     A,CADROF        ; ADD OFFSET
        MOV     R0,A
        MOVX    A,@R0
        MOV     NPSCTH,A        ; TEMP STORE
        MOV     CTH,A
        INC     R0              ; CZPSLO + OFFSET
        MOVX    A,@R0
        MOV     NPSCTL,A        ; TEMP STORE
        MOV     CTL,A           ; INIT POS CNT
        MOV     R2,#97          ; SHOW NUMBER ON LCD 1
        LCALL   SADLCD1
        MOV     R4,CTH
        MOV     R5,CTL
        LCALL   DISHEX1
PRMA06: LCALL   KBDIN
        CJNE    A,#9EH,PRMA24   ; BACK SPACE EDITING
        SJMP    PRMA02
PRMA24: CJNE    A,#9FH,PRMA25   ; ABORT
        LJMP    PRMARET
PRMA25: CJNE    A,#9AH,PRMA26   ; IS NEXT
        SJMP    PRMA27
PRMA26: CJNE    A,#9BH,PRMA07   ;IS TERM
PRMA27: CLR     C               ; CALCULATE DIFFERENCE
        MOV     A,CTL
        SUBB    A,NPSCTL
        MOV     NZTMPL,A
        MOV     A,CTH
        SUBB    A,NPSCTH
        MOV     NZTMPH,A
        SJMP    PRMA08
PRMA07: ANL     A,#0FH          ; GET NUM KEY
        MOV     R4,A            ; TMP IN BUF
        LCALL   INPADR          ; RIGHT ENTR. 2 BYTES
        MOV     R2,#97          ; SHOW NUMBER ON LCD 1
        LCALL   SADLCD1
        MOV     R4,CTH
        MOV     R5,CTL
        LCALL   DISHEX1
        SJMP    PRMA06
;
;   PROC MEDIUM MOVE 0.4   ----   DESIGN MOVEMENT STRATAGY
;
PRMA08: JB      PNC,PRMA1A      ; IS POWER UP ALREADY
        MOV     RDELAY,#PWRSTB  ; WAIT FOR POWER
        CLR     PMTRPD          ; TRIG WATCHDOG TIMER
        SETB    PMTRPD
PRMA1B: MOV     A,RDELAY        ; SUPPLY STABLE
        JNZ     PRMA1B
```

```
PRMA1A:     CLR     PMTRPD              ; TRIG WATCHDOG TIMER
            SETB    PMTRPD
            MOV     R2,#0CH             ; SHUT CURSOR OF LCD 1
            LCALL   WCMLCD1
;
            CLR     A
            MOV     MVSTG1,A            ; CLEAR MOVE STRATAGY BIT MAP
                                        ; MVRTRV, MVZUPW, MVZDNW,
                                        ; MVAPPR, ZSMLRG.
            CJNE    A,NZTMPH,PRMA0A
            CJNE    A,NZTMPL,PRMA0B
                                        ; CASE 1: NO Z MOVEMENT
            JNB     PCNTCT,PRMA09       ; IS CONTACT
            LJMP    PRMA11              ; M SEQUENCE ONLY
PRMA09:     SETB    MVRTRV              ; R-M-A SEQUENCE
            SETB    MVAPPR
            SJMP    PRMA0D
;
PRMA0A:     MOV     A,NZTMPH
            JNB     A.7,PRMA0B          ; CASE 2: NEGATIVE/UP
            SETB    MVRTRV              ; R-Z-M SEQUENCE
            SETB    MVZUPW
            SJMP    PRMA0D
;
PRMA0B:                                 ; CASE 3: POSITIVE/DOWN
            JB      CONTACT,PRMA0C      ; NOT CONTACT
            MOV     BEPDLY,#EXLNGBP     ; SOUND ALARM
            LCALL   CLRLCD1
            MOV     DPTR,#MAMSG2        ; SHOW CAN'T INC Z MSG
            MOV     R3,#40
            LCALL   DISIGN1
PCMA26:     MOV     A,BEPDLY            ; WAIT A WHILE
            JNZ     PCMA26              ; LET USER SEE THE MSG
            LJMP    PRMARET
PRMA0C:     SETB    MVZDNW              ; M-Z'-A SEQUENCE
            SETB    MVAPPR
;
;    PROC MEDIUM MOVE 0.5    ----    RETRIEVE 80 uSTEPS
;
PRMA0D:     JNB     MVRTRV,PRMA10       ; NO -R- REQUIRED
RETRIEVE:   MOV     A,PBOTMP
            JNB     PUSTEP,PCMA27       ; IS USTEP ACTIVATED
            LCALL   ACTUSTP             ; ON USTEP
PCMA27:     SETB    DIRECT              ; CW UP/-
            SETB    ZAXIS
            JNB     MVZUPW,$1           ; R-M-A SEQ, NOT R-Z-M
            MOV     A,#>NGSFRG
            CJNE    A,NZTMPH,$1         ; > 256 STEPS
            MOV     A,#<NGSFRG
            CJNE    A,NZTMPL,$2         ; COMP >= 81 STEPS
$2:         JNC     $1
            MOV     A,NZTMPL
            CPL     A
            INC     A                   ; 2'S COMPLEMENT
            MOV     R6,A
            SETB    ZSMLRG
            SJMP    PRMA0E      ; RETRACK ONLY < 80 STEP
$1:         MOV     R6,#<(SFTYRG)       ; RETRACK 80 USTEPS
PRMA0E:     MOV     A,#1
            LCALL   TGPBIT
            LCALL   REPTST
            JNB     MVABRT,PRMA2D       ; NOT ABORT BY RS232
            LJMP    PRMARET
PRMA2D:     MOV     RDELAY,#USTPDL      ; 256mS DELAY
PRMA0F:     MOV     A,RDELAY
            JNZ     PRMA0F
            DJNZ    R6,PRMA0E
            CLR     ZAXIS
;
;    PROC MEDIUM MOVE 0.6    ----    MOVE TO Z NEGATIVE LOCATIONS
;                            -/UP
;
PRMA10:     JNB     MVZUPW,PRMA11       ; NO -Z- REQUIRED
            JBC     ZSMLRG,PRMA11       ; ALREADY DONE
            MOV     A,PBOTMP
            JB      PUSTEP,PCMA28       ; IS USTEP ACTIVATED
            LCALL   ACTUSTP             ; OFF USTEP
PCMA28:     MOV     A,NZTMPH
            CPL     A                   ; NEGATIVE STEPS
            MOV     NPSCTH,A            ; COMPLEMENT IT
            MOV     A,NZTMPL
            CPL     A
            MOV     NPSCTL,A
            CLR     C                   ; R-Z-M ALWAYS TOGETHER
            MOV     A,NPSCTL            ; BUT R-M-A HAS NO Z MOVEMENT
            SUBB    A,#<SFTYRG
            MOV     NPSCTL,A            ; REMOVE THOSE uSTEPS
            MOV     A,NPSCTH
            SUBB    A,#0
            MOV     NPSCTH,A
            MOV     A,NPSCTL            ; INC 2'S COMPL
            ADD     A,#1
            MOV     NPSCTL,A
            MOV     A,NPSCTH
            ADDC    A,#0
            MOV     NPSCTH,A
            SETB    DIRECT              ; SET DIRECTION FOR CW UP/-
            SETB    ZAXIS               ; Z AXIS
            MOV     A,#ZFSDL0           ; BASE
            ADD     A,CADROF            ; ADD OFFSET
            MOV     R0,A                ; POINT Z FAST DELAY
            MOVX    A,@R0               ; GET FAST DELAY
            MOV     FASTDL,A            ; PUT TO WORK
;           LCALL   MTRCNT
            LCALL   MDMCNT
            CLR     ZAXIS
            JNB     MVABRT,PRMA11       ; NOT ABORT BY RS232
            LJMP    PRMARET
;
;    PROC MEDIUM MOVE 0.7    ----    MOVE TO X LOCATIONS
;
PRMA11:                                 ; -M- REQUIRED, ENEN 0 STEP
            MOV     A,PBOTMP
            JB      PUSTEP,PCMA29       ; IS USTEP ACTIVATED
            LCALL   ACTUSTP             ; OFF USTEP
PCMA29:     MOV     A,NXTMPH            ; IN X,Y DIR, MTR CNT DET.
            JNB     A.7,PRMA12          ; IS POSITIVE
            CPL     A                   ; NEGATIVE STEPS
            MOV     NPSCTH,A            ; COMPLEMENT IT
            MOV     A,NXTMPL
            CPL     A
            MOV     NPSCTL,A
            MOV     A,NPSCTL            ; INC 2'S COMPL
            ADD     A,#1
            MOV     NPSCTL,A
            MOV     A,NPSCTH
            ADDC    A,#0
            MOV     NPSCTH,A
```

```
        SETB    DIRECT              ; SET DIR FOR CW RIGHT/-
        SJMP    PRMA13
PRMA12: MOV     A,NXTMPH
        MOV     NPSCTH,A
        MOV     A,NXTMPL
        MOV     NPSCTL,A
        CLR     DIRECT              ; SET DIR FOR CCW LEFT/+
PRMA13: SETB    XAXIS               ; X AXIS
        MOV     A,#XFSDLO           ; BASE
        ADD     A,CADROF            ; ADD OFFSET
        MOV     R0,A                ; POINT X FAST DELAY
        MOVX    A,@R0               ; GET FAST DELAY
        MOV     FASTDL,A            ; PUT TO WORK
;        LCALL   MTRCNT
        LCALL   MDMCNT
        CLR     XAXIS
        JNB     MVABRT,PRMA14       ; NOT ABORT BY RS232
        LJMP    PRMARET
;
;   PROC MEDIUM MOVE 0.8    ----    MOVE TO Y LOCATIONS
;
PRMA14:                             ; -M- REQUIRED
        MOV     A,PBOTMP
        JB      PUSTEP,PCMA2A       ; IS USTEP ACTIVATED
        LCALL   ACTUSTP             ; OFF USTEP
PCMA2A: MOV     A,NYTMPH
        JNB     A.7,PRMA15          ; IS POSITIVE
        CPL     A                   ; NEGATIVE STEPS
        MOV     NPSCTH,A            ; COMPLEMENT IT
        MOV     A,NYTMPL
        CPL     A
        MOV     NPSCTL,A
        MOV     A,NPSCTL            ; INC 2'S COMPL
        ADD     A,#1
        MOV     NPSCTL,A
        MOV     A,NPSCTH
        ADDC    A,#0
        MOV     NPSCTH,A
        SETB    DIRECT              ; SET DIR FOR CW BACK/-
        SJMP    PRMA16
PRMA15: MOV     A,NYTMPH
        MOV     NPSCTH,A
        MOV     A,NYTMPL
        MOV     NPSCTL,A
        CLR     DIRECT              ; SET DIR FOR CCW FRONT/+
PRMA16: SETB    YAXIS               ; Y AXIS
        MOV     A,#YFSDLO           ; BASE
        ADD     A,CADROF            ; ADD OFFSET
        MOV     R0,A                ; POINT Y FAST DELAY
        MOVX    A,@R0               ; GET FAST DELAY
        MOV     FASTDL,A            ; PUT TO WORK
;        LCALL   MTRCNT
        LCALL   MDMCNT
        CLR     YAXIS
        JNB     MVABRT,PRMA17       ; NOT ABORT BY RS232
        LJMP    PRMARET
;
;   PROC MEDIUM MOVE 0.9    ----    MOVE TO Z POSITIVE LOCATIONS
;                                   +/DOWN
;
PRMA17: JNB     MVZDNW,PRMA18       ; NO -Z'- REQUIRED
        CLR     A
        CJNE    A,NZTMPH,$1         ; > 256 STEPS
        MOV     A,#((<SFTYRG)+1)
        CJNE    A,NZTMPL,$2         ; >-81 STEPS
$2:     JC      $1
        SETB    ZSMLRG              ; < 80 STEPS
        SJMP    APPROACH
$1:     MOV     A,PBOTMP
        JB      PUSTEP,PCMA2B       ; IS USTEP ACTIVATED
        LCALL   ACTUSTP             ; OFF USTEP
PCMA2B: MOV     A,NZTMPH
        MOV     NPSCTH,A
        MOV     A,NZTMPL
        MOV     NPSCTL,A
        CLR     C                   ; M-Z'-A, LAST 80 STEPS WILL
        MOV     A,NPSCTL            ; ALWAYS BE uSTEPed
        SUBB    A,#<SFTYRG
        MOV     NPSCTL,A
        MOV     A,NPSCTH
        SUBB    A,#0
        MOV     NPSCTH,A
        CLR     DIRECT              ; SET DIR FOR CCW DN/+
        SETB    ZAXIS               ; Z AXIS
        MOV     A,#ZFSDLO           ; BASE
        ADD     A,CADROF            ; ADD OFFSET
        MOV     R0,A                ; POINT Z FAST DELAY
        MOVX    A,@R0               ; GET FAST DELAY
        MOV     FASTDL,A            ; PUT TO WORK
;        LCALL   MTRCNT
        LCALL   MDMCNT
        CLR     ZAXIS
        JNB     MVABRT,PRMA18       ; NOT ABORT BY RS232
        LJMP    PRMARET
;
;   PROC MEDIUM MOVE 0.A    ----    APPROACHING
;                           Z MOTOR MOVE DOWNWARD 80 uSTEPS
;                           WITH CONTACT SENSING ALL THE WAY.
;
PRMA18: JNB     MVAPPR,PRMARET      ; NO -A- REQUIRED
APPROACH: MOV   A,PBOTMP
        JNB     PUSTEP,PRMA19       ; IS USTEP ACTIVATED
        LCALL   ACTUSTP             ; ON USTEP
PRMA19: JNB     ZSMLRG,$1
        MOV     R6,NZTMPL           ; MOVE ONLY < 80 STEPS
        SJMP    $2
$1:     MOV     R6,#<SFTYRG         ; MAKE CONTACT W/LIMIT
$2:     CLR     DIRECT              ; CCW DN/+
        SETB    ZAXIS               ; Z AXIS
;
PRMA1C: JNB     PCNTCT,PRMARET      ; CONTACT
        MOV     A,#1
        LCALL   TGPBIT              ; SINGLE STEP
        LCALL   REPTST
        JNB     MVABRT,PRMA2E       ; NOT ABORT BY RS232
        LJMP    PRMARET
PRMA2E: MOV     RDELAY,#USTPDL      ; 256mS DELAY
PRMA1D: JNB     PCNTCT,PRMARET      ; CONTACT
        MOV     A,RDELAY
        JNZ     PRMA1D
        DJNZ    R6,PRMA1C           ; SEE IF CONTACT, AGAIN
        LCALL   REPTST
;
;   PROC MEDIUM MOVE 0.B    ----    CLEAN UP
;
PRMARET: CLR    ZAXIS               ; Z AXIS
        SETB    DIRECT              ; UPWARD JUST IN CASE.
        MOV     A,PBOTMP
```

```
        JB      PUSTEP,PRMA2C   ; IS USTEP ACTIVATED
        LCALL   ACTUSTP         ; OFF USTEP
PRMA2C: LCALL   DISOFT
        MOV     R2,#0CH         ; SHUT CURSOR OF LCD 1
        LCALL   WCMLCD1
        MOV     R2,#0FH         ; SHOW CURSOR OF LCD 0
        LCALL   WCMLCD0
        MOV     BEPDLY,#SHRTBP
        JNB     RESPRQ,$1       ; RESPONSE NOT REQUIRED
        SETB    SUCCES          ; SERIAL COMMAND DONE
        LCALL   SNDSTS
        CLR     RESPRQ
$1:     RET
;
MAMSG1: ASCII   Move Med To X:     . Y:     . Z:     . |
MAMSG2: ASCII   CAN'T INC. Z ANY MORE, ALREADY CONTACT. |
;
;---------------------------------------------------
;
        END
\032
```

```
        INCLUDE KTHEAD.A51
;
;1-LEVEL : 2, CLI EXCUTIONER
;
;2-TYPE : COMMAND LINE OPERATION PROGRAMS
;
;3-FUNCTION : TESTING THE MOTORIZED POSITIONER.
;
;4-CALLING PROGRAM : FUNCTN.
;
;5-ENTRY POINT:     PROC00,PROC01,PROC02,PROC03,
;                   PROC04,PROC05,PROC06,PROC07,
;                   PROC08,PROC09,PROC0A,PROC0B,
;                   PROC0C,PROC0D,PROC0E,PROC0F.
;                   PCHOME,PROCUP,PROCDN,PROCLF,
;                   PROCRT,PROCX, PROCY, PROCZ,
;                   PROCMZ,PROCPZ,PROCNX,PROCST,
;                   PROCDL,PROCTL,PROCBS,PROCFC.
;
;    NOT IMPLEMENT:PROC00,PROC01,PROC02,PROC03,
;
;    LISTED HERE:   PROCUP,PROCDN,PROCLF,PROCRT,
;                   PROCX, PROCY, PROCZ, PROCMZ, PROCPZ,
;                   PROCNX,PROCTL, PROCDL, PROCBS,
;
;6-SUBROUTINE USED:  PROCTL, TGPBIT, PROCST,
;
;7-BUFFER, QUEUE, TABLE USED:
;
;
;-------------------------------------------------
;
IS_MELLIS: ASK      ASSEMBLE FOR MELLIS(-1) OR ALESSI & NIGHTS(-0) POSITIONER
;
;-------------------------------------------------
;
IS_ALESSI: ASK      ASSEMBLE FOR ALESSI(-1) OR KNIGHTS(-0) POSITIONER
;
;-------------------------------------------------
;
          INCLUDE KTINCL.A51
;
;-------------------------------------------------
;
; PUBLIC DECLARATION
          PUBLIC   PROCUP,PROCDN,PROCLF,PROCRT
          PUBLIC   PROCX, PROCY, PROCZ, PROCMZ, PROCPZ
          PUBLIC   PROCNX,PROCTL, PROCDL, PROCBS
;
;-------------------------------------------------
;
; EXTERNAL DECLARATION
;
          EXTERNAL ACTUSTP,MODLMH, TGPBIT, USMCNT
          EXTERNAL STDLMT, SNDSTS, REPTST
          EXTERNAL DISSIG ,DISOFT, WCMLCD0
          EXTERNAL CLRLCD1,WCMLCD1,SADLCD1
          EXTERNAL DISIGN1,DISHEX1,KBDIN,  INPADR
          EXTERNAL MTRCNT, HDMCNT, ACTCTSN,LEGNDS
;
;-------------------------------------------------
;      FUNCTION  KEY  OPERATION  ROUTINES
;-------------------------------------------------
;
```

```
;  CALL THIS TO MOVE Y BACK/+ IN DAMPED WAY.
;  USE ALL, DESTROY ALL.
;
;  CALL THIS ROUTINE TO MOVE Y ONE STEP BY uSTEPPING.
;  OR MOVE Y FAST 256 STEPS WITHOUT uSTEPPING.
;  BIT 02H SET PREVIOUSLY FOR DIRECTION TO GO.
;
PROCUP:                                  ;      UP
          MOV      C,PFAST
          MOV      F0,C
          JB       PNC,PCUP00           ; IS ALREADY POWER UP
          MOV      RDELAY,#PWRSTB       ; WAIT FOR POWER
          CLR      PMTRPD               ; TRIG WATCHDOG TIMER
          SETB     PMTRPD
PCUP01:   MOV      A,RDELAY             ; SUPPLY STABLE
          JNZ      PCUP01
PCUP00:   CLR      PMTRPD               ; TRIG WATCHDOG TIMER
          SETB     PMTRPD
;
; DUE TO ALESSI IS RIGHT HAND SIDE, AND KNIGHTS IS LEFT
;  HAND SIDE POSITIONER, BOTH USE SETB HERE. BUT FOR
;  KNIGHTS THIS IS CW BACK/-, FOR ALESSI THIS IS CCW
;  BACK/+.
;
          IF       IS_ALESSI
          CLR      DIRECT               ; CCW BACK/+
          ELSE     ; IS_KNIGHTS
          SETB     DIRECT               ; CW BACK/-
          ENDIF
;
          SETB     YAXIS                ; Y AXIS
          MOV      A,#YFSDLO            ; BASE
          ADD      A,CADROF             ; ADD OFFSET
          MOV      R0,A                 ; POINT Y FAST DELAY
          MOVX     A,@R0                ; GET FAST DELAY
          MOV      FASTDL,A             ; PUT TO WORK
          JNB      F0,PCUP04            ; FAST MODE
;
          MOV      A,PBOTMP
          JNB      PUSTEP,PCUP07        ; IS USTEP ON
          LCALL    ACTUSTP              ; ON USTEP
;PCUP02:   JB       PCNTCT,PCUP07
;          SJMP     PCUP08               ; CONTACT, PROHIBIT Y
PCUP07:   MOV      A,#1
          LCALL    TGPBIT
          LCALL    REPTST
          MOV      BEPDLY,#MIDBEP       ; USTEP SOUND
          MOV      RDELAY,#USTPDL       ; USTEP DELAY
PCUP03:   MOV      A,RDELAY             ; DEAD BAND
          JNZ      PCUP03
PCUP08:   LCALL    ACTUSTP              ; OFF USTEP
          SJMP     PCUP06
;
PCUP04:   MOV      A,PBOTMP
          JB       PUSTEP,PCUP05        ; IS USTEP ON
          LCALL    ACTUSTP              ; OFF USTEP
PCUP05:   MOV      NPSCTH,#>FSTRVL      ; 256 PULSES
          MOV      NPSCTL,#<FSTRVL
          LCALL    MTRCNT               ; MOTOR ACC/DEACC
                                        ; WITHOUT END DETECT
PCUP06:   CLR      YAXIS
          JNB      RESPRQ,$1            ; RESPONSE NOT REQUIRED
          SETB     SUCCES               ; SERIAL COMMAND DONE
          LCALL    SNDSTS
```

```
          CLR     RESPRQ
$1:       RET
;
;------------------------------------------------
;
;  CALL THIS TO MOVE Y FRONT/- IN DAMPED WAY.
;  USE ALL, DESTROY ALL.
;
;  CALL THIS ROUTINE TO MOVE Y ONE STEP BY uSTEPPING.
;  OR MOVE Y FAST 256 STEPS WITHOUT uSTEPPING.
;  BIT 02H CLEAR PREVIOUSLY FOR DIRECTION TO GO.
;
PROCDN:                               ;'     DOWN
          MOV     C,PFAST
          MOV     F0,C
          JB      PNC,PCDN00        ; IS ALREADY POWER UP
          MOV     RDELAY,#PWRSTB    ; WAIT FOR POWER
          CLR     PMTRPD            ; TRIG WATCHDOG TIMER
          SETB    PMTRPD
PCDN01:   MOV     A,RDELAY          ; SUPPLY STABLE
          JNZ     PCDN01
PCDN00:   CLR     PMTRPD            ; TRIG WATCHDOG TIMER
          SETB    PMTRPD
;
; DUE TO ALESSI IS RIGHT HAND SIDE, AND KNIGHTS IS LEFT
;  HAND SIDE POSITIONER, BOTH USE SETB HERE. BUT FOR
;  KNIGHTS THIS IS CCW FRONT/+, FOR ALESSI THIS IS
;  CW FRONT/-.
;
          IF      IS_ALESSI
          SETB    DIRECT            ; CW FRONT/-
          ELSE    ; IS_KNIGHTS
          CLR     DIRECT            ; CCW FRONT/+
          ENDIF
;
          SETB    YAXIS             ; Y AXIS
          MOV     A,#YFSDLO         ; BASE
          ADD     A,CADROF          ; ADD OFFSET
          MOV     R0,A              ; POINT Y FAST DELAY
          MOVX    A,@R0             ; GET FAST DELAY
          MOV     FASTDL,A          ; PUT TO WORK
          JNB     F0,PCDN04         ; FAST MODE
;
          MOV     A,PBOTMP
          JNB     PUSTEP,PCDN07     ; IS USTEP ON
          LCALL   ACTUSTP           ; ON USTEP
;PCDN02:   JB      PCNTCT,PCDN07
;          SJMP    PCDN08            ; CONTACT, PROHIBIT Y
PCDN07:   MOV     A,#1
          LCALL   TGPBIT
          LCALL   REPTST
          MOV     BEPDLY,#MIDBEP    ; USTEP SOUND
          MOV     RDELAY,#USTPDL    ; USTEP DELAY
PCDN03:   MOV     A,RDELAY          ; DEAD BAND
          JNZ     PCDN03
PCDN08:   LCALL   ACTUSTP           ; OFF USTEP
          SJMP    PCDN06
;
PCDN04:   MOV     A,PBOTMP
          JB      PUSTEP,PCDN05     ; IS USTEP ON
          LCALL   ACTUSTP           ; OFF USTEP
PCDN05:   MOV     NPSCTH,#>FSTRVL   ; 256 PULSES
          MOV     NPSCTL,#<FSTRVL
          LCALL   MTRCNT            ; MOTOR ACC/DEACC
                                    ; WITHOUT END DETECT
PCDN06:   CLR     YAXIS
          JNB     RESPRQ,$1         ; RESPONSE NOT REQUIRED
          SETB    SUCCES            ; SERIAL COMMAND DONE
          LCALL   SNDSTS
          CLR     RESPRQ
$1:       RET
;
;------------------------------------------------
;
;  CALL THIS TO MOVE X LEFT/+ IN DAMPED WAY.
;  USE ALL, DESTROY ALL.
;
;  CALL THIS ROUTINE TO MOVE X ONE STEP BY uSTEPPING.
;  OR MOVE X FAST 256 STEPS WITHOUT uSTEPPING.
;  BIT 02H SET PREVIOUSLY FOR DIRECTION TO GO.
;
PROCLF:                               ;      LEFT
          MOV     C,PFAST
          MOV     F0,C
          JB      PNC,PCLF00        ; IS ALREADY POWER UP
          MOV     RDELAY,#PWRSTB    ; WAIT FOR POWER
          CLR     PMTRPD            ; TRIG WATCHDOG TIMER
          SETB    PMTRPD
PCLF01:   MOV     A,RDELAY          ; SUPPLY STABLE
          JNZ     PCLF01
PCLF00:   CLR     PMTRPD            ; TRIG WATCHDOG TIMER
          SETB    PMTRPD
          CLR     DIRECT            ; CCW LEFT/+
          SETB    XAXIS             ; X AXIS
          MOV     A,#XFSDLO         ; BASE
          ADD     A,CADROF          ; ADD OFFSET
          MOV     R0,A              ; POINT X FAST DELAY
          MOVX    A,@R0             ; GET FAST DELAY
          MOV     FASTDL,A          ; PUT TO WORK
          JNB     F0,PCLF04         ; FAST MODE
;
          MOV     A,PBOTMP
          JNB     PUSTEP,PCLF07     ; IS USTEP ON
          LCALL   ACTUSTP           ; ON USTEP
;PCLF02:   JB      PCNTCT,PCLF07
;          SJMP    PCLF08            ; CONTACT, PROHIBIT X
PCLF07:   MOV     A,#1
          LCALL   TGPBIT
          LCALL   REPTST
          MOV     BEPDLY,#MIDBEP    ; USTEP SOUND
          MOV     RDELAY,#USTPDL    ; USTEP DELAY
PCLF03:   MOV     A,RDELAY          ; DEAD BAND
          JNZ     PCLF03
PCLF08:   LCALL   ACTUSTP           ; OFF USTEP
          SJMP    PCLF06
;
PCLF04:   MOV     A,PBOTMP
          JB      PUSTEP,PCLF05     ; IS USTEP ON
          LCALL   ACTUSTP           ; OFF USTEP
PCLF05:   MOV     NPSCTH,#>FSTRVL   ; 256 PULSES
          MOV     NPSCTL,#<FSTRVL
          LCALL   MTRCNT            ; MOTOR ACC/DEACC
                                    ; WITHOUT END DETECT
PCLF06:   CLR     XAXIS
          JNB     RESPRQ,$1         ; RESPONSE NOT REQUIRED
          SETB    SUCCES            ; SERIAL COMMAND DONE
          LCALL   SNDSTS
          CLR     RESPRQ
```

```
$1:         RET
;
;--------------------------------------------------
;
;  CALL THIS TO MOVE X RIGHT/- IN DAMPED WAY.
;  USE ALL, DESTROY ALL.
;
;  CALL THIS ROUTINE TO MOVE X ONE STEP BY uSTEPPING.
;  OR MOVE X FAST 256 STEPS WITHOUT uSTEPPING.
;  BIT 02H CLEAR PREVIOUSLY FOR DIRECTION TO GO.
;
PROCRT:                                 ;      RIGHT
            MOV     C,PFAST
            MOV     F0,C
            JB      PNC,PCRT00          ; IS ALREADY POWER UP
            MOV     RDELAY,#PWRSTB      ; WAIT FOR POWER
            CLR     PMTRPD              ; TRIG WATCHDOG TIMER
            SETB    PMTRPD
PCRT01:     MOV     A,RDELAY            ; SUPPLY STABLE
            JNZ     PCRT01
PCRT00:     CLR     PMTRPD              ; TRIG WATCHDOG TIMER
            SETB    PMTRPD
            SETB    DIRECT              ; CW RIGHT/-
            SETB    XAXIS               ; X AXIS
            MOV     A,#XFSDLO           ; BASE
            ADD     A,CADROF            ; ADD OFFSET
            MOV     R0,A                ; POINT X FAST DELAY
            MOVX    A,@R0               ; GET FAST DELAY
            MOV     FASTDL,A            ; PUT TO WORK
            JNB     F0,PCRT04           ; FAST MODE
;
            MOV     A,PBOTMP
            JNB     PUSTEP,PCRT07       ; IS USTEP ON
            LCALL   ACTUSTP             ; ON USTEP
;PCRT02:     JB      PCNTCT,PCRT07
;            SJMP    PCRT08              ; CONTACT, PROHIBIT X
PCRT07:     MOV     A,#1
            LCALL   TGPBIT
            LCALL   REPTST
            MOV     BEPDLY,#MIDBEP      ; USTEP SOUND
            MOV     RDELAY,#USTPDL      ; USTEP DELAY
PCRT03:     MOV     A,RDELAY            ; DEAD BAND
            JNZ     PCRT03
PCRT08:     LCALL   ACTUSTP             ; OFF USTEP
            SJMP    PCRT06
;
PCRT04:     MOV     A,PBOTMP
            JB      PUSTEP,PCRT05       ; IS USTEP ON
            LCALL   ACTUSTP             ; OFF USTEP
PCRT05:     MOV     NPSCTH,#>FSTRVL     ; 256 PULSES
            MOV     NPSCTL,#<FSTRVL
            LCALL   MTRCNT              ; MOTOR ACC/DEACC
                                        ; WITHOUT END DETECT
PCRT06:     CLR     XAXIS
            JNB     RESPRQ,$1           ; RESPONSE NOT REQUIRED
            SETB    SUCCES              ; SERIAL COMMAND DONE
            LCALL   SNDSTS
            CLR     RESPRQ
$1:         RET
;
;--------------------------------------------------
;
;  CALL THIS TO MOVE X RIGHT/- OR LEFT/+ IN
;  UNDAMPED WAY. USE ALL, DESTROY ALL.
;
;  CALL THIS ROUTINE TO MOVE X ONE STEP BY uSTEPPING.
;  OR MOVE X FAST 8 STEPS WITHOUT uSTEPPING.
;  BIT 02H CLEAR/SET PREVIOUSLY FOR DIRECTION TO GO.
;
PROCX:                                  ;      X
            MOV     C,PFAST
            MOV     F0,C
            JB      PNC,PROCX2          ; IS ALREADY POWER UP
            MOV     RDELAY,#PWRSTB      ; WAIT FOR POWER
            CLR     PMTRPD              ; TRIG WATCHDOG TIMER
            SETB    PMTRPD
PROCX5:     MOV     A,RDELAY            ; SUPPLY STABLE
            JNZ     PROCX5
PROCX2:     CLR     PMTRPD              ; TRIG WATCHDOG TIMER
            SETB    PMTRPD
            MOV     A,#XFSDLO           ; BASE
            ADD     A,CADROF            ; ADD OFFSET
            MOV     R0,A                ; POINT X FAST DELAY
            MOVX    A,@R0               ; GET FAST DELAY
            MOV     FASTDL,A            ; PUT TO WORK
            SETB    XAXIS               ; X AXIS
            JB      PCNTCT,PROCX7       ; IS CONTACT
            SJMP    PROCX1              ; PROHIBIT X MOVE 8 STEPS
PROCX7:     JNB     F0,PROCX0           ; FAST MODE
;
            SETB    DIRECT              ; CW RIGHT/-
            MOV     A,PBOTMP
            JB      PUSTEP,PROCX3       ; IS USTEP ON
            LCALL   ACTUSTP             ; OFF USTEP
;PROCX3:     MOV     NPSCTH,#>MDTRVL     ; 8 PULSES
;            MOV     NPSCTL,#<MDTRVL
PROCX3:     MOV     NPSCTH,#00          ;  |
            MOV     R0,#MDSTNB          ;  |
            MOVX    A,@R0               ;  |- NEW ADD
            MOV     NPSCTL,A            ;  |
            LCALL   MDMCNT              ;  |
;            LCALL   MTRCNT              ; MOTOR ACC/DEACC
            SJMP    PROCX1              ; WITHOUT END DETECT
;
PROCX0:     CLR     DIRECT              ; CCW LEFT/+
            MOV     A,PBOTMP
            JB      PUSTEP,PROCX4       ; IS USTEP ON
            LCALL   ACTUSTP             ; USTEP OFF
;PROCX4:     MOV     NPSCTH,#>MDTRVL     ; 8 PULSES
;            MOV     NPSCTL,#<MDTRVL
PROCX4:     MOV     NPSCTH,#00          ;  |
            MOV     R0,#MDSTNB          ;  |
            MOVX    A,@R0               ;  |- NEW ADD
            MOV     NPSCTL,A            ;  |
            LCALL   MDMCNT
;            LCALL   MTRCNT              ; MOTOR ACC/DEACC
                                        ; WITHOUT END DETECT
PROCX1:     CLR     XAXIS
            JNB     RESPRQ,$1           ; RESPONSE NOT REQUIRED
            SETB    SUCCES              ; SERIAL COMMAND DONE
            LCALL   SNDSTS
            CLR     RESPRQ
$1:         RET
;
;--------------------------------------------------
;
;  CALL THIS TO MOVE Y BACK/+ OR FRONT/- IN
;  UNDAMPED WAY. USE ALL, DESTROY ALL.
```

```
;
;  CALL THIS ROUTINE TO MOVE Y ONE STEP BY uSTEPPING.
;  OR MOVE Y FAST 8 STEPS WITHOUT uSTEPPING.
;  BIT 02H SET/CLEAR PREVIOUSLY FOR DIRECTION TO GO.
;
PROCY:                                  ;     Y
           MOV      C,PFAST
           MOV      F0,C
           JB       PNC,PROCY2          ; IS ALREADY POWER UP
           MOV      RDELAY,#PWRSTB      ; WAIT FOR POWER
           CLR      PMTRPD              ; TRIG WATCHDOG TIMER
           SETB     PMTRPD
PROCY5:    MOV      A,RDELAY            ; SUPPLY STABLE
           JNZ      PROCY5
PROCY2:    CLR      PMTRPD              ; TRIG WATCHDOG TIMER
           SETB     PMTRPD
           MOV      A,#YFSDLO           ; BASE
           ADD      A,CADROF            ; ADD OFFSET
           MOV      R0,A                ; POINT Y FAST DELAY
           MOVX     A,@R0               ; GET FAST DELAY
           MOV      FASTDL,A            ; PUT TO WORK
           SETB     YAXIS               ; Y AXIS
           JB       PCNTCT,PROCY7       ; IS CONTACT
           SJMP     PROCY1              ; PROHIBIT Y MOVE 8 STEPS
PROCY7:    JNB      F0,PROCY0           ; FAST MODE
;
; DUE TO ALESSI IS RIGHT HAND SIDE, AND KNIGHTS IS LEFT
;  HAND SIDE POSITIONER, BOTH USE SETB HERE. BUT FOR
;  KNIGHTS THIS IS CW BACK/-, FOR ALESSI THIS IS CCW
;  BACK/+.
;
           IF       IS_ALESSI
           CLR      DIRECT              ; CCW BACK/+
           ELSE     ; IS_KNIGHTS
           SETB     DIRECT              ; CW BACK/-
           ENDIF
;
           MOV      A,PBOTMP
           JB       PUSTEP,PROCY3       ; IS USTEP ON
           LCALL    ACTUSTP             ; OFF USTEP
;PROCY3:    MOV     NPSCTH,#>MDTRVL ; 8 PULSES
;           MOV     NPSCTL,#<MDTRVL
PROCY3:    MOV      NPSCTH,#00          ;  |
           MOV      R0,#MDSTNB          ;  |
           MOVX     A,@R0               ;  |- NEW ADD
           MOV      NPSCTL,A            ;  |
           LCALL    MDMCNT              ;  |
;           LCALL   MTRCNT              ; MOTOR ACC/DEACC
           SJMP     PROCY1              ; WITHOUT END DETECT
;
; DUE TO ALESSI IS RIGHT HAND SIDE, AND KNIGHTS IS LEFT
;  HAND SIDE POSITIONER, BOTH USE SETB HERE. BUT FOR
;  KNIGHTS THIS IS CCW FRONT/+, FOR ALESSI THIS IS
;  CW FRONT/-.
;
PROCY0:    IF       IS_ALESSI
           SETB     DIRECT              ; CW FRONT/-
           ELSE     ; IS_KNIGHTS
           CLR      DIRECT              ; CCW FRONT/+
           ENDIF
;
           MOV      A,PBOTMP
           JB       PUSTEP,PROCY4       ; IS USTEP ON
           LCALL    ACTUSTP             ; USTEP OFF
;PROCY4:    MOV     NPSCTH,#>MDTRVL ; 8 PULSES
;           MOV     NPSCTL,#<MDTRVL
PROCY4:    MOV      NPSCTH,#00          ;  |
           MOV      R0,#MDSTNB          ;  |
           MOVX     A,@R0               ;  |- NEW ADD
           MOV      NPSCTL,A            ;  |
           LCALL    MDMCNT              ;  |
;           LCALL   MTRCNT              ; MOTOR ACC/DEACC
                                        ; WITHOUT END DETECT
PROCY1:    CLR      YAXIS
           JNB      RESPRQ,$1           ; RESPONSE NOT REQUIRED
           SETB     SUCCES              ; SERIAL COMMAND DONE
           LCALL    SNDSTS
           CLR      RESPRQ
$1:        RET
;
;-------------------------------------------------
;
;  CALL THIS TO MOVE Z DOWN/+ OR UP/- IN
;  UNDAMPED WAY. USE ALL, DESTROY ALL.
;
;  CALL THIS ROUTINE TO MOVE Z ONE STEP BY uSTEPPING.
;  OR MOVE Z FAST 8 STEPS WITHOUT uSTEPPING.
;  BIT 02H SET/CLEAR PREVIOUSLY FOR DIRECTION TO GO.
;
PROCZ:                                  ;     Z
           MOV      C,PFAST
           MOV      F0,C
           JB       PNC,PROCZ2          ; IS ALREADY POWER UP
           MOV      RDELAY,#PWRSTB      ; WAIT FOR POWER
           CLR      PMTRPD              ; TRIG WATCHDOG TIMER
           SETB     PMTRPD
PROCZ5:    MOV      A,RDELAY            ; SUPPLY STABLE
           JNZ      PROCZ5
PROCZ2:    CLR      PMTRPD              ; TRIG WATCHDOG TIMER
           SETB     PMTRPD
           MOV      A,#ZFSDLO           ; BASE
           ADD      A,CADROF            ; ADD OFFSET
           MOV      R0,A                ; POINT Z FAST DELAY
           MOVX     A,@R0               ; GET FAST DELAY
           MOV      FASTDL,A            ; PUT TO WORK
           SETB     ZAXIS               ; Z AXIS
           JNB      F0,PROCZ0           ; FAST MODE
;
           SETB     DIRECT              ; CW UP/-
           MOV      A,PBOTMP
           JB       PUSTEP,PROCZ3       ; IS USTEP ON
           LCALL    ACTUSTP             ; OFF USTEP
;PROCZ3:    MOV     NPSCTH,#>MDTRVL ; 8 PULSES
;           MOV     NPSCTL,#<MDTRVL
PROCZ3:    MOV      NPSCTH,#00          ;  |
           MOV      R0,#MDSTNB          ;  |
           MOVX     A,@R0               ;  |- NEW ADD
           MOV      NPSCTL,A            ;  |
           LCALL    MDMCNT              ;  |
;          LCALL    MTRCNT              ; MOTOR ACC/DEACC
           SJMP     PROCZ1              ; WITHOUT END DETECT
;
;-------------------------------------------------
;
;PROCZ3:    JB      PCNTCT,PROCZ7
;           JB      DIRECT,PROCZ7       ; Z UP ALLOW
;           SJMP    PROCZ1              ; PROHIBIT Z DN
;PROCZ7:    MOV     A,#1
```

```
;           LCALL   TGPBIT
;           LCALL   REPTST
;
;--------------------------------------------------
;
;
PROCZ0:     CLR     DIRECT              ; CCW DN/+
            MOV     A,PBOTMP
            JB      PUSTEP,PROCZ4       ; IS USTEP ON
            LCALL   ACTUSTP             ; USTEP OFF
;PROCZ4:    MOV     NPSCTH,#>MDTRVL ; 8 PULSES
;           MOV     NPSCTL,#<MDTRVL
PROCZ4:     MOV     NPSCTH,#00              ;  |
            MOV     R0,#MDSTNB              ;  |
            MOVX    A,@R0                   ;  |- NEW ADD
            MOV     NPSCTL,A                ;  |
            LCALL   MDMCNT                  ;  |
;           LCALL   MTRCNT              ; MOTOR ACC/DEACC
                                        ; WITHOUT END DETECT
PROCZ1:     CLR     ZAXIS
            JNB     RESPRQ,$1           ; RESPONSE NOT REQUIRED
            SETB    SUCCES              ; SERIAL COMMAND DONE
            LCALL   SNDSTS
            CLR     RESPRQ
$1:         RET
;
;--------------------------------------------------
;
;  CALL THIS TO MOVE Z UP/- IN DAMPED WAY.
;  USE ALL, DESTROY ALL.
;
;  CALL THIS ROUTINE TO MOVE Z ONE STEP BY uSTEPPING.
;  OR MOVE Z FAST 256 STEPS WITHOUT uSTEPPING.
;  BIT 02H CLEAR PREVIOUSLY FOR DIRECTION TO GO.
;
PROCMZ:                                 ;      -
            MOV     C,PFAST
            MOV     F0,C
            JB      PNC,PROCM0          ; IS ALREADY POWER UP
            MOV     RDELAY,#PWRSTB      ; WAIT FOR POWER
            CLR     PMTRPD              ; TRIG WATCHDOG TIMER
            SETB    PMTRPD
PROCM1:     MOV     A,RDELAY            ; SUPPLY STABLE
            JNZ     PROCM1
PROCM0:     CLR     PMTRPD              ; TRIG WATCHDOG TIMER
            SETB    PMTRPD
            SETB    DIRECT              ; CW UP/-
            SETB    ZAXIS               ; Z AXIS
            MOV     A,#ZFSDLO           ; BASE
            ADD     A,CADROF            ; ADD OFFSET
            MOV     R0,A                ; POINT Z FAST DELAY
            MOVX    A,@R0               ; GET FAST DELAY
            MOV     FASTDL,A            ; PUT TO WORK
            JNB     F0,PROCM4           ; FAST MODE
;
            MOV     A,PBOTMP
            JNB     PUSTEP,PROCM2       ; IS USTEP ON
            LCALL   ACTUSTP             ; ON USTEP
PROCM2:     MOV     A,#1
            LCALL   TGPBIT
            LCALL   REPTST
            MOV     BEPDLY,#MIDBEP      ; USTEP SOUND
            MOV     RDELAY,#USTPDL      ; USTEP DELAY
PROCM3:     MOV     A,RDELAY            ; DEAD BAND
            JNZ     PROCM3
            LCALL   ACTUSTP             ; OFF USTEP
            SJMP    PROCM6
;
PROCM4:     MOV     A,PBOTMP
            JB      PUSTEP,PROCM5       ; IS USTEP ON
            LCALL   ACTUSTP             ; OFF USTEP
PROCM5:     MOV     NPSCTH,#>FSTRVL ; 256 PULSES
            MOV     NPSCTL,#<FSTRVL
            LCALL   MTRCNT              ; MOTOR ACC/DEACC
                                        ; WITHOUT END DETECT
PROCM6:     CLR     ZAXIS
            JNB     RESPRQ,$1           ; RESPONSE NOT REQUIRED
            SETB    SUCCES              ; SERIAL COMMAND DONE
            LCALL   SNDSTS
            CLR     RESPRQ
$1:         RET
;
;--------------------------------------------------
;
;  CALL THIS TO MOVE Z DN/+ IN DAMPED WAY.
;  USE ALL, DESTROY ALL.
;
;  CALL THIS ROUTINE TO MOVE Z ONE STEP BY uSTEPPING.
;  OR MOVE Z FAST 256 STEPS WITHOUT uSTEPPING.
;  BIT 02H SET PREVIOUSLY FOR DIRECTION TO GO.
;
PROCPZ:                                 ;      + / -
            MOV     C,PFAST
            MOV     F0,C
            JB      PNC,PROCP0          ; IS ALREADY POWER UP
            MOV     RDELAY,#PWRSTB      ; WAIT FOR POWER
            CLR     PMTRPD              ; TRIG WATCHDOG TIMER
            SETB    PMTRPD
PROCP1:     MOV     A,RDELAY            ; SUPPLY STABLE
            JNZ     PROCP1
PROCP0:     CLR     PMTRPD              ; TRIG WATCHDOG TIMER
            SETB    PMTRPD
            CLR     DIRECT              ; CCW DN/+
            SETB    ZAXIS               ; Z AXIS
            MOV     A,#ZFSDLO           ; BASE
            ADD     A,CADROF            ; ADD OFFSET
            MOV     R0,A                ; POINT Z FAST DELAY
            MOVX    A,@R0               ; GET FAST DELAY
            MOV     FASTDL,A            ; PUT TO WORK
            JNB     F0,PROCP4           ; FAST MODE
;
            MOV     A,PBOTMP
            JNB     PUSTEP,PROCP2       ; IS USTEP ON
            LCALL   ACTUSTP             ; ON USTEP
PROCP2:     MOV     A,#1                ; ALLOW Z OVER DRIVE
            LCALL   TGPBIT
            LCALL   REPTST
            MOV     BEPDLY,#MIDBEP      ; USTEP SOUND
            MOV     RDELAY,#USTPDL      ; USTEP DELAY
PROCP3:     MOV     A,RDELAY            ; DEAD BAND
            JNZ     PROCP3
PROCP8:     LCALL   ACTUSTP             ; OFF USTEP
            SJMP    PROCP6
;
PROCP4:     MOV     A,PBOTMP
            JB      PUSTEP,PROCP5       ; IS USTEP ON
            LCALL   ACTUSTP             ; OFF USTEP
PROCP5:     MOV     NPSCTH,#>FSTRVL ; 256 PULSES
```

```
            MOV     NPSCTL,#<FSTRVL
            LCALL   MTRCNT          ; MOTOR ACC/DEACC
                                    ; WITHOUT END DETECT
PROCP6:     CLR     ZAXIS
            JNB     RESPRQ,$1       ; RESPONSE NOT REQUIRED
            SETB    SUCCES          ; SERIAL COMMAND DONE
            LCALL   SNDSTS
            CLR     RESPRQ
$1:         RET
;
;-----------------------------------------------
;
;  CALL THIS TO SIMULATE CONTACT SENSING CONDITION.
;  USE ALL, DESTROY ALL.
;
PROCNX:                             ;      , NEXT
            JNB     PFAST,PRNX04    ; INC STATUS TO SHOW
                                    ; DIFFENENT STMSG ON FUNC
            MOV     RDELAY,#RLYSTB  ; 1 SEC
            JB      PSENSE,PRNX02   ; CONTACT SENSING ACTIVATED
            LCALL   ACTCTSN
PRNX00:     MOV     A,RDELAY        ; WAIT FOR RELAY ACTIVATED
            JNZ     PRNX00
PRNX02:     JB      PCNTCT,PRNX01   ; IS NOT CONTACT
            MOV     BEPDLY,#SHRTBP  ; CONTACT SOUND
            SJMP    PRNXRET
PRNX01:     MOV     BEPDLY,#LONGBP  ; LOST OR NO CONTACT
PRNXRET:                            ; ACTIVATE CONTACT SENSING
            JNB     RESPRQ,$1       ; RESPONSE NOT REQUIRED
            SETB    SUCCES          ; SERIAL COMMAND DONE
            LCALL   SNDSTS
            CLR     RESPRQ
$1:         RET
;
PRNX04:     INC     STTSTO          ; CHANGE SUB-SOFTMENU
            MOV     A,STTSTO
            CJNE    A,#0AH,PRNX05   ; NO WRAP NEEDED
            MOV     STTSTO,#0
            INC     STATUS
            MOV     A,STATUS
            CJNE    A,#9,PRNX05     ; NO WRAP NEEDED.
            MOV     STATUS,#0
PRNX05:     LCALL   DISOFT          ; SHOW SOFTMENU
            SJMP    PRNXRET
;
;-----------------------------------------------
;
;  CALL THIS TO SIMULATE MESSURE.
;  USE ALL, DESTORY ALL.
;
PROCDL:                             ;      DELETE
            MOV     RDELAY,#RLYSTB  ; 4 SEC
            JNB     PSENSE,$2       ; IS MEASURE MODE
            LCALL   ACTCTSN         ; DISABLE CONTACT SENSING
$3:         MOV     A,RDELAY        ; WAIT FOR RELAY ACTIVE
            JNZ     $3
$2:         JNB     RESPRQ,$1       ; RESPONSE NOT REQUIRED
            SETB    SUCCES          ; SERIAL COMMAND DONE
            LCALL   SNDSTS
            CLR     RESPRQ
$1:         RET
;
;-----------------------------------------------
;
```

```
;  CALL THIS TO ACTIVATE uSTEP PIN.
;  USE ALL; DESTROY ALL.
;
PROCTL:                             ;      CNTL
            JNB     PFAST,PCTL01    ; FAST MODE
;
            MOV     A,PBOTMP
            JNB     PUSTEP,PCTL00   ; IS USTEP ACTIVE
            LCALL   ACTUSTP         ; ON USTEP MODE
PCTL00:     JNB     RESPRQ,$1       ; RESPONSE NOT REQUIRED
            SETB    SUCCES          ; SERIAL COMMAND DONE
            LCALL   SNDSTS
            CLR     RESPRQ
$1:         RET
;
PCTL01:     MOV     A,PBOTMP
            JB      PUSTEP,$2       ; IS USTEP NOT ACTIVE
            LCALL   ACTUSTP         ; OFF USTEP
$2:         SJMP    PCTL00
;
;-----------------------------------------------
;  MAKE  CONTACT  WITH  LIMIT      20 STEPS MAXIMUM
;-----------------------------------------------
;
;  CALL THIS ROUTINE TO MAKE CONTACT WITH LIMIT.
;
;  USE ALL DESTORY ALL.
;
;  IT CONTAIN AN EXAMPLE SHOWING HOW TO SENSE KBD
;  AND INPUT PORT AT THE SAME TIME.
;
;  IT WILL SOUND A SHORT BEEP AFTER MAKING CONTACT OR
;  A LONG BEEP IF NOT MAKING ANY CONTACT.
;
;  AFTER MAKING CONTACT, THERE ARE ONLY TWO KEYS THAT
;  WILL BE RECOGNIZED: BACK SPACE OR FUNC.
;
;   BACKSPACE WILL RISE THE PROBE TIP 20uM.
;   FUNC WILL LEAVE THE PROBE TIP ON THE WAFER SURFACE.
;
;
PROCBS:                             ;      BACK SPACE
;
;    PROC BS 0.0    ---   INIT PREPARATIONS
;
            MOV     C,PFAST
            MOV     F0,C
            MOV     R2,#0CH         ; SHUT CURSOR OF LCD 0
            LCALL   WCMLCD0
            LCALL   CLRLCD1
            MOV     R2,#0FH         ; SHOW CURSOR OF LCD 1
            LCALL   WCMLCD1
            MOV     DPTR,#CMSG1     ; SHOW MAKE CONTACT MSG
            MOV     R3,#80
            LCALL   DISIGN1
            MOV     R2,#85
            LCALL   SADLCD1
            JNB     F0,$1           ; SET DIFF STEPS FOR FAST
            MOV     CTH,#0
            MOV     CTL,#20H
            SJMP    $2
$1:         MOV     CTH,#>2CENTR
            MOV     CTL,#<2CENTR
$2:         MOV     R4,CTH          ; SHOW DEFAULT STEP LIMIT
```

```
        MOV     R5,CTL
        LCALL   DISHEX1
        JB      F0,PRBS00
        MOV     NPSCTH,#>ZCENTR
        MOV     NPSCTL,#<ZCENTR
        SJMP    PRBS04          ; FAST MODE
;
;    PROC BS 0.1  ---  COLLECT STEP LIMIT PARAMETER
;
PRBS00: LCALL   KBDIN
        CJNE    A,#9EH,PRBS01   ; BACK SPACE EDITING
        SJMP    PROCBS
PRBS01: CJNE    A,#9FH,PRBS02   ; ABORT
        LJMP    PRBS0F
PRBS02: CJNE    A,#9AH,PRBS03   ; IS NEXT
        MOV     NPSCTH,CTH
        MOV     NPSCTL,CTL
        SJMP    PRBS04
PRBS03: ANL     A,#0FH          ; GET NUM KEY
        MOV     R4,A            ; TMP IN BUF
        LCALL   INPADR          ; RIGHT ENTRY 2 BYTES
        MOV     R2,#85          ; SHOW NUMBER ON LCD 1
        LCALL   SADLCD1
        MOV     R4,CTH
        MOV     R5,CTL
        LCALL   DISHEX1
        SJMP    PRBS00
;
;    PROC BS 0.2  ---  PREPARE TO MOVE USING uSTEP
;
PRBS04: MOV     R2,#0CH         ; SHUT CURSOR OF LCD1
        LCALL   WCMLCD1
        MOV     A,PBOTMP
        JNB     PUSTEP,PRBS0C   ; IS uSTEP ACTIVE
        LCALL   ACTUSTP         ; ON uSTEP
PRBS0C: JB      PNC,PRBS06      ; ALREADY POWER UP
        MOV     RDELAY,#PWRSTB
        CLR     PMTRPD          ; TRIG WATCHDOG TIMER
        SETB    PMTRPD
PRBS05: MOV     A,RDELAY        ; WAIT FOR RELAY ACTIVATED
        JNZ     PRBS05
PRBS06: CLR     PMTRPD          ; TRIG WATCHDOG TIMER
        SETB    PMTRPD
        MOV     FASTDL,#USDELY  ; FAKE FAST DELAY
        CLR     DIRECT          ; CCW DN/+
        SETB    ZAXIS           ; Z AXIS
;
;    PROC BS 0.3   ---  Z MOTOR MOVE DOWNWARD 810/1B20H
;                  STEPS WITH CONTACT SENSING ALL THE WAY.
;
        JNB     PCNTCT,PRBS07   ; CONTACT -> BREAK
        LCALL   USHCNT          ; uSTEP
        JNB     PCNTCT,PRBS07   ; CONTACT -> BREAK
        JNB     MVABRT,$14      ; LIMIT REACHED -> BREAK
        CLR     SUCCES          ; SERIAL COMMAND FAIL
        LJMP    PRBS0F          ; ABORT -> BREAK
$14:    LJMP    PRBS09
;
;    PROC BS 0.4   ---  SHOW CONDITION MESSAGE
;
;PRBS07: MOV    R6,#1           ; OVER DRIVE 0.5 MICRON
;PRBS13: MOV    A,#1
;       LCALL   TGPBIT    ; JW : TAKE OUT OVERDRIVE 1-24-89
;       LCALL   REPTST
;       JNB     MVABRT,PRBS14   ; NOT ABORT BY RS232
;       SJMP    PRBS09
;PRBS14: MOV    RDELAY,#USTPDL
;$12:   MOV     A,RDELAY
;       JNZ     $12             ; WAIT FOR USTEP
;       DJNZ    R6,PRBS13
;
PRBS07: MOV     BEPDLY,#SHRTBP  ; CONTACT SOUND
        MOV     RDELAY,#33      ; WAIT FOR ONE SEC TO CHECK
$11:    MOV     A,RDELAY        ; IF STILL CONTACT
        JNZ     $11
;
        JNB     PCNTCT,PRBS0D   ; YES, FINISH CLEAN UP
;
        CLR     PMTRPD          ; NO OVERDRIVE 5 uM MORE
        SETB    PMTRPD          ; TRIG WATCHDOG TIMER
        MOV     R2,#40
        LCALL   SADLCD1
        MOV     DPTR,#CMSG4     ; SHOW OVERDRIVE MSG
        MOV     R3,#40
        LCALL   DISIGN1
;
        MOV     R6,#10          ; OVER DRIVE 2 MICRON
PRBS10: JNB     PCNTCT,PRBS0D   ; CONTACT
PRBS15: MOV     A,#1
        LCALL   TGPBIT
        LCALL   REPTST
        JNB     MVABRT,PRBS12   ; NOT ABORT BY RS232
        SJMP    PRBS09
PRBS12: MOV     RDELAY,#USTPDL
$13:    MOV     A,RDELAY
        JNZ     $13             ; WAIT FOR USTEP
        JNB     PCNTCT,PRBS0D   ; CONTACT -> BREAK
        DJNZ    R6,PRBS15
        JNB     PCNTCT,PRBS0D   ; CONTACT -> BREAK
        JNB     MVABRT,PRBS09   ; LIMIT REACHED -> BREAK
        CLR     SUCCES          ; SERIAL COMMAND FAIL
        SJMP    PRBS0F          ; ABORT -> BREAK
;
;    PROC  BS  0.4 1/1   ---  CONTACT MADE
;
PRBS0D: JB      RESPRQ,PRBS0F   ; REMOTE MODE SHOW NO MSG
        MOV     R2,#0
        LCALL   SADLCD1
        MOV     DPTR,#CMSG2     ; SHOW MADE MSG
        MOV     R3,#80
        LCALL   DISIGN1
PRBS08: LCALL   KBDIN           ; WAIT FOR USER ACCKNOWLEDGE
        CJNE    A,#9FH,PRBS08
        SJMP    PRBS0F          ; FUNC KEY
;
;    PROC  BS  0.4 1/2  ---  LIMIT /NO CONTACT/ RESPONCE
;
PRBS09: JB      RESPRQ,PRBS0B   ; REMOTE MODE SHOW NO MSG
        MOV     BEPDLY,#LONGBP  ; NO CONTACT SOUND
        MOV     R2,#0
        LCALL   SADLCD1
        MOV     DPTR,#CMSG3     ; SHOW LIMIT REACH MSG
        MOV     R3,#80
        LCALL   DISIGN1
PRBS0A: LCALL   KBDIN           ; WAIT FOR USER ACCKNOWLEDGE
        CJNE    A,#9FH,PRBS0A
PRBS0B: CLR     SUCCES          ; SERIAL COMMAND FAIL
;
```

```
;     PROC BS 0.5    ---  CLEAN UP
;
PRBSOF:    LCALL    ACTUSTP           ; OFF USTEP
           LCALL    DISOFT
           MOV      R2,#0CH           ; SHUT CURSOR OF LCD1
           LCALL    WCMLCD1
           MOV      R2,#0FH           ; SHOW CURSOR ON LCD0
           LCALL    WCMLCD0
           CLR      ZAXIS
           SETB     DIRECT            ; SUCCESIVE Z MOVEMENT
                                      ; MUST BE UPWARD
           JNB      RESPRQ,$1         ; RESPONSE NOT REQUIRED
           JNB      SUCCES,$2         ; FAILED
           SETB     SUCCES            ; SERIAL COMMAND DONE
$2:        LCALL    SNDSTS
           CLR      RESPRQ
$1:        RET
;
;--------------------------------------------------
;
CMSG1:     ASCII    Making Contact with Step Limitation      |
           ASCII    Current Step Limit :                     |
CMSG2:     ASCII    Contact Made.  Use DEL to enter Measure |
           ASCII    mode after you press FUNC to Proceed!   |
CMSG3:     ASCII    No Contact Made !                        |
           ASCII    Limit Reached.     Press FUNC to Proceed!|
CMSG4:     ASCII    No Contact Made ! Over Drive to Contact!|
;
;--------------------------------------------------
;
           END
\032
```

```
        INCLUDE KTHEAD.A51
;
;1-LEVEL : 0 AND 1,
;
;2-TYPE : UTILITY PROGRAM
;
;           1)   FOR KBD INPUT, ENCODE DISPLAY
;           2)   FOR LCD 0 & 1
;           3)   FOR MOTOR CONTROL
;
;3-FUNCTION : TESTING THE MOTORIZED POSITIONER.
;
;4-CALLING PROGRAM :
;
;           1) ECHO IN INIT 0.8, PROCBS
;           2) INIT 0.4, PROCST, DISSGN IN KNPRFC
;           3) PCHOME IN FUNCTN
;              PROCPZ, PROCMZ, PROCX, PROCY, PROCZ,
;              PROCBS IN KNPRFC.
;
;5-ENTRY POINT:
;
;           1) KBDIN, ENACC
;           2) CLRLCD0, RSTLCD0, WCMLCD0, WDTLCD0, HMCLCD0.
;              SADLCD0, CLRLCD1, RSTLCD1, WCMLCD1, WDTLCD1,
;              HMCLCD1, SADLCD1;
;           3) MTRCNT.
;           MISC:   DISHEX, SELPST.
;
;6-SUBROUTINE USED:
;
;
;
;7-BUFFER, QUEUE, TABLE USED:
;
;            ACCTBL SIZE 256, ACC/DEACC TIME CONSTANTS.
;            LEGNDS  SIZE 32  KEYLOC TO KEY CODE XLATE.
;            DGPATS  SIZE 32  DIGIT PATTERN.
;
;
;--------------------------------------------------
;
IS_MELLIS: ASK     ASSEMBLE FOR MELLIS(-1) OR ALESSI & NIGHTS(-0) POSITIONER
;
;--------------------------------------------------
;
IS_ALESSI: ASK     ASSEMBLE FOR ALESSI(-1) OR KNIGHTS(-0) POSITIONER
;
;--------------------------------------------------
;
            INCLUDE KTINCL.A51
;
;--------------------------------------------------
;
; PUBLIC DECLARATION
            PUBLIC  KBDIN,  LEGNDS
            PUBLIC  ENACC,  DGPATS
            PUBLIC  INPADR, INPUT0, INPUT1, INPVLT
            PUBLIC  CLRLCD0,HMCLCD0,SADLCD0,OUTDIG0
            PUBLIC  WCMLCD0,WDTLCD0,RSTLCD0,RDTLCD0
            PUBLIC  CLRLCD1,HMCLCD1,SADLCD1,OUTDIG1
            PUBLIC  WCMLCD1,WDTLCD1,RSTLCD1,RDTLCD1
            PUBLIC  SELPST, SENSPS, MARKPS, DISSIG
            PUBLIC  SNDLOG, LOGTAB
            PUBLIC  DISTIM0,DISTIM1,DISIGN0,DISIGN1
            PUBLIC  DISBYT0,DJSBYT1,DISHEX0,DISHEX1
            PUBLIC  DISTDG0,DISTDG1,INPADC, SHWADC1
            PUBLIC  SHWTHR1,OPTTHR, SHWOFS1,OPOFST
;
;--------------------------------------------------
;
; EXTERNAL DECLARATION
            EXTERNAL TXOBWR, XFRLMT, KTDPCH
            EXTERNAL SHRNIB, BCDADD, BCDSUB
            EXTERNAL CNVPCK, CNVXFR, SCALING
            EXTERNAL BCDHEX, HEXBCD, BCDAD3
            EXTERNAL BCDSB3
;
;--------------------------------------------------
;           UTILITY SUBROUTINES
;--------------------------------------------------
;
;  KEY BOARD INPUT ROUTINE. CALL THIS WILL STAY HERE
;  LOOPING UNTIL THERE IS A KEY PRESSED.
;  KEYY CODE PASS BACK IN ACC.
;
KBDIN:      MOV     R1,#KBDBUF
            MOV     A,#80H
            XCH     A,@R1
            JB      A.7,KBDIN
            MOV     BEPDLY,#SHRTBP
;
            ANL     A,#1FH
            INC     A
            MOVC    A,@A+PC
            RET
;
LEGNDS:     EQU     $               ;   KEY
            DB      8FH             ;     F, - -
            DB      80H             ;     0
            DB      9EH             ;     BACK SPACE
            DB      9FH             ;     FUNC
            DB      87H             ;     7
            DB      88H             ;     8
            DB      89H             ;     9
            DB      90H             ;     HOME
            DB      84H             ;     4
            DB      85H             ;     5
            DB      86H             ;     6
            DB      9CH             ;     DELETE
            DB      81H             ;     1
            DB      82H             ;     2
            DB      83H             ;     3
            DB      9DH             ;     CNTL
            DB      96H             ;     Y
            DB      97H             ;     Z, - R SHIFT
            DB      9AH             ;     , NEXT, - L SHIFT
            DB      9BH             ;     . STOP, - ENTER
            DB      8BH             ;     B
            DB      8CH             ;     C
            DB      8DH             ;     D
            DB      8EH             ;     E
            DB      95H             ;     X
            DB      93H             ;     RIGHT -->
            DB      92H             ;     FRONT
            DB      94H             ;     LEFT <--
            DB      8AH             ;     A
            DB      98H             ;     -     , Z UP    - ,
```

```
        DB      91H             ;       BACK
        DB      99H             ;       + / -, Z DOWN - .
;
;-------------------------------------------------
;
;   ENCODE THE ACCUMULETOR TRANSLATE KEY CODE TO
;   DISPLAY CODE.
;   KEY CODE IN ACC, DISPLAY CODE PASS BACK IN ACC.
;
ENACC:  ANL     A,#1FH
        INC     A
        MOVC    A,@A+PC
        RET
;
DGPATS: EQU     $
        DB      30H             ; KEY 0
        DB      31H             ;     1
        DB      32H             ;     2
        DB      33H             ;     3
        DB      34H             ;     4
        DB      35H             ;     5
        DB      36H             ;     6
        DB      37H             ;     7
        DB      38H             ;     8
        DB      39H             ;     9
        DB      41H             ;     A
        DB      42H             ;     B
        DB      43H             ;     C
        DB      44H             ;     D
        DB      45H             ;     E
        DB      46H             ;     F
;
        DB      48H             ; KEY HOME
        DB      0C4H            ;     UP
        DB      0DAH            ;     DOWN
        DB      7FH             ;     LEFT
        DB      7EH             ;     RIGHT
        DB      58H             ;     X
        DB      59H             ;     Y
        DB      5AH             ;     Z
        DB      2DH             ;     -
        DB      2BH             ;     + / -
        DB      2CH             ;     , NEXT
        DB      2EH             ;     . STOP
        DB      23H             ;     DELETE
        DB      5EH             ;     CNTL
        DB      0FFH            ;     ENTER
        DB      66H             ;     FUNC
;
;-------------------------------------------------
;
;  CALL THIS ROUTINE TO INPUT 2 BYTE HEX ADDRESS
;  INTO -H,-L PAIR, (R4)-0K --- THE DIGIT KEY.
;  AND IT IS RIGHT ENTRY: THE LEFT MOST DIGIT IN
;  CTH WILL BE PURGED.
;
INPADR: MOV     R1,#CTL
INPUT0: MOV     R2,#2
INPUT1: MOV     A,@R1           ; (A)-XY
        SWAP    A               ; (A)-YX
        MOV     R5,A            ; (R5)-(A)-YX
        ANL     A,#0FH          ; (A)-0X
        MOV     R3,A            ; (R3)-0X
        MOV     A,R5            ; (A)-YX
        ANL     A,#0F0H         ; (A)-Y0
        XRL     A,R4            ; (A)-YK
        MOV     @R1,A           ; (CT-)-YK
        MOV     A,R3            ; (A)-0X
        MOV     R4,A            ; (R4)-0X
        DEC     R1
        DJNZ    R2,INPUT1
        RET
;
;-------------------------------------------------
;
;  CALL THIS ROUTINE TO INPUT 2 1/2 BYTE HEX VOLT
;  INTO -D,-H,-L  PAIR, (R4)-0K --- THE DIGIT KEY.
;  AND IT IS RIGHT ENTRY: THE LEFT MOST DIGIT IN
;  WKACCD WILL BE PURGED.
;
INPVLT: LCALL   INPUT0
        MOV     A,R4
        MOV     @R1,A           ; WKACCD-0K
        RET
;
;-------------------------------------------------
;
;  CALL THIS TO READ THE ADC VALUE
;
INPADC: CLR     PSTART          ; START ADC CONVERTION
        SETB    PSTART          ; ENABLE READ CYCLE
$1:     JB      PADCMP,$1       ; READIN EOC
        MOV     DPTR,#PORTA0
        MOVX    A,@DPTR         ; READ MSB
        MOV     VADCIH,A        ; H2,H1
        MOV     DPTR,#PORTC0
        MOVX    A,@DPTR         ; READ LSB
        ANL     A,#0FH
        MOV     VADCIL,A        ; 0,H0
        MOV     A,VADCIH        ; H2,H1
        ANL     A,#0FH          ; 0,H1
        SWAP    A               ; H1,0
        ORL     A,VADCIL
        MOV     VADCIL,A        ; H1,H0 --> VADCIL
        MOV     A,VADCIH        ; H2,H1
        ANL     A,#0F0H         ; H2,0
        SWAP    A
        MOV     VADCIH,A        ; 0,H2  --> VADCIH
        RET
;
;-------------------------------------------------
;
;     LCD DISPLAY MANIPOLATION ROUTINE
;
;-------------------------------------------------
;
;     INITIALIZE LCD CONTROLLER CHIP 0
;     DETORY ACC, R2.  DPTR INTACT.
;
CLRLCD0: MOV    R2,#01H         ; MSG - RESET
        LCALL   WCMLCD0
        RET
;
;-------------------------------------------------
;
;     MOVE LCD 0 CURSOR TO HOME POSITION.
;     DESTROY ACC, R2.  DPTR INTACT.
;
```

```
HMCLCD0:  MOV     R2,#02H          ; CURSOR HOME
          LCALL   WCMLCD0
          RET
;
;--------------------------------------------------
;
;      MOVE CURSOR TO LCD 0 DISPLAY ADDRESS @(R2).
;      DESTROY ACC, R2. DPTR INTACT.
;
SADLCD0:  ORL     02H,#80H         ; SET ADDRESS
          LCALL   WCMLCD0
          RET
;
;--------------------------------------------------
;
;      OUTPUT ONE DIGIT TO LCD 0.
;      WITH LEADING ZERO SUPPRESSION.
;      DESTROY ACC, R2.  DPTR INTACT.
;
OUTDIG0:  ANL     A,#0FH
          LCALL   ENACC
          JB      LZBLNK,OUTD01    ; NON LEADING DIGITS
          CJNE    A,#30H,OUTD00    ; IS IT A LEADING ZERO
          MOV     A,#20H
          SJMP    OUTD01
OUTD00:   SETB    LZBLNK           ; NON ZERO DIGIT ENCOUNTER
OUTD01:   MOV     R2,A
          LCALL   WDTLCD0
          RET
;
;--------------------------------------------------
;
;      WRITE COMMAND TO LCD 0 CONTROLLER.
;      USE DPTR, ACC, AND R2.
;      DESTROY ACC.
;
WCMLCD0:
          PUSH    DPL
          PUSH    DPH
          MOV     DPTR,#STADR0
WCML06:   MOVX    A,@DPTR
          JNB     A.7,WCML07
          JB      PDIAG,WCML06     ; IS LCD INSTALLED
WCML07:   MOV     A,R2
          MOVX    @DPTR,A
          POP     DPH
          POP     DPL
          RET
;
;      WRITE DISPLAY DATA TO LCD 0 CONTROLLER.
;      USE DPTR, ACC, AND R2.
;      DESTROY ACC.
;
WDTLCD0:
          PUSH    DPL
          PUSH    DPH
          MOV     DPTR,#STADR0
WDTL06:   MOVX    A,@DPTR
          JNB     A.7,WDTL07
          JB      PDIAG,WDTL06     ; IS LCD INSTALLED
WDTL07:   MOV     DPTR,#GDATA0
          MOV     A,R2
          MOVX    @DPTR,A
          POP     DPH
          POP     DPL
          RET
;
;      READ BUSY FLAG + CURRENT CURSOR ADDRESS FROM
;      LCD 0 CONTROLLER.
;      USE DPTR, ACC.
;      DESTROY ACC.
;
RSTLCD0:
          PUSH    DPL
          PUSH    DPH
          MOV     DPTR,#STADR0
RSTL06:   MOVX    A,@DPTR
          JNB     A.7,RSTL07
          JB      PDIAG,RSTL06     ; IS LCD INSTALLED
RSTL07:   POP     DPH
          POP     DPL
          RET
;
;      READ DISPLAY DATA FROM LCD 0 CONTROLLER.
;      USE DPTR, ACC.
;      DESTROY ACC.
;
RDTLCD0:
          PUSH    DPL
          PUSH    DPH
          MOV     DPTR,#GDATA0
          MOVX    A,@DPTR
          POP     DPH
          POP     DPL
          RET
;
;--------------------------------------------------
;
;      INITIALIZE LCD CONTROLLER CHIP 1
;      DETORY ACC, R2.  DPTR INTACT.
;
CLRLCD1:  MOV     R2,#01H          ; MSG - RESET
          LCALL   WCMLCD1
          RET
;
;--------------------------------------------------
;
;      MOVE LCD 1 CURSOR TO HOME POSITION.
;      DESTROY ACC, R2.  DPTR INTACT.
;
HMCLCD1:  MOV     R2,#02H          ; CURSOR HOME
          LCALL   WCMLCD1
          RET
;
;--------------------------------------------------
;
;      MOVE CURSOR TO LCD 1 DISPLAY ADDRESS @(R2).
;      DESTROY ACC, R2. DPTR INTACT.
;
SADLCD1:  ORL     02H,#80H         ; SET ADDRESS
          LCALL   WCMLCD1
          RET
;
;--------------------------------------------------
;
;      OUTPUT ONE DIGIT TO LCD 1.
;      WITH LEADING ZERO SUPPRESSION.
;      DESTROY ACC, R2.  DPTR INTACT.
```

```
;
OUTDIG1:    ANL     A,#0FH
            LCALL   ENACC
            JB      LZBLNK,OUTD11    ; NON LEADING DIGITS
            CJNE    A,#30H,OUTD10    ; IS IT A LEADING ZERO
            MOV     A,#20H
            SJMP    OUTD11
OUTD10:     SETB    LZBLNK           ; NON ZERO DIGIT ENCOUNTER
OUTD11:     MOV     R2,A
            LCALL   WDTLCD1
            RET
;
;------------------------------------------------
;
;       WRITE COMMAND TO LCD 1 CONTROLLER.
;       USE DPTR, ACC, AND R2.
;       DESTROY ACC.
;
WCMLCD1:
            PUSH    DPL
            PUSH    DPH
            MOV     DPTR,#STADR1
WCML16:     MOVX    A,@DPTR
            JNB     A.7,WCML17
            JB      PDIAG,WCML16   ; IS LCD INSTALLED
WCML17:     MOV     A,R2
            MOVX    @DPTR,A
            POP     DPH
            POP     DPL
            RET
;
;       WRITE DISPLAY DATA TO LCD 1 CONTROLLER.
;       USE DPTR, ACC, AND R2.
;       DESTROY ACC.
;
WDTLCD1:
            PUSH    DPL
            PUSH    DPH
            MOV     DPTR,#STADR1
WDTL16:     MOVX    A,@DPTR
            JNB     A.7,WDTL17
            JB      PDIAG,WDTL16   ; IS LCD INSTALLED
WDTL17:     MOV     DPTR,#GDATA1
            MOV     A,R2
            MOVX    @DPTR,A
            POP     DPH
            POP     DPL
            RET
;
;       READ BUSY FLAG + CURRENT CURSOR ADDRESS FROM
;       LCD 1 CONTROLLER.
;       USE DPTR, ACC.
;       DESTROY ACC.
;
RSTLCD1:
            PUSH    DPL
            PUSH    DPH
            MOV     DPTR,#STADR1
RSTL16:     MOVX    A,@DPTR
            JNB     A.7,RSTL17
            JB      PDIAG,RSTL16   ; IS LCD INSTALLED
RSTL17:     POP     DPH
            POP     DPL
            RET
;
;       READ DISPLAY DATA FROM LCD 1 CONTROLLER.
;       USE DPTR, ACC.
;       DESTROY ACC.
;
RDTLCD1:
            PUSH    DPL
            PUSH    DPH
            MOV     DPTR,#GDATA1
            MOVX    A,@DPTR
            POP     DPH
            POP     DPL
            RET
;
;------------------------------------------------
;           POSITIONER ROUTINE
;------------------------------------------------
;
;   CALL THIS ROUTINE TO SELECT ONE OF EIGHT
;   POSITIONER. USE ALL, DESTROY ALL.
;   PB1TMP BIT 7-5 WILL BE CHANGED ACCORDING
;   TO WHAT POSITIONER HAS BEEN SELECT.
;
SELPST:     MOV     A,CPSNUM
            MOV     B,#LENSTR        ; OFFSET ADDR
            MUL     AB
            MOV     CADROF,A         ; STORE
;
            MOV     A,FGSTUS
            ANL     A,#11111000B     ; GET RID OFF OLD PS#
            MOV     FGSTUS,A
            MOV     A,CPSNUM
            ANL     A,#00000111B     ; JUST FOR SAFE OP
            ORL     A,FGSTUS         ; PUT IN NEW PS#
            MOV     FGSTUS,A
;
            MOV     DPTR,#PORTB0
            MOV     A,PB0TMP
            ORL     A,#10000000B     ; TURN OFF ONE
            MOV     PB0TMP,A
            MOVX    @DPTR,A
            INC     DPTR             ; PORTC0
            MOV     A,#11111111B     ; TURN OFF ALL
            MOVX    @DPTR,A
            MOV     A,CPSNUM
            INC     A
            MOV     R2,A             ; SETUP COUNTER
            SETB    C
            MOV     A,#01111111B
            RLC     A
            DJNZ    R2,$1
            SJMP    $2               ; FOR PEN0
$1:         RRC     A
            DJNZ    R2,$1
            ORL     A,#00001111B     ; DPTR @PORTC0
            MOVX    @DPTR,A
            SJMP    $3               ; -> EXIT
$2:         MOV     DPTR,#PORTB0
            MOV     A,PB0TMP
            ANL     A,#01111111B
            MOV     PB0TMP,A
            MOVX    @DPTR,A
;
; BASE OF 12-BYTE END ZONE LIMIT REG OF #N POSITIONER
```

```
;
$3:         LCALL   XFRLMT
;
SELPRET:    RET
;
;--------------------------------------------------
;
;   CALL THIS TO DETECT THE PRESENCE OF POSITIONERS
;   BY READING IN THE END SWITCHES, ALL ONE'S MEAN
;   NOT PRESENT.
;
SENSPS:     MOV     C,PPRSNT
            MOV     PSEXST,C
            RET
;
;--------------------------------------------------
;
;   CALL THIS TO MARK THE BIT IN XSEG TO INDICATE
;   THE PRESENCE OF A POSITIONER
;
MARKPS:     MOV     R2,CPSNUM       ; AS COUNTER
            INC     R2
            CLR     A               ; ROTATE PATTERN IN
            SETB    C
MKPS00:     RLC     A
            DJNZ    R2,MKPS00
            MOV     R2,A            ; TMP STORE OF BIT #
            MOV     R0,#EXISPS
            MOVX    A,@R0
            ORL     A,R2
            MOVX    @R0,A           ; MARK EXISTANCE OF PS
            RET
;
;--------------------------------------------------
;           COMPLICATE DISPLAY ROUTINE
;--------------------------------------------------
;
;   CALL THIS ROUTINE TO DISPLAY SIGN ON MESSAGE.
;   USE ALL, DESTROY ALL.
;
DISSIG:     MOV     DPTR,#INITAB
            MOV     R3,#65
            LCALL   DISIGNO
            MOV     R2,#84
            LCALL   SADLCD1
            MOV     DPTR,#TMMSG
            MOV     R3,#20
            LCALL   DISIGNO
            LCALL   DISTIMO
            RET
;
;INITAB:     EQU     $
;            BYTE    ODH,OAH
;            BYTE    20H
;            ASCII   Knights Tech. Inc. |
;            BYTE    ODH,OAH
;            ASCII   PositionerController|
;            BYTE    ODH,OAH
;            BYTE    20H,20H,20H
;            ASCII   Copyright 1989   |
;            BYTE    ODH,OAH
;            BYTE    20H,20H,20H,20H,20H
;            ASCII   Version 2.42   |
;            BYTE    ODH,OAH
;
TMMSG:      BYTE    20H,20H,20H,20H,20H
            ASCII   Time            |
;
;--------------------------------------------------
;
;   CALL THIS ROUTINE TO DISPLAY LOGO MESSAGE
;     TO RS-232C INTERFACE.
;   USE ALL, DESTROY ALL.
;
SNDLOG:     MOV     A,#20H          ; FORCE TXISR START
            LCALL   TXOBWR          ; UPDATE WRITE POINTER
            MOV     DPTR,#LOGTAB
            MOV     R3,#85          ; MOVE TO SOTBUF
SNDL00:     CLR     A
            MOVC    A,@A+DPTR
            LCALL   TXOBWR          ; UPDATE WRITE POINTER
            INC     DPTR
            DJNZ    R3,SNDL00
            SETB    TI              ; START TRANSMITTING
            RET
;
LOGTAB:     EQU     $
            BYTE    ODH,OAH
            BYTE    20H
INITAB:     ASCII   Knights Tech. Inc. |
            BYTE    ODH,OAH
            ASCII   Positioner Controller|
            BYTE    ODH,OAH
            BYTE    20H,20H,20H
            ASCII   Copyright 1989|
            BYTE    ODH,OAH
            BYTE    20H,20H,20H,20H
            ASCII   Version 2.42|
            BYTE    ODH,OAH,07H
;
;--------------------------------------------------
;
;   CALL THIS ROUTINE TO DISPLAY SIGN ON MESSAGE.
;   USE ALL, DESTROY ALL.
;
DISTIMO:    MOV     R2,#94
DSTIMEO:    LCALL   SADLCDO
            MOV     R4,T1H
            LCALL   DISBYTO
            MOV     R2,#3AH
            LCALL   WDTLCDO
            MOV     R4,T1M
            LCALL   DISBYTO
            MOV     R2,#3AH
            LCALL   WDTLCDO
            MOV     R4,T1S
            LCALL   DISBYTO
            RET
;
DISTIM1:    MOV     R2,#94
DSTIME1:    LCALL   SADLCD1
            MOV     R4,T1H
            LCALL   DISBYT1
            MOV     R2,#3AH
            LCALL   WDTLCD1
            MOV     R4,T1M
            LCALL   DISBYT1
            MOV     R2,#3AH
```

```
        LCALL   WDTLCD1
        MOV     R4,T1S
        LCALL   DISBYT1
        RET
;
;-------------------------------------------------
;
;  DISPLAY POWER SUPPLY VOLTAGE ON LCD 1
;
SHWOFS1: SETB   LZBLNK    ; DISABLE LEADING ZERO BLANKING
        MOV     A,WKACCD
        LCALL   OUTDIG1         ; BORROW THE REST OF THR
        SJMP    SHWT00
;
;-------------------------------------------------
;
;  DISPLAY THRESHOLD VOLTAGE ON LCD1
;
SHWTHR1: SETB   LZBLNK    ; DISABLE LEADING ZERO BLANKING
        JB      WKASGN,SHWT03          ; IS POSTIVE
;
        CLR     A         ; CHECK -10.000
        CJNE    A,WKACCH,SHWT01
        CJNE    A,WKACCL,SHWT01        ; BOTH ARE ZERO
        MOV     R2,#'-'
        LCALL   WDTLCD1
        MOV     R2,#'1'                ; DISPLAY -1
        SJMP    SHWT04
SHWT01: MOV     R2,#' '                ; -9.999 - -0.001
        LCALL   WDTLCD1
        MOV     R2,#'-'
        SJMP    SHWT04
;
SHWT03: MOV     R2,#' '
        LCALL   WDTLCD1
        MOV     R2,#'+'                ; +9.999 - +0.000
;
SHWT04: LCALL   WDTLCD1
SHWT00: MOV     A,WKACCH
        SWAP    A
        LCALL   OUTDIG1
        MOV     R2,#'.'
        LCALL   WDTLCD1
        MOV     R4,WKACCH
        MOV     R5,WKACCL
        LCALL   DISTDG1
        RET
;
;-------------------------------------------------
;
;  CALL THIS TO SHOW THE ADC INPUT READINGS ON
;    LCD1. THERE IS A 2.441mV STEP SCALING FACTOR.
;
SHWADC1: MOV    C,WKASGN
        MOV     CTDSGN,C
        MOV     A,WKACCD
        PUSH    A
        MOV     A,WKACCH
        PUSH    A
        MOV     A,WKACCL
        PUSH    A
;
        CLR     WKACCD
        MOV     A,VADCIH
        MOV     C,A.3                   ; SIGN BIT
        MOV     WKASGN,C                ; 1=+
        CLR     A.3
        MOV     WKACCH,A
        MOV     WKACCL,VADCIL
;
        JB      WKASGN,SHWAD00          ; POSTIVE ADC VOLT
        LJMP    SHWAD10                 ; NEGATIVE ADC VOLT
;
SHWAD00: LCALL  SCALING                 ; 0000 TO 0FFF
        LCALL   HEXBCD                  ; 0000 TO 270F
        MOV     R2,#' '
        LCALL   WDTLCD1
        MOV     R2,#'+'                 ; 0.000 TO 9.999
        SJMP    SHWAD20
;
SHWAD10: MOV    A,WKACCH                ; 0000 TO 07FF
        CPL     A
        MOV     WKACCH,A
        MOV     A,WKACCL
        CPL     A
        ADD     A,#1
        MOV     WKACCL,A
        MOV     A,WKACCH
        ADDC    A,#0
        ANL     A,#7H
        MOV     WKACCH,A                ; 07FF TO 0000
        CLR     A         ; CHECK CARRY INTO 12th BIT
        CJNE    A,WKACCH,SHWAD11
        CJNE    A,WKACCL,SHWAD11
        MOV     R2,#'-'
        LCALL   WDTLCD1                 ; -10.000
        MOV     R2,#'1'
        SJMP    SHWAD20
SHWAD11: LCALL  SCALING                 ; 0000 TO 07FF
        LCALL   HEXBCD                  ; 0000 TO 270F
        MOV     R2,#' '
        LCALL   WDTLCD1
        MOV     R2,#'-'          ; -0.002 TO -9.999
;
SHWAD20: LCALL  WDTLCD1
        SETB    LZBLNK
        MOV     A,WKACCH
        ANL     A,#0F0H                 ; GET 4.XXX
        SWAP    A
        LCALL   OUTDIG1
        MOV     R2,#'.'
        LCALL   WDTLCD1                 ; SHOW POINT
        MOV     A,WKACCH
        ANL     A,#0FH                  ; GET X.9XX
        MOV     R4,A
        MOV     R5,WKACCL
        LCALL   DISTDG1                 ; SHOW THE REST
;
SHWARET: POP    A
        MOV     WKACCL,A
        POP     A
        MOV     WKACCH,A
        POP     A
        MOV     WKACCD,A
        MOV     C,CTDSGN
        MOV     WKASGN,C
        RET
;
```

```
;--------------------------------------------------
;
;   CALL THIS ROUTINE TO DISPLAY SIGN ON MESSAGE.
;   USE ALL, DESTROY ALL.
;
DISIGN0:    CLR     A
            MOVC    A,@A+DPTR
            CJNE    A,#0DH,DIS00
            SJMP    DIS02
DIS00:      CJNE    A,#0AH,DIS01
            SJMP    DIS02
DIS01:      MOV     R2,A
            LCALL   WDTLCD0
DIS02:      INC     DPTR
            DJNZ    R3,DISIGN0
            RET
;
DISIGN1:    CLR     A
            MOVC    A,@A+DPTR
            CJNE    A,#0DH,DIS10
            SJMP    DIS12
DIS10:      CJNE    A,#0AH,DIS11
            SJMP    DIS12
DIS11:      MOV     R2,A
            LCALL   WDTLCD1
DIS12:      INC     DPTR
            DJNZ    R3,DISIGN1
            RET
;
;--------------------------------------------------
;
;   CALL THIS ROUTINE TO SHOW TWO HEXDECIMAL DIGITS
;   ON LCD STARTING FROM THE CURRENT LCD CURSOR POSI-
;   TION.  THE BYTE OF THE HEXDECIMAL DIGITS ARE
;   STORE IN R4.
;   USE ALL, DESTORY ACC AND R2.
;
DISBYT0:    CLR     LZBLNK          ; LEADING ZERO SUPPRESION
            MOV     A,R4
            SWAP    A
            LCALL   OUTDIG0
            SETB    LZBLNK          ; MUST SHOW LAST DIGIT
            MOV     A,R4
            LCALL   OUTDIG0
            RET
;
DISBYT1:    CLR     LZBLNK          ; LEADING ZERO SUPPRESSION
            MOV     A,R4
            SWAP    A
            LCALL   OUTDIG1
            SETB    LZBLNK          ; MUST SHOW LAST DIGIT
            MOV     A,R4
            LCALL   OUTDIG1
            RET
;
;--------------------------------------------------
;
;   CALL THIS ROUTINE TO SHOW THREE HEXDECIMAL DIGITS
;   ON LCD STARTING FROM THE CURRENT LCD CURSOR POSI-
;   TION.  THE HIGH BYTE OF THE HEXDECIMAL DIGITS ARE
;   STORE IN R4, LOW BYTE IN R5.
;   USE ALL, DESTORY ACC AND R2.
;
DISTDG0:    MOV     A,R4
            LCALL   OUTDIG0
            MOV     A,R5
            SWAP    A
            LCALL   OUTDIG0
            SETB    LZBLNK          ; MUST SHOW LAST DIGIT
            MOV     A,R5
            LCALL   OUTDIG0
            RET
;
DISTDG1:    MOV     A,R4
            LCALL   OUTDIG1
            MOV     A,R5
            SWAP    A
            LCALL   OUTDIG1
            SETB    LZBLNK          ; MUST SHOW LAST DIGIT
            MOV     A,R5
            LCALL   OUTDIG1
            RET
;
;--------------------------------------------------
;
;   CALL THIS ROUTINE TO SHOW FOUR HEXDECIMAL DIGITS
;   ON LCD STARTING FROM THE CURRENT LCD CURSOR POSI-
;   TION.  THE HIGH BYTE OF THE HEXDECIMAL DIGITS ARE
;   STORE IN R4, LOW BYTE IN R5.
;   USE ALL, DESTORY ACC AND R2.
;
DISHEX0:    CLR     LZBLNK          ; LEADING ZERO SUPPRESION
            MOV     A,R4
            SWAP    A
            LCALL   OUTDIG0
            MOV     A,R4
            LCALL   OUTDIG0
            MOV     A,R5
            SWAP    A
            LCALL   OUTDIG0
            SETB    LZBLNK          ; MUST SHOW LAST DIGIT
            MOV     A,R5
            LCALL   OUTDIG0
            RET
;
DISHEX1:    CLR     LZBLNK          ; LEADING ZERO SUPPRESSION
            MOV     A,R4
            SWAP    A
            LCALL   OUTDIG1
            MOV     A,R4
            LCALL   OUTDIG1
            MOV     A,R5
            SWAP    A
            LCALL   OUTDIG1
            SETB    LZBLNK          ; MUST SHOW LAST DIGIT
            MOV     A,R5
            LCALL   OUTDIG1
            RET
;
;--------------------------------------------------
;
;    CALCULATE AND OUTPUT TO PORT 8800H
;     VALUE STORE IN SGNTHR,VTHRH,VTHRL
;     IN DECIMAL FORMAT.
;
OPTTHR:     MOV     C,WKASGN            ; PUSH
            MOV     CTDSGN,C
            MOV     CTH,WKACCH
```

```
        MOV     CTL,WKACCL
;
        LCALL   $HRNIB          ; SHIFT LEFT ONE NIBBLE
        JB      WKASGN,$1       ; POSITIVE NUMBER
;
        CLR     A
        CJNE    A,WKACCH,OPTT00
        CJNE    A,WKACCL,OPTT00
        MOV     A,#10H
        ORL     A,WKACCH        ; -1.000
        MOV     WKACCH,A
OPTT00: SETB    TPRSGN          ; -0.999 - (-2.048)
        MOV     TPREGH,#20H     ; -0.999 + 2.048
        MOV     TPREGL,#48H
        MOV     R0,#WKACCL
        MOV     R1,#TPREGL
        MOV     C,WKASGN
        MOV     SGNFG0,C
        MOV     C,TPRSGN
        MOV     SGNFG1,C
        LCALL   BCDADD
;
$1:     LCALL   BCDHEX          ; CONVERT TO HEX
        LCALL   CNVPCK          ; PACK INTO PC1,PA1TMP
        MOV     DPTR,#PORTA1
        MOV     A,PA1TMP
        MOVX    @DPTR,A         ; PA7-0 LSB
        MOV     DPTR,#PORTC1
        MOV     A,PC1TMP
        MOVX    @DPTR,A         ; PC7-4 MSB
;
        MOV     C,CTDSGN        ; POP
        MOV     WKASGN,C
        MOV     WKACCH,CTH
        MOV     WKACCL,CTL
        RET
;
;--------------------------------------------------
;
;   CALCULATE AND OUTPUT TO PORT 8800H
;    VALUE STORE IN VOFSTD,VOFSTH,VOFSTL
;    IN DECIMAL FORMAT.
;
OPOFST: MOV     CTD,WKACCD
        MOV     CTH,WKACCH
        MOV     CTL,WKACCL
;
        CLR     TPRSGN
        MOV     TPREGD,#01H
        MOV     TPREGH,#79H
        MOV     TPREGL,#52H
        MOV     R0,#WKACCL
        MOV     R1,#TPREGL
        MOV     C,WKASGN
        MOV     SGNFG0,C
        MOV     C,TPRSGN
        MOV     SGNFG1,C
        LCALL   BCDAD3          ; SUBTRACT 17.952 FROM IT
                                ; TO GET 0 - 4.096 VOLT
        LCALL   BCDHEX          ; CONVERT TO HEX
        LCALL   CNVXFR          ; PACK INTO PB1,PC1TMP
        MOV     DPTR,#PORTB1
        MOV     A,PB1TMP
        MOVX    @DPTR,A         ; PB7-0 MSB
        INC     DPTR            ; PORTC1
        MOV     A,PC1TMP
        MOVX    @DPTR,A         ; PC3-0 LSB
;
        MOV     WKACCD,CTD
        MOV     WKACCH,CTH
        MOV     WKACCL,CTL
        RET
;
;--------------------------------------------------
;
        END
```

```
        INCLUDE KTHEAD.A51
;
;1-LEVEL : 0 AND 1,
;
;2-TYPE : UTILITY PROGRAM
;
;
;3-FUNCTION : TESTING THE MOTORIZED POSITIONER.
;
;4-CALLING PROGRAM :
;
;
;5-ENTRY POINT:
;
;         MISC:   MTRCNT, HMTCNT, USMCNT,
;                 TGPBIT, DETEND, MDMCNT.
;
;6-SUBROUTINE USED:
;
;          TGPBIT, DETEND, REPTST.
;
;7-BUFFER, QUEUE, TABLE USED:
;
;          ACCTBL SIZE 256, ACC/DEACC TIME CONSTANTS.
;
;-------------------------------------------------
;
IS_MELLIS: ASK     ASSEMBLE FOR MELLIS(-1) OR ALESSI & NIGHTS(-0) POSITIONER
;
;-------------------------------------------------
;
IS_ALESSI: ASK     ASSEMBLE FOR ALESSI(-1) OR KNIGHTS(-0) POSITIONER
;
;-------------------------------------------------
;
           INCLUDE KTINCL.A51
;
;-------------------------------------------------
;
; PUBLIC DECLARATION
           PUBLIC  MTRCNT, HMTCNT, USMCNT, TGPBIT
           PUBLIC  PSPWDN, MDMCNT
;
;-------------------------------------------------
;
; EXTERNAL DECLARATION
           EXTERNAL REPTST, ACTCTSN
           EXTERNAL PROCMZ, PROCRT, PROCUP, PROCDN
;
;-------------------------------------------------
;          UTILITY SUBROUTINES  FILE # 1
;-------------------------------------------------
;
;  CALL THIS TO DO A SMALL RANGE POWER DOWN
;    SEQUENCE FOR A PRE-SELECTED POSITIONER.
;
PSPWDN:    SETB    DIRECT           ; RETRACT DIRECTION
           SETB    ZAXIS
           MOV     NPSCTL,#SMORNG
PSPD00:    JNB     PZM,PSPD01       ; MO-0, DONE
           LCALL   PROCMZ
           DJNZ    NPSCTL,PSPD00
PSPD01:    CLR     ZAXIS
           SETB    XAXIS
           MOV     NPSCTL,#SMORNG
PSPD02:    JNB     PXM,PSPD03       ; MO=0, DONE
           LCALL   PROCRT
           DJNZ    NPSCTL,PSPD02
PSPD03:    CLR     XAXIS
           SETB    YAXIS
           MOV     NPSCTL,#SMORNG
PSPD04:    JNB     PYM,PSPD05       ; MO=0, DONE
;
           IF      IS_ALESSI
           LCALL   PROCDN
           ELSE    ;IS_KNIGHT
           LCALL   PROCUP
           ENDIF
;
           DJNZ    NPSCTL,PSPD04
PSPD05:    CLR     YAXIS
           RET
;
;-------------------------------------------------
;
;  CALL THIS ROUTINE TO MOVE ONE STEP.
;  BIT 02H-05H ARE SET TO INDICATE WHICH AXIS AND
;  WHICH DIRECTION.
;  SET BIT 02H-05H, R3 FOR STEP INTERVAL WHEN
;  YOU WANT TO MOVE FAST.
;  SET BIT 02H-05H WHEN YOU WANT TO uSTEP.
;  R3 CONTENT DOESN'T CARE IN uSTEP BECAUSE TIMING
;  IS CONTROLED IN uSTEP ROUTINE.
;  USE ACC, DPTR, R3,  DESTROY R3.
;
;  P3.4 IS AUTOMATICALLY TOGGLE TO KEEP POWER DOWN
;  FROM BEING ACTIVATED.
;
TGPBIT:    PUSH    DPL
           PUSH    DPH
           PUSH    A
TGPBI0:    MOV     DPTR,#PORTB0
           JB      ZAXIS,TGPBZZ     ; Z AXIS
           JB      YAXIS,TGPBYY     ; Y AXIS
           JB      XAXIS,TGPBX0     ; X AXIS
;
TGPRET:    POP     A
           MOV     R3,A             ; ACC/DEACC DELAY
TGPBI2:    MOV     R7,FASTDL; GET PROGRAMMABLE DELAY
TGPBI1:    NOP
           NOP
           NOP
           DJNZ    R7,TGPBI1   ; PROGRAMMABLE DELAY
           DJNZ    R3,TGPBI2        ; TRANSIT JUMP
           POP     DPH              ; DELAY IS DONE
           POP     DPL
           RET
;
TGPBYY:    LJMP    TGPBY0
TGPBZZ:    NOP                      ; PAD
           NOP
           LJMP    TGPBZ0
;
TGPBX0:    JNB     DIRECT,TGPBX4    ; IS CCW DN/LEFT/FRONT/+
;
           MOV     A,#CXPSLO        ; BASE
           ADD     A,CADROF         ; ADD OFFSET
           MOV     R0,A
```

```
        MOVX    A,@R0
        CJNE    A,CXLMNL,TGPBX1 ; CW UP/RIGHT/BACK/- NOT
        DEC     R0              ; CXPSHO + OFFSET
        MOVX    A,@R0
        CJNE    A,CXLMNH,TGPBX1 ; ALLOW TO DEC BELOW ZERO
        SETB    MVABRT     ; NOTIFY MOVE ROUTINE OF ABORT
        LJMP    TGPRET
TGPBX1: MOV     A,PBOTMP        ; CW UP/RIGHT/BACK/-
        SETB    PXCW
        MOV     PBOTMP,A
        MOVX    @DPTR,A
        CLR     PMTRPD          ; TRIG WATCHDOG TIMER
        SETB    PMTRPD
        MOV     A,#CXPSLO       ; BASE
        ADD     A,CADROF        ; ADD OFFSET
        MOV     R0,A
        MOVX    A,@R0
        CJNE    A,#0,TGPBX2
        DEC     R0              ; CXPSHO + OFFSET
        MOVX    A,@R0
        DEC     A
        MOVX    @R0,A
        INC     R0              ; CXPSLO + OFFSET
TGPBX2: MOVX    A,@R0
        DEC     A
        MOVX    @R0,A
        MOV     R3,#8           ; PULSE WIDTH
TGPBX3: DJNZ    R3,TGPBX3
        MOV     A,PBOTMP
        CLR     PXCW
        MOV     PBOTMP,A
        MOVX    @DPTR,A
        LJMP    TGPRET
;
TGPBX4: MOV     A,#CXPSLO       ; BASE
        ADD     A,CADROF        ; ADD OFFSET
        MOV     R0,A
        MOVX    A,@R0
        CJNE    A,CXLMXL,TGPBX5 ; CCW DN/LEFT/FRONT/+ NOT
        DEC     R0              ; CXPSHO + OFFSET
        MOVX    A,@R0
        CJNE    A,CXLMXH,TGPBX5 ; ALLOW TO INC ABOVE 40,000
        SETB    MVABRT     ; NOTIFY MOVE ROUTINE OF ABORT
        LJMP    TGPRET
TGPBX5: MOV     A,PBOTMP        ; CCW DN/LEFT/FRONT/+
        SETB    PXCCW
        MOV     PBOTMP,A
        MOVX    @DPTR,A
        CLR     PMTRPD          ; TRIG WATCHDOG TIMER
        SETB    PMTRPD
        MOV     A,#CXPSLO       ; BASE
        ADD     A,CADROF        ; ADD OFFSET
        MOV     R0,A
        MOVX    A,@R0
        CJNE    A,#0FFH,TGPBX6
        DEC     R0              ; CXPSHO + OFFSET
        MOVX    A,@R0
        INC     A
        MOVX    @R0,A
        INC     R0              ; CXPSLO + OFFSET
TGPBX6: MOVX    A,@R0
        INC     A
        MOVX    @R0,A
        MOV     R3,#8           ; PULSE WIDTH
TGPBX7: DJNZ    R3,TGPBX7
        MOV     A,PBOTMP
        CLR     PXCCW
        MOV     PBOTMP,A
        MOVX    @DPTR,A
        LJMP    TGPRET
;
TGPBY0: JNB     DIRECT,TGPBY4   ; IS CCW DN/LEFT/FRONT/+
;
        MOV     A,#CYPSLO       ; BASE
        ADD     A,CADROF        ; ADD OFFSET
        MOV     R0,A
        MOVX    A,@R0
        CJNE    A,CYLMNL,TGPBY1 ; CW UP/RIGHT/BACK/- NOT
        DEC     R0              ; CYPSHO + OFFSET
        MOVX    A,@R0
        CJNE    A,CYLMNH,TGPBY1 ; ALLOW TO DEC BELOW ZERO
        SETB    MVABRT          ; NOTIFY MOVE ROUTINE OF ABORT
        LJMP    TGPRET
TGPBY1: MOV     A,PBOTMP        ; CW UP/RIGHT/BACK/-
        SETB    PYCW
        MOV     PBOTMP,A
        MOVX    @DPTR,A
        CLR     PMTRPD          ; TRIG WATCHDOG TIMER
        SETB    PMTRPD
        MOV     A,#CYPSLO       ; BASE
        ADD     A,CADROF        ; ADD OFFSET
        MOV     R0,A
        MOVX    A,@R0
        CJNE    A,#0,TGPBY2
        DEC     R0              ; CYPSHO + OFFSET
        MOVX    A,@R0
        DEC     A
        MOVX    @R0,A
        INC     R0              ; CYPSLO + OFFSET
TGPBY2: MOVX    A,@R0
        DEC     A
        MOVX    @R0,A
        MOV     R3,#8           ; PULSE WIDTH
TGPBY3: DJNZ    R3,TGPBY3
        MOV     A,PBOTMP
        CLR     PYCW
        MOV     PBOTMP,A
        MOVX    @DPTR,A
        LJMP    TGPRET
;
TGPBY4: MOV     A,#CYPSLO       ; BASE
        ADD     A,CADROF        ; ADD OFFSET
        MOV     R0,A
        MOVX    A,@R0
        CJNE    A,CYLMXL,TGPBY5 ; CCW DN/LEFT/FRONT/+ NOT
        DEC     R0              ; CYPSHO + OFFSET
        MOVX    A,@R0
        CJNE    A,CYLMXH,TGPBY5 ; ALLOW TO INC ABOVE 40,000
        SETB    MVABRT     ; NOTIFY MOVE ROUTINE OF ABORT
        LJMP    TGPRET
TGPBY5: MOV     A,PBOTMP        ; CCW DN/LEFT/FRONT/+
        SETB    PYCCW
        MOV     PBOTMP,A
        MOVX    @DPTR,A
        CLR     PMTRPD          ; TRIG WATCHDOG TIMER
        SETB    PMTRPD
        MOV     A,#CYPSLO       ; BASE
        ADD     A,CADROF        ; ADD OFFSET
```

```
         MOV     R0,A
         MOVX    A,@R0
         CJNE    A,#0FFH,TGPBY6
         DEC     R0               ; CYPSHO + OFFSET
         MOVX    A,@R0
         INC     A
         MOVX    @R0,A
         INC     R0               ; CYPSLO + OFFSET
TGPBY6:  MOVX    A,@R0
         INC     A
         MOVX    @R0,A
         MOV     R3,#8            ; PULSE WIDTH
TGPBY7:  DJNZ    R3,TGPBY7
         MOV     A,PBOTMP
         CLR     PYCCW
         MOV     PBOTMP,A
         MOVX    @DPTR,A
         LJMP    TGPRET
;
TGPBZ0:  JNB     DIRECT,TGPBZ4    ; IS CCW DN/LEFT/FRONT/+
;
         MOV     A,#CZPSLO        ; BASE
         ADD     A,CADROF         ; ADD OFFSET
         MOV     R0,A
         MOVX    A,@R0
         CJNE    A,CZLMNL,TGPBZ1 ; CW UP/RIGHT/BACK/- NOT
         DEC     R0               ; CZPSHO + OFFSET
         MOVX    A,@R0
         CJNE    A,CZLMNH,TGPBZ1 ; ALLOW TO DEC BELOW ZERO
         SETB    MVABRT           ; NOTIFY MOVE ROUTINE OF ABORT
         LJMP    TGPRET
TGPBZ1:  MOV     A,PBOTMP         ; CW UP/RIGHT/FRONT/-
         SETB    PZCW
         MOV     PBOTMP,A
         MOVX    @DPTR,A
         CLR     PMTRPD           ; TRIG WATCHDOG TIMER
         SETB    PMTRPD
         MOV     A,#CZPSLO        ; BASE
         ADD     A,CADROF         ; ADD OFFSET
         MOV     R0,A
         MOVX    A,@R0
         CJNE    A,#0,TGPBZ2
         DEC     R0               ; CZPSHO + OFFSET
         MOVX    A,@R0
         DEC     A
         MOVX    @R0,A
         INC     R0               ; CZPSLO + OFFSET
TGPBZ2:  MOVX    A,@R0
         DEC     A
         MOVX    @R0,A
         MOV     R3,#8            ; PULSE WIDTH
TGPBZ3:  DJNZ    R3,TGPBZ3
         MOV     A,PBOTMP
         CLR     PZCW
         MOV     PBOTMP,A
         MOVX    @DPTR,A
         LJMP    TGPRET
;
TGPBZ4:  MOV     A,#CZPSLO        ; BASE
         ADD     A,CADROF         ; ADD OFFSET
         MOV     R0,A
         MOVX    A,@R0
         CJNE    A,CZLMXL,TGPBZ5 ; CW DN/LEFT/FRONT/+ NOT
         DEC     R0               ; CZPSHO + OFFSET
         MOVX    A,@R0
         CJNE    A,CZLMXH,TGPBZ5 ; ALLOW TO INC ABOVE 20,000
         SETB    MVABRT      ; NOTIFY MOVE ROUTINE OF ABORT
         LJMP    TGPRET
TGPBZ5:  MOV     A,PBOTMP         ; CW DN/LEFT/FRONT/+
         SETB    PZCCW
         MOV     PBOTMP,A
         MOVX    @DPTR,A
         CLR     PMTRPD           ; TRIG WATCHDOG TIMER
         SETB    PMTRPD
         MOV     A,#CZPSLO        ; BASE
         ADD     A,CADROF         ; ADD OFFSET
         MOV     R0,A
         MOVX    A,@R0
         CJNE    A,#0FFH,TGPBZ6
         DEC     R0               ; CZPSHO + OFFSET
         MOVX    A,@R0
         INC     A
         MOVX    @R0,A
         INC     R0               ; CZPSLO + OFFSET
TGPBZ6:  MOVX    A,@R0
         INC     A
         MOVX    @R0,A
         MOV     R3,#8            ; PULSE WIDTH
TGPBZ7:  DJNZ    R3,TGPBZ7
         MOV     A,PBOTMP
         CLR     PZCCW
         MOV     PBOTMP,A
         MOVX    @DPTR,A
         LJMP    TGPRET
;
;--------------------------------------------------
;
; CALL THIS ROUTINE TO MOVE MOTOR TO HOME POSITION
; FAST, IN ANY DIRECTION, FOR ANY AXISES.
; PUT NUMBER OF STEPS TO BE MOVED IN (NPSCTH,
; NPSCTL) AND SET BIT 02H-05H FIRST.
; IT WILL CALCULATE THE STEPS TO SEE WHEN TO
; ACCERLATE AND NEVER TO DEACCERLATE. USED ONLY FOR
; HOME PURPOSE, OTHER CASE USE MTRCNT.
;
; KEEP AWAY FROM SURFACE BECAUSE IT IS NOT DAMPED.
;
; USE ALL, DESTROY ALL.
;
HMTCNT:                                 ; MOTOR CONTROL
         CLR     A
         CJNE    A,NPSCTL,HMT00         ; STEPS EQU 0
         CJNE    A,NPSCTH,HMT00
         LJMP    HMCRET                 ; DON'T MOVE
HMT00:   MOV     RDELAY,#RLYSTB         ; WAIT FOR RELAY TO STABLE
         JB      PSENSE,HMT02           ; IS CONTACT SENSING ON
         LCALL   ACTCTSN                ; TURN ON
$1:      MOV     A,RDELAY
         JNZ     $1
HMT02:   MOV     R2,#1                  ; 1ST IN ACCTAB
         MOV     DPTR,#ACCTBL
         JB      PNC,HMT04
         MOV     RDELAY,#PWRSTB
         CLR     PMTRPD                 ; TRIG WATCHDOG TIMER
         SETB    PMTRPD
HMT03:   MOV     A,RDELAY               ; WAIT FOR POWER
         JNZ     HMT03                  ; SUPPLY STABLE
HMT04:   CLR     PMTRPD                 ; TRIG WATCHDOG TIMER
```

```
        SETB    PMTRPD
        JB      PCNTCT,HMT01    ; NOT CONTACT
        JB      ZAXIS,$1        ; CONTACT, BUT OK TO MOVE Z
        SJMP    $2
$1:     JB      DIRECT,HMT01
$2:     LJMP    HMCRET          ; DON'T MOVE, ON SURFACE
HMT01:  MOV     IEC,#DISMSK     ; DIS I
        CLR     MVABRT          ; NOT ABORT BY RS232
;
        CLR     A
        CJNE    A,NPSCTL,HMC11  ; LOW STEPS EQU 0
        DEC     NPSCTH          ; BORROW 100H
HMC11:  JB      PCNTCT,HMC16    ; NOT CONTACT
        JB      ZAXIS,$1        ; CONTACT, BUT OK TO MOVE Z
        SJMP    $2
$1:     JB      DIRECT,HMC16
$2:     LJMP    HMCRET          ; DON'T MOVE, ON SURFACE
HMC16:  MOV     A,R2
        MOVC    A,@A+DPTR       ; ACC DELAY CNT
        LCALL   TGPBIT
        JNB     MVABRT,HMC17    ; NOT ABORT BY RS232
        LJMP    HMCRET
HMC17:  CJNE    R2,#0,HMC12
        SJMP    HMC13
HMC12:  INC     R2
HMC13:  DJNZ    NPSCTL,HMC11
        DJNZ    NPSCTH,HMC11
;
        MOV     A,NPSCTL        ; CUT SHORT 16 STEPS
        CLR     C
        SUBB    A,#17
        MOV     NPSCTL,A
        MOV     R2,#0           ; KEEPING HIGH SPEED
HMT14:  JB      PCNTCT,HMT15    ; NOT CONTACT
        JB      ZAXIS,$1        ; CONTACT, BUT OK TO MOVE Z
        SJMP    $2
$1:     JB      DIRECT,HMT15
$2:     SJMP    HMCRET          ; DON'T MOVE, ON SURFACE
HMT15:  MOV     A,R2
        MOVC    A,@A+DPTR       ; ACC DELAY CNT
        LCALL   TGPBIT
        JNB     MVABRT,HMC18    ; NOT ABORT BY RS232
        SJMP    HMCRET
HMC18:  DJNZ    NPSCTL,HMT14
;
        MOV     R2,#0           ; KEEPING HIGH SPEED
HMT20:  JB      PCNTCT,HMT21    ; NOT CONTACT
        JB      ZAXIS,$1        ; CONTACT, BUT OK TO MOVE Z
        SJMP    $2
$1:     JB      DIRECT,HMT21
$2:     SJMP    HMCRET          ; DON'T MOVE, ON SURFACE
HMT21:  JB      ZAXIS,HMT23
        JB      YAXIS,HMT24
        JB      PXM,HMT25       ; XAXIS-1
        SJMP    HMCRET
HMT23:  JNB     PZM,HMCRET
        SJMP    HMT25
HMT24:  JNB     PYM,HMCRET
HMT25:  MOV     A,R2
        MOVC    A,@A+DPTR       ; ACC DELAY CNT
        LCALL   TGPBIT          ; NO ABORT IN SEEKING
        DJNZ    NPSCTL,HMT20    ; POWER DOWN MODE
;
HMCRET: MOV     IEC,#ENAMSK     ; EN I
```

```
        LCALL   REPTST
        MOV     RDELAY,#DEADBN
HMCRT0: MOV     A,RDELAY
        JNZ     HMCRT0
        RET
;
;-------------------------------------------------
;
;    CALL THIS TO MOVE uSTEP WITH CONTACT SENSING.
;
;    100mS PERIOD.
;
USMCNT:                                 ; MOTOR CONTROL
        CLR     A
        CJNE    A,NPSCTL,USM00  ; STEPS EQU 0
        CJNE    A,NPSCTH,USM00
        LJMP    USMRET          ; DON'T MOVE
USM00:  MOV     RDELAY,#RLYSTB  ; WAIT FOR RELAY TO STABLE
        JB      PSENSE,USM02    ; IS CONTACT SENSING ON
        LCALL   ACTCTSN         ; TURN ON
$1:     MOV     A,RDELAY
        JNZ     $1
USM02:  JB      PNC,USM04
        MOV     RDELAY,#PWRSTB
        CLR     PMTRPD          ; TRIG WATCHDOG TIMER
        SETB    PMTRPD
USM03:  MOV     A,RDELAY        ; WAIT FOR POWER
        JNZ     USM03           ; SUPPLY STABLE
USM04:  CLR     PMTRPD          ; TRIG WATCHDOG TIMER
        SETB    PMTRPD
        JB      PCNTCT,USM01    ; NOT CONTACT
        JB      ZAXIS,$1        ; CONTACT, BUT OK TO MOVE Z
        SJMP    $2
$1:     JB      DIRECT,USM01
$2:     LJMP    USMRET          ; DON'T MOVE, ON SURFACE
USM01:  CLR     MVABRT          ; NOT ABORT BY RS232
        CLR     A
        CJNE    A,NPSCTH,USM10  ; > 100H STEPS
        SJMP    USM14           ; < 100H STEPS
;
;  PROCESS USTEP MOVE > 100H STEPS
;
USM10:  CLR     A
        CJNE    A,NPSCTL,USM11  ; LOW STEPS EQU 0
        DEC     NPSCTH          ; BORROW 100H
        CJNE    A,NPSCTH,USM11  ; IF IT DEC TO BE 0
        SJMP    USM14           ; DO LIKE LAST 100H STEPS
USM11:  JB      PCNTCT,USM16    ; NOT CONTACT
        JB      ZAXIS,$1        ; CONTACT, BUT OK TO MOVE Z
        SJMP    $2
$1:     JB      DIRECT,USM16
$2:     SJMP    USMRET          ; DON'T MOVE, ON SURFACE
USM16:  MOV     A,#1
        LCALL   TGPBIT
        LCALL   REPTST
        JNB     MVABRT,USM17    ; NOT ABORT BY RS232
        SJMP    USMRET
USM17:  MOV     RDELAY,#USTPDL
$1:     MOV     A,RDELAY        ; WAIT FOR USTEP
        JNZ     $1
        DJNZ    NPSCTL,USM11
        DJNZ    NPSCTH,USM11
;
;  PROCESS USTEP MOVE < 100H STEPS
```

```
;
USM14:      JB      PCNTCT,USM15      ; NOT CONTACT
            JB      ZAXIS,$1          ; CONTACT, BUT OK TO MOVE Z
            SJMP    $2
$1:         JB      DIRECT,USM15
$2:         SJMP    USMRET            ; DON'T MOVE, ON SURFACE
USM15:      MOV     A,#1
            LCALL   TGPBIT
            LCALL   REPTST
            JNB     MVABRT,USM18      ; NOT ABORT BY RS232
            SJMP    USMRET
USM18:      MOV     RDELAY,#USTPDL
$1:         MOV     A,RDELAY          ; WAIT FOR POWER
            JNZ     $1                ; SUPPLY STABLE
            DJNZ    NPSCTL,USM14
;
;  CLEAN UP AND RETURN
;
USMRET:     LCALL   REPTST
            RET
;
;-----------------------------------------------
;
;  CALL THIS ROUTINE TO MOVE MOTOR MEDIUM, IN ANY
;  DIRECTION, FOR ANY AXISES.
;  PUT NUMBER OF STEPS TO BE MOVED IN (NPSCTH,
;  NPSCTL) AND SET BIT 02H-05H FIRST.
;  IT WILL CALCULATE THE STEPS TO SEE WHEN TO
;  ACCERLATE AND WHEN TO DEACCERLATE.
;  IT WILL USE MDTBEN TO LIMIT THE TOP SPEED,
;  IT ALSO USE MDSTNB TO LIMIT THE DISTANCE.
;  KEEP AWAY FROM SURFACE BECAUSE IT IS NOT DAMPED.
;
;  USE ALL, DESTROY ALL.
;
MDMCNT:                               ; MOTOR CONTROL
            CLR     A
            CJNE    A,NPSCTL,MDM00    ; STEPS EQU 0
            CJNE    A,NPSCTH,MDM00
            LJMP    MDCRET            ; DON'T MOVE
MDM00:      MOV     RDELAY,#RLYSTB    ; WAIT FOR RELAY TO STABLE
            JB      PSENSE,MDM02      ; IS CONTACT SENSING ON
            LCALL   ACTCTSN           ; TURN ON
$4:         MOV     A,RDELAY
            JNZ     $4
MDM02:      JB      PNC,MDM05         ; IS POWER UP
            MOV     RDELAY,#PWRSTB
            CLR     PMTRPD            ; TRIG WATCHDOG TIMER
            SETB    PMTRPD
MDM03:      MOV     A,RDELAY          ; WAIT FOR POWER
            JNZ     MDM03             ; SUPPLY STABLE
MDM05:      CLR     PMTRPD            ; TRIG WATCHDOG TIMER
            SETB    PMTRPD
            JB      PCNTCT,MDM01      ; NOT CONTACT
            JB      ZAXIS,$1          ; CONTACT, BUT OK TO MOVE Z
            SJMP    $2
$1:         JB      DIRECT,MDM01
$2:         LJMP    MDCRET            ; DON'T MOVE, ON SURFACE
MDM01:      MOV     IEC,#DISMSK       ; DIS I
            CLR     MVABRT            ; NOT ABORT BY RS232
            MOV     R2,#1             ; 1ST IN ACCTAB
            MOV     DPTR,#ACCTBL
;
;  CHECK FOR STEPS > 2 * TABLE ENTRY
;
            MOV     R0,#MDTBEN        ; GET CURRENT TABLE #
            MOVX    A,@R0
            MOV     B,#2
            MUL     AB                ; ACC + DEACC
            MOV     R4,B              ; SAVE
            MOV     R5,A
            MOV     A,R4
            CJNE    A,NPSCTH,$1 ; IS STEPS(H) > 2*TABLE# (H) ?
            SJMP    $2                ; PROCESS EQUAL
$1:         JNC     MDM04             ; 2*TABLE# IS GREATER
            SJMP    $4                ; LARGE AMOUNT OF STEPS
$2:         MOV     A,R5              ; COMPARE NPSCTL W/ R5
            CJNE    A,NPSCTL,$3 ; IS STEPS(L) > 2*TABLE# (L) ?
; *******   SJMP    $4                ; EQUAL, PROCESS LARGE
$3:         JNC     MDM04             ; 2*TABLE# IS GREATER
$4:         LJMP    MDC10             ; LARGE AMOUNT OF STEPS
;
;  PROCESS MEDIUM SMALL RANGE MOVE
;
MDM04:      CLR     ODDSTP
            MOV     A,NPSCTH          ; STEPS <- 2*TABLE #
            CLR     C                 ; GET HALF CNT
            RRC     A
            MOV     A,NPSCTL
            RRC     A
            JNC     MDC00
            SETB    ODDSTP
            INC     A
MDC00:      MOV     NSTEPS,A
            INC     NPSCTH            ; LET DJNZ WORK
            CLR     A
            CJNE    A,NPSCTL,MDC01    ; LOW STEPS EQU 0
            DEC     NPSCTH            ; BORROW 100H
MDC01:      JB      PCNTCT,MDC06      ; NOT CONTACT
            JB      ZAXIS,$1          ; CONTACT, BUT OK TO MOVE Z
            SJMP    $2
$1:         JB      DIRECT,MDC06
$2:         LJMP    MDCRET            ; DON'T MOVE, ON SURFACE
MDC06:      MOV     A,R2
            MOVC    A,@A+DPTR         ; ACC DELAY CNT
            LCALL   TGPBIT
            JNB     MVABRT,MDC07      ; NOT ABORT BY RS232
            LJMP    MDCRET
MDC07:      MOV     A,R2
            CJNE    A,NSTEPS,MDC02
            SJMP    MDC05             ; DEACC TRIGERED
MDC02:      INC     R2
            DJNZ    NPSCTL,MDC01
            DJNZ    NPSCTH,MDC01      ; SHOULD NEVER FALL
; ------------------------------      ; THROUGH
MDC05:      JNB     ODDSTP,MDC03
            DJNZ    R2,MDC03
            LJMP    MDCRET
MDC03:      JB      PCNTCT,MDC04      ; NOT CONTACT
            JB      ZAXIS,$1          ; CONTACT, BUT OK TO MOVE Z
            SJMP    $2
$1:         JB      DIRECT,MDC04
$2:         LJMP    MDCRET            ; DON'T MOVE, ON SURFACE
MDC04:      MOV     A,R2              ; DEACC
            MOVC    A,@A+DPTR
            LCALL   TGPBIT
            JNB     MVABRT,MDC08      ; NOT ABORT BY RS232
            LJMP    MDCRET
```

```
MDC08:      DEC     NPSCTL
            DJNZ    R2,MDC03
            LJMP    MDCRET
;
;   -----------------------------------------------------
;
;   PROCESS MEDIUM LAGRE RANGE MOVE
;
MDC10:
;
;   PREPARATION: SUBTRACT 2*TABLE ENTRY FORM NPSCTH,L
;
            CLR     C
            MOV     A,NPSCTH            ; TAKE OUT ACCERLATION
            SUBB    A,R4                ; AND DE-ACCERLATION STEPS
            MOV     NPSCTH,A            ; FROM NUMBER OF STEPS TO
            MOV     A,NPSCTL            ; MOVE. THEY ARE STORE
            SUBB    A,R5                ; IN (R4,R5) PAIR.
            MOV     NPSCTL,A
;
;   MOVE IN ACCERLATION
;
MDCC11:     JB      PCNTCT,MDCC16       ; NOT CONTACT
            JB      ZAXIS,$1            ; CONTACT, BUT OK TO MOVE Z
            SJMP    $2
$1:         JB      DIRECT,MDCC16
$2:         LJMP    MDCRET              ; DON'T MOVE, ON SURFACE
MDCC16:     MOV     A,R2
            MOVC    A,@A+DPTR           ; ACC DELAY CNT
            LCALL   TGPBIT
            JNB     MVABRT,MDCC17       ; NOT ABORT BY RS232
            LJMP    MDCRET
;   MDCC17: MOV     A,R2       ( this is modified by Jimmy Wang )
MDCC17:     MOV     R0,#MDTBEN          ;  1    1 & 2 IS FOUND IN EXISTING FIRMWARE
            MOVX    A,@R0               ;  2
            CJNE    A,02,$3             ; CHECK TOP SPEED REACHED
            SJMP    MDCC13              ; ALREADY AT TOP SPEED
$3:          JNC     MDCC12              ; THIS IS FOUND IN EXISTING FIRMWARE
;$3:          JC      MDCC12              ; NOT AT TOP SPEED YET
;             MOV     R2,MDSTNB           ; ERROR CORRECTION
            MOV     R2,A
            SJMP    MDCC13
MDCC12:     INC     R2
            SJMP    MDCC11
;
;   MOVE AT CONSTANT TOP SPEED
;
MDCC13:     INC     NPSCTH              ; MAKE DJNZ WORKS
            CLR     A
            CJNE    A,NPSCTL,MDC11      ; LOW STEPS EQU 0
            DEC     NPSCTH              ; BORROW 100H
MDC11:      JB      PCNTCT,MDC16        ; NOT CONTACT
            JB      ZAXIS,$1            ; CONTACT, BUT OK TO MOVE Z
            SJMP    $2
$1:         JB      DIRECT,MDC16
$2:         LJMP    MDCRET              ; DON'T MOVE, ON SURFACE
MDC16:      MOV     A,R2
            MOVC    A,@A+DPTR           ; ACC DELAY CNT
            LCALL   TGPBIT
            JNB     MVABRT,MDC17        ; NOT ABORT BY RS232
            LJMP    MDCRET
MDC17:      DJNZ    NPSCTL,MDC11
            DJNZ    NPSCTH.MDC11
```

```
;   MOVE IN DE-ACCERLATION
;
MDC14:      JB      PCNTCT,MDC15        ; NOT CONTACT
            JB      ZAXIS,$1            ; CONTACT, BUT OK TO MOVE Z
            SJMP    $2
$1:         JB      DIRECT,MDC15
$2:         LJMP    MDCRET              ; DON'T MOVE, ON SURFACE
MDC15:      MOV     A,R2                ; DEACC
            MOVC    A,@A+DPTR
            LCALL   TGPBIT
            JNB     MVABRT,MDC18        ; NOT ABORT BY RS232
            LJMP    MDCRET
MDC18:      DEC     NPSCTL
            DJNZ    R2,MDC14
;
;   CLEAN UP AND RETURN
;
MDCRET:     MOV     IEC,#ENAMSK         ; EN I
            LCALL   REPTST
            MOV     RDELAY,#DEADBN
MDCRT0:     MOV     A,RDELAY
            JNZ     MDCRT0
            RET
;
;-----------------------------------------------------
;
;   CALL THIS ROUTINE TO MOVE MOTOR FAST, IN ANY
;   DIRECTION, FOR ANY AXISES.
;   PUT NUMBER OF STEPS TO BE MOVED IN (NPSCTH,
;   NPSCTL) AND SET BIT 02H-05H FIRST.
;   IT WILL CALCULATE THE STEPS TO SEE WHEN TO
;   ACCERLATE AND WHEN TO DEACCERLATE.
;   KEEP AWAY FROM SURFACE BECAUSE IT IS NOT DAMPED.
;
;   USE ALL, DESTROY ALL.
;
MTRCNT:                                 ; MOTOR CONTROL
            CLR     A
            CJNE    A,NPSCTL,MTR00      ; STEPS EQU 0
            CJNE    A,NPSCTH,MTR00
            LJMP    MTCRET              ; DON'T MOVE
MTR00:      MOV     RDELAY,#RLYSTB      ; WAIT FOR RELAY TO STABLE
            JB      PSENSE,MTR02        ; IS CONTACT SENSING ON
            LCALL   ACTCTSN             ; TURN ON
$4:         MOV     A,RDELAY
            JNZ     $4
MTR02:      JB      PNC,MTR05
            MOV     RDELAY,#PWRSTB
            CLR     PMTRPD              ; TRIG WATCHDOG TIMER
            SETB    PMTRPD
MTR03:      MOV     A,RDELAY            ; WAIT FOR POWER
            JNZ     MTR03               ; SUPPLY STABLE
MTR05:      CLR     PMTRPD              ; TRIG WATCHDOG TIMER
            SETB    PMTRPD
            JB      PCNTCT,MTR01        ; NOT CONTACT
            JB      ZAXIS,$1            ; CONTACT, BUT OK TO MOVE Z
            SJMP    $2
$1:         JB      DIRECT,MTR01
$2:         LJMP    MTCRET              ; DON'T MOVE, ON SURFACE
MTR01:      MOV     IEC,#DISMSK         ; DIS I
            CLR     MVABRT              ; NOT ABORT BY RS232
            MOV     R2,#1               ; 1ST IN ACCTAB
            MOV     DPTR,#ACCTBL
            MOV     A,NPSCTH
```

```
        ANL     A,#0FEH             ; STEPS > 511
        JZ      MTR04
        LJMP    MTC10               ; LARGE AMOUNT OF STEPS
;
;  PROCESS FAST SMALL RANGE MOVE
;
MTR04:  CLR     ODDSTP
        MOV     A,NPSCTH            ; STEPS < 511
        CLR     C                   ; GET HALF CNT
        RRC     A
        MOV     A,NPSCTL
        RRC     A
        JNC     MTC00
        SETB    ODDSTP
        INC     A
MTC00:  MOV     NSTEPS,A
        INC     NPSCTH              ; LET DJNZ WORK
        CLR     A
        CJNE    A,NPSCTL,MTC01      ; LOW STEPS EQU 0
        DEC     NPSCTH              ; BORROW 100H
MTC01:  JB      PCNTCT,MTC06        ; NOT CONTACT
        JB      ZAXIS,$1            ; CONTACT, BUT OK TO MOVE Z
        SJMP    $2
$1:     JB      DIRECT,MTC06
$2:     LJMP    MTCRET              ; DON'T MOVE, ON SURFACE
MTC06:  MOV     A,R2
        MOVC    A,@A+DPTR           ; ACC DELAY CNT
        LCALL   TGPBIT
        JNB     MVABRT,MTC07        ; NOT ABORT BY RS232
        LJMP    MTCRET
MTC07:  MOV     A,R2
        CJNE    A,NSTEPS,MTC02
        SJMP    MTC05               ; DEACC TRIGERED
MTC02:  INC     R2
        DJNZ    NPSCTL,MTC01
        DJNZ    NPSCTH,MTC01        ; SHOULD NEVER FALL
                                    ; THROUGH
MTC05:  JNB     ODDSTP,MTC03
        DJNZ    R2,MTC03
        LJMP    MTCRET
MTC03:  JB      PCNTCT,MTC04        ; NOT CONTACT
        JB      ZAXIS,$1            ; CONTACT, BUT OK TO MOVE Z
        SJMP    $2
$1:     JB      DIRECT,MTC04
$2:     LJMP    MTCRET              ; DON'T MOVE, ON SURFACE
MTC04:  MOV     A,R2                ; DEACC
        MOVC    A,@A+DPTR
        LCALL   TGPBIT
        JNB     MVABRT,MTC08        ; NOT ABORT BY RS232
        LJMP    MTCRET
MTC08:  DEC     NPSCTL
        DJNZ    R2,MTC03
        LJMP    MTCRET
;
;  PROCESS FAST LARGE RANGE MOVE
;
MTC10:  CLR     A
        CJNE    A,NPSCTL,MTC11      ; LOW STEPS EQU 0
        DEC     NPSCTH              ; BORROW 100H
MTC11:  JB      PCNTCT,MTC16        ; NOT CONTACT
        JB      ZAXIS,$1            ; CONTACT, BUT OK TO MOVE Z
        SJMP    $2
$1:     JB      DIRECT,MTC16
$2:     SJMP    MTCRET              ; DON'T MOVE, ON SURFACE
MTC16:  MOV     A,R2
        MOVC    A,@A+DPTR           ; ACC DELAY CNT
        LCALL   TGPBIT
        JNB     MVABRT,MTC17        ; NOT ABORT BY RS232
        SJMP    MTCRET
MTC17:  CJNE    R2,#0,MTC12
        SJMP    MTC13
MTC12:  INC     R2
MTC13:  DJNZ    NPSCTL,MTC11
        DJNZ    NPSCTH,MTC11
;
MTC14:  JB      PCNTCT,MTC15        ; NOT CONTACT
        JB      ZAXIS,$1            ; CONTACT, BUT OK TO MOVE Z
        SJMP    $2
$1:     JB      DIRECT,MTC15
$2:     SJMP    MTCRET              ; DON'T MOVE, ON SURFACE
MTC15:  MOV     A,R2                ; DEACC
        MOVC    A,@A+DPTR
        LCALL   TGPBIT
        JNB     MVABRT,MTC18        ; NOT ABORT BY RS232
        SJMP    MTCRET
MTC18:  DEC     NPSCTL
        DJNZ    R2,MTC14
;
;  CLEAN UP AND RETURN
;
MTCRET: MOV     IEC,#ENAMSK         ; EN I
        LCALL   REPTST
        MOV     RDELAY,#DEADBN
MTCRT0: MOV     A,RDELAY
        JNZ     MTCRT0
        RET
;
;--------------------------------------------------
;
ACCTBL: EQU     $
        DB      0AH,6EH,69H,67H,64H
        DB      61H,5DH,5AH,59H,56H
        DB      54H,53H,52H,51H,50H
        DB      4FH,4EH,4DH,4CH,4BH
        DB      4AH,49H,48H,47H,45H
        DB      44H,43H,42H,42H,40H
        DB      40H,3EH,3EH,3EH,3CH
        DB      3CH,3AH,3AH,38H,38H
        DB      36H,36H,36H,34H,34H
        DB      32H,32H,32H,32H,30H
        DB      30H,30H,30H,2EH,2EH
        DB      2EH,2EH,2CH,2CH,2CH
        DB      2CH,2CH,2CH,2CH,2CH
        DB      2CH,2CH,2AH,2AH,2AH
        DB      2AH,2AH,2AH,2AH,2AH
        DB      2AH,2AH,2AH,2AH,28H     ; 34F
        DB      28H,28H,28H,28H,28H
        DB      28H,28H,28H,28H,28H
        DB      28H,26H,26H,26H,26H
        DB      26H,26H,26H,26H,26H
        DB      26H,26H,26H,26H,26H
        DB      26H,26H,24H,24H,24H
        DB      24H,24H,24H,24H,24H
        DB      21H,21H,21H,21H,21H
        DB      21H,21H,1FH,1FH,1FH
        DB      1FH,1FH,1FH,1FH,1FH
        DB      1FH,1DH,1DH,1DH,1DH
        DB      1DH,1DH,1DH,1DH,1BH
```

```
        DB      1BH,1BH,1BH,1BH,1BH
        DB      1BH,1BH,19H,19H,19H
        DB      19H,19H,19H,19H,18H
        DB      18H,18H,18H,18H,18H     ; 39F
        DB      18H,18H,18H,14H,14H
        DB      14H,14H,14H,14H,14H
        DB      14H,14H,14H,14H,14H
        DB      14H,14H,14H,14H,12H
        DB      12H,12H,12H,12H,12H
        DB      12H,12H,12H,12H,12H
        DB      12H,12H,12H,12H,12H
        DB      10H,10H,10H,10H,10H
        DB      10H,10H,10H,10H,10H
        DB      10H,10H,10H,10H,10H
        DB      10H,0EH,0EH,0EH,0EH
        DB      0EH,0EH,0EH,0EH,0EH
        DB      0EH,0EH,0EH,0EH,0EH
        DB      0EH,0EH,0CH,0CH,0CH
        DB      0CH,0CH,0CH,0CH,0CH
        DB      0CH,0CH,0CH,0CH,0CH     ; 3EF
        DB      0CH,0CH,0CH,0AH,0AH
        DB      0AH,0AH,0AH,0AH,0AH
        DB      0AH,0AH,0AH,0AH,0AH
        DB      0AH
;
;-------------------------------------------------
;
        END
\032
```

```
        INCLUDE KTHEAD.A51
;
;1-LEVEL : 0 AND 1,
;
;2-TYPE : UTILITY PROGRAM
;
;
;3-FUNCTION : TESTING THE MOTORIZED POSITIONER.
;
;4-CALLING PROGRAM :
;
;
;5-ENTRY POINT:
;
;           1) BCDHEX,  SHRNIB,  SNDSTS
;              TXOBWR,  TXOBRD,  RXIBWR
;              RXIBRD,  MODLMH,  STDLMT
;              MVXTME,  REPTST,  ACTUSTP
;              XFRLMT,  ACTCTSN.
;           2) DISOFT
;
;6-SUBROUTINE USED:
;
;              HMCLCDO,STUSTB
;              DISIGNO,SADLCDO,RSTLCDO
;              WDTLCDO,DISHEXO
;              CLRLCD1, DISIGN1
;
;7-BUFFER, QUEUE, TABLE USED:
;
;          STMSG7  SIZE 80 PER ENTRY
;
;-------------------------------------------------
;
IS_MELLIS: ASK     ASSEMBLE FOR MELLIS(=1) OR ALESSI & NIGHTS(=0) POSITIONER
;
;-------------------------------------------------
;
IS_ALESSI: ASK     ASSEMBLE FOR ALESSI(=1) OR KNIGHTS(=0) POSITIONER
;
;-------------------------------------------------
;
           INCLUDE KTINCL.A51
;
;-------------------------------------------------
;
; PUBLIC DECLARATION
           PUBLIC  BCDHEX,  SHRNIB,  SNDSTS
           PUBLIC  TXOBWR,  TXOBRD,  RXIBWR
           PUBLIC  RXIBRD,  MODLMH,  STDLMT
           PUBLIC  MVXTME,  REPTST,  ACTUSTP
           PUBLIC  ACTCTSN,DISOFT,  XFRLMT
           PUBLIC  REPCNT,  CNVPCK,  CNVXFR
           PUBLIC  BCDADD,  BCDSUB,  HEXBCD
           PUBLIC  SCALING,BCDAD3,  BCDSB3
;
;-------------------------------------------------
;
; EXTERNAL DECLARATION
           EXTERNAL HMCLCDO,STUSTB
           EXTERNAL DISIGNO,SADLCDO,RSTLCDO
           EXTERNAL WDTLCDO,DISHEXO
           EXTERNAL CLRLCD1, DISIGN1
;
```

```
;-------------------------------------------------
;          UTILITY SUBROUTINES  FILE # 2
;-------------------------------------------------
;
;    CALL THIS TO CONVERT 4 DIGITS PACKED BCD INTO
;      4 DIGITS OF HEX. BCD RANGE FROM 0000 TO 9999
;      HEX RANGE FROM 0000 TO 270F. FULL DEBUGGED.
;
BCDHEX:    MOV     A,WKACCL        ; A=D1,D0
           ANL     A,#0F0H         ; A=D1,0
           SWAP    A               ; A=0,D1
           XCH     A,WKACCL        ; A=D1,D0; WKACCL=0,D1
           ANL     A,#0FH          ; A=0,D0
           MOV     R2,A            ; R2=0,D0
           MOV     A,WKACCH        ; A=D3,D2
           ANL     A,#0FH          ; A=0,D2
           XCH     A,WKACCH        ; A=D3,D2; WKACCH=0,D2
           ANL     A,#0F0H         ; A=D3,0
           SWAP    A               ; A=0,D3
           MOV     B,#10           ; A=D3*10
           MUL     AB
           ADD     A,WKACCH        ; A=D3*10+D2
           MOV     B,#10
           MUL     AB              ; A=(D3*10+D2)*10
           ADD     A,WKACCL        ; A=(D3*10+D2)*10+D1
           MOV     WKACCL,A        ; TEMP LO
           MOV     A,B
           ADDC    A,#0            ; ADJ HIGH BYTE
           MOV     B,#10
           MUL     AB
           MOV     WKACCH,A        ; TEMP HI * 10
           MOV     A,WKACCL
           MOV     B,#10
           MUL     AB
           ADD     A,R2            ; TEMP LO * 10 + D0
           MOV     WKACCL,A
           MOV     A,B
           ADDC    A,WKACCH        ; TEMP HI + CARRY
           MOV     WKACCH,A
           RET
;
;-------------------------------------------------
;
;    CALL THIS TO CONVERT 3 1/2 DIGITS HEX INTO 4 DIGITS
;      OF PACKED BCD . HEX RANGE FROM 0000 TO 270F.
;      BCD RANGE FROM 0000 TO 9999.
;
HEXBCD:    MOV     A,WKACCL        ; A=H1,H0
           ANL     A,#0F0H         ; A=H1,0
           SWAP    A               ; A=0,H1
           XCH     A,WKACCL        ; A=H1,H0; WKACCL=0,H1
           ANL     A,#0FH          ; A=0,H0
           MOV     R2,A            ; R2=0,H0
;
           MOV     A,WKACCH        ; A=H3,H2
           ANL     A,#03FH         ; A=00H3,H2
           MOV     B,#10
           DIV     AB
           SWAP    A
           ORL     A,B
           MOV     WKACCH,A        ; D3,D2
;
           ANL     A,#0FH
           XCH     A,WKACCH        ; WKACCH=0,D2
```

```
        ANL     A,#0F0H
        SWAP    A                       ; A=0,D3
        MOV     R3,A                    ; R3=0,D3
        MOV     R4,A                    ; R4=0,D3*100H 1ST
        MOV     A,WKACCH                ; A=0,D2
        MOV     B,#6H
        MUL     AB
        MOV     B,#10
        DIV     AB
        SWAP    A
        ORL     A,B                     ; A=D2*6
        MOV     R5,A                    ;               2ND
        MOV     A,WKACCH                ; A=D2
        SWAP    A                       ; A=D2,0
        ADD     A,R5
        DA      A
        MOV     R5,A
        MOV     A,R4
        ADDC    A,#0
        DA      A
        MOV     R4,A                    ;               3RD
        MOV     A,R3
        MOV     B,#6H
        MUL     AB
        MOV     B,#10
        DIV     AB
        ADD     A,R4
        DA      A
        MOV     R4,A
        MOV     A,B
        SWAP    A
        ADD     A,R5
        DA      A
        MOV     R5,A
        MOV     A,R4                    ; A=(H3*16+H2)*16
        ADDC    A,#0
        DA      A
        MOV     R4,A                    ;               4TH

        MOV     A,WKACCL
        MOV     B,#10
        DIV     AB
        SWAP    A
        ORL     A,B
        MOV     WKACCL,A
        MOV     A,R5
        ADD     A,WKACCL                ; A=(H3*16+H2)*16+H1
        DA      A
        MOV     R5,A                    ; TEMP LO
        MOV     A,R4
        ADDC    A,#0                    ; ADJ HIGH BYTE
        DA      A
        MOV     R4,A

        MOV     A,R5
        ANL     A,#0FH
        XCH     A,R5                    ; R5=D1
        ANL     A,#0F0H
        SWAP    A
        MOV     R3,A                    ; R3=D2
        MOV     A,R4
        SWAP    A
        ORL     A,R3
        MOV     WKACCH,A                ; WKACCH=D3,D2 * 100H
        MOV     A,R5
        MOV     B,#6H
        MUL     AB
        MOV     B,#10
        DIV     AB
        SWAP    A
        ORL     A,B
        MOV     WKACCL,A                ; WKACCL=D1 * 6
        MOV     A,R5
        SWAP    A
        ADD     A,WKACCL
        DA      A
        MOV     WKACCL,A
        MOV     A,WKACCH
        ADDC    A,#0
        DA      A
        MOV     WKACCH,A
        MOV     A,R4
        MOV     B,#6H
        MUL     AB
        MOV     B,#10
        DIV     AB
        SWAP    A
        ORL     A,B
        ADD     A,WKACCH
        DA      A
        MOV     WKACCH,A
        MOV     A,R3
        MOV     B,#6H
        MUL     AB
        MOV     B,#10
        DIV     AB
        ADD     A,WKACCH
        DA      A
        MOV     WKACCH,A
        MOV     A,B
        SWAP    A
        ADD     A,WKACCL
        DA      A
        MOV     WKACCL,A
        MOV     A,WKACCH
        ADDC    A,#0
        DA      A
        MOV     WKACCH,A                ; TEMP HI * 16
;
        MOV     A,R2
        MOV     B,#10
        DIV     AB
        SWAP    A
        ORL     A,B
        MOV     R2,A
        MOV     A,WKACCL
        ADD     A,R2                    ; TEMP LO * 16 + D0
        DA      A
        MOV     WKACCL,A
        MOV     A,WKACCH
        ADDC    A,#0                    ; TEMP HI + CARRY
        DA      A
        MOV     WKACCH,A
        RET
;
;----------------------------------------------------
;
;       CALL THIS TO ADD N BYTES OF BCD NUMBER
```

```
;
RAWAD3:    MOV     A,@R0           ; LSB
           ADD     A,@R1
           DA      A
           MOV     @R0,A
           DEC     R0
           DEC     R1
           MOV     A,@R0           ; Mid-SB
           ADDC    A,@R1
           DA      A
           MOV     @R0,A
           DEC     R0
           DEC     R1
           MOV     A,@R0           ; MSB
           ADDC    A,@R1
           DA      A
           MOV     @R0,A
           RET
;
RAWADD:    MOV     A,@R0           ; LSB
           ADD     A,@R1
           DA      A
           MOV     @R0,A
           DEC     R0
           DEC     R1
           MOV     A,@R0           ; MSB
           ADDC    A,@R1
           DA      A
           MOV     @R0,A
           RET
;
;-----------------------------------------------------
;
;  CALL THIS TO ADD N BYTES OF BCD NUMBER
;
BCDAD3:    MOV     A,R0
           MOV     R4,A
           MOV     A,R1
           MOV     R5,A
;
           JB      SGNFG1,BCDA30
           LCALL   BCDCP3
BCDA30:    JB      SGNFG0,BCDA31
           MOV     A,R4
           MOV     R1,A
           LCALL   BCDCP3
;
BCDA31:    MOV     A,R4
           MOV     R0,A
           MOV     A,R5
           MOV     R1,A
           LCALL   RAWAD3
;
           JNB     SGNFG0,BCDA32         ; NEGATIVE ADDEND
;
           JB      SGNFG1,BCDA3RET       ; POSTIVE ADDER
           JC      BCDA3RET              ; NO UNDERFLOW
           CLR     SGNFG0
           MOV     A,R4
           MOV     R1,A
           LCALL   BCDCP3
           SJMP    BCDA3RET
;
BCDA32:    JNB     SGNFG1,BCDA33         ; NEGATIVE ADDER
           JNC     BCDA33                ; NO UNDERFLOW
           SETB    SGNFG0
           SJMP    BCDA3RET
BCDA33:    MOV     A,R4
           MOV     R1,A
           LCALL   BCDCP3
BCDA3RET:  RET
;
BCDADD:    MOV     A,R0
           MOV     R4,A
           MOV     A,R1
           MOV     R5,A
;
           JB      SGNFG1,BCDA00
           LCALL   BCDCPL
BCDA00:    JB      SGNFG0,BCDA01
           MOV     A,R4
           MOV     R1,A
           LCALL   BCDCPL
;
BCDA01:    MOV     A,R4
           MOV     R0,A
           MOV     A,R5
           MOV     R1,A
           LCALL   RAWADD
;
           JNB     SGNFG0,BCDA02         ; NEGATIVE ADDEND
;
           JB      SGNFG1,BCDARET        ; POSTIVE ADDER
           JC      BCDARET               ; NO UNDERFLOW
           CLR     SGNFG0
           MOV     A,R4
           MOV     R1,A
           LCALL   BCDCPL
           SJMP    BCDARET
;
BCDA02:    JNB     SGNFG1,BCDA03         ; NEGATIVE ADDER
           JNC     BCDA03                ; NO UNDERFLOW
           SETB    SGNFG0
           SJMP    BCDARET
BCDA03:    MOV     A,R4
           MOV     R1,A
           LCALL   BCDCPL
BCDARET:   RET
;
;-----------------------------------------------------
;
;  CALL THIS TO SUBTRACT N BYTES OF BCD NUMBER
;
BCDSB3:    MOV     A,R0
           MOV     R4,A
           MOV     A,R1
           MOV     R5,A
;
           JNB     SGNFG1,BCDS30 ; NEGATIVE SUBTRACTOR
           LCALL   BCDCP3
BCDS30:    JB      SGNFG0,BCDS31 ; POSITIVE SUBTRACTEND
           MOV     A,R4
           MOV     R1,A
           LCALL   BCDCP3
;
BCDS31:    MOV     A,R4
           MOV     R0,A
           MOV     A,R5
```

```
                MOV     R1,A
                LCALL   RAWAD3
;
                JNB     SGNFG0,BCDS32 ; NEGATIVE SUBTRACTEND
;
                JNB     SGNFG1,BCDS3RET; NEGATIVE SUBTRACTOR
                JNC     BCDS3RET      ; NO UNDERFLOW
                CLR     SGNFG0
                MOV     A,R4
                MOV     R1,A
                LCALL   BCDCP3
                SJMP    BCDS3RET
;
BCDS32:         JB      SGNFG1,BCDS33  ; POSITIVE SUBTRACTOR
                JC      BCDS33         ; NO OVERFLOW
                SETB    SGNFG1
                SJMP    BCDS3RET
BCDS33:         MOV     A,R4           ; NEGATIVE RESULT
                MOV     R0,A
                LCALL   BCDCP3
BCDS3RET:       RET
;
BCDSUB:         MOV     A,R0
                MOV     R4,A
                MOV     A,R1
                MOV     R5,A
;
                JNB     SGNFG1,BCDS00 ; NEGATIVE SUBTRACTOR
                LCALL   BCDCPL
BCDS00:         JB      SGNFG0,BCDS01 ; POSITIVE SUBTRACTEND
                MOV     A,R4
                MOV     R1,A
                LCALL   BCDCPL
;
BCDS01:         MOV     A,R4
                MOV     R0,A
                MOV     A,R5
                MOV     R1,A
                LCALL   RAWADD
;
                JNB     SGNFG0,BCDS02 ; NEGATIVE SUBTRACTEND
;
                JNB     SGNFG1,BCDSRET; NEGATIVE SUBTRACTOR
                JNC     BCDSRET       ; NO UNDERFLOW
                CLR     SGNFG0
                MOV     A,R4
                MOV     R1,A
                LCALL   BCDCPL
                SJMP    BCDSRET
;
BCDS02:         JB      SGNFG1,BCDS03 ; POSITIVE SUBTRACTOR
                JC      BCDS03        ; NO OVERFLOW
                SETB    SGNFG1
                SJMP    BCDSRET
BCDS03:         MOV     A,R4                 ; NEGATIVE RESULT
                MOV     R0,A
                LCALL   BCDCPL
BCDSRET:        RET
;
;--------------------------------------------------
;
;  CALL THIS TO 10'S COMPLEMENT N BYTES OF BCD NUMBER
;
BCDCP3:         MOV     A,R1
                MOV     R0,A
                CLR     C              ; MAKE 9'S COMP
                MOV     A,#99H
                SUBB    A,@R0          ; LSB
                DA      A
                MOV     @R0,A
                DEC     R0
                MOV     A,#99H
                SUBB    A,@R0
                DA      A
                MOV     @R0,A
                DEC     R0
                MOV     A,#99H         ; MSB
                SUBB    A,@R0
                DA      A
                MOV     @R0,A
;
                MOV     A,R1           ; MAKE 10'S COMPL
                MOV     R0,A
                MOV     A,@R0
                ADD     A,#1
                DA      A
                MOV     @R0,A
                DEC     R0
                MOV     A,@R0
                ADDC    A,#0
                DA      A
                MOV     @R0,A
                DEC     R0
                MOV     A,@R0
                ADDC    A,#0
                DA      A
                MOV     @R0,A
                RET
;
BCDCPL:         MOV     A,R1
                MOV     R0,A
                CLR     C              ; MAKE 9'S COMP
                MOV     A,#99H
                SUBB    A,@R0          ; LSB
                DA      A
                MOV     @R0,A
                DEC     R0
                MOV     A,#99H         ; MSB
                SUBB    A,@R0
                DA      A
                MOV     @R0,A
;
                MOV     A,R1
                MOV     R0,A
                MOV     A,@R0          ; MAKE 10'S COMPL
                ADD     A,#1
                DA      A
                MOV     @R0,A
                DEC     R0
                MOV     A,@R0
                ADDC    A,#0
                DA      A
                MOV     @R0,A
                RET
;
;--------------------------------------------------
;
;    CALL THIS TO ROTATE 12 BITS RIGHT 4 BITS.
```

```
;
SHRNIB:    MOV     A,WKACCL   ;  (WKACCL7-0)
           ANL     A,#0F0H    ;  (WKACCL7-4,0000)
           SWAP    A          ;  (0000,WKACCL7-4)
           MOV     WKACCL,A   ;  (WKACCL7-0)=(0000,WKACCL7-4)
           MOV     A,WKACCH   ;  (WKACCH7-0)
           ANL     A,#0FH     ;  (0000,WKACCH3-0)
           SWAP    A          ;  (WKACCH3-0,0000)
           ORL     A,WKACCL   ;  (WKACCH3-0,WKACCL7-4)
           MOV     WKACCL,A   ;  (WKACCL7-0)=(WKACCH3-0,L7-4)
           MOV     A,WKACCH   ;  (WKACCH7-0)
           ANL     A,#0F0H    ;  (WKACCH7-4,0000)
           SWAP    A          ;  (0000,WKACCH7-4)
           MOV     WKACCH,A   ;  (WKACCH)=(0000,WKACCH7-4)
           RET
;
;--------------------------------------------------
;
;  CALL THIS TO CONVERT WKASGN,WKACCH,WKACCL INTO
;    PC1TMP,PA1TMP.
;
CNVPCK:    MOV     A,PC1TMP
           ANL     A,#0FH
           MOV     PC1TMP,A        ; CLEAR PC1TMP HIGH
           MOV     A,WKACCH
           JNB     WKASGN,$1       ; 0 FOR NEG.
           SETB    A.3
$1:        ANL     A,#0FH          ; JUST PLAY SAFE
           SWAP    A
           ORL     A,PC1TMP        ; PC1H
           MOV     PC1TMP,A        ; SET INTO PC1TMP
           MOV     A,WKACCL
           SWAP    A               ; PA1L-PA1H
           MOV     PA1TMP,A        ; SET INTO PA1TMP
           RET
;
;--------------------------------------------------
;
;  CALL THIS TO CONVERT (WKACCD),WKACCH,WKACCL INTO
;    PB1TMP,PC1TMP.
;
CNVXFR:    MOV     A,PC1TMP
           ANL     A,#0F0H
           MOV     PC1TMP,A        ; CLEAR PC1TMP LOW
           MOV     A,WKACCH        ; PB1H
           ANL     A,#0FH          ; JUST PLAY SAFE
           SWAP    A
           MOV     WKACCH,A        ; PB1H,0000
           MOV     A,WKACCL        ; PB1L-PC1L
           ANL     A,#0F0H         ; PB1L,0000
           SWAP    A               ; 0000,PB1L
           ORL     A,WKACCH        ; PB1H-PB1L
           MOV     PB1TMP,A        ; SET INTO PB1TMP
           MOV     A,WKACCL        ; PB1L-PC1L
           ANL     A,#0FH          ; 0000,PC1L
           ORL     A,PC1TMP        ; PC1H-PC1L
           MOV     PC1TMP,A        ; SET INTO PC1TMP
           RET
;
;--------------------------------------------------
;
;  CALL THIS TO MULTIPLY BY 4.88476
;
;    USING TPREGH,TPREGL WKACCH,WKACCL R6
;
SCALING:   MOV     A,WKACCL        ; *2
           CLR     C
           RLC     A
           MOV     WKACCL,A
           MOV     A,WKACCH
           RLC     A
           MOV     WKACCH,A        ; WKACCH-L
;
           MOV     A,WKACCL        ; *2
           CLR     C
           RLC     A
           MOV     TPREGL,A
           MOV     A,WKACCH
           RLC     A
           MOV     TPREGH,A        ; TPREGH-L
;
           MOV     A,WKACCH        ; + 1/2
           CLR     C
           RRC     A
           MOV     R6,A
           MOV     A,WKACCL
           RRC     A
           ADD     A,TPREGL
           MOV     TPREGL,A
           MOV     A,TPREGH
           ADDC    A,R6
           MOV     TPREGH,A        ; TPREGH-L
;
           MOV     A,WKACCH        ; - 1/16
           ANL     A,#0FH
           SWAP    A
           MOV     R6,A
           MOV     A,WKACCL
           ANL     A,#0F0H
           SWAP    A
           ORL     A,R6
           MOV     R6,A            ; R6
           MOV     A,TPREGL
           CLR     C
           SUBB    A,R6
           MOV     TPREGL,A
           MOV     A,TPREGH
           SUBB    A,#0
           MOV     TPREGH,A        ; TPREGH-L
;
           MOV     A,WKACCH        ; + 1/256
           ANL     A,#0FH
           ADD     A,TPREGL
           MOV     TPREGL,A
           MOV     A,TPREGH
           ADDC    A,#0
           MOV     TPREGH,A        ; TPREGH-L
;
           MOV     A,R6            ; + 1/1024
           ANL     A,#11000000B
           RL      A
           RL      A               ; 000000XXB
           ADD     A,TPREGL
           MOV     TPREGL,A
           MOV     A,TPREGH
           ADDC    A,#0
           MOV     TPREGH,A
;
```

```
        MOV     WKACCH,TPREGH
        MOV     WKACCL,TPREGL
        RET
;
;--------------------------------------------------
;
;   CALL THIS TO SEND STRUCTURED STATUS DATA
;     BACK TO HOST.
;
SNDSTS: JNB     SUCCES,$6       ; IS SERIAL COMMAND DONE
        MOV     A,#'A'          ; FORCE RS232C TO BEGIN
        SJMP    $5
$6:     MOV     A,#'F'          ; SEND FAIL HEADER
$5:     LCALL   TXOBWR
;
        MOV     A,PB1TMP
        JNB     A.7,$4          ; CONTACT SENSING ACTIVATED
        MOV     DPTR,#PORTC1
        MOVX    A,@DPTR
        JB      A.7,$3          ; IS NOT CONTACT
        CLR     CONTACT
        SJMP    $4
$3:     SETB    CONTACT
$4:     MOV     A,FGSTUS        ; STATUS REGISTER
        LCALL   TXOBWR
;
        MOV     A,#CXPSH0       ; X COORDINATES
        ADD     A,CADROF
        MOV     R0,A
        MOV     R2,#6
SNDST0: MOVX    A,@R0           ; GET PARA
        LCALL   TXOBWR
        INC     R0
        DJNZ    R2,SNDST0
;
        MOV     R0,#ZMXPH0      ; CURRENT Z FLOOR
        MOVX    A,@R0
        LCALL   TXOBWR
        INC     R0              ; ZMXPL0
        MOVX    A,@R0
        LCALL   TXOBWR
;
        MOV     A,VADCIH        ; ADC VOLTAGE
        LCALL   TXOBWR
        MOV     A,VADCIL
        LCALL   TXOBWR
;
;   ASSEMBLE NEW FLAG WORD
;
        MOV     C,PSENSE        ; MSU/SCT MODE
        JC      SNDST1
        MOV     A,#'M'          ; MSU MODE
        SJMP    SNDST2
SNDST1: MOV     A,#'C'          ; SCT MODE
SNDST2: LCALL   TXOBWR
        MOV     C,PSENSE        ; MSU/SCT MODE
        MOV     A.7,C
        MOV     C,PPRSNT
        MOV     A.6,C
        MOV     C,PCNTCT
        MOV     A.5,C
        MOV     C,PFAST
        MOV     A.4,C
        MOV     C.PNC
        MOV     A.3,C
        MOV     B,PBOTMP
        MOV     C,B.6           ; PUSTEP
        MOV     A.2,C
        MOV     C,DIRECT
        MOV     A.1,C
        MOV     C,MVABRT
        MOV     A.0,C
        LCALL   TXOBWR          ; NEW FLAGS REG.
;
        MOV     A,#13           ; CR, END OF LINE
        LCALL   TXOBWR
        RET
;
;--------------------------------------------------
;
;   CALL THIS TO SEND STRUCTURED STATUS DATA
;     BACK TO HOST.
;
TXOBWR: PUSH    DPL
        PUSH    DPH
        PUSH    A
;
PRCSWR: INC     SOPWRP          ; INC WRITE POINTER
        MOV     A,SOPWRP
        CJNE    A,#128,$3       ; WRAP
$3:     JC      $4              ; < 128
        MOV     SOPWRP,#0       ; >= 128
;
$4:     MOV     A,SOPWRP
        MOV     DPTR,#SOTBUF    ; SERIAL OUTPUT BUFFER
        MOV     A,SOPWRP        ; WRITE POINTER
        ADD     A,DPL
        MOV     DPL,A
        CLR     A
        ADD     A,DPH
        MOV     DPH,A
        POP     A
        MOVX    @DPTR,A         ; INTO RS-232C OUT BUF
        POP     DPH
        POP     DPL
        RET
;
;--------------------------------------------------
;
;   CALL THIS TO SEND STRUCTURED STATUS DATA
;     BACK TO HOST.
;
TXOBRD: PUSH    DPL
        PUSH    DPH
        MOV     A,SOPRDP        ; POINT AT LAST EMPTY
        CJNE    A,SOPWRP,$1     ; KEEP UP TILL EQUAL
        SETB    TBEMPY
        SJMP    $2              ; NOTHING TO PICKUP
;
$1:     CLR     TBEMPY
        INC     SOPRDP          ; INC READ POINTER
        MOV     A,SOPRDP
        CJNE    A,#128,$3       ; WRAP
$3:     JC      $4              ; < 128
        MOV     SOPRDP,#0       ; >= 128
;
$4:     MOV     DPTR,#SOTBUF    ; SERIAL OUTPUT BUFFER
        MOV     A,SOPRDP        ; READ POINTER
```

```
        ADD     A,DPL
        MOV     DPL,A
        CLR     A
        ADD     A,DPH
        MOV     DPH,A
        MOVX    A,@DPTR         ; OUT OF RS-232C OUT BUF
;
$2:     POP     DPH
        POP     DPL
        RET
;
;--------------------------------------------------
;
;   CALL THIS TO SEND STRUCTURED STATUS DATA
;     BACK TO HOST.
;
RXIBWR: PUSH    DPL
        PUSH    DPH
        PUSH    A
        MOV     A,SINWRP        ; POINT AT LAST NON-EMPTY
        CJNE    A,SINRDP,$1     ; DON'T OVERRUN
$1:     JNC     $2              ; GREATER OR EQUAL, STUFF IN
;
        SETB    OVERRUN         ; OVERRUN HAPPEND
        SJMP    $5
;
;     SJMP    $4  ; INDICATE TO HOST
;                 ; KILL THIS AFTER HOST CAN
;                 ; SEE THE receive STRUCT
;
$2:     CLR     OVERRUN
$5:     INC     SINWRP          ; INC WRITE POINTER
        MOV     A,SINWRP
        CJNE    A,#128,$3       ; WRAP
$3:     JC      $4              ; < 128
        MOV     SINWRP,#0       ; >= 128
;
$4:     MOV     A,SINWRP
        MOV     DPTR,#SINBUF    ; SERIAL INPUT BUFFER
        MOV     A,SINWRP        ; WRITE POINTER
        ADD     A,DPL
        MOV     DPL,A
        CLR     A
        ADD     A,DPH
        MOV     DPH,A
        POP     A
        MOVX    @DPTR,A         ; INTO RS-232C IN BUF
        POP     DPH
        POP     DPL
        RET
;
;--------------------------------------------------
;
;   CALL THIS TO SEND STRUCTURED STATUS DATA
;     BACK TO HOST.
;
RXIBRD: PUSH    DPL
        PUSH    DPH
        MOV     A,SINRDP        ; POINT AT LAST EMPTY
        CJNE    A,SINWRP,$1     ; KEEP UP TILL EQUAL
        SETB    RBEMPY
        SJMP    $2              ; NOTHING TO PICKUP
;
$1:     CLR     RBEMPY
        INC     SINRDP          ; INC READ POINTER
        MOV     A,SINRDP
        CJNE    A,#128,$3       ; WRAP
$3:     JC      $4              ; < 128
        MOV     SINRDP,#0       ; >= 128
;
$4:     MOV     DPTR,#SINBUF    ; SERIAL INPUT BUFFER
        MOV     A,SINRDP        ; READ POINTER
        ADD     A,DPL
        MOV     DPL,A
        CLR     A
        ADD     A,DPH
        MOV     DPH,A
        MOVX    A,@DPTR         ; OUT OF RS-232C IN BUF
;
$2:     POP     DPH
        POP     DPL
        RET
;
;--------------------------------------------------
;
;   CALL THIS TO EXTEND THE LIMIT OF THE
;     SOFT LIMIT CHECK DONE IN TGPBIT
;
MODLMH: MOV     A,#XMNPH0
        ADD     A,CADROF
        MOV     R0,A
        MOV     R1,#CXLMNH
        MOV     R2,#6
        CLR     A
MOD00:  MOVX    @R0,A
        MOV     @R1,A
        INC     R0
        INC     R1
        DJNZ    R2,MOD00
;
        MOV     A,#>MAXXRG
        MOVX    @R0,A
        MOV     @R1,A
        INC     R0
        INC     R1
        MOV     A,#<MAXXRG
        MOVX    @R0,A
        MOV     @R1,A
        INC     R0
        INC     R1
        MOV     A,#>MAXYRG
        MOVX    @R0,A
        MOV     @R1,A
        INC     R0
        INC     R1
        MOV     A,#<MAXYRG
        MOVX    @R0,A
        MOV     @R1,A
        INC     R0
        INC     R1
        MOV     A,#>MAXZRG
        MOVX    @R0,A
        MOV     @R1,A
        INC     R0
        INC     R1
        MOV     A,#<MAXZRG
        MOVX    @R0,A
        MOV     @R1,A
```

```
        RET
;
;--------------------------------------------------
;
;   CALL THIS TO RESTORE THE LIMITS BACK TO
;     NORMAL STANRARD LIMITS SO THAT THE
;     POSITIONER WILL NOT GO NEAR TRAVEL ENDS
;     WITHIN 400H STEPS
;
STDLMT: MOV     A,#XMNPHO
        ADD     A,CADROF
        MOV     R0,A
        MOV     R1,#CXLMNH
;
        MOV     A,#>MINXLM
        MOVX    @R0,A
        MOV     @R1,A
        INC     R0
        INC     R1
        MOV     A,#<MINXLM
        MOVX    @R0,A
        MOV     @R1,A
        INC     R0
        INC     R1
        MOV     A,#>MINYLM
        MOVX    @R0,A
        MOV     @R1,A
        INC     R0
        INC     R1
        MOV     A,#<MINYLM
        MOVX    @R0,A
        MOV     @R1,A
        INC     R0
        INC     R1
        MOV     A,#>MINZLM
        MOVX    @R0,A
        MOV     @R1,A
        INC     R0
        INC     R1
        MOV     A,#<MINZLM
        MOVX    @R0,A
        MOV     @R1,A
        INC     R0
        INC     R1
;
        MOV     A,#>MAXXLM
        MOVX    @R0,A
        MOV     @R1,A
        INC     R0
        INC     R1
        MOV     A,#<MAXXLM
        MOVX    @R0,A
        MOV     @R1,A
        INC     R0
        INC     R1
        MOV     A,#>MAXYLM
        MOVX    @R0,A
        MOV     @R1,A
        INC     R0
        INC     R1
        MOV     A,#<MAXYLM
        MOVX    @R0,A
        MOV     @R1,A
        INC     R0
        INC     R1
        MOV     A,#>MAXZLM
        MOVX    @R0,A
        MOV     @R1,A
        INC     R0
        INC     R1
        MOV     A,#<MAXZLM
        MOVX    @R0,A
;
        INC     R0              ; SET DEFAULT SPEED
        MOV     A,#DFFSDL       ; DEFAULT X FAST DELAY
        MOVX    @R0,A
        INC     R0
        MOVX    @R0,A           ; DEFAULT Y FAST DELAY
        INC     R0
        MOVX    @R0,A           ; DEFAULT Z FAST DELAY
        RET
;
;--------------------------------------------------
;
;   CALL THIS TO TRANSFER THE LIMITS FROM
;     SRAM INTO INT RAM, SET THE CURRENT
;     LIMITS SO THAT THE POSITIONER WILL
;     NOT GO NEAR TRAVEL ENDS WITHIN 400H
;     STEPS
;
XFRLMT: MOV     A,#XMNPHO       ; BASE
        ADD     A,CADROF        ; ADD OFFSET
        MOV     R1,A            ; POINT TO #N ADDRESS
        MOV     R0,#CXLMNH
        MOV     R2,#12          ; TRANSFER 12 BYTES
$1:     MOVX    A,@R1           ; GET FROM SRAM
        MOV     @R0,A           ; STORE IN DBYTE
        INC     R1              ; FOR EASY REFERANCE
        INC     R0              ; BY TGPBIT
        DJNZ    R2,$1
        RET
;
;--------------------------------------------------
;
;   CALL THIS TO MOVE DATE TIME TO SRAM
;
MVXTME: MOV     R0,#XT1S        ; WARM WRONG TIME
        MOV     R1,#T1S         ; USER ADJUST
        MOV     R2,#8           ; OR USE CLOCK CHIP
MVXTM0: MOV     A,@R1
        MOVX    @R0,A
        INC     R0
        INC     R1
        DJNZ    R2,MVXTM0
        RET
;
;--------------------------------------------------
;
;   CALL  THIS TO SHOW STATUS OF THE PS # ON
;     LCD #0.
;
REPTST: LCALL   HMCLCD0
        MOV     DPTR,#STUSTB
        MOV     R3,#80
        LCALL   DISIGN0
;
        MOV     R2,#16
        LCALL   SADLCD0
```

```
        MOV     A,CPSNUM        ; GET CURRENT PS NUMBER
        ADD     A,#31H          ; CONVERT TO ASCII
        MOV     R2,A            ; DISPLAY IT
        LCALL   WDTLCD0
;
        MOV     R2,#23
        LCALL   SADLCD0
        MOV     A,#CXPSH0       ; BASE
        ADD     A,CADROF        ; ADD OFFSET
        MOV     R0,A            ; POINT TO #N ADDRESS
        MOVX    A,@R0
        MOV     R4,A
        INC     R0              ; CXPSLO + OFFSET
        MOVX    A,@R0
        MOV     R5,A
        LCALL   DISHEX0
;
        MOV     R2,#33
        LCALL   SADLCD0
        MOV     A,#CYPSH0       ; BASE
        ADD     A,CADROF        ; ADD OFFSET
        MOV     R0,A            ; POINT TO #N ADDRESS
        MOVX    A,@R0
        MOV     R4,A
        INC     R0              ; CYPSLO + OFFSET
        MOVX    A,@R0
        MOV     R5,A
        LCALL   DISHEX0
;
        MOV     R2,#87
        LCALL   SADLCD0
        MOV     A,#CZPSH0       ; BASE
        ADD     A,CADROF        ; ADD OFFSET
        MOV     R0,A            ; POINT TO #N ADDRESS
        MOVX    A,@R0
        MOV     R4,A
        INC     R0              ; CZPSLO + OFFSET
        MOVX    A,@R0
        MOV     R5,A
        LCALL   DISHEX0
;
REPCNT: MOV     R2,#102
        LCALL   SADLCD0
        JNB     PSENSE,$1       ; IN MEASURE MODE
;
        JNB     PCNTCT,$3       ; IN SENSE MODE
        MOV     R2,#'N'
        SJMP    RPSTRET
$3:     MOV     R2,#'Y'
        SJMP    RPSTRET
;
$1:     MOV     A,FGSTUS        ; ONLY PREVIOUS FLAG
$2:     JNB     CONTACT,RPST09
        MOV     R2,#4EH         ; N
        SJMP    RPSTRET
RPST09: MOV     R2,#59H         ; Y
RPSTRET: LCALL  WDTLCD0
        RET
;
;-----------------------------------------------
;
;   CALL THIS TO TOGGLE uSTEP PINS
;
ACTUSTP: MOV    DPTR,#PORTB0
        MOV     A,PB0TMP
        XRL     A,#01000000B    ; USTEP
        MOV     PB0TMP,A
        MOVX    @DPTR,A
        RET
;
;-----------------------------------------------
;
;   CALL THIS TO TOGGLE CONTACT SENSING RELAYS
;
ACTCTSN: CPL    PSENSE
        RET
;
;-----------------------------------------------
;
;   CALL THIS TO DISPLAY THE SOFT KEY MENU ON LCD 1
;   BASE ON STATUS/STTST0/STTST1/STTST2.
;
DISOFT: LCALL   CLRLCD1
        MOV     DPTR,#STMSGTB
        MOV     A,STATUS
        RL      A               ; X 2
        MOV     R2,A            ; TMP
        MOVC    A,@A+DPTR       ; GET TB ADR
        XCH     A,R2
        INC     A
        MOVC    A,@A+DPTR       ; GET TB ADR
        MOV     DPL,A
        MOV     DPH,R2
;
        MOV     A,STTST0
        MOV     B,#80
        MUL     AB
        ADD     A,DPL
        MOV     DPL,A
        MOV     A,B
        ADDC    A,DPH
        MOV     DPH,A           ; BASE + ( ST * 40 )
        MOV     R3,#80          ; MSG LENGTH
        LCALL   DISIGN1
        RET
;
STMSGTB: DW     STMSG00
        DW      STMSG10
        DW      STMSG20
        DW      STMSG30
        DW      STMSG40
        DW      STMSG50
        DW      STMSG60
        DW      STMSG70
        DW      STMSG80
;
STMSG00: ASCII  Setup   Local   Learn   Program Help     |
        ASCII   Alignm  Remote  Debug   Execute Abort 00|
STMSG01: ASCII  Setup   Mode :          Home    Help     |
        ASCII   Date    Time    Invert  Exist   Abort 01|
STMSG02: ASCII  Local   Mode :  Register #      Help     |
        ASCII   Move to Contact Cursor  Alignm  Abort 02|
STMSG03: ASCII  Learn   Mode :  Register #      Help     |
        ASCII   Back    Forward Debug   Execute Abort 03|
STMSG04: ASCII  Program Mode :  Reg #   File #  Help     |
        ASCII   Back    Forward Debug   Execute Abort 04|
STMSG05: ASCII  Alignment Mode :                Help     |
        ASCII   X Align Y Align Go To   Home    Abort 05|
```

```
STMSG06:   ASCII   Remote Mode :                     Help    |
           ASCII   Load     Save                     Abort 06|
STMSG07:   ASCII   Debug    Mode :                   Help    |
           ASCII   Reg #    File #  Go To   Execute  Abort 07|
STMSG08:   ASCII   Execute Mode :                    Help    |
           ASCII   File #                   Execute  Abort 08|
STMSG09:   ASCII   Execute Mode :                    Help    |
           ASCII   File #                   Execute  Abort 09|
;
STMSG10:   ASCII   Setup    Mode :          Home     Help    |
           ASCII   Date     Time    Invert  Exist    Abort 10|
STMSG11:   ASCII   Setup    Mode :          Home     Help    |
           ASCII   Date     Time    Invert  Exist    Abort 11|
STMSG12:   ASCII   Local    Mode :  Register #       Help    |
           ASCII   Move to Contact Cursor   Alignm   Abort 12|
STMSG13:   ASCII   Learn    Mode :  Register #       Help    |
           ASCII   Back     Forward Debug   Execute  Abort 13|
STMSG14:   ASCII   Program Mode :   Reg #   File #   Help    |
           ASCII   Back     Forward Debug   Execute  Abort 14|
STMSG15:   ASCII   Alignment Mode :                  Help    |
           ASCII   X Align Y Align Go To    Home     Abort 15|
STMSG16:   ASCII   Remote Mode :                     Help    |
           ASCII   Load     Save                     Abort 16|
STMSG17:   ASCII   Debug    Mode :                   Help    |
           ASCII   Reg #    File #  Go To   Execute  Abort 17|
STMSG18:   ASCII   Execute Mode :                    Help    |
           ASCII   File #                   Execute  Abort 18|
STMSG19:   ASCII   Execute Mode :                    Help    |
           ASCII   File #                   Execute  Abort 19|
;
STMSG20:   ASCII   Local    Mode :  Register #       Help    |
           ASCII   Move to Contact Cursor   Alignm   Abort 20|
STMSG21:   ASCII   Setup    Mode :          Home     Help    |
           ASCII   Date     Time    Invert  Exist    Abort 21|
STMSG22:   ASCII   Local    Mode :  Register #       Help    |
           ASCII   Move to Contact Cursor   Alignm   Abort 22|
STMSG23:   ASCII   Learn    Mode :  Register #       Help    |
           ASCII   Back     Forward Debug   Execute  Abort 23|
STMSG24:   ASCII   Program Mode :   Reg #   File #   Help    |
           ASCII   Back     Forward Debug   Execute  Abort 24|
STMSG25:   ASCII   Alignment Mode :                  Help    |
           ASCII   X Align Y Align Go To    Home     Abort 25|
STMSG26:   ASCII   Remote Mode :                     Help    |
           ASCII   Load     Save                     Abort 26|
STMSG27:   ASCII   Debug    Mode :                   Help    |
           ASCII   Reg #    File #  Go To   Execute  Abort 27|
STMSG28:   ASCII   Execute Mode :                    Help    |
           ASCII   File #                   Execute  Abort 28|
STMSG29:   ASCII   Execute Mode :                    Help    |
           ASCII   File #                   Execute  Abort 29|
;
STMSG30:   ASCII   Learn    Mode :  Register #       Help    |
           ASCII   Back     Forward Debug   Execute  Abort 30|
STMSG31:   ASCII   Setup    Mode :          Home     Help    |
           ASCII   Date     Time    Invert  Exist    Abort 31|
STMSG32:   ASCII   Local    Mode :  Register #       Help    |
           ASCII   Move to Contact Cursor   Alignm   Abort 32|
STMSG33:   ASCII   Learn    Mode :  Register #       Help    |
           ASCII   Back     Forward Debug   Execute  Abort 33|
STMSG34:   ASCII   Program Mode :   Reg #   File #   Help    |
           ASCII   Back     Forward Debug   Execute  Abort 34|
STMSG35:   ASCII   Alignment Mode :                  Help    |
           ASCII   X Align Y Align Go To    Home     Abort 35|
STMSG36:   ASCII   Remote Mode :                     Help    |
           ASCII   Load     Save                     Abort 36|
STMSG37:   ASCII   Debug    Mode :                   Help    |
           ASCII   Reg #    File #  Go To   Execute  Abort 37|
STMSG38:   ASCII   Execute Mode :                    Help    |
           ASCII   File #                   Execute  Abort 38|
STMSG39:   ASCII   Execute Mode :                    Help    |
           ASCII   File #                   Execute  Abort 39|
;
STMSG40:   ASCII   Program Mode :   Reg #   File #   Help    |
           ASCII   Back     Forward Debug   Execute  Abort 40|
STMSG41:   ASCII   Setup    Mode :          Home     Help    |
           ASCII   Date     Time    Invert  Exist    Abort 41|
STMSG42:   ASCII   Local    Mode :  Register #       Help    |
           ASCII   Move to Contact Cursor   Alignm   Abort 42|
STMSG43:   ASCII   Learn    Mode :  Register #       Help    |
           ASCII   Back     Forward Debug   Execute  Abort 43|
STMSG44:   ASCII   Program Mode :   Reg #   File #   Help    |
           ASCII   Back     Forward Debug   Execute  Abort 44|
STMSG45:   ASCII   Alignment Mode :                  Help    |
           ASCII   X Align Y Align Go To    Home     Abort 45|
STMSG46:   ASCII   Remote Mode :                     Help    |
           ASCII   Load     Save                     Abort 46|
STMSG47:   ASCII   Debug    Mode :                   Help    |
           ASCII   Reg #    File #  Go To   Execute  Abort 47|
STMSG48:   ASCII   Execute Mode :                    Help    |
           ASCII   File #                   Execute  Abort 48|
STMSG49:   ASCII   Execute Mode :                    Help    |
           ASCII   File #                   Execute  Abort 49|
;
STMSG50:   ASCII   Alignment Mode :                  Help    |
           ASCII   X Align Y Align Go To    Home     Abort 50|
STMSG51:   ASCII   Setup    Mode :          Home     Help    |
           ASCII   Date     Time    Invert  Exist    Abort 51|
STMSG52:   ASCII   Local    Mode :  Register #       Help    |
           ASCII   Move to Contact Cursor   Alignm   Abort 52|
STMSG53:   ASCII   Learn    Mode :  Register #       Help    |
           ASCII   Back     Forward Debug   Execute  Abort 53|
STMSG54:   ASCII   Program Mode :   Reg #   File #   Help    |
           ASCII   Back     Forward Debug   Execute  Abort 54|
STMSG55:   ASCII   Alignment Mode :                  Help    |
           ASCII   X Align Y Align Go To    Home     Abort 55|
STMSG56:   ASCII   Remote Mode :                     Help    |
           ASCII   Load     Save                     Abort 56|
STMSG57:   ASCII   Debug    Mode :                   Help    |
           ASCII   Reg #    File #  Go To   Execute  Abort 57|
STMSG58:   ASCII   Execute Mode :                    Help    |
           ASCII   File #                   Execute  Abort 58|
STMSG59:   ASCII   Execute Mode :                    Help    |
           ASCII   File #                   Execute  Abort 59|
;
STMSG60:   ASCII   Remote Mode :                     Help    |
           ASCII   Load     Save                     Abort 60|
STMSG61:   ASCII   Setup    Mode :          Home     Help    |
           ASCII   Date     Time    Invert  Exist    Abort 61|
STMSG62:   ASCII   Local    Mode :  Register #       Help    |
           ASCII   Move to Contact Cursor   Alignm   Abort 62|
STMSG63:   ASCII   Learn    Mode :  Register #       Help    |
           ASCII   Back     Forward Debug   Execute  Abort 63|
STMSG64:   ASCII   Program Mode :   Reg #   File #   Help    |
           ASCII   Back     Forward Debug   Execute  Abort 64|
STMSG65:   ASCII   Alignment Mode :                  Help    |
           ASCII   X Align Y Align Go To    Home     Abort 65|
STMSG66:   ASCII   Remote Mode :                     Help    |
           ASCII   Load     Save                     Abort 66|
```

```
STMSG67:   ASCII   Debug    Mode :                     Help    |
           ASCII   Reg #    File #   Go To   Execute  Abort 67|
STMSG68:   ASCII   Execute Mode :                      Help    |
           ASCII   File #                    Execute  Abort 68|
STMSG69:   ASCII   Execute Mode :                      Help    |
           ASCII   File #                    Execute  Abort 69|
;
STMSG70:   ASCII   Debug    Mode :                     Help    |
           ASCII   Reg #    File #   Go To   Execute  Abort 70|
STMSG71:   ASCII   Setup    Mode :           Home     Help    |
           ASCII   Date     Time     Invert  Exist    Abort 71|
STMSG72:   ASCII   Local    Mode :   Register #       Help    |
           ASCII   Move to Contact Cursor  Alignm    Abort 72|
STMSG73:   ASCII   Learn    Mode : ' Register #       Help    |
           ASCII   Back     Forward Debug    Execute  Abort 73|
STMSG74:   ASCII   Program Mode :   Reg #   File #   Help    |
           ASCII   Back     Forward Debug    Execute  Abort 74|
STMSG75:   ASCII   Alignment Mode :                    Help    |
           ASCII   X Align Y Align Go To    Home     Abort 75|
STMSG76:   ASCII   Remote Mode :                       Help    |
           ASCII   Load     Save                       Abort 76|
STMSG77:   ASCII   Debug    Mode :                     Help    |
           ASCII   Reg #    File #   Go To   Execute  Abort 77|
STMSG78:   ASCII   Execute Mode :                      Help    |
           ASCII   File #                    Execute  Abort 78|
STMSG79:   ASCII   Execute Mode :                      Help    |
           ASCII   File #                    Execute  Abort 79|
;
STMSG80:   ASCII   Execute Mode :                      Help    |
           ASCII   File #                    Execute  Abort 80|
STMSG81:   ASCII   Setup    Mode :           Home     Help    |
           ASCII   Date     Time     Invert  Exist    Abort 81|
STMSG82:   ASCII   Local    Mode :   Register #       Help    |
           ASCII   Move to Contact Cursor  Alignm    Abort 82|
STMSG83:   ASCII   Learn    Mode :   Register #       Help    |
           ASCII   Back     Forward Debug    Execute  Abort 83|
STMSG84:   ASCII   Program Mode :   Reg #   File #   Help    |
           ASCII   Back     Forward Debug    Execute  Abort 84|
STMSG85:   ASCII   Alignment Mode :                    Help    |
           ASCII   X Align Y Align Go To    Home     Abort 85|
STMSG86:   ASCII   Remote Mode :                       Help    |
           ASCII   Load     Save                       Abort 86|
STMSG87:   ASCII   Debug    Mode :                     Help    |
           ASCII   Reg #    File #   Go To   Execute  Abort 87|
STMSG88:   ASCII   Execute Mode :                      Help    |
           ASCII   File #                    Execute  Abort 88|
STMSG89:   ASCII   Execute Mode :                      Help    |
           ASCII   File #                    Execute  Abort 89|
;
;-------------------------------------------------
;
```

APPENDIX D

Netlist Display Canvas Commands

* Cell Close—This command closes the current cell and brings it one level up in the cell hierarchy.
* Cell Open—By choosing a desired cell instance name or its cell name the particular cell will be opened for display. For both the Cell Close and Cell Open command the Netlist hierarchy canvas will automatically zoom in around the cell box of the current cell being displayed. Also under the text item "Cell" in the control panel, the path name of the current cell will be printed.
* Fit Cell—This command brings the display of the current cell to the beginning of the cell.
* Map to Layout—This command allows the user to do cross-mapping from netlist to layout. Choosing the signal/device to be mapped will cause that signal/device to be highlighted throughout the netlist. The corresponding signal/device in the layout is also highlighted in the Layout canvas of the Maskview window. Also a trace of that signal/device will be shown in the Netlist hierarchy canvas.
* Redraw—This command will redraw the current window.
* Trace Signal—This command will trace a signal in the netlist. This is done by choosing the signal to be traced. This signal will be highlighted throughout the netlist. A trace of this signal is also shown in the Netlist hierarchy canvas.
* Top Cell—This command will display the top cell of the netlist.

APPENDIX E

Netlist Hierarchy Canvas Commands

* Clear Trace—This command clears the trace highlight of the last signal traced.
* Cell Open—This command opens a particular cell in the netlist for viewing. This is done by selecting the cell box of the cell to be opened. This cell will be displayed in the Netlist display canvas. The path name of this cell will be shown in the control panel under the text item "Cell".
* Pan—Allows panning operations.
* Redraw—Redisplays the current view.
* Top View—Goes back to display the top netlist hierarchy view.
* Zoom In—Zooms in a smaller area for display. The area to zoom in is defined by a box drawn in the canvas. The area within the box will be displayed to the full extent of the canvas.
* Zoom Out—Zooms out to a larger area for display. The area to zoom out is defined by a box drawn in the canvas. The current view will be displayed within the box.

APPENDIX F

Group Name and Waveform Canvas Commands

1) Display Group—This command allows the user to select groups to be displayed in the Waveform Canvas. This is done by choosing the group to be selected.
2) Redraw—This command allows the user to redraw this window.
3) Create Marker—This command allows the user to create vertical markers as visual aid.
4) Delete Marker—This command allows the user to remove markers created.
5) Move Marker—This command allows the user to move existing markers.
6) Undisplay Group—This command allows the user to remove a whole group from being displayed.
7) Move Group—This command allows the user to rearrange the display order of groups.
8) Zoom In—This command allows the user to zoom in to a smaller portion of the waveforms for display.
9) Zoom Out—This command allows the user to zoom out to a larger portion of the waveforms for display.
10) Pan—This command allows panning.
11) Redraw—This command redraws the Waveform canvas.
12) Create Group—This command allows the user to create a new group of signals. The Signal Add mode is displayed for the user to create a new group and add signals to it.
13) Mod/Del Group—This command allows the user to modify a group which in under displayed. It also allows the user to delete a group. This command also recalls the Group and Signal additive mode.
14) Modify Ckt Info—This command allows the user to modify circuit information.
15) Sample 1 Signal—This command allows the user to sample the last signal acquired and create a group and signal entry for it. Signal ID window described previously will be recalled for the user to enter the group and id names.
16) Save File—This command allows the user to save all the signals and group configuration information into a disk file. In future sessions this file is read in automatically and the waveforms will be displayed initially.

17) Reload File—This command allows the user to restore the initial waveforms displayed and group information from a disk file which has been saved previously.

What is claimed is:

1. A system for testing integrated circuits comprising:

computer means for storing, accessing and displaying a database describing the integrated circuit being tested;

microprobe means for injecting test signals into and receiving test signals from the integrated circuit;

microprobe drive means comprising a plurality of stepping motors coupled to the microprobe means for moving the microprobe in three axes;

microscope means for viewing the integrated circuit being tested;

microscope drive means comprising a plurality of stepping motors coupled to the microscope means for moving the microscope in three axes;

controller means coupled to the computer means, the microprobe drive means, and the microscope drive means for automatically moving the microscope and microprobe to the same area of the integrated circuit as is being accessed in the database and being displayed on the computer means; and wherein an integrator circuit is provided for each separate winding in the stepping motors, the circuit receiving a voltage signal from the controller and transmitting a modified voltage signal wherein the time to rise to and fall from maximum amplitude has been significantly increased.

2. A system for testing integrated circuits using a mechanical microprobe for injecting and receiving test signals, a microscope for viewing the integrated circuit being tested, and a computer for storing and displaying the computer aided design ('CAD') database of the integrated circuit being tested, the system comprising:

microscope drive means comprising a plurality of stepping motors coupled to the microscope for moving the microscope in three dimensions;

microprobe drive means comprising a plurality of stepping motors coupled to the microprobe for moving the microprobe in three dimensions;

controller means coupled to the computer, the microscope drive means and the microprobe drive means, for moving the microscope means and the microprobe means to the location on the integrated circuit which corresponds to the location being accessed on the computer, the controller effecting these movements automatically after the user selects the location to access, the system further comprising a voltage integrator circuit comprised of an operational amplifier, a capacitor coupled between the negative input of the operational amplifier and the output of the operational amplifier, a resistor coupled to the controller and the negative input of the operational amplifier, a ground connection to the positive input of the operational amplifier and an emitter follower transistor coupled to the output of the operational amplifier which receives a voltage signal from the controller means and transmits from the emitter of the transistor a voltage signal with the same peak amplitude as the received voltage signal but with a significantly increased rise time and fall time from the peak voltage.

3. The system of claim 1 wherein the controller contains a contact sensing circuit which prevents further microprobe motion once the microprobe contacts the integrated circuit.

4. The system of claim 2 wherein the controller contains a contact sensing circuit which prevents microprobe motion once the microprobe contacts the integrated circuit being tested.

5. The system of claim 1 wherein the integrator circuit prevents microprobe vibration due to motor resonance.

6. The system of claim 2 wherein the voltage integrator circuit prevents microprobe vibration due to motor resonance.

* * * * *